US007308242B2

(12) United States Patent
Sorrells et al.

(10) Patent No.: US 7,308,242 B2
(45) Date of Patent: Dec. 11, 2007

(54) METHOD AND SYSTEM FOR DOWN-CONVERTING AND UP-CONVERTING AN ELECTROMAGNETIC SIGNAL, AND TRANSFORMS FOR SAME

(75) Inventors: David F. Sorrells, Middleburg, FL (US); Michael J. Bultman, Jacksonville, FL (US); Robert W. Cook, Switzerland, FL (US); Richard C. Looke, Jacksonville, FL (US); Charley D. Moses, Jr., Jacksonville, FL (US); Gregory S. Rawlins, Heathrow, FL (US); Michael W. Rawlins, Lake Mary, FL (US)

(73) Assignee: ParkerVision, Inc., Jacksonville, FL (US)

(*) Notice: Subject to any disclaimer, the term of this patent is extended or adjusted under 35 U.S.C. 154(b) by 638 days.

(21) Appl. No.: 10/914,337

(22) Filed: Aug. 10, 2004

(65) Prior Publication Data

US 2005/0009494 A1 Jan. 13, 2005

Related U.S. Application Data

(63) Continuation of application No. 09/838,387, filed on Apr. 20, 2001, now Pat. No. 6,813,485, which is a continuation-in-part of application No. 09/550,644, filed on Apr. 14, 2000, which is a continuation-in-part of application No. 09/521,879, filed on Mar. 9, 2000, now abandoned, which is a continuation-in-part of application No. 09/293,342, filed on Apr. 16, 1999, now Pat. No. 6,687,493, which is a continuation-in-part of application No. 09/176,022, filed on Oct. 21, 1998, now Pat. No. 6,061,551, said application No. 09/838,387.

(60) Provisional application No. 60/199,141, filed on Apr. 24, 2000.

(51) Int. Cl.
*H04B 1/04* (2006.01)
*H04B 1/00* (2006.01)

(52) U.S. Cl. ...................... 455/313; 455/118; 455/323

(58) Field of Classification Search ................ 455/313, 455/323, 190.1, 112, 131, 327, 333, 118, 455/130, 76, 91, 260, 191.1, 182.1; 375/343–344, 375/350; 327/100, 113
See application file for complete search history.

(56) References Cited

U.S. PATENT DOCUMENTS

| | | | |
|---|---|---|---|
| 2,057,613 | A | 10/1936 | Gardner |
| 2,241,078 | A | 5/1941 | Vreeland |
| 2,270,385 | A | 1/1942 | Skillman |
| 2,283,575 | A | 5/1942 | Roberts |
| 2,358,152 | A | 9/1944 | Earp |
| 2,410,350 | A | 10/1946 | Labin et al. |
| 2,451,430 | A | 10/1948 | Barone |
| 2,462,069 | A | 2/1949 | Chatterjea et al. |
| 2,462,181 | A | 2/1949 | Grosselfinger |
| 2,472,798 | A | 6/1949 | Fredendall |
| 2,497,859 | A | 2/1950 | Boughtwood et al. |
| 2,499,279 | A | 2/1950 | Peterson |
| 2,530,824 | A | 11/1950 | King |
| 2,802,208 | A | 8/1957 | Hobbs |
| 2,985,875 | A | 5/1961 | Grisdale et al. |
| 3,023,309 | A | 2/1962 | Foulkes |
| 3,069,679 | A | 12/1962 | Sweeney et al. |
| 3,104,393 | A | 9/1963 | Vogelman |
| 3,114,106 | A | 12/1963 | McManus |
| 3,118,117 | A | 1/1964 | King et al. |
| 3,226,643 | A | 12/1965 | McNair |
| 3,246,084 | A | 4/1966 | Kryter |
| 3,258,694 | A | 6/1966 | Shepherd |
| 3,383,598 | A | 5/1968 | Sanders |
| 3,384,822 | A | 5/1968 | Miyagi |
| 3,454,718 | A | 7/1969 | Perreault |
| 3,523,291 | A | 8/1970 | Pierret |
| 3,548,342 | A | 12/1970 | Maxey |
| 3,555,428 | A | 1/1971 | Perreault |
| 3,614,627 | A | 10/1971 | Runyan et al. |
| 3,614,630 | A | 10/1971 | Rorden |
| 3,617,892 | A | 11/1971 | Hawley et al. |
| 3,617,898 | A | 11/1971 | Janning, Jr. |
| 3,621,402 | A | 11/1971 | Gardner |

| | | | |
|---|---|---|---|
| 3,622,885 A | 11/1971 | Oberdorf et al. | |
| 3,623,160 A | 11/1971 | Giles et al. | |
| 3,626,417 A | 12/1971 | Gilbert | |
| 3,629,696 A | 12/1971 | Bartelink | |
| 3,662,268 A | 5/1972 | Gans et al. | |
| 3,689,841 A | 9/1972 | Bello et al. | |
| 3,694,754 A | 9/1972 | Baltzer | |
| 3,702,440 A | 11/1972 | Moore | |
| 3,714,577 A | 1/1973 | Hayes | |
| 3,716,730 A | 2/1973 | Cerny, Jr. | |
| 3,717,844 A | 2/1973 | Barret et al. | |
| 3,719,903 A | 3/1973 | Goodson | |
| 3,735,048 A | 5/1973 | Tomsa et al. | |
| 3,736,513 A | 5/1973 | Wilson | |
| 3,737,778 A | 6/1973 | Van Gerwen et al. | |
| 3,739,282 A | 6/1973 | Bruch et al. | |
| 3,764,921 A | 10/1973 | Huard | |
| 3,767,984 A | 10/1973 | Shinoda et al. | |
| 3,806,811 A | 4/1974 | Thompson | |
| 3,852,530 A | 12/1974 | Shen | |
| 3,868,601 A | 2/1975 | MacAfee | |
| 3,940,697 A | 2/1976 | Morgan | |
| 3,949,300 A | 4/1976 | Sadler | |
| 3,967,202 A | 6/1976 | Batz | |
| 3,980,945 A | 9/1976 | Bickford | |
| 3,987,280 A | 10/1976 | Bauer | |
| 3,991,277 A | 11/1976 | Hirata | |
| 4,003,002 A | 1/1977 | Snijders et al. | |
| 4,013,966 A | 3/1977 | Campbell | |
| 4,016,366 A | 4/1977 | Kurata | |
| 4,017,798 A | 4/1977 | Gordy et al. | |
| 4,019,140 A | 4/1977 | Swerdlow | |
| 4,032,847 A | 6/1977 | Unkauf | |
| 4,035,732 A | 7/1977 | Lohrmann | |
| 4,045,740 A | 8/1977 | Baker | |
| 4,047,121 A | 9/1977 | Campbell | |
| 4,051,475 A | 9/1977 | Campbell | |
| 4,066,841 A | 1/1978 | Young | |
| 4,066,919 A | 1/1978 | Huntington | |
| 4,080,573 A | 3/1978 | Howell | |
| 4,081,748 A | 3/1978 | Batz | |
| 4,115,737 A | 9/1978 | Hongu et al. | |
| 4,130,765 A | 12/1978 | Arakelian et al. | |
| 4,130,806 A | 12/1978 | Van Gerwen et al. | |
| 4,132,952 A | 1/1979 | Hongu et al. | |
| 4,142,155 A | 2/1979 | Adachi | |
| 4,143,322 A | 3/1979 | Shimamura | |
| 4,158,149 A | 6/1979 | Otofuji | |
| 4,170,764 A | 10/1979 | Salz et al. | |
| 4,204,171 A | 5/1980 | Sutphin, Jr. | |
| 4,210,872 A | 7/1980 | Gregorian | |
| 4,220,977 A | 9/1980 | Yamanaka | |
| 4,241,451 A | 12/1980 | Maixner et al. | |
| 4,245,355 A | 1/1981 | Pascoe et al. | |
| 4,250,458 A | 2/1981 | Richmond et al. | |
| 4,253,066 A | 2/1981 | Fisher et al. | |
| 4,253,067 A | 2/1981 | Caples et al. | |
| 4,253,069 A | 2/1981 | Nossek | |
| 4,286,283 A | 8/1981 | Clemens | |
| 4,308,614 A | 12/1981 | Fisher et al. | |
| 4,320,361 A | 3/1982 | Kikkert | |
| 4,320,536 A | 3/1982 | Dietrich | |
| 4,334,324 A | 6/1982 | Hoover | |
| 4,346,477 A | 8/1982 | Gordy | |
| 4,355,401 A | 10/1982 | Ikoma et al. | |
| 4,356,558 A | 10/1982 | Owen et al. | |
| 4,360,867 A | 11/1982 | Gonda | |
| 4,363,132 A | 12/1982 | Collin | |
| 4,365,217 A | 12/1982 | Berger et al. | |
| 4,369,522 A | 1/1983 | Cerny, Jr. et al. | |
| 4,370,572 A | 1/1983 | Cosand et al. | |
| 4,380,828 A | 4/1983 | Moon | |
| 4,384,357 A | 5/1983 | deBuda et al. | |

| | | | |
|---|---|---|---|
| 4,389,579 A | 6/1983 | Stein | |
| 4,392,255 A | 7/1983 | Del Giudice | |
| 4,393,395 A | 7/1983 | Hacke et al. | |
| 4,430,629 A | 2/1984 | Betzl et al. | |
| 4,439,787 A | 3/1984 | Mogi et al. | |
| 4,441,080 A | 4/1984 | Saari | |
| 4,446,438 A | 5/1984 | Chang et al. | |
| 4,456,990 A | 6/1984 | Fisher et al. | |
| 4,470,145 A | 9/1984 | Williams | |
| 4,472,785 A | 9/1984 | Kasuga | |
| 4,479,226 A | 10/1984 | Prabhu et al. | |
| 4,481,490 A | 11/1984 | Huntley | |
| 4,481,642 A | 11/1984 | Hanson | |
| 4,483,017 A | 11/1984 | Hampel et al. | |
| 4,484,143 A | 11/1984 | French et al. | |
| 4,485,488 A | 11/1984 | Houdart | |
| 4,488,119 A | 12/1984 | Marshall | |
| 4,504,803 A | 3/1985 | Lee et al. | |
| 4,510,467 A | 4/1985 | Chang et al. | |
| 4,517,519 A | 5/1985 | Mukaiyama | |
| 4,517,520 A | 5/1985 | Ogawa | |
| 4,518,935 A | 5/1985 | van Roermund | |
| 4,521,892 A | 6/1985 | Vance et al. | |
| 4,562,414 A | 12/1985 | Linder et al. | |
| 4,563,773 A | 1/1986 | Dixon, Jr. et al. | |
| 4,577,157 A | 3/1986 | Reed | |
| 4,583,239 A | 4/1986 | Vance | |
| 4,591,736 A | 5/1986 | Hirao et al. | |
| 4,591,930 A | 5/1986 | Baumeister | |
| 4,602,220 A | 7/1986 | Kurihara | |
| 4,603,300 A | 7/1986 | Welles, II et al. | |
| 4,612,464 A | 9/1986 | Ishikawa et al. | |
| 4,612,518 A | 9/1986 | Gans et al. | |
| 4,616,191 A | 10/1986 | Galani et al. | |
| 4,621,217 A | 11/1986 | Saxe et al. | |
| 4,628,517 A | 12/1986 | Schwarz et al. | |
| 4,633,510 A | 12/1986 | Suzuki et al. | |
| 4,634,998 A | 1/1987 | Crawford | |
| 4,648,021 A | 3/1987 | Alberkrack | |
| 4,651,034 A | 3/1987 | Sato | |
| 4,653,117 A | 3/1987 | Heck | |
| 4,660,164 A | 4/1987 | Leibowitz | |
| 4,675,882 A | 6/1987 | Lillie et al. | |
| 4,688,253 A | 8/1987 | Gumm | |
| 4,716,376 A | 12/1987 | Daudelin | |
| 4,716,388 A | 12/1987 | Jacobs | |
| 4,718,113 A | 1/1988 | Rother et al. | |
| 4,726,041 A | 2/1988 | Prohaska et al. | |
| 4,733,403 A | 3/1988 | Simone | |
| 4,734,591 A | 3/1988 | Ichitsubo | |
| 4,737,969 A | 4/1988 | Steel et al. | |
| 4,740,675 A | 4/1988 | Brosnan et al. | |
| 4,740,792 A | 4/1988 | Sagey et al. | |
| 4,743,858 A | 5/1988 | Everard | |
| 4,745,463 A | 5/1988 | Lu | |
| 4,751,468 A | 6/1988 | Agoston | |
| 4,757,538 A | 7/1988 | Zink | |
| 4,761,798 A * | 8/1988 | Griswold et al. | 375/295 |
| 4,768,187 A | 8/1988 | Marshall | |
| 4,769,612 A | 9/1988 | Tamakoshi et al. | |
| 4,772,853 A | 9/1988 | Hart | |
| 4,785,463 A | 11/1988 | Janc et al. | |
| 4,789,837 A | 12/1988 | Ridgers | |
| 4,791,584 A | 12/1988 | Greivenkamp, Jr. | |
| 4,801,823 A | 1/1989 | Yokoyama | |
| 4,806,790 A | 2/1989 | Sone | |
| 4,810,904 A | 3/1989 | Crawford | |
| 4,810,976 A | 3/1989 | Cowley et al. | |
| 4,811,362 A | 3/1989 | Yester, Jr. et al. | |
| 4,811,422 A | 3/1989 | Kahn | |
| 4,814,649 A | 3/1989 | Young | |
| 4,816,704 A | 3/1989 | Fiori, Jr. | |
| 4,819,252 A | 4/1989 | Christopher | |

| | | | |
|---|---|---|---|
| 4,833,445 | A | 5/1989 | Buchele |
| 4,841,265 | A | 6/1989 | Watanabe et al. |
| 4,845,389 | A | 7/1989 | Pyndiah et al. |
| 4,855,894 | A | 8/1989 | Asahi et al. |
| 4,857,928 | A | 8/1989 | Gailus et al. |
| 4,862,121 | A | 8/1989 | Hochschild et al. |
| 4,866,441 | A | 9/1989 | Conway et al. |
| 4,868,654 | A | 9/1989 | Juri et al. |
| 4,870,659 | A | 9/1989 | Oishi et al. |
| 4,871,987 | A | 10/1989 | Kawase |
| 4,873,492 | A | 10/1989 | Myer |
| 4,885,587 | A | 12/1989 | Wiegand et al. |
| 4,885,671 | A | 12/1989 | Peil |
| 4,885,756 | A | 12/1989 | Fontanes et al. |
| 4,888,557 | A | 12/1989 | Puckette, IV et al. |
| 4,890,302 | A | 12/1989 | Muilwijk |
| 4,893,316 | A | 1/1990 | Janc et al. |
| 4,893,341 | A | 1/1990 | Gehring |
| 4,894,766 | A | 1/1990 | De Agro |
| 4,896,152 | A | 1/1990 | Tiemann |
| 4,902,979 | A | 2/1990 | Puckette, IV |
| 4,908,579 | A | 3/1990 | Tawfik et al. |
| 4,910,752 | A | 3/1990 | Yester, Jr. et al. |
| 4,914,405 | A | 4/1990 | Wells |
| 4,920,510 | A | 4/1990 | Senderowicz et al. |
| 4,922,452 | A | 5/1990 | Larsen et al. |
| 4,931,716 | A | 6/1990 | Jovanovic et al. |
| 4,931,921 | A | 6/1990 | Anderson |
| 4,943,974 | A | 7/1990 | Motamedi |
| 4,944,025 | A | 7/1990 | Gehring et al. |
| 4,955,079 | A | 9/1990 | Connerney et al. |
| 4,965,467 | A | 10/1990 | Bilterijst |
| 4,967,160 | A | 10/1990 | Quievy et al. |
| 4,970,703 | A | 11/1990 | Hariharan et al. |
| 4,972,436 | A | 11/1990 | Halim et al. |
| 4,982,353 | A | 1/1991 | Jacob et al. |
| 4,984,077 | A | 1/1991 | Uchida |
| 4,995,055 | A | 2/1991 | Weinberger et al. |
| 5,003,621 | A | 3/1991 | Gailus |
| 5,005,169 | A | 4/1991 | Bronder et al. |
| 5,006,810 | A | 4/1991 | Popescu |
| 5,010,585 | A | 4/1991 | Garcia |
| 5,012,245 | A | 4/1991 | Scott et al. |
| 5,014,130 | A | 5/1991 | Heister et al. |
| 5,014,304 | A | 5/1991 | Nicollini et al. |
| 5,015,963 | A | 5/1991 | Sutton |
| 5,016,242 | A | 5/1991 | Tang |
| 5,017,924 | A | 5/1991 | Guiberteau et al. |
| 5,020,149 | A | 5/1991 | Hemmie |
| 5,020,154 | A | 5/1991 | Zierhut |
| 5,052,050 | A | 9/1991 | Collier et al. |
| 5,058,107 | A | 10/1991 | Stone et al. |
| 5,062,122 | A | 10/1991 | Pham et al. |
| 5,063,387 | A | 11/1991 | Mower |
| 5,065,409 | A | 11/1991 | Hughes et al. |
| 5,083,050 | A | 1/1992 | Vasile |
| 5,091,921 | A | 2/1992 | Minami |
| 5,095,533 | A | 3/1992 | Loper et al. |
| 5,095,536 | A | 3/1992 | Loper |
| 5,111,152 | A | 5/1992 | Makino |
| 5,113,094 | A | 5/1992 | Grace et al. |
| 5,113,129 | A | 5/1992 | Hughes |
| 5,115,409 | A | 5/1992 | Stepp |
| 5,122,765 | A | 6/1992 | Pataut |
| 5,124,592 | A | 6/1992 | Hagino |
| 5,126,682 | A | 6/1992 | Weinberg et al. |
| 5,131,014 | A | 7/1992 | White |
| 5,136,267 | A | 8/1992 | Cabot |
| 5,140,699 | A | 8/1992 | Kozak |
| 5,140,705 | A | 8/1992 | Kosuga |
| 5,150,124 | A | 9/1992 | Moore et al. |
| 5,151,661 | A | 9/1992 | Caldwell et al. |
| 5,157,687 | A | 10/1992 | Tymes |
| 5,159,710 | A | 10/1992 | Cusdin |
| 5,164,985 | A | 11/1992 | Nysen et al. |
| 5,170,414 | A | 12/1992 | Silvian |
| 5,172,019 | A | 12/1992 | Naylor et al. |
| 5,172,070 | A | 12/1992 | Hiraiwa et al. |
| 5,179,731 | A | 1/1993 | Tränkle et al. |
| 5,191,459 | A | 3/1993 | Thompson et al. |
| 5,196,806 | A | 3/1993 | Ichihara |
| 5,204,642 | A | 4/1993 | Ashgar et al. |
| 5,212,827 | A | 5/1993 | Meszko et al. |
| 5,214,787 | A | 5/1993 | Karkota, Jr. |
| 5,218,562 | A | 6/1993 | Basehore et al. |
| 5,220,583 | A | 6/1993 | Solomon |
| 5,220,680 | A | 6/1993 | Lee |
| 5,222,144 | A | 6/1993 | Whikehart |
| 5,230,097 | A | 7/1993 | Currie et al. |
| 5,239,496 | A | 8/1993 | Vancraeynest |
| 5,239,686 | A | 8/1993 | Downey |
| 5,239,687 | A | 8/1993 | Chen |
| 5,241,561 | A | 8/1993 | Barnard |
| 5,249,203 | A | 9/1993 | Loper |
| 5,251,218 | A | 10/1993 | Stone et al. |
| 5,251,232 | A | 10/1993 | Nonami |
| 5,260,970 | A | 11/1993 | Henry et al. |
| 5,260,973 | A | 11/1993 | Watanabe |
| 5,263,194 | A | 11/1993 | Ragan |
| 5,263,196 | A | 11/1993 | Jasper |
| 5,263,198 | A | 11/1993 | Geddes et al. |
| 5,267,023 | A | 11/1993 | Kawasaki |
| 5,278,826 | A | 1/1994 | Murphy et al. |
| 5,282,023 | A | 1/1994 | Scarpa |
| 5,282,222 | A | 1/1994 | Fattouche et al. |
| 5,287,516 | A | 2/1994 | Schaub |
| 5,293,398 | A | 3/1994 | Hamao et al. |
| 5,303,417 | A | 4/1994 | Laws |
| 5,307,517 | A | 4/1994 | Rich |
| 5,315,583 | A | 5/1994 | Murphy et al. |
| 5,319,799 | A | 6/1994 | Morita |
| 5,321,852 | A | 6/1994 | Seong |
| 5,325,204 | A | 6/1994 | Scarpa |
| 5,337,014 | A | 8/1994 | Najle et al. |
| 5,339,054 | A | 8/1994 | Taguchi |
| 5,339,459 | A | 8/1994 | Schiltz et al. |
| 5,345,239 | A | 9/1994 | Madni et al. |
| 5,353,306 | A | 10/1994 | Yamamoto |
| 5,355,114 | A | 10/1994 | Sutterlin et al. |
| 5,361,408 | A | 11/1994 | Watanabe et al. |
| 5,369,404 | A | 11/1994 | Galton |
| 5,369,789 | A | 11/1994 | Kosugi et al. |
| 5,369,800 | A | 11/1994 | Takagi et al. |
| 5,375,146 | A | 12/1994 | Chalmers |
| 5,379,040 | A | 1/1995 | Mizomoto et al. |
| 5,379,141 | A | 1/1995 | Thompson et al. |
| 5,388,063 | A | 2/1995 | Takatori et al. |
| 5,389,839 | A | 2/1995 | Heck |
| 5,390,215 | A | 2/1995 | Anita et al. |
| 5,390,364 | A | 2/1995 | Webster et al. |
| 5,400,084 | A | 3/1995 | Scarpa |
| 5,404,127 | A | 4/1995 | Lee et al. |
| 5,410,195 | A | 4/1995 | Ichihara |
| 5,410,270 | A | 4/1995 | Rybicki et al. |
| 5,410,541 | A | 4/1995 | Hotto |
| 5,410,743 | A | 4/1995 | Seely et al. |
| 5,412,352 | A | 5/1995 | Graham |
| 5,416,449 | A | 5/1995 | Joshi |
| 5,416,803 | A | 5/1995 | Janer |
| 5,422,909 | A | 6/1995 | Love et al. |
| 5,422,913 | A | 6/1995 | Wilkinson |
| 5,423,082 | A | 6/1995 | Cygan et al. |
| 5,428,638 | A | 6/1995 | Cioffi et al. |
| 5,428,640 | A | 6/1995 | Townley |
| 5,434,546 | A | 7/1995 | Palmer |
| 5,438,329 | A | 8/1995 | Gastouniotis et al. |

| | | | |
|---|---|---|---|
| 5,438,692 | A | 8/1995 | Mohindra |
| 5,440,311 | A | 8/1995 | Gallagher et al. |
| 5,444,415 | A | 8/1995 | Dent et al. |
| 5,444,416 | A | 8/1995 | Ishikawa et al. |
| 5,444,865 | A | 8/1995 | Heck et al. |
| 5,446,421 | A | 8/1995 | Kechkaylo |
| 5,446,422 | A | 8/1995 | Mattila et al. |
| 5,448,602 | A | 9/1995 | Ohmori et al. |
| 5,451,899 | A | 9/1995 | Lawton |
| 5,454,007 | A | 9/1995 | Dutta |
| 5,454,009 | A | 9/1995 | Fruit et al. |
| 5,463,356 | A | 10/1995 | Palmer |
| 5,463,357 | A | 10/1995 | Hobden |
| 5,465,071 | A | 11/1995 | Kobayashi et al. |
| 5,465,410 | A | 11/1995 | Hiben et al. |
| 5,465,415 | A | 11/1995 | Bien |
| 5,465,418 | A | 11/1995 | Zhou et al. |
| 5,471,162 | A | 11/1995 | McEwan |
| 5,471,665 | A | 11/1995 | Pace et al. |
| 5,479,120 | A | 12/1995 | McEwan |
| 5,479,447 | A | 12/1995 | Chow et al. |
| 5,481,570 | A | 1/1996 | Winters |
| 5,483,193 | A | 1/1996 | Kennedy et al. |
| 5,483,549 | A | 1/1996 | Weinberg et al. |
| 5,483,600 | A | 1/1996 | Werrbach |
| 5,483,691 | A | 1/1996 | Heck et al. |
| 5,483,695 | A | 1/1996 | Pardoen |
| 5,490,173 | A | 2/1996 | Whikehart et al. |
| 5,490,176 | A | 2/1996 | Peltier |
| 5,493,581 | A | 2/1996 | Young et al. |
| 5,493,721 | A | 2/1996 | Reis |
| 5,495,200 | A | 2/1996 | Kwan et al. |
| 5,495,202 | A | 2/1996 | Hsu |
| 5,495,500 | A | 2/1996 | Jovanovich et al. |
| 5,499,267 | A | 3/1996 | Ohe et al. |
| 5,500,758 | A | 3/1996 | Thompson et al. |
| 5,513,389 | A | 4/1996 | Reeser et al. |
| 5,515,014 | A | 5/1996 | Troutman |
| 5,517,688 | A | 5/1996 | Fajen et al. |
| 5,519,890 | A | 5/1996 | Pinckley |
| 5,523,719 | A | 6/1996 | Longo et al. |
| 5,523,726 | A | 6/1996 | Kroeger et al. |
| 5,523,760 | A | 6/1996 | McEwan |
| 5,535,402 | A | 7/1996 | Leibowitz et al. |
| 5,539,770 | A | 7/1996 | Ishigaki |
| 5,551,076 | A | 8/1996 | Bonn |
| 5,552,789 | A | 9/1996 | Schuermann |
| 5,555,453 | A | 9/1996 | Kajimoto et al. |
| 5,557,641 | A | 9/1996 | Weinberg |
| 5,557,642 | A | 9/1996 | Williams |
| 5,563,550 | A | 10/1996 | Toth |
| 5,564,097 | A | 10/1996 | Swanke |
| 5,574,755 | A | 11/1996 | Persico |
| 5,579,341 | A | 11/1996 | Smith et al. |
| 5,579,347 | A | 11/1996 | Lindquist et al. |
| 5,584,068 | A | 12/1996 | Mohindra |
| 5,589,793 | A | 12/1996 | Kassapian |
| 5,592,131 | A | 1/1997 | Labreche et al. |
| 5,600,680 | A | 2/1997 | Mishima et al. |
| 5,602,847 | A | 2/1997 | Pagano et al. |
| 5,602,868 | A | 2/1997 | Wilson |
| 5,604,592 | A | 2/1997 | Kotidis et al. |
| 5,604,732 | A | 2/1997 | Kim et al. |
| 5,606,731 | A | 2/1997 | Pace et al. |
| 5,608,531 | A | 3/1997 | Honda et al. |
| 5,610,946 | A | 3/1997 | Tanaka et al. |
| RE35,494 | E | 4/1997 | Nicollini |
| 5,617,451 | A | 4/1997 | Mimura et al. |
| 5,619,538 | A | 4/1997 | Sempel et al. |
| 5,621,455 | A | 4/1997 | Rogers et al. |
| 5,628,055 | A | 5/1997 | Stein |
| 5,630,227 | A | 5/1997 | Bella et al. |
| 5,633,610 | A | 5/1997 | Maekawa et al. |
| 5,633,815 | A | 5/1997 | Young |
| 5,634,207 | A | 5/1997 | Yamaji et al. |
| 5,636,140 | A | 6/1997 | Lee et al. |
| 5,638,396 | A | 6/1997 | Klimek |
| 5,640,415 | A | 6/1997 | Pandula |
| 5,640,424 | A | 6/1997 | Banavong et al. |
| 5,640,428 | A | 6/1997 | Abe et al. |
| 5,640,698 | A | 6/1997 | Shen et al. |
| 5,642,071 | A | 6/1997 | Sevenhans et al. |
| 5,648,985 | A | 7/1997 | Bjerede et al. |
| 5,650,785 | A | 7/1997 | Rodal |
| 5,661,424 | A | 8/1997 | Tang |
| 5,663,878 | A | 9/1997 | Walker |
| 5,663,986 | A | 9/1997 | Striffler |
| 5,668,836 | A | 9/1997 | Smith et al. |
| 5,675,392 | A | 10/1997 | Nayebi et al. |
| 5,678,220 | A | 10/1997 | Fournier |
| 5,678,226 | A | 10/1997 | Li et al. |
| 5,680,078 | A | 10/1997 | Ariie |
| 5,680,418 | A | 10/1997 | Croft et al. |
| 5,682,099 | A | 10/1997 | Thompson et al. |
| 5,689,413 | A | 11/1997 | Jaramillo et al. |
| 5,694,096 | A | 12/1997 | Ushiroku et al. |
| 5,697,074 | A | 12/1997 | Makikallio et al. |
| 5,699,006 | A | 12/1997 | Zele et al. |
| 5,703,584 | A | 12/1997 | Hill |
| 5,705,949 | A | 1/1998 | Alelyunas et al. |
| 5,705,955 | A | 1/1998 | Freeburg et al. |
| 5,710,992 | A | 1/1998 | Sawada et al. |
| 5,710,998 | A | 1/1998 | Opas |
| 5,714,910 | A | 2/1998 | Skoczen et al. |
| 5,715,281 | A | 2/1998 | Bly et al. |
| 5,721,514 | A | 2/1998 | Crockett et al. |
| 5,724,002 | A | 3/1998 | Hulick |
| 5,724,653 | A | 3/1998 | Baker et al. |
| 5,729,577 | A | 3/1998 | Chen |
| 5,729,829 | A | 3/1998 | Talwar et al. |
| 5,732,333 | A | 3/1998 | Cox et al. |
| 5,734,683 | A | 3/1998 | Hulkko et al. |
| 5,736,895 | A | 4/1998 | Yu et al. |
| 5,737,035 | A | 4/1998 | Rotzoll |
| 5,742,189 | A | 4/1998 | Yoshida et al. |
| 5,745,846 | A | 4/1998 | Myer et al. |
| 5,748,683 | A | 5/1998 | Smith et al. |
| 5,751,154 | A | 5/1998 | Tsugai |
| 5,757,858 | A | 5/1998 | Black et al. |
| 5,757,870 | A | 5/1998 | Miya et al. |
| RE35,829 | E | 6/1998 | Sanderford, Jr. |
| 5,760,629 | A | 6/1998 | Urabe et al. |
| 5,760,632 | A | 6/1998 | Kawakami et al. |
| 5,760,645 | A | 6/1998 | Comte et al. |
| 5,764,087 | A | 6/1998 | Clark |
| 5,767,726 | A | 6/1998 | Wang |
| 5,768,118 | A | 6/1998 | Faulk et al. |
| 5,768,323 | A | 6/1998 | Kroeger et al. |
| 5,770,985 | A | 6/1998 | Ushiroku et al. |
| 5,771,442 | A | 6/1998 | Wang et al. |
| 5,777,692 | A | 7/1998 | Ghosh |
| 5,777,771 | A | 7/1998 | Smith |
| 5,778,022 | A | 7/1998 | Walley |
| 5,784,689 | A | 7/1998 | Kobayashi |
| 5,786,844 | A | 7/1998 | Rogers et al. |
| 5,787,125 | A | 7/1998 | Mittel |
| 5,790,587 | A | 8/1998 | Smith et al. |
| 5,793,801 | A | 8/1998 | Fertner |
| 5,793,817 | A | 8/1998 | Wilson |
| 5,793,818 | A | 8/1998 | Claydon et al. |
| 5,801,654 | A | 9/1998 | Traylor |
| 5,802,463 | A | 9/1998 | Zuckerman |
| 5,805,460 | A | 9/1998 | Greene et al. |
| 5,809,060 | A | 9/1998 | Cafarella et al. |
| 5,812,546 | A | 9/1998 | Zhou et al. |
| 5,818,582 | A | 10/1998 | Fernandez et al. |

| | | | |
|---|---|---|---|
| 5,818,869 | A | 10/1998 | Miya et al. |
| 5,825,254 | A | 10/1998 | Lee |
| 5,825,257 | A | 10/1998 | Klymyshyn et al. |
| 5,834,979 | A | 11/1998 | Yatsuka |
| 5,834,985 | A | 11/1998 | Sundegård |
| 5,834,987 | A | 11/1998 | Dent |
| 5,841,324 | A | 11/1998 | Williams |
| 5,841,811 | A | 11/1998 | Song |
| 5,844,449 | A | 12/1998 | Abeno et al. |
| 5,844,868 | A | 12/1998 | Takahashi et al. |
| 5,847,594 | A | 12/1998 | Mizuno |
| 5,859,878 | A | 1/1999 | Phillips et al. |
| 5,864,754 | A | 1/1999 | Hotto |
| 5,870,670 | A | 2/1999 | Ripley et al. |
| 5,872,446 | A | 2/1999 | Cranford, Jr. et al. |
| 5,878,088 | A | 3/1999 | Knutson et al. |
| 5,881,375 | A | 3/1999 | Bonds |
| 5,883,548 | A | 3/1999 | Assard et al. |
| 5,887,001 | A | 3/1999 | Russell |
| 5,892,380 | A | 4/1999 | Quist |
| 5,894,239 | A | 4/1999 | Bonaccio et al. |
| 5,894,496 | A | 4/1999 | Jones |
| 5,896,304 | A | 4/1999 | Tiemann et al. |
| 5,896,562 | A | 4/1999 | Heinonen |
| 5,898,912 | A | 4/1999 | Heck et al. |
| 5,900,747 | A | 5/1999 | Brauns |
| 5,901,054 | A | 5/1999 | Leu et al. |
| 5,901,187 | A | 5/1999 | Iinuma |
| 5,901,344 | A | 5/1999 | Opas |
| 5,901,347 | A | 5/1999 | Chambers et al. |
| 5,901,348 | A | 5/1999 | Bang et al. |
| 5,901,349 | A | 5/1999 | Guegnaud et al. |
| 5,903,178 | A | 5/1999 | Miyatsuji et al. |
| 5,903,187 | A | 5/1999 | Claverie et al. |
| 5,903,196 | A | 5/1999 | Salvi et al. |
| 5,903,421 | A | 5/1999 | Furutani et al. |
| 5,903,553 | A | 5/1999 | Sakamoto et al. |
| 5,903,595 | A | 5/1999 | Suzuki |
| 5,903,609 | A | 5/1999 | Kool et al. |
| 5,903,827 | A | 5/1999 | Kennan et al. |
| 5,903,854 | A | 5/1999 | Abe et al. |
| 5,905,433 | A | 5/1999 | Wortham |
| 5,905,449 | A | 5/1999 | Tsubouchi et al. |
| 5,907,149 | A | 5/1999 | Marckini |
| 5,907,197 | A | 5/1999 | Faulk |
| 5,909,447 | A | 6/1999 | Cox et al. |
| 5,911,116 | A | 6/1999 | Nosswitz |
| 5,911,123 | A | 6/1999 | Shaffer et al. |
| 5,914,622 | A | 6/1999 | Inoue |
| 5,915,278 | A | 6/1999 | Mallick |
| 5,918,167 | A | 6/1999 | Tiller et al. |
| 5,920,199 | A | 7/1999 | Sauer |
| 5,926,065 | A | 7/1999 | Wakai et al. |
| 5,926,513 | A | 7/1999 | Suominen et al. |
| 5,933,467 | A | 8/1999 | Sehier et al. |
| 5,937,013 | A | 8/1999 | Lam et al. |
| 5,943,370 | A | 8/1999 | Smith |
| 5,945,660 | A | 8/1999 | Nakasuji et al. |
| 5,949,827 | A | 9/1999 | DeLuca et al. |
| 5,952,895 | A | 9/1999 | McCune, Jr. et al. |
| 5,953,642 | A | 9/1999 | Feldtkeller et al. |
| 5,955,992 | A | 9/1999 | Shattil |
| 5,959,850 | A | 9/1999 | Lim |
| 5,960,033 | A | 9/1999 | Shibano et al. |
| 5,970,053 | A | 10/1999 | Schick et al. |
| 5,982,315 | A | 11/1999 | Bazarjani et al. |
| 5,982,329 | A | 11/1999 | Pittman et al. |
| 5,986,600 | A | 11/1999 | McEwan |
| 5,994,689 | A | 11/1999 | Charrier |
| 5,995,030 | A | 11/1999 | Cabler |
| 5,999,561 | A | 12/1999 | Naden et al. |
| 6,005,506 | A | 12/1999 | Bazarjani et al. |
| 6,005,903 | A | 12/1999 | Mendelovicz |

| | | | |
|---|---|---|---|
| 6,011,435 | A | 1/2000 | Takeyabu et al. |
| 6,014,176 | A | 1/2000 | Nayebi et al. |
| 6,014,551 | A | 1/2000 | Pesola et al. |
| 6,018,262 | A | 1/2000 | Noro et al. |
| 6,018,553 | A | 1/2000 | Sanielevici et al. |
| 6,026,286 | A | 2/2000 | Long |
| 6,028,887 | A | 2/2000 | Harrison et al. |
| 6,031,217 | A | 2/2000 | Aswell et al. |
| 6,034,566 | A | 3/2000 | Ohe |
| 6,041,073 | A | 3/2000 | Davidovici et al. |
| 6,047,026 | A | 4/2000 | Chao et al. |
| 6,049,573 | A | 4/2000 | Song |
| 6,049,706 | A | 4/2000 | Cook et al. |
| 6,054,889 | A | 4/2000 | Kobayashi |
| 6,057,714 | A | 5/2000 | Andrys et al. |
| 6,061,551 | A | 5/2000 | Sorrells et al. |
| 6,061,555 | A | 5/2000 | Bultman et al. |
| 6,064,054 | A | 5/2000 | Waczynski et al. |
| 6,067,329 | A | 5/2000 | Kato et al. |
| 6,073,001 | A | 6/2000 | Sokoler |
| 6,076,015 | A | 6/2000 | Hartley et al. |
| 6,078,630 | A | 6/2000 | Prasanna |
| 6,081,691 | A | 6/2000 | Renard et al. |
| 6,084,465 | A | 7/2000 | Dasqupta |
| 6,084,922 | A | 7/2000 | Zhou et al. |
| 6,085,073 | A | 7/2000 | Palermo et al. |
| 6,091,289 | A | 7/2000 | Song et al. |
| 6,091,939 | A | 7/2000 | Banh |
| 6,091,940 | A | 7/2000 | Sorrells et al. |
| 6,091,941 | A | 7/2000 | Moriyama et al. |
| 6,094,084 | A | 7/2000 | Abou-Allam et al. |
| 6,098,046 | A | 8/2000 | Cooper et al. |
| 6,098,886 | A | 8/2000 | Swift et al. |
| 6,121,819 | A | 9/2000 | Traylor |
| 6,125,271 | A | 9/2000 | Rowland |
| 6,144,236 | A | 11/2000 | Vice et al. |
| 6,144,331 | A | 11/2000 | Jiang |
| 6,144,846 | A * | 11/2000 | Durec ........................ 455/323 |
| 6,147,340 | A | 11/2000 | Levy |
| 6,147,763 | A | 11/2000 | Steinlechner |
| 6,150,890 | A | 11/2000 | Damgaard et al. |
| 6,151,354 | A | 11/2000 | Abbey |
| 6,160,280 | A | 12/2000 | Bonn et al. |
| 6,169,733 | B1 | 1/2001 | Lee |
| 6,175,728 | B1 | 1/2001 | Mitama |
| 6,178,319 | B1 | 1/2001 | Kashima |
| 6,182,011 | B1 | 1/2001 | Ward |
| 6,204,789 | B1 | 3/2001 | Nagata |
| 6,208,636 | B1 | 3/2001 | Tawil et al. |
| RE37,138 | E | 4/2001 | Dent |
| 6,211,718 | B1 | 4/2001 | Souetinov |
| 6,212,369 | B1 | 4/2001 | Avasarala |
| 6,215,475 | B1 | 4/2001 | Meyerson et al. |
| 6,215,828 | B1 | 4/2001 | Signell et al. |
| 6,225,848 | B1 | 5/2001 | Tilley et al. |
| 6,230,000 | B1 | 5/2001 | Tayloe |
| 6,266,518 | B1 | 7/2001 | Sorrells et al. |
| 6,298,065 | B1 | 10/2001 | Dombkowski et al. |
| 6,307,894 | B2 | 10/2001 | Eidson et al. |
| 6,308,058 | B1 | 10/2001 | Souetinov et al. |
| 6,313,685 | B1 | 11/2001 | Rabii |
| 6,313,700 | B1 | 11/2001 | Nishijima et al. |
| 6,314,279 | B1 | 11/2001 | Mohindra |
| 6,317,589 | B1 | 11/2001 | Nash |
| 6,321,073 | B1 | 11/2001 | Luz et al. |
| 6,327,313 | B1 | 12/2001 | Traylor et al. |
| 6,330,244 | B1 | 12/2001 | Swartz et al. |
| 6,335,656 | B1 | 1/2002 | Goldfarb et al. |
| 6,353,735 | B1 | 3/2002 | Sorrells et al. |
| 6,363,262 | B1 | 3/2002 | McNicol |
| 6,366,622 | B1 | 4/2002 | Brown et al. |
| 6,370,371 | B1 | 4/2002 | Sorrells et al. |
| 6,385,439 | B1 | 5/2002 | Hellberg |

| | | | |
|---|---|---|---|
| 6,393,070 B1 | 5/2002 | Reber | |
| 6,400,963 B1 * | 6/2002 | Glockler et al. | 455/553.1 |
| 6,404,758 B1 | 6/2002 | Wang | |
| 6,404,823 B1 | 6/2002 | Grange et al. | |
| 6,421,534 B1 | 7/2002 | Cook et al. | |
| 6,437,639 B1 | 8/2002 | Nguyen et al. | |
| 6,438,366 B1 | 8/2002 | Lindfors et al. | |
| 6,441,659 B1 | 8/2002 | Demone | |
| 6,441,694 B1 | 8/2002 | Turcotte et al. | |
| 6,445,726 B1 | 9/2002 | Gharpurey | |
| 6,459,721 B1 | 10/2002 | Mochizuki et al. | |
| 6,509,777 B2 | 1/2003 | Razavi et al. | |
| 6,512,544 B1 | 1/2003 | Merrill et al. | |
| 6,512,785 B1 | 1/2003 | Zhou et al. | |
| 6,516,185 B1 | 2/2003 | MacNally | |
| 6,531,979 B1 | 3/2003 | Hynes | |
| 6,542,722 B1 | 4/2003 | Sorrells et al. | |
| 6,560,301 B1 | 5/2003 | Cook et al. | |
| 6,560,451 B1 | 5/2003 | Somayajula | |
| 6,567,483 B1 | 5/2003 | Dent et al. | |
| 6,580,902 B1 | 6/2003 | Sorrells et al. | |
| 6,591,310 B1 | 7/2003 | Johnson | |
| 6,600,795 B1 | 7/2003 | Ohta et al. | |
| 6,600,911 B1 | 7/2003 | Morishige et al. | |
| 6,608,647 B1 | 8/2003 | King | |
| 6,611,569 B1 * | 8/2003 | Schier et al. | 375/322 |
| 6,618,579 B1 | 9/2003 | Smith et al. | |
| 6,628,328 B1 | 9/2003 | Yokouchi et al. | |
| 6,633,194 B2 | 10/2003 | Arnborg et al. | |
| 6,634,555 B1 | 10/2003 | Sorrells et al. | |
| 6,639,939 B1 | 10/2003 | Naden et al. | |
| 6,647,250 B1 | 11/2003 | Bultman et al. | |
| 6,647,270 B1 | 11/2003 | Himmelstein | |
| 6,686,879 B2 | 2/2004 | Shattil | |
| 6,687,493 B1 | 2/2004 | Sorrells et al. | |
| 6,690,232 B2 | 2/2004 | Ueno et al. | |
| 6,694,128 B1 | 2/2004 | Sorrells et al. | |
| 6,697,603 B1 | 2/2004 | Lovinggood et al. | |
| 6,704,549 B1 | 3/2004 | Sorrells et al. | |
| 6,704,558 B1 | 3/2004 | Sorrells et al. | |
| 6,741,139 B2 | 5/2004 | Pleasant et al. | |
| 6,741,650 B1 | 5/2004 | Painchaud et al. | |
| 6,775,684 B1 | 8/2004 | Toyoyama et al. | |
| 6,798,351 B1 | 9/2004 | Sorrells et al. | |
| 6,801,253 B1 | 10/2004 | Yonemoto et al. | |
| 6,813,485 B2 | 11/2004 | Sorrells et al. | |
| 6,823,178 B2 | 11/2004 | Pleasant et al. | |
| 6,836,650 B2 * | 12/2004 | Sorrells et al. | 455/319 |
| 6,850,742 B2 | 2/2005 | Fayyaz | |
| 6,853,690 B1 * | 2/2005 | Sorrells et al. | 375/295 |
| 6,865,399 B2 | 3/2005 | Fujioka et al. | |
| 6,873,836 B1 * | 3/2005 | Sorrells et al. | 455/313 |
| 6,879,817 B1 | 4/2005 | Sorrells et al. | |
| 6,882,194 B2 | 4/2005 | Belot et al. | |
| 6,892,057 B2 | 5/2005 | Nilsson | |
| 6,892,062 B2 | 5/2005 | Lee et al. | |
| 6,909,739 B1 | 6/2005 | Eerola et al. | |
| 6,910,015 B2 | 6/2005 | Kawai | |
| 6,917,796 B2 | 7/2005 | Setty et al. | |
| 6,920,311 B2 | 7/2005 | Rofougaran et al. | |
| 6,959,178 B2 | 10/2005 | Macedo et al. | |
| 6,963,626 B1 | 11/2005 | Shaeffer et al. | |
| 6,963,734 B2 | 11/2005 | Sorrells et al. | |
| 6,973,476 B1 | 12/2005 | Naden et al. | |
| 6,975,848 B2 | 12/2005 | Rawlins et al. | |
| 6,999,747 B2 | 2/2006 | Su | |
| 7,006,805 B1 | 2/2006 | Sorrells et al. | |
| 7,010,286 B2 | 3/2006 | Sorrells et al. | |
| 7,010,559 B2 | 3/2006 | Rawlins et al. | |
| 7,016,663 B2 | 3/2006 | Sorrells et al. | |
| 7,027,786 B1 | 4/2006 | Smith et al. | |
| 7,039,372 B1 | 5/2006 | Sorrells et al. | |
| 7,050,058 B2 | 5/2006 | Liang et al. | |
| 7,054,296 B1 | 5/2006 | Sorrells et al. | |
| 7,065,162 B1 | 6/2006 | Sorrells et al. | |
| 7,072,390 B1 | 7/2006 | Sorrells et al. | |
| 7,072,427 B2 | 7/2006 | Rawlins et al. | |
| 7,076,011 B2 | 7/2006 | Cook et al. | |
| 7,082,171 B1 | 7/2006 | Johnson et al. | |
| 7,085,335 B2 | 8/2006 | Rawlins et al. | |
| 7,107,028 B2 | 9/2006 | Sorrells et al. | |
| 7,110,435 B1 | 9/2006 | Sorrells et al. | |
| 7,110,444 B1 | 9/2006 | Sorrells et al. | |
| 7,194,044 B2 * | 3/2007 | Birkett et al. | 375/324 |
| 7,194,246 B2 * | 3/2007 | Sorrells et al. | 455/319 |
| 7,212,581 B2 * | 5/2007 | Birkett et al. | 375/295 |
| 2001/0015673 A1 | 8/2001 | Yamashita et al. | |
| 2001/0036818 A1 | 11/2001 | Dobrovolny | |
| 2002/0037706 A1 | 3/2002 | Ichihara | |
| 2002/0080728 A1 | 6/2002 | Sugar et al. | |
| 2002/0132642 A1 | 9/2002 | Hines et al. | |
| 2002/0163921 A1 | 11/2002 | Ethridge et al. | |
| 2003/0045263 A1 | 3/2003 | Wakayama et al. | |
| 2003/0081781 A1 | 5/2003 | Jensen et al. | |
| 2003/0149579 A1 | 8/2003 | Begemann et al. | |
| 2004/0125879 A1 | 7/2004 | Jaussi et al. | |
| 2006/0039449 A1 | 2/2006 | Fontana et al. | |

FOREIGN PATENT DOCUMENTS

| | | |
|---|---|---|
| DE | 1936252 | 1/1971 |
| DE | 35 41 031 A1 | 5/1986 |
| DE | 42 37 692 C1 | 3/1994 |
| DE | 196 27 640 A1 | 1/1997 |
| DE | 692 21 098 T2 | 1/1998 |
| DE | 196 48 915 A1 | 6/1998 |
| DE | 197 35 798 C1 | 7/1998 |
| EP | 0 035 166 A1 | 9/1981 |
| EP | 0 087 336 A1 | 8/1983 |
| EP | 0 099 265 A1 | 1/1984 |
| EP | 0 087 336 B1 | 7/1986 |
| EP | 0 254 844 A2 | 2/1988 |
| EP | 0 276 130 A2 | 7/1988 |
| EP | 0 276 130 A3 | 7/1988 |
| EP | 0 193 899 B1 | 6/1990 |
| EP | 0 380 351 A2 | 8/1990 |
| EP | 0 380 351 A3 | 2/1991 |
| EP | 0 411 840 A2 | 2/1991 |
| EP | 0 423 718 A2 | 4/1991 |
| EP | 0 411 840 A3 | 7/1991 |
| EP | 0 486 095 A1 | 5/1992 |
| EP | 0 423 718 A3 | 8/1992 |
| EP | 0 512 748 A2 | 11/1992 |
| EP | 0 529 836 A1 | 3/1993 |
| EP | 0 548 542 A1 | 6/1993 |
| EP | 0 512 748 A3 | 7/1993 |
| EP | 0 560 228 A1 | 9/1993 |
| EP | 0 632 288 A2 | 1/1995 |
| EP | 0 632 577 A1 | 1/1995 |
| EP | 0 643 477 A2 | 3/1995 |
| EP | 0 643 477 A3 | 3/1995 |
| EP | 0 411 840 B1 | 10/1995 |
| EP | 0 696 854 A1 | 2/1996 |
| EP | 0 632 288 A3 | 7/1996 |
| EP | 0 732 803 A1 | 9/1996 |
| EP | 0 486 095 B1 | 2/1997 |
| EP | 0 782 275 A2 | 7/1997 |
| EP | 0 785 635 A1 | 7/1997 |
| EP | 0 789 449 A2 | 8/1997 |
| EP | 0 789 449 A3 | 8/1997 |
| EP | 0 795 955 A2 | 9/1997 |
| EP | 0 795 955 A3 | 9/1997 |
| EP | 0 795 978 A2 | 9/1997 |
| EP | 0 817 369 A2 | 1/1998 |
| EP | 0 817 369 A3 | 1/1998 |
| EP | 0 837 565 A1 | 4/1998 |

| | | | |
|---|---|---|---|
| EP | 0 862 274 A1 | 9/1998 |
| EP | 0 874 499 A2 | 10/1998 |
| EP | 0 512 748 B1 | 11/1998 |
| EP | 0 877 476 A1 | 11/1998 |
| EP | 0 977 351 A1 | 2/2000 |
| FR | 2 245 130 | 4/1975 |
| FR | 2 669 787 A1 | 5/1992 |
| FR | 2 743 231 A1 | 7/1997 |
| GB | 2 161 344 A | 1/1986 |
| GB | 2 215 945 A | 9/1989 |
| GB | 2 324 919 A | 11/1998 |
| JP | 47-2314 | 2/1972 |
| JP | 55-66057 | 5/1980 |
| JP | 56-114451 | 9/1981 |
| JP | 58-7903 | 1/1983 |
| JP | 58-133004 | 8/1983 |
| JP | 59-144249 | 8/1984 |
| JP | 60-58705 | 4/1985 |
| JP | 60-130203 | 7/1985 |
| JP | 61-30821 | 2/1986 |
| JP | 61-232706 | 10/1986 |
| JP | 62-12381 | 1/1987 |
| JP | 63-50042 | 3/1988 |
| JP | 63-65587 | 3/1988 |
| JP | 63-153691 | 6/1988 |
| JP | 2-39632 | 2/1990 |
| JP | 2-131629 | 5/1990 |
| JP | 2-276351 | 11/1990 |
| JP | 4-123614 | 4/1992 |
| JP | 4-127601 | 4/1992 |
| JP | 4-154227 | 5/1992 |
| JP | 5-175730 | 7/1993 |
| JP | 5-175734 | 7/1993 |
| JP | 5-327356 | 12/1993 |
| JP | 6-237276 | 8/1994 |
| JP | 6-284038 | 10/1994 |
| JP | 7-154344 | 6/1995 |
| JP | 7-307620 | 11/1995 |
| JP | 8-23359 | 1/1996 |
| JP | 8-32556 | 2/1996 |
| JP | 8-139524 | 5/1996 |
| JP | 9-36664 | 2/1997 |
| JP | 9-171399 | 6/1997 |
| JP | 10-41860 | 2/1998 |
| JP | 10-96778 | 4/1998 |
| JP | 10-173563 | 6/1998 |
| JP | 11-98205 | 4/1999 |
| WO | WO 80/01633 A1 | 8/1980 |
| WO | WO 91/18445 A1 | 11/1991 |
| WO | WO 94/05087 A1 | 3/1994 |
| WO | WO 95/01006 A1 | 1/1995 |
| WO | WO 96/02977 A1 | 2/1996 |
| WO | WO 96/08078 A1 | 3/1996 |
| WO | WO 96/39750 A1 | 12/1996 |
| WO | WO 97/08839 A2 | 3/1997 |
| WO | WO 97/08839 A3 | 3/1997 |
| WO | WO 97/38490 A1 | 10/1997 |
| WO | WO 98/00953 A1 | 1/1998 |
| WO | WO 98/24201 A1 | 6/1998 |
| WO | WO 98/40968 A2 | 9/1998 |
| WO | WO 98/40968 A3 | 9/1998 |
| WO | WO 98/53556 A2 | 11/1998 |
| WO | WO 99/23755 A1 | 5/1999 |
| WO | WO 00/31659 A1 | 6/2000 |

OTHER PUBLICATIONS

Hellwarth, G.A. and Jones, G.D, "Automatic Conditioning of Speech Signals," *IEEE Transactions on Audio and Electroacoustics*, vol. AU-16, No. 2, pp. 169-179 (Jun. 1968).

Gaudiosi, J., "Retailers will bundle Microsoft's Xbox with games and peripherals," *Video Store Magazine*, vol. 23, Issue 36, p. 8, 2 pages (Sep. 2-8, 2001).

English-language Translation of German Patent Publication No. DT 1936252, translation provided by Transperfect Translations, 12 pages (Jan. 28, 1971—Date of publication of application).

English-language Abstract of Japanese Patent Publication, No. JP 62-12381, data supplied by the espacenet, 1 page (Jan. 21, 1987—Date of publication of application).

English-language Abstract of Japanese Patent Publication No. JP 4-154227, data supplied by the espacenet, 1 page (May 27, 1992—Date of publication of application).

English-language Abstract of Japanese Patent Publication No. JP 6-284038, data supplied by the espacenet, 1 page (Oct. 7, 1994—Date of publication of application).

English-language Abstract of Japanese Patent Publication No. JP 10-96778, data supplied by the espacenet, 1 page (Apr. 14, 1998—Date of publication of application).

English-language Abstract of Japanese Patent Publication No. JP 11-98205, data supplied by the espacenet, 1 page (Apr. 9, 1999—Date of publication of application).

English-language Abstract of Japanese Patent Publication No. JP 61-232706, data supplied by the espacenet, 1 page (Oct. 17, 1986—Date of publication of application).

English-language Abstract of Japanese Patent Publication No. JP 9-171399, data supplied by the espacenet, 1 page (Jun. 30, 1997—Date of publication of application).

English-language Abstract of Japanese Patent Publication No. JP 10-41860, data supplied by the espacenet, 1 page (Feb. 13, 1998—Date of publication of application).

English-language Computer Translation of Japanese Patent Publication No. JP 10-173563, provided by the JPO, 10 pages (Jun. 26, 1998—Date of publication of application) and cited in U.S. Appl. No. 10/305,299, directed to related subject matter.

*What is I/Q Data?*, printed Sep. 16, 2006, from http://zone.ni.com, 8 pages (Copyright 2003).

Aghvami, H. et al., "Land Mobile Satellites Using the Highly Elliptic Orbits- The UK T-SAT Mobile Payload," *Fourth International Conference on Satellite Systems for Mobile Communications and Navigation*, IEE, pp. 147-153 (Oct. 17-19, 1988).

Akers, N.P. et al., "RF Sampling Gates: a Brief Review," *IEE Proceedings*, IEE, vol. 133, Part A, No. 1, pp. 45-49 (Jan. 1986).

Al-Ahmad, H.A.M. et al., "Doppler Frequency Correction for a Non-Geostationary Communications Satellite. Techniques for CERS and T-SAT," *Electronics Division Colloquium on Low Noise Oscillators and Synthesizers*, IEE, pp. 4/1-4/5 (Jan. 23, 1986).

Ali, I. et al., "Doppler Characterization for LEO Satellites," *IEEE Transactions on Communications*, IEEE, vol. 46, No. 3, pp. 309-313 (Mar. 1998).

Allan, D.W., "Statistics of Atomic Frequency Standards," *Proceedings Of The IEEE Special Issue on Frequency Stability*, IEEE, pp. 221-230 (Feb. 1966).

Allstot, D.J. et al., "MOS Switched Capacitor Ladder Filters," *IEEE Journal of Solid-State Circuits*, IEEE, vol. SC-13, No. 6, pp. 806-814 (Dec. 1978).

Allstot, D.J. and Black Jr. W.C., "Technological Design Considerations for Monolithic MOS Switched-Capacitor Filtering Systems," *Proceedings of the IEEE*, IEEE, vol. 71, No. 8, pp. 967-986 (Aug. 1983).

Alouini, M. et al., "Channel Characterization and Modeling for Ka-Band Very Small Aperture Terminals," *Proceedings Of the IEEE*, IEEE, vol. 85, No. 6, pp. 981-997 (Jun. 1997).

Andreyev, G.A. and Ogarev, S.A., "Phase Distortions of Keyed Millimeter-Wave Signals in the Case of Propagation in a Turbulent Atmosphere," *Telecommunications and Radio-Engineering*, Scripta Technica, vol. 43, No. 12, 87-90 (Dec. 1988).

Antonetti, A. et al., "Optoelectronic Sampling in the Picosecond Range," *Optics Communcations*, North-Holland Publishing Company, vol. 21, No. 2, pp. 211-214 (May 1977).

Austin, J. et al., "Doppler Correction of the Telecommunication Payload Oscillators in the UK T-SAT," *18th European Microwave Conference*, Microwave Exhibitions and Publishers Ltd., pp. 851-857 (Sep. 12-15, 1988).

Auston, D.H., "Picosecond optoelectronic switching and gating in silicon," *Applied Physics Letters*, American Institute of Physics, vol. 26, No. 3, pp. 101-103 (Feb. 1, 1975).

Baher, H., " Transfer Functions for Switched-Capacitor and Wave Digital Filters," *IEEE Transactions on Circuits and Systems*, IEEE Circuits and Systems Society, vol. CAS-33, No. 11, pp. 1138-1142 (Nov. 1986).
Baines, R., "The DSP Bottleneck," *IEEE Communications Magazine*, IEEE Communications Society, pp. 46-54 (May 1995).
Banjo, O.P. and Vilar, E., "Binary Error Probabilities on Earth-Space Links Subject to Scintillation Fading," *Electronics Letters*, IEE, vol. 21, No. 7, pp. 296-297 (Mar. 28, 1985).
Banjo, O.P. and Vilar, E., "The Dependence of Slant Path Amplitude Scintillations on Various Meteorological Parameters," *Fifth International Conference on Antennas and Propagation (ICAP 87) Part 2: Propagation*, IEE, pp. 277-280 (Mar. 30-Apr. 2, 1987).
Banjo, O.P. and Vilar, E. "Measurement and Modeling of Amplitude Scintillations on Low-Elevation Earth-Space Paths and Impact on Communication Systems," *IEEE Transactions on Communications*, IEEE Communications Society, vol. COM-34, No. 8, pp. 774-780 (Aug. 1986).
Banjo, O.P. et al., "Tropospheric Amplitude Spectra Due to Absorption and Scattering in Earth-Space Paths," *Fourth International Conference on Antennas and Propagation (ICAP 85)*, IEE, pp. 77-82 (Apr. 16-19, 1985).
Basili,P. et al., "Case Study of Intense Scintillation Events on the OTS Path," *IEEE Transactions on Antennas and Propagation*, IEEE, vol. 38, No. 1, pp. 107-113 (Jan. 1990).
Basili, P. et al., "Observation of High $C^2$ and Turbulent Path Length on OTS Space-Earth Link," *Electronics Letters*, IEE, vol. 24, No. 17, pp. 1114-1116 (Aug. 18, 1988).
Blakey, J.R. et al., "Measurement of Atmospheric Millimetre-Wave Phase Scintillations in an Absorption Region," *Electronics Letters*, IEE, vol. 21, No. 11, pp. 486-487 (May 23, 1985).
Burgueño, A. et al., "Influence of rain gauge integration time on the rain rate statistics used in microwave communications," *annales des tèlècommunications*, International Union of Radio Science, pp. 522-527 (Sep./Oct. 1988).
Burgueño, A. et al., "Long-Term Joint Statistical Analysis of Duration and Intensity of Rainfall Rate with Application to Microwave Communications," *Fifth International Conference on Antennas and Propagation (ICAP 87) Part 2: Propagation*, IEE, pp. 198-201 (Mar.-Apr. 2, 1987).
Burgueño. A. et al., "Long-Term Statistics of Precipitation Rate Return Periods in the Context of Microwave Communications," *Sixth International Conference on Antennas and Propagation (ICAP 89) Part 2: Propagation*, IEE, pp. 297-301 (Apr. 4-7, 1989).
Burgueño, A. et al., "Spectral Analysis of 49 Years of Rainfall Rate and Relation to Fade Dynamics," *IEEE Transactions on Communications*, IEEE Communications Society, vol. 38, No. 9, pp. 1359-1366 (Sep. 1990).
Catalan, C. and Vilar, E., "Approach for satellite slant path remote sensing," *Electroncis Letters*, IEE, vol. 34, No. 12, pp. 1238-1240 (Jun. 11, 1998).
Chan, P. et al., "A Highly Linear 1-GHz CMOS Downconversion Mixer," *European Solid State Circuits Conference*, IEEE Communication Society, pp. 210-213 (Sep. 22-24, 1993).
Dewey, R.J. and Collier, C.J., "Multi-Mode Radio Receiver," *Electronics Division Colloquium on Digitally Implemented Radios*, IEE, pp. 3/1-3/5 (Oct. 18, 1985).
DIALOG File 347 (JAPIO) English Language Patent Abstract for JP 2-276351, 1 page (Nov. 13, 1990—Date of publication of application).
DIALOG File 347 (JAPIO) English Language Patent Abstract for JP 2-131629, 1 page (May 21, 1990—Date of publication of application).
DIALOG File 347 (JAPIO) English Language Patent Abstract for JP 2-39632, 1 page (Feb. 8, 1990—Date of publication of application).
DIALOG File 348 (European Patents) English Language Patent Abstract for EP 0 785 635 A1, 3 pages (Dec. 26, 1996—Date of publication of application).
DIALOG File 348 (European Patents) English Language Patent Abstract for EP 35166 A1, 2 pages (Feb. 18, 1981—Date of publication of application).
"DSO takes sampling rate to 1 GHz," *Electronic Engineering*, Morgan Grampian Publishers, vol. 59, No. 723, pp. 77 and 79 (Mar. 1987).
Erdi, G. and Henneuse, P.R., "A Precision FET-Less Sample-and-Hold with High Charge-to-Droop Current Ratio," *IEEE Journal of Solid-State Circuits*, IEEE, vol. SC-13, No. 6, pp. 864-873 (Dec. 1978).
Faulkner, N.D. and Vilar, E., "Subharmonic Sampling for the Measurement of Short Term Stability of Microwave Oscillators," *IEEE Transactions on Instrumentation and Measurement*, IEEE, vol. IM-32, No. 1, pp. 208-213 (Mar. 1983).
Faulkner, N.D. et al., "Sub-Harmonic Sampling for the Accurate Measurement of Frequency Stability of Microwave Oscillators," *CPEM 82 Digest: Conference on Precision Electromagnetic Measurements*, IEEE, pp. M-10 and M-11 (1982).
Faulkner, N.D. and Vilar, E., "Time Domain Analysis of Frequency Stability Using Non-Zero Dead-Time Counter Techniques," *CPEM 84 Digest Conference on Precision Electromagnetic Measurements*, IEEE, pp. 81-82 (1984).
Filip, M. and Vitar, E., "Optimum Utilization of the Channel Capacity of a Satellite Link in the Presence of Amplitude Scintillations and Rain Attenuation," *IEEE Transactions on Communications*, IEEE Communications Society, vol. 38, No. 11, pp. 1958-1965 (Nov. 1990).
Fukahori, K., "A CMOS Narrow-Band Signaling Filter with Q Reduction," *IEEE Journal of Solid-State Circuits*, IEEE, vol. SC-19, No. 6, pp. 926-932 (Dec. 1984).
Fukuchi, H. and Otsu, Y., "Available time statistics of rain attenuation on earth-space path," *IEE Proceedings-H: Microwaves, Antennas and Propagation*, IEE, vol. 135, Pt. H, No. 6, pp. 387-390 (Dec. 1988).
Gibbins, C.J. and Chadha, R., "Millimetre-wave propagation through hydrocarbon flame," *IEE Proceedings*, IEE, vol. 134, Pt. H, No. 2, pp. 169-173 (Apr. 1987).
Gilchrist, B. et al., "Sampling hikes performance of frequency synthesizers," *Microwaves & RF*, Hayden Publishing, vol. 23, No. 1, pp. 93-94 and 110 (Jan. 1984).
Gossard, E.E., "Clear weather meteorological effects on propagation at frequencies above 1 GHz," *Radio Science*, American Geophysical Union, vol. 16, No. 5, pp. 589-608 (Sep.-Oct. 1981).
Gregorian, R. et al., "Switched-Capacitor Circuit Design," *Proceedings of the IEEE*, IEEE, vol. 71, No. 8, pp. 941-966 (Aug. 1983).
Groshong et al., "Undersampling Techniques Simplify Digital Radio," *Electronic Design*, Penton Publishing, pp. 67-68, 70, 73-75 and 78 (May 23, 1991).
Grove, W.M., "Sampling for Oscilloscopes and Other RF Systems: Dc through X-Band," *IEEE Transactions on Microwave Theory and Techniques*, IEEE, pp. 629-635 (Dec. 1966).
Haddon, J. et al., "Measurement of Microwave Scintillations on a Satellite Down-Link at X-Band," *Antennas and Propagation*, IEE, pp. 113-117 (1981).
Haddon, J. and Vilar, E., "Scattering Induced Microwave Scintillations from Clear Air and Rain on Earth Space Paths and the Influence of Antenna Aperture," *IEEE Transactions on Antennas and Propagation*, IEEE, vol. AP-34, No. 5, pp. 646-657 (May 1986).
Hafdallah, H. et al., "2-4 Ghz MESFET Sampler," *Electronics Letters*, IEE, vol. 24, No. 3, pp. 151-153 (Feb. 4, 1988).
Herben, M.H.A.J., "Amplitude and Phase Scintillation Measurements on 8-2 km Line-Of-Sight Path at 30 Ghz," *Electroncis Letters*, IEE, vol. 18, No. 7, pp. 287-289 (Apr. 1, 1982).
Hewitt, A. et al., "An 18 Ghz Wideband LOS Multipath Experiment," *International Conference on Measurements for Telecommunication Transmission Systems—MTTS 85*, IEE, pp. 112-116 (Nov. 27-28, 1985).
Hewitt, A. et al., "An Autoregressive Approach to the Identification of Multipath Ray Parameters from Field Measurements," *IEEE Transactions on Communications*, IEEE Communications Society, vol. 37, No. 11, pp. 1136-1143 (Nov. 1989).
Hewitt, A. and Vilar, E., "Selective fading on LOS Microwave Links: Classical and Spread-Spectrum Measurement Techniques," *IEEE Transactions on Communications*, IEEE Communications Society, vol. 36, No. 7, pp. 789-796 (Jul. 1988).

Hospitalier, E., "Instruments for Recording and Observing Rapidly Varying Phenomena," *Science Abstracts*, IEE, vol. VII, pp. 22-23 (1904).
Howard, I.M. and Swansson, N.S., "Demodulating High Frequency Resonance Signals for Bearing Fault Detection," *The Institution of Engineers Australia Vibration and Noise Conference*, Institution of Engineers, Australia, pp. 115-121 (Sep. 18-20, 1990).
Hu, X., *A Switched-Current Sample-and-Hold Amplifer for FM Demodulation*, Thesis for Master of Applied Science, Dept. of Electrical and Computer Engineering, University of Toronto, UMI Dissertation Services, pp. 1-64 (1995).
Hung, H-L. A. et al., "Characterization of Microwave Integrated Circuits Using An Optical Phase-Locking and Sampling System," *IEEE MTT-S Digest*, IEEE, pp. 507-510 (1991).
Hurst, P.J., "Shifting the Frequency Response of Switched-Capacitor Filters by Nonuniform Sampling," *IEEE Transactions on Circuits and Systems*, IEEE Circuits and Systems Society, vol. 38, No. 1, pp. 12-19 (Jan. 1991).
Itakura, T., "Effects of the sampling pulse width on the frequency characteristics of a sample-and-hold circuit," *IEE Proceedings Circuits, Devices and Systems*, IEE, vol. 141, No. 4, pp. 328-336 (Aug. 1994).
Janssen, J.M.L., "An Experimental 'Stroboscopic' Oscilloscope for Frequencies up to about 50 Mc/s: I. Fundamentals," *Philips Technical Review*, Philips Research Laboratories, vol. 12, No. 2, pp. 52-59 (Aug. 1950).
Janssen, J.M.L. and Michels, A.J., "An Experimental 'Stroboscopic' Oscilloscope for Frequencies up to about 50 Mc/s: II. Electrical Build-Up," *Philips Technical Review*, Philips Research Laboratories, vol. 12, No. 3, pp. 73-82 (Sep. 1950).
Jondral, V.F. et al., "Doppler Profiles for Communication Satellites," *Frequenz*, Herausberger, pp. 111-116 (May-Jun. 1996).
Kaleh, G.K., "A Frequency Diversity Spread Spectrum System for Communication in the Presence of In-band Interference," *1995 IEEE Globecom*, IEEE Communications Society, pp. 66-70 (1995).
Karasawa, Y. et al., "A New Prediction Method for Tropospheric Scintillation on Earth-Space Paths," *IEEE Transactions on Antennas and Propagation*, IEEE Antennas and Propagation Society, vol. 36, No. 11, pp. 1608-1614 (Nov. 1988).
Kirsten, J. and Fleming, J., "Undersampling reduces data-acquisition costs for select applications," *EDN*, Cahners Publishing, vol. 35, No. 13, pp. 217-222, 224, 226-228 (Jun. 21, 1990).
Lam, W.K. et al., "Measurement of the Phase Noise Characteristics of an Unlocked Communications Channel Identifier," *Proceedings Of the 1993 IEEE International Frequency Control Symposium*, IEEE, pp. 283-288 (Jun. 2-4, 1993).
Lam, W.K. et al., "Wideband sounding of 11.6 Ghz transhorizon channel," *Electronics Letters*, IEE, vol. 30, No. 9, pp. 738-739 (Apr. 28, 1994).
Larkin, K.G., "Efficient demodulator for bandpass sampled AM signals," *Electronics Letters*, IEE, vol. 32, No. 2, pp. 101-102 (Jan. 18, 1996).
Lau, W.H. et al., "Analysis of the Time Variant Structure of Microwave Line-of-sight Multipath Phenomena," *IEEE Global Telecommunications Conference & Exhibition*, IEEE, pp. 1707-1711 (Nov. 28-Dec. 1, 1988).
Lau, W.H. et al., "Improved Prony Algorithm to Identify Multipath Components," *Electronics Letters*, IEE, vol. 23, No. 20, pp. 1059-1060 (Sep. 24, 1987).
Lesage, P. and Audoin, C., "Effect of Dead-Time on the Estimation of the Two-Sample Variance," *IEEE Transactions on Instrumentation and Measurement*, IEEE Instrumentation and Measurement Society, vol. IM-28, No. 1, pp. 6-10 (Mar. 1979).
Liechti, C.A., "Performance of Dual-gate GaAs MESFET's as Gain-Controlled Low-Noise Amplifiers and High-Speed Modulators," *IEEE Transactions on Microwave Theory and Techniques*, IEEE Microwave Theory and Techniques Society, vol. MTT-23, No. 6, pp. 461-469 (Jun. 1975).
Linnenbrink, T.E. et al., "A One Gigasample Per Second Transient Recorder," *IEEE Transactions on Nuclear Science*, IEEE Nuclear and Plasma Sciences Society, vol. NS-26, No. 4, pp. 4443-4449 (Aug. 1979).
Liou, M.L., "A Tutorial on Computer-Aided Analysis of Switched-Capacitor Circuits," *Proceedings of the IEEE*, IEEE, vol. 71, No. 8, pp. 987-1005 (Aug. 1983).
Lo, P. et al., "Coherent Automatic Gain Control," *IEE Colloquium on Phase Locked Techniques*, IEE, p. 2/1-2/6 (Mar. 26, 1980).
Lo, P. et al., "Computation of Rain Induced Scintillations on Satellite Down-Links at Microwave Frequencies," *Third International Conference on Antennas and Propagation* (*ICAP 83*), pp. 127-131 (Apr. 12-15, 1983).
Lo, P.S.L.O. et al., "Observations of Amplitude Scintillations on a Low-Elevation Earth-Space Path," *Electronics Letters*, IEE, vol. 20, No. 7, pp. 307-308 (Mar. 29, 1984).
Madani, K. and Althison, C.S., "A 20 Ghz Microwave Sampler," *IEEE Transactions on Microwave Theory and Techniques*, IEEE Microwave Theory and Techniques Society, vol. 40, No. 10, pp. 1960-1963 (Oct. 1992).
Marsland, R.A. et al., "130 Ghz GaAs monolithic integrated circuit sampling head," *Appl. Phys. Lett*., American Institute of Physics, vol. 55, No. 6, pp. 592-594 (Aug. 7, 1989).
Martin, K. and Sedra, A.S., "Switched-Capacitor Building Blocks for Adaptive Systems," *IEEE Transactions on Circuits and Systems*, IEEE Circuits and Systems Society, vol. CAS-28, No. 6, pp. 576-584 (Jun. 1981).
Marzano, F.S. and d'Auria, G., "Model-based Prediction of Amplitude Scintillation variance due to Clear-Air Tropospheric Turbulence on Earth-Satellite Microwave Links," *IEEE Transactions on Antennas and Propagation*, IEEE Antennas and Propagation Society, vol. 46, No. 10, pp. 1506-1518 (Oct. 1998).
Matricciani, E., "Prediction of fade durations due to rain in satellite communication systems," *Radio Science*, American Geophysical Union, vol. 32, No. 3, pp. 935-941 (May-Jun. 1997).
McQueen, J.G., "The Monitoring of High-Speed Waveforms," *Electronic Engineering*, Morgan Brothers Limited, vol. XXIV, No. 296, pp. 436-441 (Oct. 1952).
Merkelo, J. and Hall, R.D., "Broad-Band Thin-Film Signal Sampler," *IEEE Journal of Solid-State Circuits*, IEEE, vol. SC-7, No. 1, pp. 50-54 (Feb. 1972).
Merlo, U. et al., "Amplitude Scintillation Cycles in a Sirio Satellite-Earth Link," *Electronics Letters*, IEE, vol. 21, No. 23, pp. 1094-1096 (Nov. 7, 1985).
Morris, D., "Radio-holographic reflector measurement of the 30-m millimeter radio telescope at 22 Ghz with a cosmic signal source," *Astronomy and Astrophysics*, Springer-Verlag, vol. 203, No. 2, pp. 399-406 (Sep. (II) 1988).
Moulsley, T.J. et al., "The efficient acquisition and processing of propagation statistics," *Journal of the Institution of Electronic and Radio Engineers*, IERE, vol. 55, No. 3, pp. 97-103 (Mar. 1985).
Ndzi, D. et al., "Wide-Band Statistical Characterization of an Over-the-Sea Experimental Transhorizon Link," *IEE Colloquium on Radio Communications at Microwave and Millimetre Wave Frequencies*, IEE, pp. 1/1-1/6 (Dec. 16, 1996).
Ndzi, d. et al., "Wideband Statistics of Signal Levels and Doppler Spread on an Over-The-Sea Transhorizon Link," *IEE Colloquium on Propagation Characteristics and Related System Techniques for Beyond Line-of-Sight Radio*, IEE, pp. 9/1-9/6 (Nov. 24, 1997).
"New zero IF chipset from Philips," *Electronic Engineering*, United News & Media, vol. 67, No. 825, p. 10 (Sep. 1995).
Ohara, H. et al., "First monolithic PCM filter cuts cost of telecomm systems," *Electronic Design*, Hayden Publishing Company, vol. 27, No. 8, pp. 130-135 (Apr. 12, 1979).
Oppenheim, A.V. et al., *Signals and Systems*, Prentice-Hall, pp. 527-531 and 561-562 (1983).
Ortgies, G., "Experimental Parameters Affecting Amplitude Scintillation Measurements on Satellite Links," *Electronics Letters*, IEE, vol. 21, No. 17, pp. 771-772 (Aug. 15, 1985).
Pärssinen et al., "A 2-GHz Subharmonic Sampler for Signal Downconversion," *IEEE Transactions on Microwave Theory and Techniques*, IEEE, vol. 45, No. 12, 7 pages (Dec. 1997).
Peeters, G. et al., "Evaluation of Statistical Models for Clear-Air Scintillation Prediction Using Olympus Satellite Measurements," *International Journal of Satellite Communications*, John Wiley and Sons, vol. 15, No. 2, pp. 73-88 (Mar.-Apr. 1997).

Perrey, A.G. and Schoenwetter, H.K., *NBS Technical Note 1121: A Schottky Diode Bridge Sampling Gate*, U.S. Dept. of Commerce, pp. 1-14 (May 1980).
Poulton, K. et al., "A 1-Ghz 6-bit ADC System," *IEEE Journal of Solid-State Circuits*, IEEE, vol. SC-22, No. 6, pp. 962-969 (Dec. 1987).
Press Release, "Parkervision, Inc. Announces Fiscal 1993 Results," Lippert/Heilshorn and Associates, 2 Pages (Apr. 6, 1994).
Press Release, "Parkervision, Inc. Announces the Appointment of Michael Baker to the New Position of National Sales Manager," Lippert/Heilshorn and Associates, 1 Page (Apr. 7, 1994).
Press Release, "Parkervision's Cameraman Well-Received By Distance Learning Market," Lippert/Heilshorn and Associates, 2 Pages (Apr. 8, 1994).
Press Release, "Parkervision, Inc. Announces First Quarter Financial Results," Lippert/Heilshorn and Associates, 2 Pages (Apr. 26, 1994).
Press Release, "Parkervision, Inc. Announces The Retirement of William H. Fletcher, Chief Financial Officer," Lippert/Heilshorn and Associates, 1 Page (May 11, 1994).
Press Release, "Parkervision, Inc. Announces New Cameraman System II™ At Infocomm Trade Show," Lippert/Heilshorn and Associates, 3 Pages (Jun. 9, 1994).
Press Release, "Parkervision, Inc. Announces Appointments to its National Sales Force," Lippert/Heilshorn and Associates, 2 Pages (Jun. 17, 1994).
Press Release, "Parkervision, Inc. Announces Second Quarter and Six Months Financial Results," Lippert/Heilshorn and Associates, 3 Pages (Aug. 9, 1994).
Press Release, "Parkervision, Inc. Announces Third Quarter and Nine Months Financial Results," Lippert/Heilshorn and Associates, 3 Pages (Oct. 28, 1994).
Press Release, "Parkervision, Inc. Announces First Significant Dealer Sale of Its *Cameraman*® System II," Lippert/Heilshorn and Associates, 2 Pages (Nov. 7, 1994).
Press Release, "Parkervision, Inc. Announces Fourth Quarter and Year End Results," Lippert/Heilshorn and Associates, 2 Pages (Mar. 1, 1995).
Press Release, "Parkervision, Inc. Announces Joint Product Developments With VTEL," Lippert/Heilshorn and Associates, 2 Pages (Mar. 21, 1995).
Press Release, "Parkervision, Inc. Announces First Quarter Financial Results," Lippert/Heilshorn and Associates, 3 Pages (Apr. 28, 1995).
Press Release, "Parkervision Wins Top 100 Product Districts' Choice Award," Parkervision Marketing and Manufacturing Headquarters, 1 Page (Jun. 29, 1995).
Press Release, "Parkervision National Sales Manager Next President of USDLA," Parkervision Marketing and Manufacturing Headquarters, 1 Page (Jul. 6, 1995).
Press Release, "Parkervision Granted New Patent," Parkervision Marketing and Manufacturing Headquarters, 1 Page (Jul. 21, 1995).
Press Release, "Parkervision, Inc. Announces Second Quarter and Six Months Financial Results," Parkervision Marketing and Manufacturing Headquarters, 2 Pages (Jul. 31, 1995).
Press Release, "Parkervision, Inc. Expands Its Cameraman System II Product Line," Parkervision Marketing and Manufacturing Headquarters, 2 Pages (Sep. 22, 1995).
Press Release, "Parkervision Announces New Camera Control Technology," Parkervision Marketing and Manufacturing Headquarters, 2 Pages (Oct. 25, 1995).
Press Release, "Parkervision, Inc. Announces Completion of VTEL/Parkervision Joint Product Line," Parkervision Marketing and Manufacturing Headquarters, 2 Pages (Oct. 30, 1995).
Press Release, "Parkervision, Inc. Announces Third Quarter and Nine Months Financial Results," Parkervision Marketing and Manufacturing Headquarters, 2 Pages (Oct. 30, 1995).
Press Release, "Parkervision's Cameraman Personal Locator Camera System Wins Telecon XV Award," Parkervision Marketing and Manufacturing Headquarters, 2 Pages (Nov. 1, 1995).
Press Release, "Parkervision, Inc. Announces Purchase Commitment From VTEL Corporation," Parkervision Marketing and Manufacturing Headquarters, 1 Page (Feb. 26, 1996).
Press Release, "ParkerVision, Inc. Announces Fourth Quarter and Year End Results," Parkervision Marketing and Manufacturing Headquarters, 2 Pages (Feb. 27, 1996).
Press Release, "ParkerVision, Inc. Expands its Product Line," Parkervision Marketing and Manufacturing Headquarters, 2 Pages (Mar. 7, 1996).
Press Release, "ParkerVision Files Patents for its Research of Wireless Technology," Parkervision Marketing and Manufacturing Headquarters, 1 Page (Mar. 28, 1996).
Press Release, "Parkervision, Inc. Announces First Significant Sale of its Cameraman® Three-Chip System," Parkervision Marketing and Manufacturing Headquarters, 2 Pages (Apr. 12, 1996).
Press Release, "Parkervision, Inc. Introduces New Product Line For Studio Production Market," Parkervision Marketing and Manufacturing Headquarters, 2 Pages (Apr. 15, 1996).
Press Release, "Parkervision, Inc. Announces Private Placement of 800,000 Shares," Parkervision Marketing and Manufacturing Headquarters, 1 Page (Apr. 15, 1996).
Press Release, "Parkervision, Inc. Announces First Quarter Financial Results," Parkervision Marketing and Manufacturing Headquarters, 3 Pages (Apr. 30, 1996).
Press Release, "ParkerVision's New Studio Product Wins Award," Parkervision Marketing and Manufacturing Headquarters, 2 Pages (Jun. 5, 1996).
Press Release, "Parkervision, Inc. Announces Second Quarter and Six Months Financial Results," Parkervision Marketing and Manufacturing Headquarters, 3 Pages (Aug. 1, 1996).
Press Release, "Parkervision, Inc. Announces Third Quarter and Nine Months Financial Results," Parkervision Marketing and Manufacturing Headquarters, 2 Pages (Oct. 29, 1996).
Press Release, "PictureTel and ParkerVision Sign Reseller Agreement," Parkervision Marketing and Manufacturing Headquarters, 2 Pages (Oct. 30, 1996).
Press Release, "CLI and ParkerVision Bring Enhanced Ease-of-Use to Videoconferencing," CLI/Parkervision, 2 Pages (Jan. 20, 1997).
Press Release, "Parkervision, Inc. Announces Fourth Quarter and Year End Results," Parkervision Marketing and Manufacturing Headquarters, 3 Pages (Feb. 27, 1997).
Press Release, "Parkervision, Inc. Announces First Quarter Financial Results," Parkervision Marketing and Manufacturing Headquarters, 3 Pages (Apr. 29, 1997).
Press Release, "NEC and Parkervision Make Distance Learning Closer," NEC America, 2 Pages (Jun. 18, 1997).
Press Release, "Parkervision Supplies JPL with Robotic Cameras, Cameraman Shot Director for Mars Mission," Parkervision Marketing and Manufacturing Headquarters, 2 pages (Jul. 8, 1997).
Press Release, "ParkerVision and IBM Join Forces to Create Wireless Computer Peripherals," Parkervision Marketing and Manufacturing Headquarters, 2 Pages (Jul. 23, 1997).
Press Release, "ParkerVision, Inc. Announces Second Quarter and Six Months Financial Results," Parkervision Marketing and Manufacturing Headquarters, 3 Pages (Jul. 31, 1997).
Press Release, "Parkervision, Inc. Announces Private Placement of 990,000 Shares," Parkervision Marketing and Manufacturing Headquarters, 2 Pages (Sep. 8, 1997).
Press Release, "Wal-Mart Chooses Parkervision for Broadcast Production," Parkervision Marketing and Manufacturing Headquarters, 2 Pages (Oct. 24, 1997).
Press Release, "Parkervision, Inc. Announces Third Quarter Financial Results," Parkervision Marketing and Manufacturing Headquarters, 3 Pages (Oct. 30, 1997).
Press Release, "ParkerVision Announces Breakthrough in Wireless Radio Frequency Technology" Parkervision Marketing and Manufacturing Headquarters, 3 Pages (Dec. 10, 1997).
Press Release, "ParkerVision, Inc. Announces the Appointment of Joseph F. Skovron to the Position of Vice President, Licensing—Wireless Technologies" Parkervision Marketing and Manufacturing Headquarters, 2 Pages (Jan. 9, 1998).
Press Release, "Parkervision Announces Existing Agreement with IBM Terminates- Company Continues with Strategic Focus Announced in Dec.," Parkervision Marketing and Manufacturing Headquarters, 2 Pages (Jan. 27, 1998).

Press Release, "Laboratory Tests Verify Parkervision Wireless Technology" Parkervision Marketing and Manufacturing Headquarters, 2 Pages (Mar. 3, 1998).
Press Release, "Parkervision, Inc. Announces Fourth Quarter and Year End Financial Results," Parkervision Marketing and Manufacturing Headquarters, 3 Pages (Mar. 5, 1998).
Press Release, "Parkervision Awarded Editors' Pick of Show for NAB 98," Parkervision Marketing and Manufacturing Headquarters, 2 Pages (Apr. 15, 1998).
Press Release, "Parkervision Announces First Quarter Financial Results," Parkervision Marketing and Manufacturing Headquarters, 3 Pages (May 4, 1998).
Press Release, "Parkervision 'DIRECT2DATA' Introduced in Response to Market Demand," Parkervision Marketing and Manufacturing Headquarters, 3 Pages (Jul. 9, 1998).
Press Release, "Parkervision Expands Senior Management Team," Parkervision Marketing and Manufacturing Headquarters, 2 Pages (Jul. 29, 1998).
Press Release, "Parkervision Announces Second Quarter and Six Months Financial Results," Parkervision Marketing and Manufacturing Headquarters, 4 Pages (Jul. 30, 1998).
Press Release, "Parkervision, Inc. Announces Third Quarter and Nine Months Financial Results," Parkervision Marketing and Manufacturing Headquarters, 3 Pages (Oct. 30, 1998).
Press Release, "Questar Infocomm, Inc. Invests $5 Million in Parkervision Common Stock," Parkervision Marketing and Manufacturing Headquarters, 3 Pages (Dec. 2, 1998).
Press Release, "Parkervision Adds Two New Directors," Parkervision Marketing and Manufacturing Headquarters, 2 Pages (Mar. 5, 1999).
Press Release, "Parkervision Announces Fourth Quarter and Year End Financial Results," Parkervision Marketing and Manufacturing Headquarters, 3 Pages (Mar. 5, 1999).
Press Release, "Joint Marketing Agreement Offers New Automated Production Solution," Parkervision Marketing and Manufacturing Headquarters, 2 Pages (Apr. 13, 1999).
"Project COST 205: Scintillations in Earth-satellite links," *Alta Frequenza: Scientific Review in Electronics*, AEI, vol. LIV, No. 3, pp. 209-211 (May-Jun. 1985).
Razavi, B., *RF Microelectronics*, Prentice-Hall, pp. 147-149 (1998).
Reeves, R.J.D., "The Recording and Collocation of Waveforms (Part 1)," *Electronic Engineering*, Morgan Brothers Limited, vol. 31, No. 373, pp. 130-137 (Mar. 1959).
Reeves, R.J.D., "The Recording and Collocation of Waveforms (Part 2)," *Electronic Engineering*, Morgan Brothers Limited, vol. 31, No. 374, pp. 204-212 (Apr. 1959).
Rein, H.M. and Zahn, M., "Subnanosecond-Pulse Generator with Variable Pulsewidth Using Avalanche Transistors," *Electronics Letters*, IEE, vol. 11, No. 1, pp. 21-23 (Jan. 9, 1975).
Riad, S.M. and Nahman, N.S., "Modeling of the Feed-through Wideband (DC to 12.4 Ghz) Sampling-Head," *IEEE MTT-S International Microwave Symposium Digest*, IEEE, pp. 267-269 (Jun. 27-29, 1978).
Rizzoli, V. et al., "Computer-Aided Noise Analysis of MESFET and HEMT Mixers," *IEEE Transactions on Microwave Theory and Techniques*, IEEE, vol. 37, No. 9, pp. 1401-1410 (Sep. 1989).
Rowe, H.E., *Signals and Noise in Communication Systems*, D. Van Nostrand Company, Inc., Princeton, New Jersey, including, for example, Chapter V, Pulse Modulation Systems (1965).
Rücker, F. and Dintelmann, F., "Effect of Antenna Size on OTS Signal Scintillations and The Seasonal Dependence," *Electronics Letters*, IEE, vol. 19, No. 24, pp. 1032-1034 (Nov. 24, 1983).
Russell, R. and Hoare, L., "Millimeter Wave Phase Locked Oscillators," *Military Microwaves '78 Conference Proceedings*, Microwave Exhibitions and Publishers, pp. 238-242 (Oct. 25-27, 1978).
Sabel, L.P., "A DSP Implementation of a Robust Flexible Receiver/Demultiplexer for Broadcast Data Satellite Communications," *The Institution of Engineers Australia Communications Conference*, Institution of Engineers, Australia, pp. 218-223 (Oct. 16-18, 1990).
Salous, S., "IF digital generation of FMCW waveforms for wideband channel characterization," *IEE Proceedings-I*, IEE, vol. 139, No. 3, pp. 281-288 (Jun. 1992).
"Sampling Loops Lock Sources to 23 Ghz," *Microwaves & RF*, Penton Publishing, p. 212 (Sep. 1990).
Sasikumar, M. et al., "Active Compensation in the Switched-Capacitor Biquad," *Proceedings of the IEEE*, IEEE, vol. 71, No. 8, pp. 1008-1009 (Aug. 1983).
Saul, P.H., "A GaAs MESFET Sample and Hold Switch," *Fifth European Solid State Circuits Conference-ESSCIRC 79*, IEE, pp. 5-7 (1979).
Shen, D.H. et al., "A 900-MHZ RF Front-End with Integrated Discrete-Time Filtering," *IEEE Journal of Solid-State Circuits*, IEEE Solid-State Circuits Council, vol. 31, No. 12, pp. 1945-1954 (Dec. 1996).
Shen, X.D. and Vilar, E., "Anomalous transhorizon propagation and meteorological processes of a multilink path," *Radio Science*, American Geophysical Union, vol. 30, No. 5, pp. 1467-1479 (Sep.-Oct. 1995).
Shen, X. and Tawfik, A.N., "Dynamic Behaviour of Radio Channels Due to Trans-Horizon Propagation Mechanisms," *Electronics Letters*, IEE, vol. 29, No. 17, pp. 1582-1583 (Aug. 19, 1993).
Shen, X. et al., "Modeling Enhanced Spherical Diffraction and Troposcattering on a Transhorizon Path with aid of the parabolic Equation and Ray Tracing Methods," *IEE Colloquium on Common modeling techniques for electromagnetic wave and acoustic wave propagation*, IEE, pp. 4/1-4/7 (Mar. 8, 1996).
Shen, X. and Vilar, E., "Path loss statistics and mechanisms of transhorizon propagation over a sea path," *Electronics Letters*, IEE, vol. 32, No. 3, pp. 259-261 (Feb. 1, 1996).
Shen, D. et al., "A 900 MHZ Integrated Discrete-Time Filtering RF Front-End," *IEEE International Solid State Circuits Conference*, IEEE, vol. 39, pp. 54-55 and 417 (Feb. 1996).
Spillard, C. et al., "X-Band Tropospheric Transhorizon Propagation Under Differing Meteorological Conditions," *Sixth International Conference on Antennas and Propagation (ICAP 89) Part 2: Propagation*, IEE, pp. 451-455 (Apr. 4-7, 1989).
Stafford, K.R. et al., "A Complete Monolithic Sample/Hold Amplifier," *IEEE Journal of Solid-State Circuits*, IEEE, vol. SC-9, No. 6, pp. 381-387 (Dec. 1974).
Staruk, W. Jr. et al., "Pushing HF Data Rates," *Defense Electronics*, EW Communications, vol. 17, No. 5, pp. 211, 213, 215, 217, 220 and 222 (May 1985).
Stephenson, A.G., "Digitizing multiple RF signals requires an optimum sampling rate," *Electronics*, McGraw-Hill, pp. 106-110 (Mar. 27, 1972).
Sugarman, R., "Sampling Oscilloscope for Statistically Varying Pulses," *The Review of Scientific Instrumemts*, American Institute of Physics, vol. 28, No. 11, pp. 933-938 (Nov. 1957).
Sylvain, M., "Experimental probing of multipath microwave channels," *Radio Science*, American Geophysical Union, vol. 24, No. 2, pp. 160-178 (Mar.-Apr. 1989).
Takano, T., "NOVEL GaAs Pet Phase Detector Operable To Ka Band," *IEEE MT-S Digest*, IEEE, pp. 381-383 (1984).
Tan, M.A., "Biquadratic Transconductance Switched-Capacitor Filters," *IEEE Transactions on Circuits and Systems- I: Fundamentals Theory and Applications*, IEEE Circuits and Systems Society, vol. 40, No. 4, pp. 272-275 (Apr. 1993).
Tanaka, K. et al., "Single Chip Multisystem AM Stereo Decoder IC," *IEEE Transactions on Consumer Electronics*, IEEE Consumer Electronics Society, vol. CE-32, No. 3, pp. 482-496 (Aug. 1986).
Tawfik, A.N., "Amplitude, Duration and Predictability of Long Hop Trans-Horizon X-band Signals Over the Sea," *Electronics Letters*, IEE, vol. 28, No. 6, pp. 571-572 (Mar. 12, 1992).
Tawfik, A.N. and Vilar, E., "Correlation of Transhorizon Signal Level Strength with Localized Surface Meteorological Parameters," *Eighth International Conference on Antennas and Propagation*, Electronics Division of the IEE, pp. 335-339 (Mar. 30-Apr. 2, 1993).
Tawfik, A.N. and Vilar, E., "Dynamic Structure of a Transhorizon Signal at X-band Over a Sea Path," *Sixth International Conference on Antennas and Propagation (ICAP 89) Part 2: Propagation*, IEE, pp. 446-450 (Apr. 4-7, 1989).
Tawfik, A.N. and Vilar, E., "Statistics of Duration and Intensity of Path Loss in a Microwave Transhorizon Sea-Path," *Electronics Letters*, IEE, vol. 26, No. 7, pp. 474-476 (Mar. 29, 1990).

Tawfik, A.N. and Vilar, E., "X-Band Transhorizon Measurements of CW Transmissions Over the Sea- Part 1: Path Loss, Duration of Events, and Their Modeling," *IEEE Transactions on Antennas and Propagation*, IEEE Antennas and Propagation Society, vol. 41, No. 11, pp. 1491-1500 (Nov. 1993).
Ternes, G.C. and Tsividis, T., "The Special Section on Switched-Capacitor Circuits," *Proceedings of the IEEE*, IEEE, vol. 71, No. 8, pp. 915-916 (Aug. 1983).
Thomas, G.B., *Calculus and Analytic Geometry*, Third Edition, Addison-Wesley Publishing, pp. 119-133 (1960).
Tomassetti, Q., "An Unusual Microwaved Mixer," *16th European Microwave Conference*, Microwave Exhibitions and Publishers, pp. 754-759 (Sep. 8-12, 1986).
Tortoli, P. et al., "Bidirectional Doppler Signal Analysis Based on a Single RF Sampling Channel," *IEEE Transactions on Ultrasonics, Ferroelectrics, and Frequency Control*, IEEE Ultrasonics, Ferroelectrics, and Frequency Control Society, vol. 41, No. 1, pp. 1-3 (Jan. 1984).
Tsividis, Y. and Antognetti, P. (Ed.), *Design of MOS VLSI Circuits for Telecommunications*, Prentice-Hall, p. 304 (1985).
Tsividis, Y., "Principles of Operation and Analysis of Switched-Capacitor Circuits," *Proceedings of the IEEE*, IEEE, vol. 71, No. 8, pp. 926-940 (Aug. 1983).
Tsurumi, H. and Maeda, T., "Design Study on a Direct Conversion Receiver Front-End for 280 MHZ, 900 MHZ, and 2.6 Ghz Band Radio Communication Systems," *41st IEEE Vehicular Technology Conference*, IEEE Vehicular Technology Society, pp. 457-462 (May 19-22, 1991).
Valdmanis, J.A. et al., "Picosecond and Subpicosend Optoelectronics for Measurements of Future High Speed Electronic Devices," *IEDM Technical Digest*, IEEE, pp. 597-600 (Dec. 5-7, 1983).
van de Kamp, M.M.J.L., "Asymmetric signal level distribution due to tropospheric scintillation," *Electronics Letters*, IEE, vol. 34, No. 11, pp. 1145-1146 (May 28, 1998).
Vasseur, H. and Vanhoenacker, D., "Characterization of tropospheric turbulent layers from radiosonde data," *Electronics Letters*, IEE, vol. 34, No. 4, pp. 318-319 (Feb. 19, 1998).
Verdone, R., "Outage Probability Analysis for Short-Range Communication Systems at 60 Ghz in ATT Urban Environments," *IEEE Transactions on Vehicular Technology*, IEEE Vehicular Technology Society, vol. 46, No. 4, pp. 1027-1039 (Nov. 1997).
Vierira-Ribeiro, S.A., *Single-IF DECT Receiver Architecture using a Quadrature Sub-Sampling Band-Pass Sigma-Delta Modulator*, Thesis for Degree of Master's of Engineering, Carleton University, UMI Dissertation Services, pp. 1-180 (Apr. 1995).
Vilar, E. et al., "A Comprehensive/Selective MM-Wave Satellite Downlink Experiment on Fade Dynamics," *Tenth International Conference on Antennas and Propagation*, Electronics Division of the IEE, pp. 2.98-2.101 (Apr. 14-17, 1997).
Vilar, E. et al., "A System to Measure LOS Atmospheric Transmittance at 19 Ghz," *AGARD Conference Proceedings No. 346: Characteristics of the Lower Atmosphere Influencing Radio Wave Propagation*, AGARD, pp. 8-1-8-16 (Oct. 4-7, 1983).
Vilar, E. and Smith, H., "A Theoretical and Experimental Study of Angular Scintillation in Earth Space Paths," *IEEE Transactions on Antennas and Propagation*, IEEE, vol. AP-34, No. 1, pp. 2-10 (Jan. 1986).
Vilar, E. et al., "A Wide Band Transhorizon Experiment at 11.6 Ghz," *Eighth International Conference on Antennas and Propagation*, Electronics Division of the IEE, pp. 441-445 (Mar. 30-Apr. 2, 1993).
Vilar, E. and Matthews, P.A., "Amplitude Dependence of Frequency in Oscillators," *Electronics Letters*, IEE, vol. 8, No. 20, pp. 509-511 (Oct. 5, 1972).
Vilar, E. et al., "An experimental mm-wave receiver system for measuring phase noise due to atmospheric turbulence," *Proceedings of the 25th European Microwave Conference*, Nexus House, pp. 114-119 (1995).
Vilar, E. and Burgueño, A., "Analysis and Modeling of Time Interval Between Rain Rate Exceedances in the Context of Fade Dynamics," *IEEE Transactions on Communications*, IEEE Communications Society, vol. 39, No. 9, pp. 1306-1312 (Sep. 1991).
Vilar, E. et al., "Angle of Arrival Fluctuations in High and Low Elevation Earth Space Paths," *Fourth International Conference on Antennas and Propagation* (*ICAP 85*), Electronics Division of the IEE, pp. 83-88 (Apr. 16-19, 1985).
Vilar, E., "Antennas and Propagation: A Telecommunications Systems Subject," *Electronics Division Colloquium on Teaching Antennas and Propagation to Undergraduates*, IEE, pp. 7/1-7/6 (Mar. 8, 1988).
Vilar, E. et al., "CERS*. Millimetre-Wave Beacon Package and Related Payload Doppler Correction Strategies," *Electronics Division Colloquium on CERS- Communications Engineering Research Satellite*, IEE, pp. 10/1-10/10 (Apr. 10, 1984).
Vilar, E. and Moulsley, T.J., "Comment and Reply: Probability Density Function of Amplitude Scintillations," *Electronics Letters*, IEE, vol. 21, No. 14, pp. 620-622 (Jul. 4, 1985).
Vilar, E. et al., "Comparison of Rainfall Rate Duration Distributions for ILE-IFE and Barcelona," *Electronics Letters*, IEE, vol. 28, No. 20, pp. 1922-1924 (Sep. 24, 1992).
Vilar, E., "Depolarization and Field Transmittance in Indoor Communications," *Electronics Letters*, IEE, vol. 27, No. 9, pp. 732-733 (Apr. 25, 1991).
Vilar, E. and Larsen, J.R., "Elevation Dependence of Amplitude Scintillations on Low Elevation Earth Space Paths," *Sixth International Conference on Antennas and Propagation* (*ICAP 89*) *Part 2: Propagation*, IEE, pp. 150-154 (Apr. 4-7, 1989).
Vilar, E. et al., "Experimental System and Measurements of Transhorizon Signal Levels at 11 Ghz," *18th European Microwave Conference*, Microwave Exhibitions and Publishers Ltd., pp. 429-435 (Sep. 12-15, 1988).
Vilar, E. and Matthews, P.A., "Importance of Amplitude Scintillations in Millimetric Radio Links," *Proceedings of the 4th European Microwave Conference*, Microwave Exhibitions and Publishers, pp. 202-206 (Sep. 10-13, 1974).
Vilar, E. adn Haddon, J., "Measurement and Modeling of Scintillation Intensity to Estimate Turbulence Parameters in an Earth-Space Path," *IEEE Transactions on Antennas and Propagation*, IEEE Antennas and Propagation Society, vol. AP-32, No. 4, pp. 340-346 (Apr. 1984).
Vilar, E. and Matthews, P.A., "Measurement of Phase Fluctuations on Millimetric Radiowave Propagation," *Electronics Letters*, IEE, vol. 7, No. 18, pp. 566-568 (Sep. 9, 1971).
Vilar, E. and Wan, K.W., "Narrow and Wide Band Estimates of Field Strength for Indoor Communications in the Millimetre Band," *Electronics Division Colloquium on Radiocommunications in the Range 30-60 Ghz*, IEE, pp. 5/1-5/8 (Jan. 17, 1991).
Vilar, E. and Faulkner, N.D., "Phase Noise and Frequency Stability Measurements, Numerical Techniques and Limitations," *Electronics Division Colloquium on Low Noise Oscillators and Synthesizer*, IEE, 5 pages (Jan. 23, 1986).
Vilar, E. and Senin, S., "Propagation phase noise identified using 40 Ghz satellite downlink," *Electronics Letters*, IEE, vol. 33, No. 22, pp. 1901-1902 (Oct. 23, 1997).
Vilar, E. et al., "Scattering and Extinction: Dependence Upon Raindrop Size Distribution in Temperate (Barcelona) and Tropical (Belem) Regions," *Tenth International Conference on Antennas and Propagation*, Electronics Division of the IEE, pp. 2.230-2.233 (Apr. 14-17, 1997).
Vilar, E. and Haddon, J., "Scintillation Modeling and Measurement—A Tool for Remote-Sensing Slant Paths," *AGARD Conference Proceedings No. 332: Propagation Aspects of Frequency Sharing, Interference And System Diversity*, AGARD, pp. 27-1-27-13 (Oct. 8-22, 1982).
Vilar, E., "Some Limitations on Digital Transmission Through Turbulent Atmosphere," *International Conference on Satellite Communication Systems Technology*, Electronics Division of the IEE, pp. 169-187 (Apr. 7-10, 1975).
Vilar, E. and Matthews, P.A., "Summary of Scintillation Observations in a 36 Ghz Link Across London," *International Conference on Antennas and Propagation Part 2: Propagation*, IEE, pp. 36-40 (Nov. 28-30, 1978).

Vilar, E. et al., "Wideband Characterization of Scattering Channels," *Tenth International Conference on Antennas and Propagation*, Electronics Division of the IEE, pp. 2.353-2.358 (Apr. 14-17, 1997).
Vollmer, A., "Complete GPS Receiver Fits on Two Chips," *Electronic Design*, Penton Publishing, pp. 50, 52, 54 and 56 (Jul. 6, 1998).
*Voltage and Time Resolution in Digitizing Oscilloscopes: Applications Note 348*, Hewlett Packard, pp. 1-11 (Nov. 1986).
Wan, K.W. et al., "A Novel Approach to the Simultaneous Measurement of Phase and Amplitude Noises in Oscillator," *Proceedings of the 19th European Microwave Conference*, Microwave Exhibitions and Publishers Ltd., pp. 809-813 (Sep. 4-7, 1989).
Wan, K.W. et al., "Extended Variances and Autoregressive/Moving Average Algorithm for the Measurement and Synthesis of Oscillator Phase Noise," *Proceedings Of the 43rd Annual Symposium on Frequency Control*, IEEE, pp. 331-335 (1989).
Wan, K.W. et al., "Wideband Transhorizon Channel Sounder at 11 Ghz," *Electronics Division Colloquium on High Bit Rate UHF/SHF Channel Sounders—Technology and Measuremetn*, IEE, pp. 3/1-3/5 (Dec. 3, 1993).
Wang, H., "A 1-V Multigigahertz RF Mixer Core in 0.5—μm CMOS," *IEEE Journal of Solid-State Circuits*, IEEE Solid-State Circuits Society, vol. 33, No. 12, pp. 2265-2267 (Dec. 1998).
Watson, A.W.D. et al., "Digital Conversion and Signal Processing for High Performance Communications Receivers," *Digital Processing of Signals in Communications*, Institution of Electronic and Radio Engineers, pp. 367-373 (Apr. 22-26, 1985).
Weast, R.C. et al. (Ed.), *Handbook of Mathematical Tables*, Second Edition, The Chemical Rubber Co., pp. 480-485 (1964).
Wiley, R.G., "Approximate FM Demodulation Using Zero Crossings," *IEEE Transactions on Communications*, IEEE, vol. COM-29, No. 7, pp. 1061-1065 (Jul. 1981).
Worthman, W., "Convergence . . . Again," *RF Design*, Primedia, p. 102 (Mar. 1999).
Young, I.A. and Hodges, D.A., "MOS Switched-Capacitor Analog Sampled-Data Direct-Form Recursive Filters," *IEEE Journal of Solid-State Circuits*, IEEE, vol. SC-14, No. 6, pp. 1020-1033 (Dec. 1979).
Translation of Specification and Claims of FR Patent No. 2245130, 3 pages (Apr. 18, 1975- Date of publication of application).
Fest, Jean-Pierre, "Le Convertisseur A/N Revolutionne Le Recepteur Radio," *Electronique*, JMJ (Publisher), No. 54, pp. 40-42 (Dec. 1995).
Translation of DE Patent No. 35 41 031 A1, 22 pages (May 22, 1986- Date of publication of application).
Translation of EP Patent No. 0 732 803 A1, 9 pages (Sep. 18, 1996- Date of publication of application).
Fest, Jean-Pierre, "The A/D Converter Revolutionizes the Radio Receiver," *Electronique*, JMJ (Publisher), No. 54, 3 pages (Dec. 1995). (Translation of Doc. AQ50).
Translation of German Patent No. DE 197 35 798 C1, 8 pages (Jul. 16, 1998- Date of publication of application).
Miki, S. and Nagahama, R., *Modulation System II*, Common Edition 7, Kyoritsu Publishing Co., Ltd., pp. 146-154 (Apr. 30, 1956).
Miki, S. and Nagahama, R., *Modulation System II*, Common Edition 7, Kyoritsu Publishing Co., Ltd., pp. 146-149 (Apr. 30, 1956), (Partial Translation of Doc. AQ51).
Rabiner, L.R. and Gold, B., *Theory And Application Of Digital Signal Processing*, Prentice-Hall, Inc., pp. v-xii and 40-46 (1975).
English-language Abstract of Japanese Patent Publication No. 08-032556, from http://www1.ipdl.jpo.go.jp, 2 Pages (Feb. 2, 1996—Date of publication of application).
English-language Abstract of Japanese Patent Publication No. 08-139524, from http://www1.ipdl.jpo.go.jp, 2 Pages (Mar. 31, 1996—Date of publication of application).
English-language Abstract of Japanese Patent Publication No. 59-144249, from http://www1.ipdl.jpo.go.jp, 2 Pages (Aug. 18, 1984—Date of publication of application).
English-language Abstract of Japanese Patent Publication No. 63-054002, from http://www1.ipdl.jpo.go.jp, 2 Pages (Mar. 8, 1988—Date of publication of application).
English-language Abstract of Japanese Patent Publication No. 06-237276, from http://www1.ipdl.jpo.go.jp, 2 Pages (Aug. 23, 1994—Date of publication of application).
English-language Abstract of Japanese Patent Publication No. 08-023359, from http://www1.ipdl.jpo.go.jp, 2 Pages (Jan. 23, 1996—Date of publication of application).
Translation of Japanese Patent Publication No. 47-2314, 7 pages (Feb. 4, 1972- Date of publication of application).
Partial Translation of Japanese Patent Publication No. 58-7903, 3 pages (Jan. 17, 1983- Date of publication of application).
English-language Abstract of Japanese Patent Publication No. 58-133004, from http://www1.ipdl.jpo.go.jp, 2 Pages (Aug. 8, 1993—Date of publication of application).
English-language Abstract of Japanese Patent Publication No. 60-058705, from http://www1.ipdl.jpo.go.jp, 2 Pages (Apr. 4, 1985—Date of publication of application).
English-language Abstract of Japanese Patent Publication No. 04-123614, from http://www1.ipdl.jpo.go.jp, 2 Pages (Apr. 23, 1992—Date of publication of application).
English-language Abstract of Japanese Patent Publication No. 04-127601, from http://www1.ipdl.jpo.go.jp, 2 Pages (Apr. 28, 1992—Date of publication of application).
English-language Abstract of Japanese Patent Publication No. 05-175730, from http://www1.ipdl.jpo.go.jp, 2 Pages (Jul. 13, 1993—Date of publication of application).
English-language Abstract of Japanese Patent Publication No. 05-175734, from http://www1.ipdl.jpo.go.jp, 2 Pages (Jul. 13, 1993—Date of publication of application).
English-language Abstract of Japanese Patent Publication No. 07-154344, from http://www1.ipdl.jpo.go.jp, 2 Pages (Jun. 16, 1995—Date of publication of application).
English-language Abstract of Japanese Patent Publication No. 07-307620, from http://www1.ipdl.jpo.go.jp, 2 Pages (Nov. 21, 1995—Date of publication of application).
Oppenheim, A.V. and Schafer, R.W., *Digital Signal Processing*, Prentice-Hall, pp. vii-x, 6-35, 45-78, 87-121 and 136-165 (1975).
English-language Abstract of Japanese Patent Publication No. 55-066057, from http://www1.ipdl.jpo.go.jp, 2 Pages (May 19, 1980—Date of publication of application).
English-language Abstract of Japanese Patent Publication No. 63-065587, from http://www1.ipdl.jpo.go.jp, 2 Pages (Mar. 24, 1988—Date of publication of application).
English-language Abstract of Japanese Patent Publication No. 63-153691, from http://www1.ipdl.jpo.go.jp, 2 Pages (Jun. 27, 1988—Date of publication of application).
Translation ofJapanese Patent Publication No. 60-130203, 3 pages (Jul. 11, 1985—Date of publication of application).
Razavi, B., "A 900-MHz/1.8-Ghz CMOS Transmitter for Dual-Band Applications," *Symposium on VLSI Circuits Digest of Technical Papers*, IEEE, pp. 128-131 (1998).
Ritter, G.M., "SDA, A New Solution for Transceivers," *16th European Microwave Conference*, Microwave Exhibitions and Publishers, pp. 729-733 (Sep. 8, 1986).
DIALOG File 351 (Derwent WPI) English Language Patent Abstract for FR 2 669 787, 1 page (May 29, 1992- Date of publication of application).
Akos, D.M. et al., "Direct Bandpass Sampling of Multiple Distinct RF Signals," *IEEE Transactions on Communications*, IEEE, vol. 47, No. 7, pp. 938-988 (Jul. 1999).
Patel, M. et al., "Bandpass Sampling for Software Radio Receivers, and the Effect of Oversampling on Aperture Jitter," *VTC 2002*, IEEE, pp. 1901-1905 (2002).
English-language Abstract of Japanese Patent Publication No. 61-030821, from http://www1.ipdl.jpo.go.jp, 2 Pages (Feb. 13, 1986—Date of publication of application).
English-language Abstract of Japanese Patent Publication No. 05-327356, from http://www1.ipdl.jpo.go.jp, 2 Pages (Dec. 10, 1993—Date of publication of application).
Tayloe, D., "A Low-noise, High-performance Zero IF Quadrature Detector/Preamplifier," *RF Design*, Primedia Business Magazines & Media, Inc., pp. 58, 60, 62 and 69 (Mar. 2003).

Dines, J.A.B., "Smart Pixel Optoelectronic Receiver Based on a Charge Sensitive Amplifier Design," *IEEE Journal of Selected Topics in Quantum Electronics*, IEEE, vol. 2, No. 1, pp. 117-120 (Apr. 1996).

Simoni, A. et al., "A Digital Camera for Machine Vision," *20th International Conference on Industrial Electronics*, Control and Instrumentation, IEEE, pp. 879-883 (Sep. 1994).

Stewart, R.W. and Pfann, E., "Oversampling and sigma-delta strategies for data conversion," *Electronics & Communication Engineering Journal*, IEEE, pp. 37-47 (Feb. 1998).

Rudell, J.C. et al., "A 1.9-Ghz Wide-Band IF Double Conversion CMOS Receiver for Cordless Telephone Applications," *IEEE Journal of Solid-State Circuits*, IEEE, vol. 32, No. 12, pp. 2071-2088 (Dec. 1997).

English-language Abstract of Japanese Patent Publication No. 09-036664, from http://www1.ipdl.jpo.go.jp, 2 Pages (Feb. 7, 1997—Date of publication of application).

Simoni, A. et al., "A Single-Chip Optical Sensor with Analog Memory for Motion Detection," *IEEE Journal of Solid-State Circtuits*, IEEE, vol. 30, No. 7, pp. 800-806 (Jul. 1995).

Deboo, Gordon J., *Integrated Circuits and Semiconductor Devices*, 2nd Edition, McGraw-Hill, Inc., pp. 41-45 (1977).

Sorrells et al., U.S. Appl. No. 09/550,644, filed Apr. 14, 2000, entitled "Method and System for Down-converting an Electromagnetic Signal, Transforms For Same, and Aperture Relationships".

Sorrells et al., U.S. Appl. No. 09/550,642, filed Apr. 14, 2000, entitled "Method an System for Down-converting and Electromagnetic Signal, and Transforms for Same".

* cited by examiner

*Primary Examiner*—Sonny Trinh
(74) *Attorney, Agent, or Firm*—Sterne, Kessler, Goldstein & Fox PLLC

(57) ABSTRACT

Methods, systems, and apparatuses, and combinations and sub-combinations thereof, for down-converting and up-converting an electromagnetic (EM) signal are described herein. Briefly stated, in embodiments the invention operates by receiving an EM signal and recursively operating on approximate half cycles (½, 1½, 2½, etc.) of the carrier signal. The recursive operations can be performed at a sub-harmonic rate of the carrier signal. The invention accumulates the results of the recursive operations and uses the accumulated results to form a down-converted signal. In an embodiment, the EM signal is down-converted to an intermediate frequency (IF) signal. In another embodiment, the EM signal is down-converted to a baseband information signal. In another embodiment, the EM signal is a frequency modulated (FM) signal, which is down-converted to a non-FM signal, such as a phase modulated (PM) signal or an amplitude modulated (AM) signal. Up-conversion is accomplished by controlling a switch with an oscillating signal, the frequency of the oscillating signal being selected as a sub-harmonic of the desired output frequency.

25 Claims, 139 Drawing Sheets

- SUBSTANTIAL EQUIVALENCE IN LOGIC ONLY IS NECESSARY
- U7 SHOWN FOR POLARITY CONSISTENCY WITH CKT EXAMPLES DESCRIBED ELSEWHERE

A. RISING EDGE PULSE GENERATOR

B. FALLING-EDGE PULSE GENERATOR

IMPEDANCE MATCHED ALIASING MODULE

ALIASING MODULE

INFORMATION SIGNAL 1302

OSCILLATING SIGNAL 1304

FREQUENCY MODULATED INPUT SIGNAL 1306

HARMONICALLY RICH SIGNAL (SHOWN AS SQUARE WAVE) 1308

SEE FIG. 13E

CARRIER PROCESSED BY 3RD HARMONIC UFT PROCESSOR

MAG FREQUENCY RESPONSE OF SAMPLING APERTURE WAVEFORM

APERTURE FREQUENCY DOMAIN REPRESENTATION

UFT OUTPUT CHARGE TRANSFER

FIG. 49F

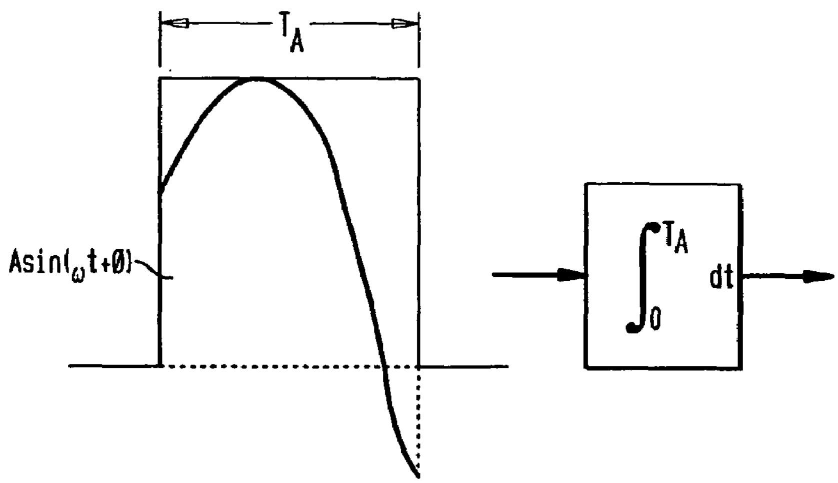

$$\int_0^{T_A} Au(t-T_A)\sin(\omega t+\emptyset)\,dt=\int_0^{T_A} A(u(t-T_A)\cos\emptyset\sin(\omega t)+u(t-T_A)\sin\emptyset\cos(\omega t))\,dt$$

$$=\underbrace{A\cos(\emptyset)}_{\text{CONSTANT}}\underbrace{\int_0^{T_A} u(t-T_A)\sin(\omega t)\,dt}_{\text{UFT CORRELATOR KERNEL}}+\underbrace{A\sin(\emptyset)}_{\text{CONSTANT}}\underbrace{\int_0^{T_A} u(t-T_A)\cos(\omega t)\,dt}_{=0}$$

$$=A\cos(\emptyset)\int_0^{T_A} u(t-T_A)\sin(\omega t)\,dt$$

- A IS CONSTANT ON A SINE TO SINE BASIS
- Ø IS CONSTANT ON A SINE TO SINE BASIS
- i.e., THE MODULATION RATE DUE TO INFORMATION FOR PHASE AND AMPLITUDE IS VERY SLOW COMPARED TO CARRIER FREQUENCY $$C_I(t) = \sum_{m=-\infty}^{\infty} \delta(t-mT_S) * p_C(t) = \sum_{m=-\infty}^{\infty} p(t-mT_S)$$ 6002

$$C_I(t) = \sum_{m=-\infty}^{\infty} (u(t)-u(t-T_A)) * \delta(t-mT_S)$$ 6004

$$C_Q(t) = \sum_{m=-\infty}^{\infty} (u[t-T_A/2]-u[t-3T_A/2]) * \delta(t-(mT_S+T_A/2))$$ 6006

IQDEMOD SHOWING TIME RELATIONSHIP OF TX_I DATA

IQDEMOD SHOWING TIME RELATIONSHIP OF TX_Q DATA

FURTHER OPTIMIZED MULTIPLE APERTURE REALIZATION

WIRELESS TRADE-OFF DESIGN CONCERNS

FIG. 89

NOISE FIGURE CALCULATIONS BASED ON RMS
VOLTAGE AND CURRENT NOISE SPECIFICATIONS

ENTER, THE VOLTAGE NOISE DENSITY, $e_n$, AND THE CURRENT NOISE DENSITY, $i_n$, FOR THE AMPLIFIER CHOSEN:

$e_n := 6 \cdot 10^{-9}$ V/sqrt(Hz)
$i_n := 1 \cdot 10^{-12}$ A/sqrt(Hz)

ENTER THE SOURCE RESISTANCE DRIVING THE AMPLIFIER:

$K : 1.38 \cdot 10^{-23}$ J/K  $T := 290K$ $$\text{PARALELL}(x,y) := \frac{x \cdot y}{x + y} \qquad NF(R_S) := 20 \cdot \log\left(\sqrt{\frac{e_n^2 + 4 \cdot K \cdot T \cdot R_S + i_n^2 \cdot R_S^2}{4 \cdot K \cdot T \cdot R_S}}\right)$$

IF WE PLOT NOISE FIGURE VERSUS SOURCE RESISTANCE WE CAN GET AN IDEA OF WHAT IS THE OPTIMUM SOURCE RESISTANCE.
IT IS NOT NECESSARILY THE LOWEST RESISTANCE!

$R_S := 100, 200 \ldots 100 \cdot 10^3$

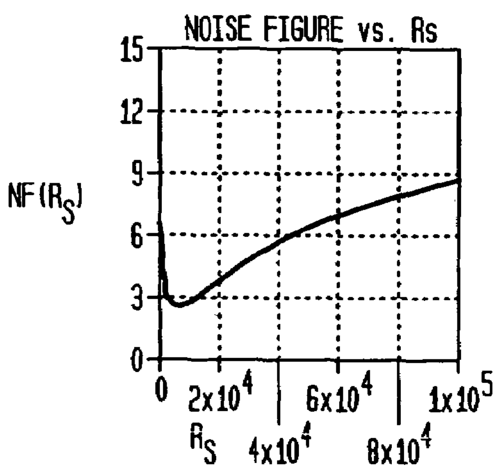

IC CONCEPTUAL SCHEMATIC

BASIC ARCHITECTURE

FIG. 94

DC EQUATIONS $$Vin = V \cdot \frac{Rout}{Rin + Rout}$$

$$Vc = Vin - (Vin - Vinit) \cdot \exp\left(\frac{-tc}{Rin \cdot C}\right)$$

$$Vd = Vc \cdot \exp\left(\frac{-td}{Rout \cdot C}\right)$$

DEFINITIONS:
- Rin - INPUT RESISTANCE
- Rout - OUTPUT RESISTANCE
- C - CAPACITOR
- tc - CHARGE TIME OR APERATURE
- td - DISCHARGE TIME OR LO PERIOD-tc
- V - INPUT VOLTAGE
- Vinit - INITIAL CAPACITOR VOLTAGE
- Vc - FINAL CHARGE CAPACITOR VOLTAGE
- Vd - FINAL DISCHARGE CAPACITOR VOLTAGE

FIG. 95

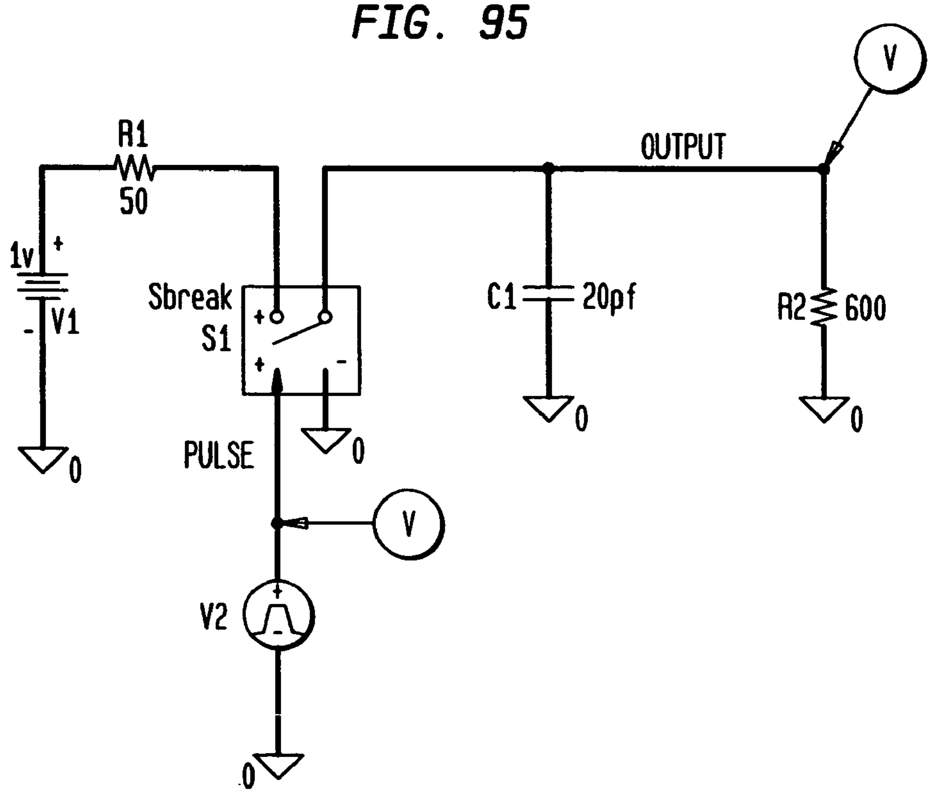

*FIG. 100*

CHARGE TRANSFER

DEFINITIONS:

q=CHARGE IN COULOMBS
C=CAPACITANCE IN FARADS
V=VOLTAGE IN VOLTS
A=INPUT SIGNAL AMPLITUDE $$q=C\cdot V$$
$$V=A\cdot \sin(t)$$
$$q(t)=C\cdot A\cdot \sin(t)$$
$$\Delta q(t)=C\cdot A\cdot \sin(t)-C\cdot A\cdot \sin(t-T)$$
$$\Delta q(t)=C\cdot A\cdot (\sin(t)-\sin(t-T)) \qquad \text{EQUATION A}$$

$\Delta q(t)$ EXPRESSES THE CHANGE IN CHARGE ACROSS CAPACITOR C DURING APERTURE T. AS CAN BE SEEN, WHEN APERTURE T TENDS TOWARDS 0, $\Delta q(t)$ TENDS TOWARDS 0.

FIG. 101

USING THE SUM TO PRODUCT TRIGONOMETRIC IDENTITY, $$\sin(\alpha)-\sin(\beta)=2\cdot\sin\left(\frac{\alpha-\beta}{2}\right)\cdot\cos\left(\frac{\alpha+\beta}{2}\right) \qquad \text{IDENTITY 1}$$

EQUATION 1 CAN BE RE-WRITTEN AS:

$$\Delta q(t)=2\cdot C\cdot A\cdot \sin\left[\frac{t-(t-T)}{2}\right]\cdot\cos\left[\frac{t+(t-T)}{2}\right]$$

$$\Delta q(t)=2\cdot C\cdot A\cdot \sin\left(\frac{1}{2}\cdot T\right)\cdot\cos\left(t-\frac{1}{2}\cdot T\right) \qquad \text{EQUATION B}$$

THE sin TERM IN EQUATION B IS A FUNCTION OF APERTURE T ONLY. IT IS EASILY SEEN THAT $\Delta q(t)$ WILL OBTAIN A MAXIMUM VALUE WHEN T IS EQUAL TO ANN ODD MULTIPLE OF $\pi$; i.e., $\pi$, $3\pi$, $5\pi$... THEREFORE, CAPACITOR C EXPERIENCES THE GREATEST CHANGE IN CHARGE WHEN THE APERTURE HAS A VALUE OF $\pi$ OR A TIME INTERVAL REPRESENTATIVE OF 180 DEGREES OF THE INPUT SINUSOID. CONVERSELY, WHEN T IS EQUAL TO $2\pi$, $4\pi$, $6\pi$....MINIMAL CHARGE IS TRANSFERRED.

SOLVING FOR q(t) BY INTEGRATING EQUATION A ALLOWS THE CHARGE ON C WITH RESPECT TO TIME TO BE GRAPHED ON THE SAME AXIS AS THE INPUT SINUSOID sin(t).

$$q(t)=\int C\cdot A\cdot(\sin(t)-\sin(t-T))\,dt$$

$$q(t)=-\cos(t)\cdot C\cdot A+\cos(t-T)\cdot C\cdot A$$

$$q(t)=C\cdot A\cdot(\cos(t-T)-\cos(t))\qquad \text{EQUATION C}$$

GRAPH 1

DIFFERENTIAL CONFIGURATION

UFD CLOCK SPREADING

B.B. RECOVERED I/Q WAVEFORMS WITH SLIGHTLY OFFSET CLOCK (CARRIER)

CMOS IMPLEMENTATION BLOCK DIAGRAM

LO GAIN BLOCK AT GATE LEVEL

LO GAIN BLOCK AT TRANSISTOR LEVEL

PULSE GENERATOR#1 AT GATE LEVEL

PULSE GENERATOR#1 AT TRANSISTOR LEVEL

POWER GAIN BLOCK AT GATE LEVEL

POWER GAIN BLOCK AT TRANSISTOR LEVEL

SWITCH AT TRANSISTOR LEVEL

CMOS "HOT CLOCK" BLOCK DIAGRAM

POSITIVE PULSE GENERATOR AT GATE LEVEL

POSITIVE PULSER AT TRANSISTOR LEVEL

PULSE WIDTH ERROR EFFECT FOR 1/2 CYCLE

SINGLE-ENDED UFD MODULE

SINGLE-ENDED UFD MODULE

FULL DIFFERENTIAL

FULL DIFFERENTIAL

SINGLE-ENDED, NEAR IDEAL SIMULATION

FIG. 139

| PARAMETER | 802.11 REQUIREMENT OR INDUSTRY PRACTICE | UFT MODULE BASED RX PERFORMANCE |
|---|---|---|
| OPERATING BAND | 2.4-2.5 GHz | 2.4-2.5 GHz |
| CHANNELS | 2.402 TO 2.495 IN 1 MHz STEPS<br>2.412 TO 2.484 GHz IN 5 MHz STEPS | 2.402 TO 2.495 IN 1 MHz STEPS<br>2.412 TO 2.484 GHz IN 5 MHz STEPS |
| MODULATION | BPSK, QPSK, (BARKER, CCK) | BPSK, QPSK |
| TX SPECTRAL MASK | FIRST SIDELOBE REJECT<-30, +15dBm<br>SECOND SIDELOBE REJECT<-50, +15dBm | -35 dBr, -55dBr |
| EYE OPENING | Verr<.35<br>FOR 1000 COMPLEX SAMPLES | <.3 |
| OPERATIONAL DYNAMIC RANGE | 76 dB (DERIVED) | 83 dB |
| MAX. INPUT, @, 8% PER | -4 dBm | -4 dBm |
| SENSITIVITY | -80 dBm @ <8% PER | -87 dBm @ <5% PER |
| ACQUISITION | 802.11 DSS AND FH | 802.11 DSS AND FH |
| IMAGE REJECTION | >80 dB | >80 dB |
| LO RERADIATION | < -50 dBm | < -50 dBm |
| ADJACENT CHANNEL REJECTION | > 35 dB @ 30 MHz OFFSET<br>PER <8% | > 35 dB @ 30 MHz OFFSET<br>PER <5% |
| POWER | 3.3,5V 1.5W (RX MODE) | 3.3,5V,700mW |

MULTIPLE APERTURE RECEIVER IMPLEMENTATION

RECEIVER TIMING OSCILLATOR OUTPUT

WAVEFORM GENERATOR OUTPUT

RF SWITCH/INTEGRATOR OUTPUT

OPTIONAL AMPLIFIER/FILTER OUTPUT

RECTIFIER/FILTER OUTPUT
VARIABLE THRESHOLD GENERATOR OUTPUT

INFORMATION OUTPUT (WAVEFORM GENERATOR OUTPUT)

(WAVEFORM GENERATOR OUTPUT)

(WAVEFORM GENERATOR OUTPUT)

(WAVEFORM GENERATOR OUTPUT)

RF DIFFERENTIAL RECEIVER

PSEUDO DIFFERENTIAL RECEIVER (WAVEFORM GENERATOR OUTPUT)

(WAVEFORM GENERATOR OUTPUT)

METHOD AND SYSTEM FOR DOWN-CONVERTING AND UP-CONVERTING AN ELECTROMAGNETIC SIGNAL, AND TRANSFORMS FOR SAME

CROSS-REFERENCE TO RELATED APPLICATIONS

This application is a continuation of U.S. application Ser. No. 09/838,387, filed Apr. 20, 2001 (now U.S. Pat. No. 6,813,485), which is a continuation-in-part of U.S. application Ser. No. 09/550,644, filed Apr. 14, 2000, which is a continuation-in-part of U.S. application Ser. No. 09/521,879, filed Mar. 9, 2000 (now abandoned), which is a continuation-in-part of U.S. application Ser. No. 09/293,342, filed Apr. 16, 1999 (now U.S. Pat. No. 6,687,493), which is a continuation-in-part of U.S. application Ser. No. 09/176,022, filed Oct. 21, 1998 (now U.S. Pat. No. 6,061,551 issued May 9, 2000), all of which except for U.S. application Ser. No. 09/838,387 are herein incorporated by reference in their entireties, and U.S. application Ser. No. 09/838,387, filed Apr. 20, 2001 claims the benefit of U.S. Provisional Application No. 60/199,141, filed Apr. 24, 2000.

The following patents and patent applications of common assignee are related to the present application, and are herein incorporated by reference in their entireties:

U.S. Pat. No. 6,091,940, entitled "Method and System for Frequency Up-Conversion," filed Oct. 21, 1998 and issued Jul. 18, 2000.

U.S. Pat. No. 6,049,706, entitled "Integrated Frequency Translation And Selectivity," filed Oct. 21, 1998 and issued Apr. 11, 2000.

U.S. Non-Provisional application Ser. No. 09/525,615, entitled "Method, System, and Apparatus for Balanced Frequency Up-Conversion of a Baseband Signal," filed Mar. 14, 2000.

STATEMENT REGARDING FEDERALLY-SPONSORED RESEARCH AND DEVELOPMENT

Not applicable.

BACKGROUND OF THE INVENTION

1. Field of the Invention

The present invention relates generally to the down-conversion and up-conversion of an electromagnetic signal using a universal frequency translation module.

2. Related Art

Various communication components exist for performing frequency down-conversion, frequency up-conversion, and filtering. Also, schemes exist for signal reception in the face of potential jamming signals.

BRIEF DESCRIPTION OF THE DRAWINGS/FIGURES

The invention shall be described with reference to the accompanying figures, wherein.

Figure 7A:
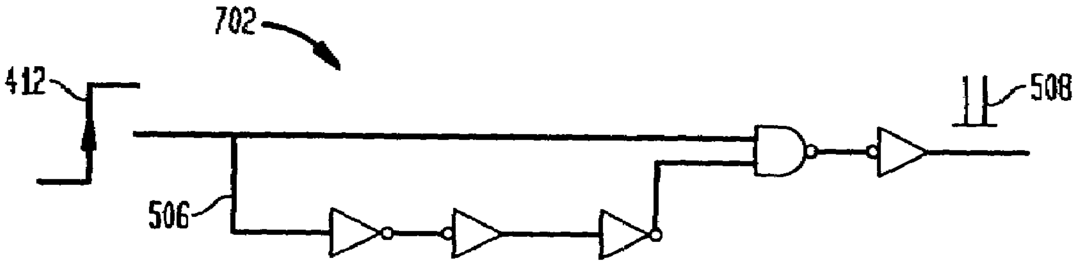
Figure 7B:
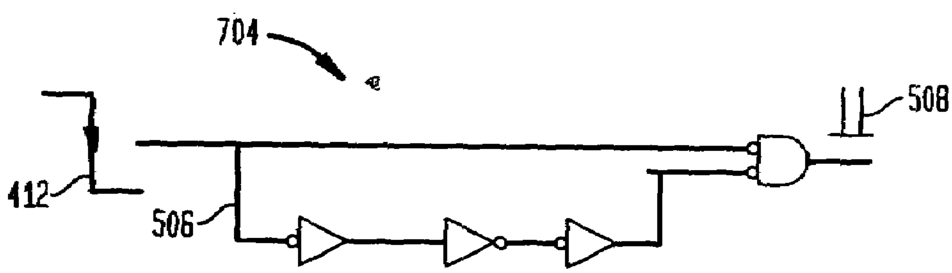

FIGS. 7A-B illustrate example aperture generators.

Figure 8:
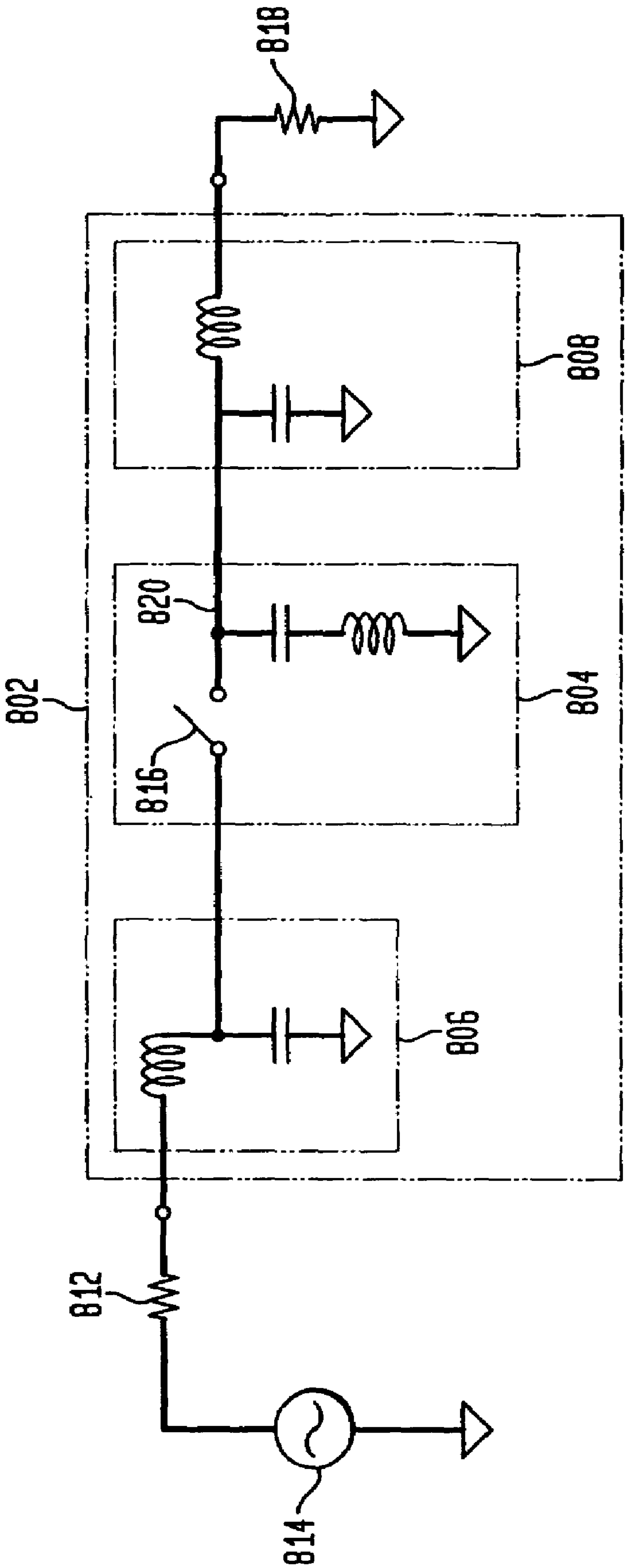

FIG. 8 illustrates an aliasing module with input and output impedance match according to an embodiment of the invention.

Figure 9:
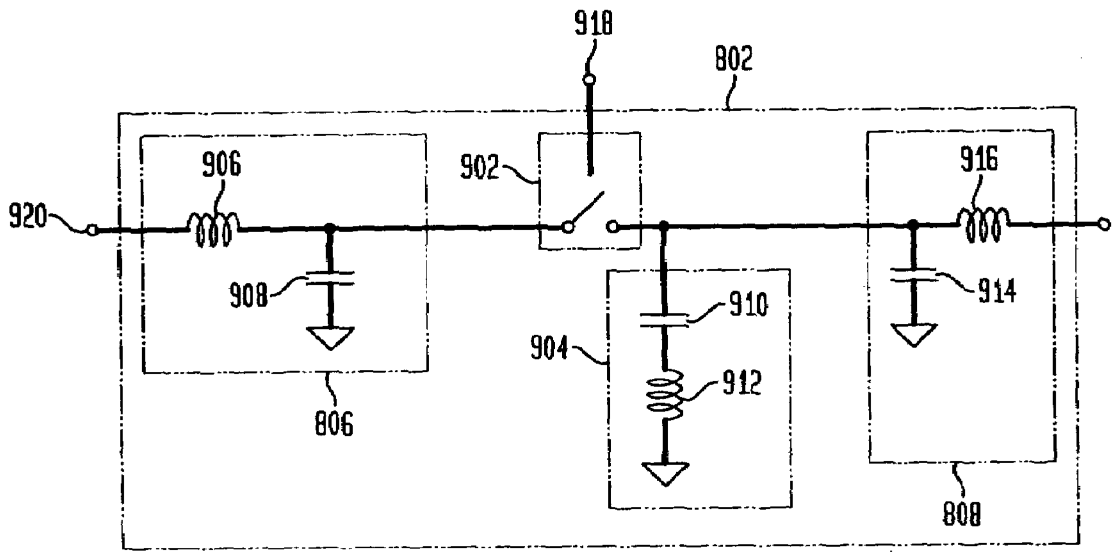

FIG. 9 illustrates an example energy transfer module with a switch module and a reactive storage module according to an embodiment of the invention.

Figure 10:
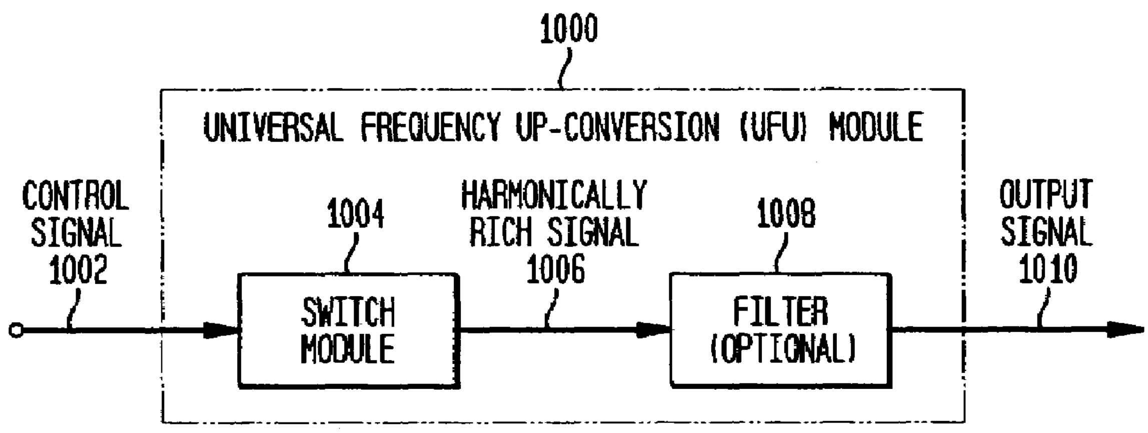

FIG. 10 is a block diagram of a universal frequency up-conversion (UFU) module according to an embodiment of the invention.

Figure 11:
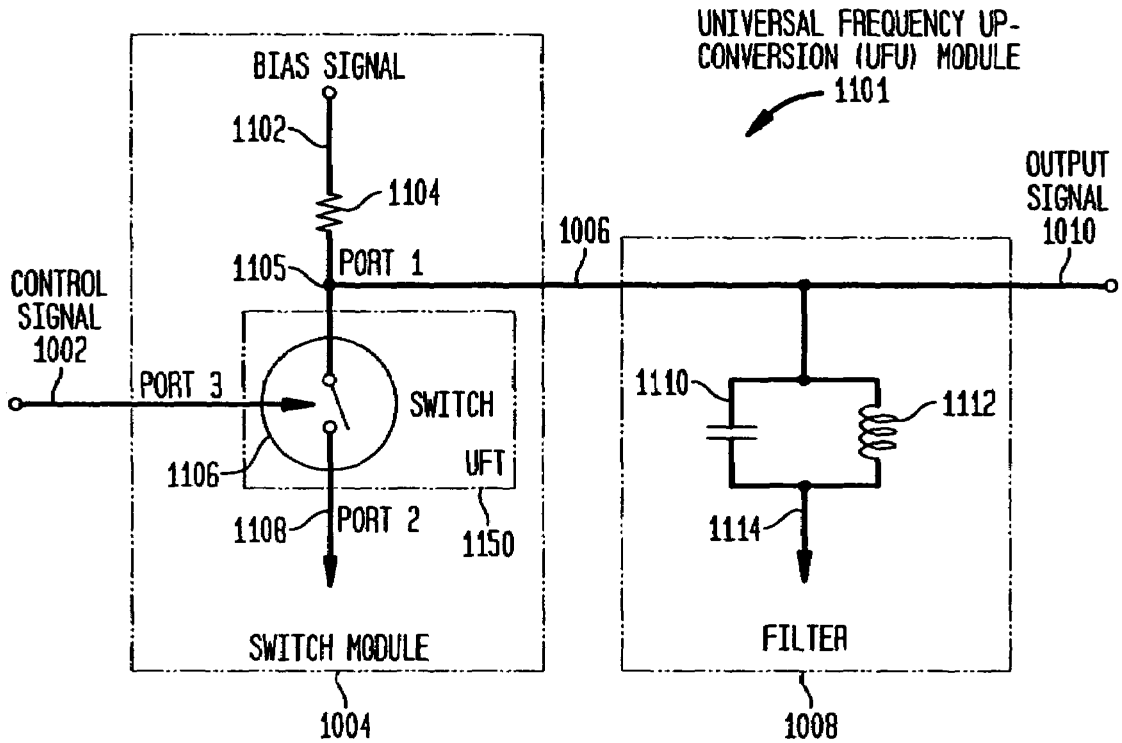

FIG. 11 is a more detailed diagram of a universal frequency up-conversion (UFU) module according to an embodiment of the invention.

Figure 12:
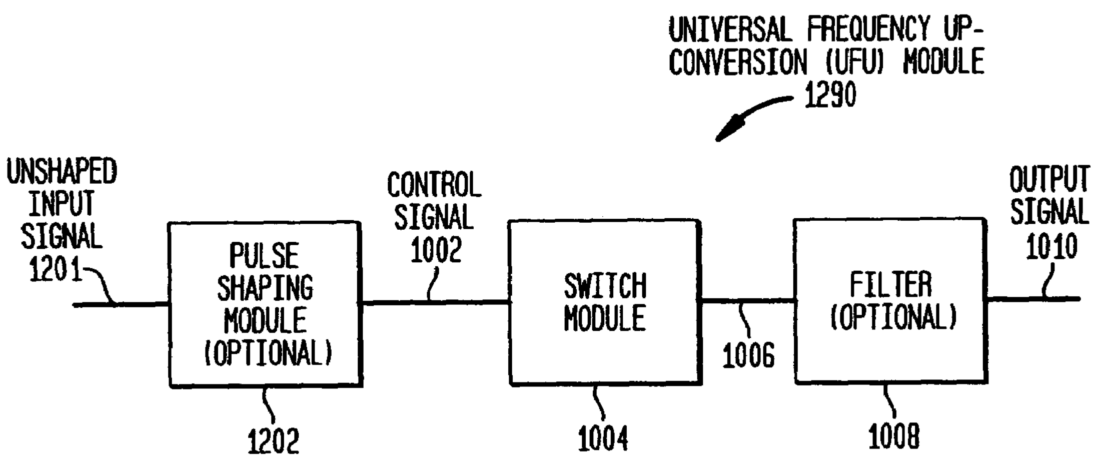

FIG. 12 is a block diagram of a universal frequency up-conversion (UFU) module according to an alternative embodiment of the invention.

FIGS. 13A-13I illustrate example waveforms used to describe the operation of the UFU module.

Figure 14:
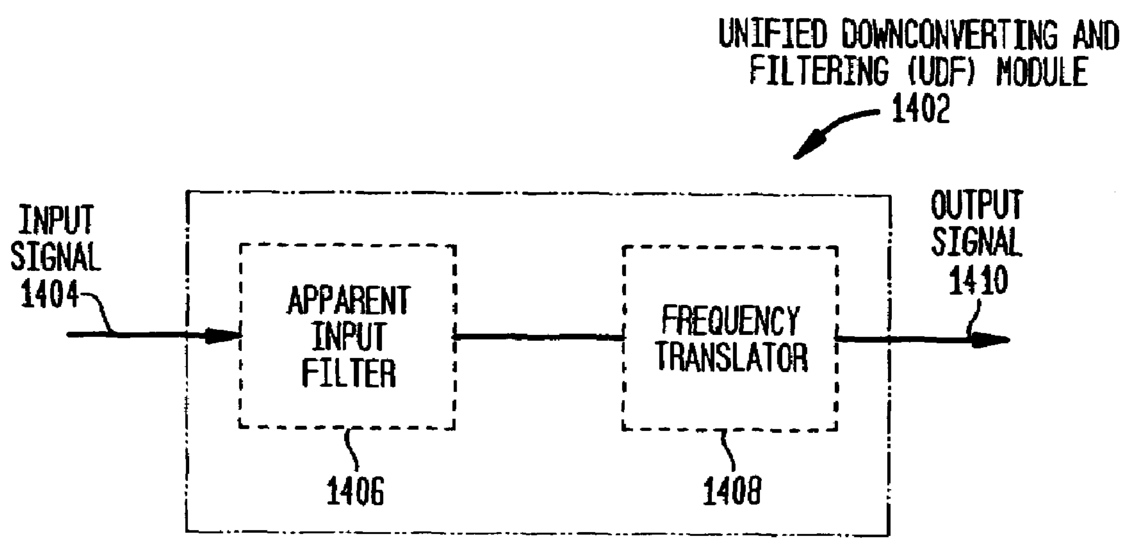

FIG. 14 illustrates a unified down-converting and filtering, (UDF) module according to an embodiment of the invention.

Figure 15:
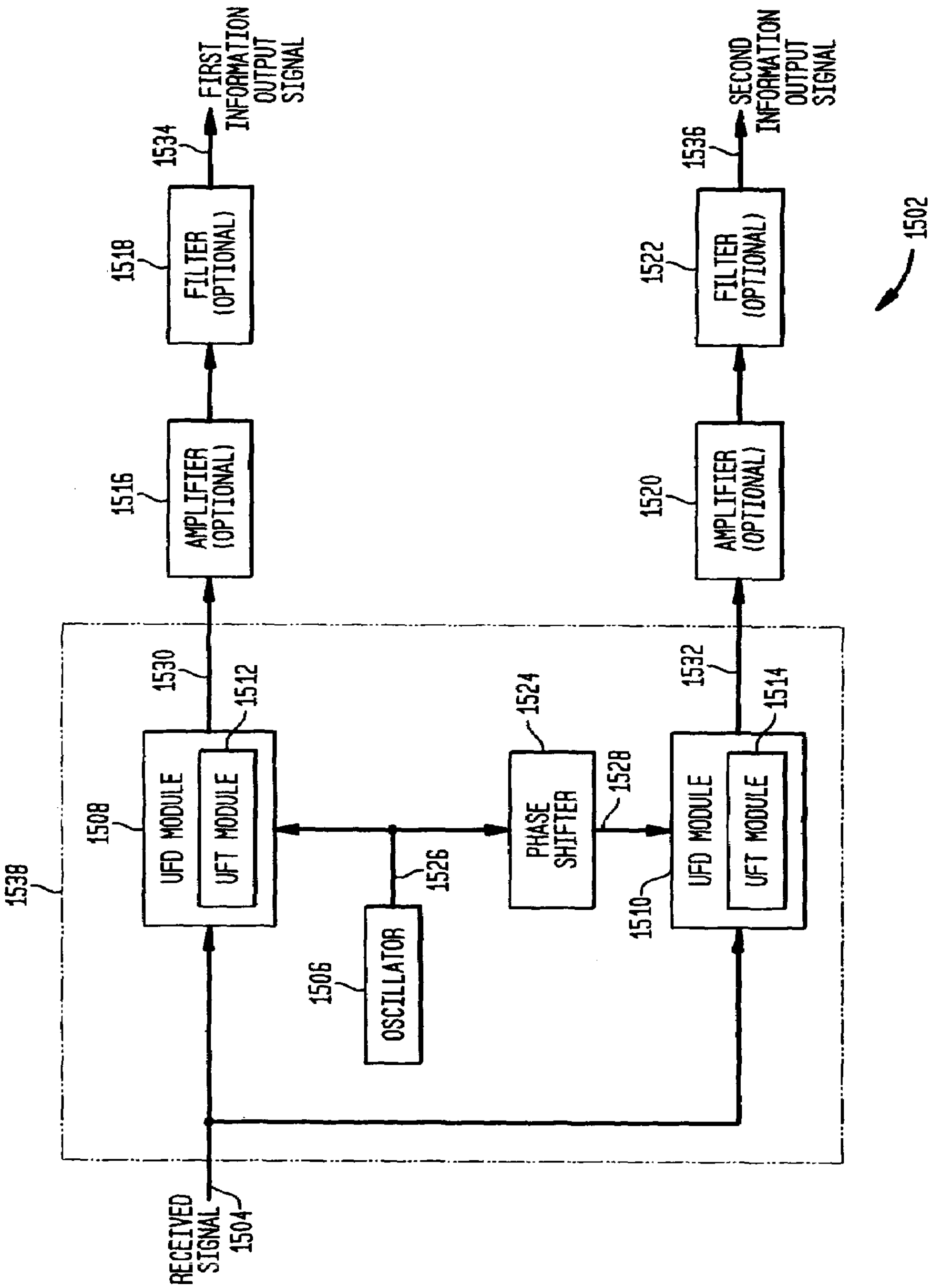

FIG. 15 illustrates an exemplary I/Q modulation embodiment of a receiver according to the invention.

Figure 16:
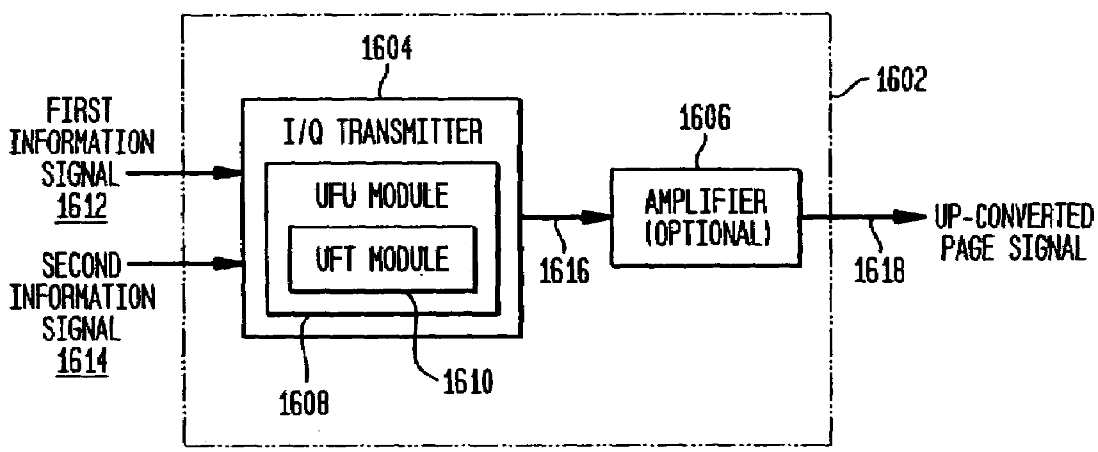
Figure 17:
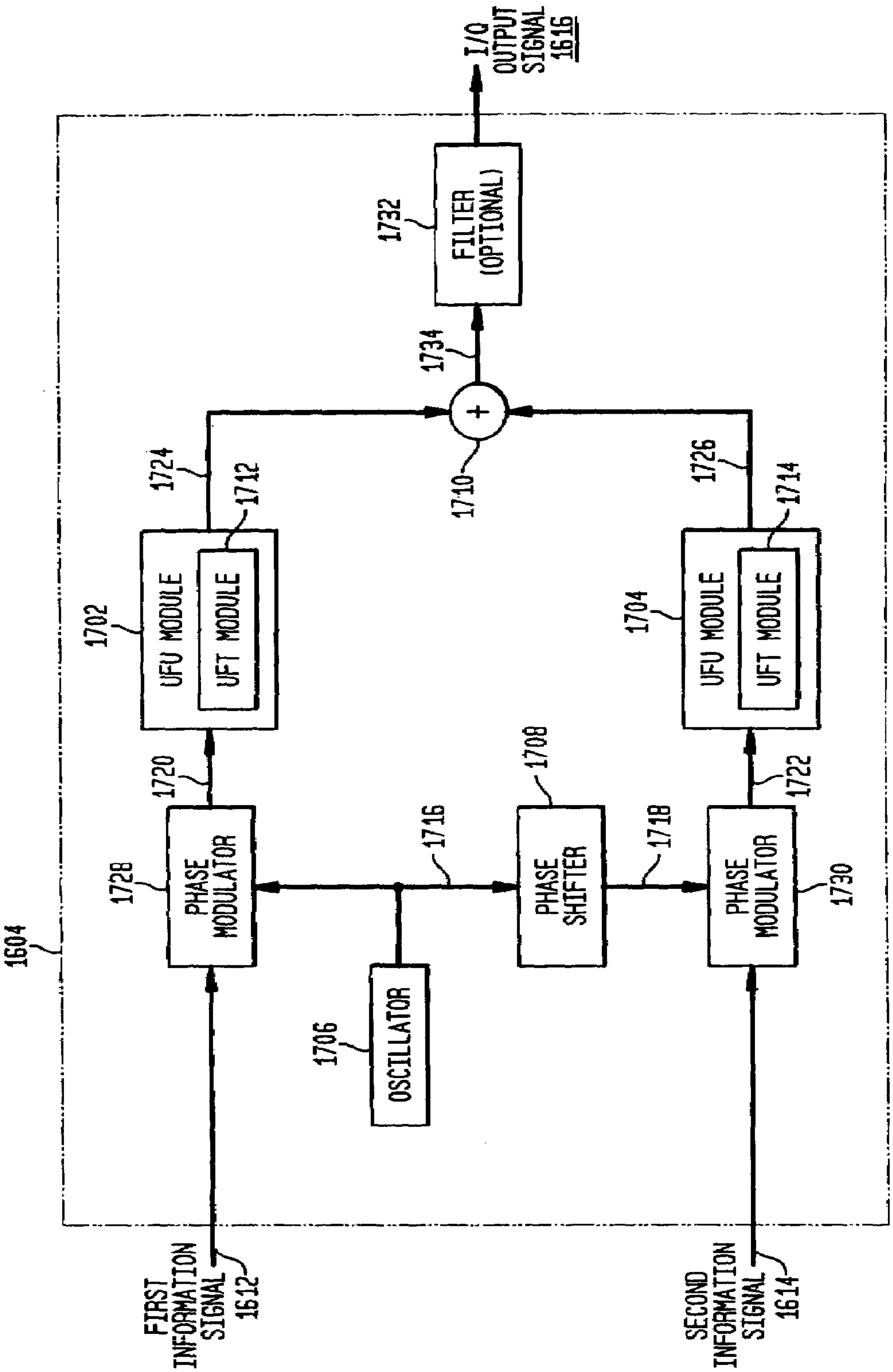

FIGS. 16-17 illustrate exemplary block diagrams of a transmitter operating in an I/Q modulation mode, according to embodiments of the invention.

Figure 18:
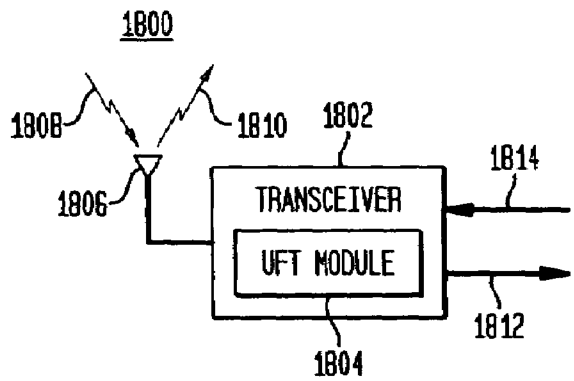

FIG. 18 illustrates a block diagram of a transceiver implementation according to an embodiment of the present invention.

Figure 19:
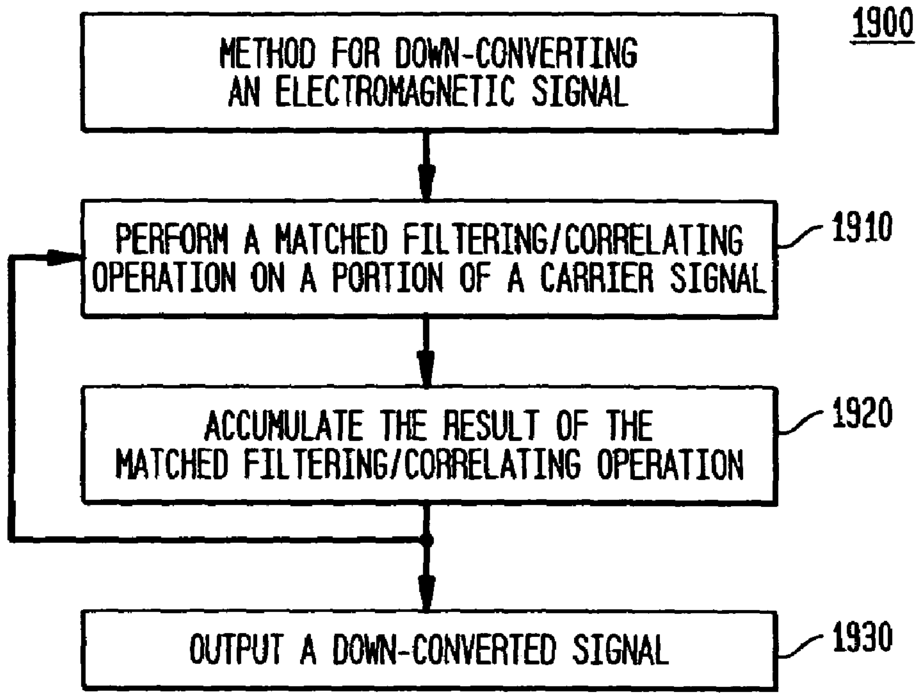

FIG. 19 illustrates a method for down-converting an electromagnetic signal according to an embodiment of the present invention using a matched filtering/correlating operation.

Figure 20:
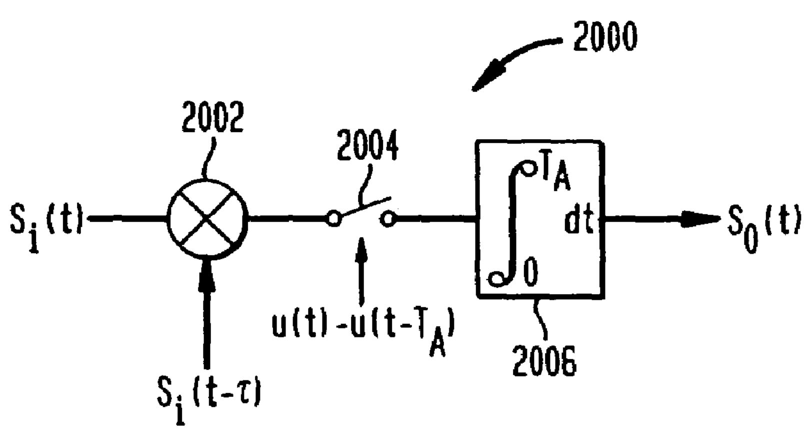

FIG. 20 illustrates a matched filtering/correlating processor according to an embodiment of the present invention.

Figure 21:
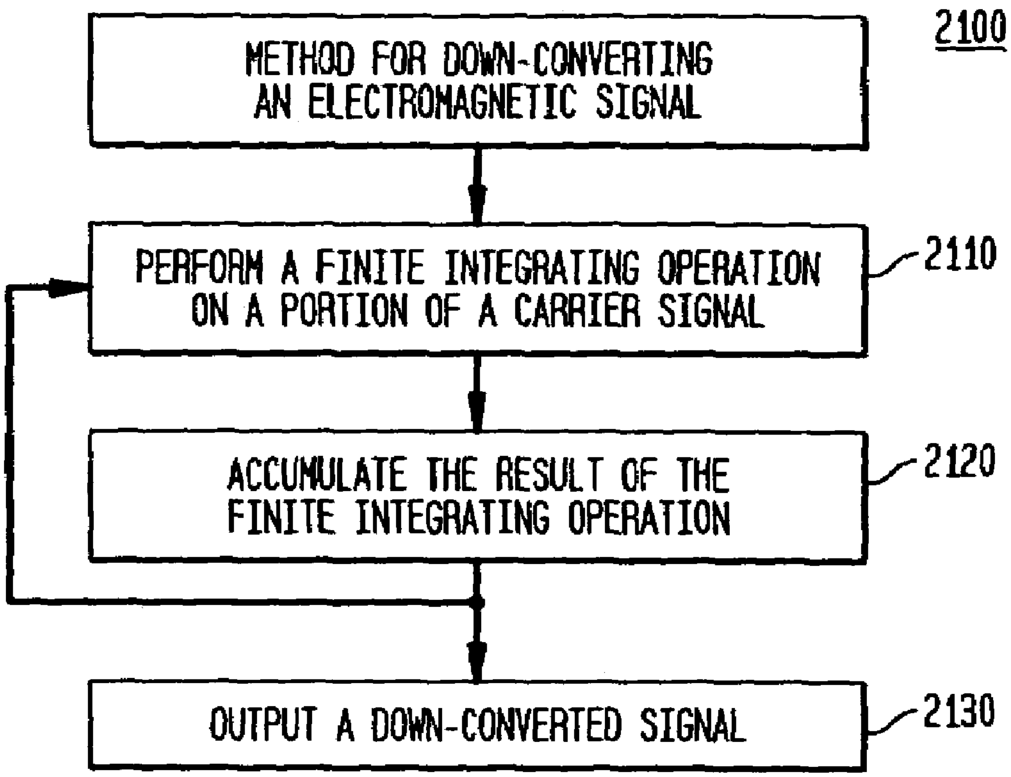

FIG. 21 illustrates a method for down-converting an electromagnetic signal according to an embodiment of the present invention using a finite time integrating operation.

Figure 22:
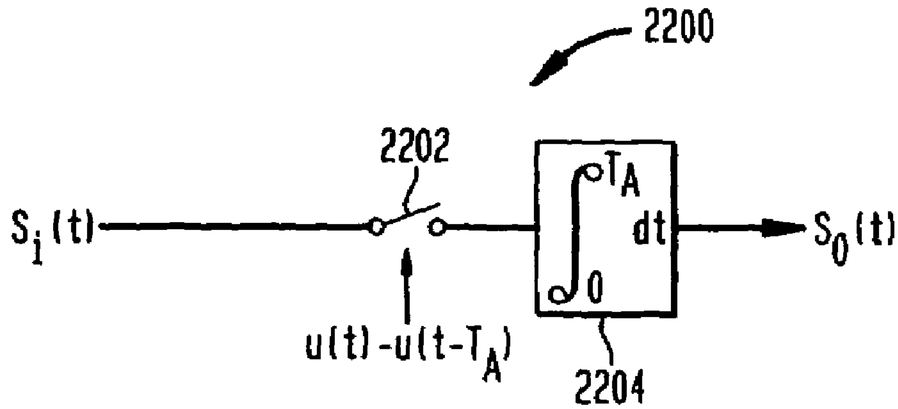

FIG. 22 illustrates a finite time integrating processor according to an embodiment of the present invention.

Figure 23:
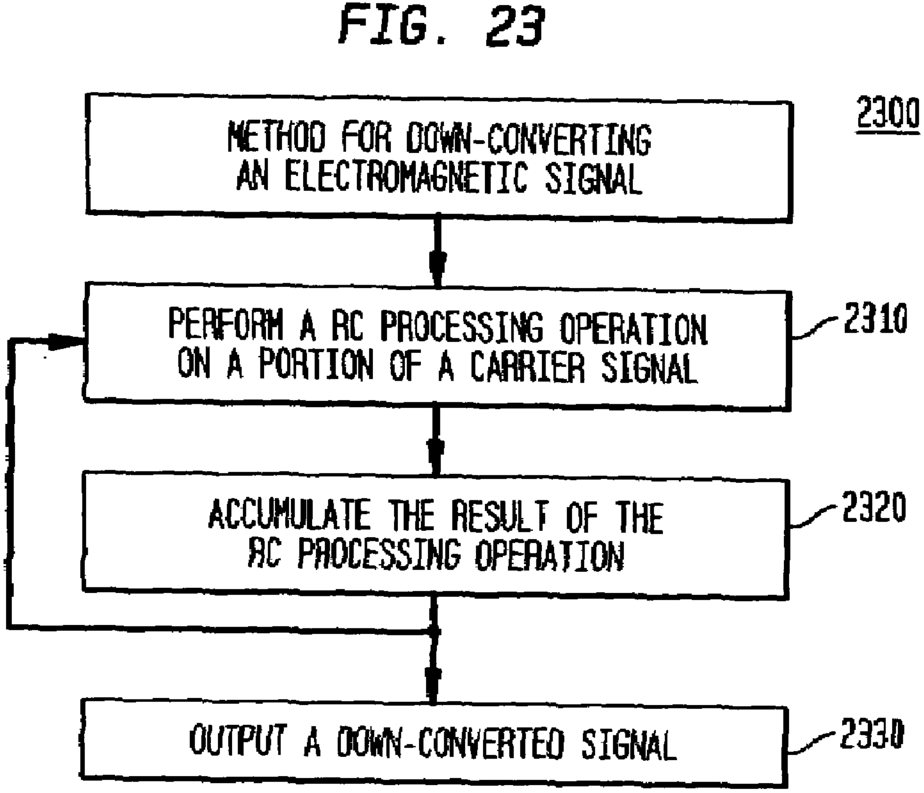

FIG. 23 illustrates a method for down-converting an electromagnetic signal according to an embodiment of the present invention using an RC processing operation.

Figure 24:
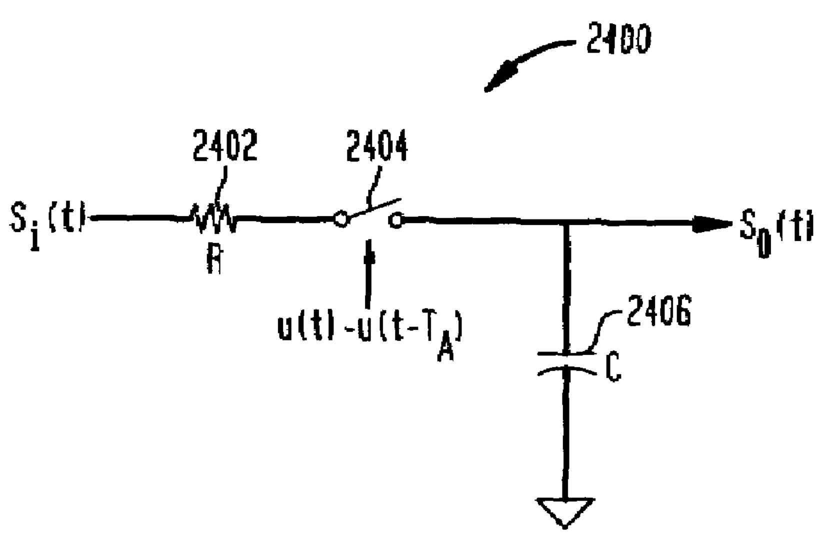

FIG. 24 illustrates an RC processor according to an embodiment of the present invention.

Figure 25:
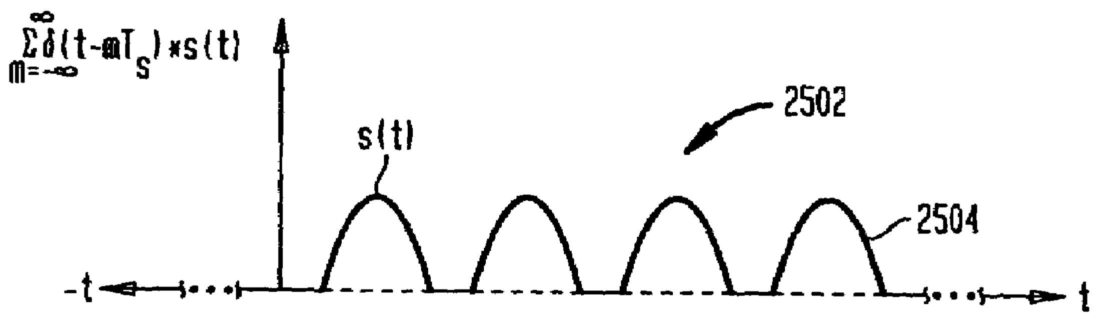

FIG. 25 illustrates an example pulse train.

Figure 26:
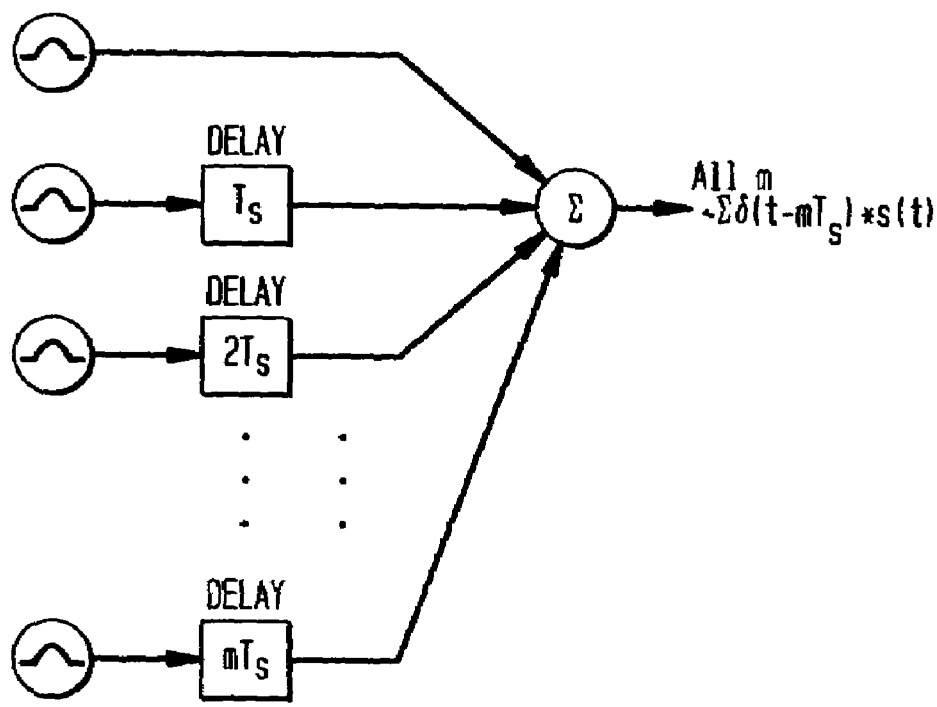

FIG. 26 illustrates combining a pulse train of energy signals to produce a power signal according to an embodiment of the invention.

Figure 27:
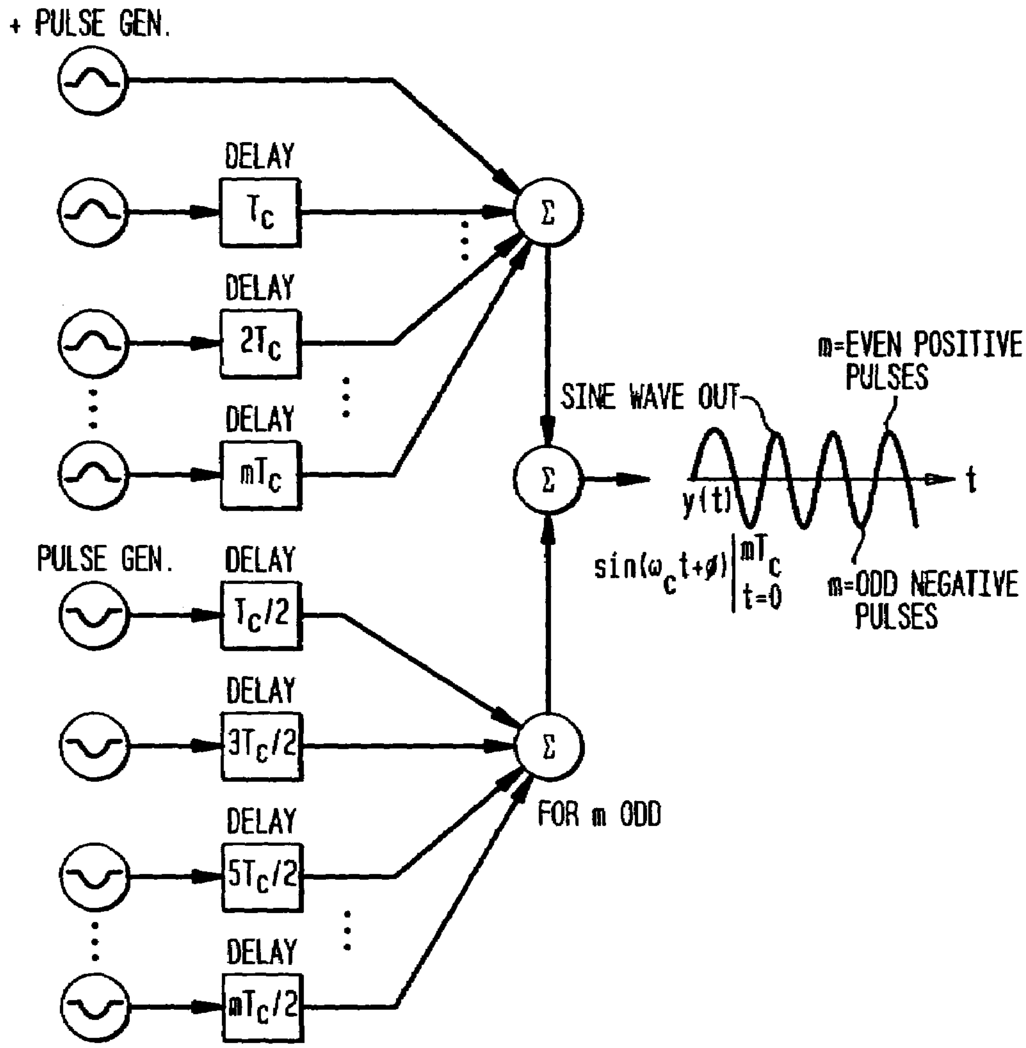

FIG. 27 illustrates an example piecewise linear reconstruction of a sine wave.

Figure 28:
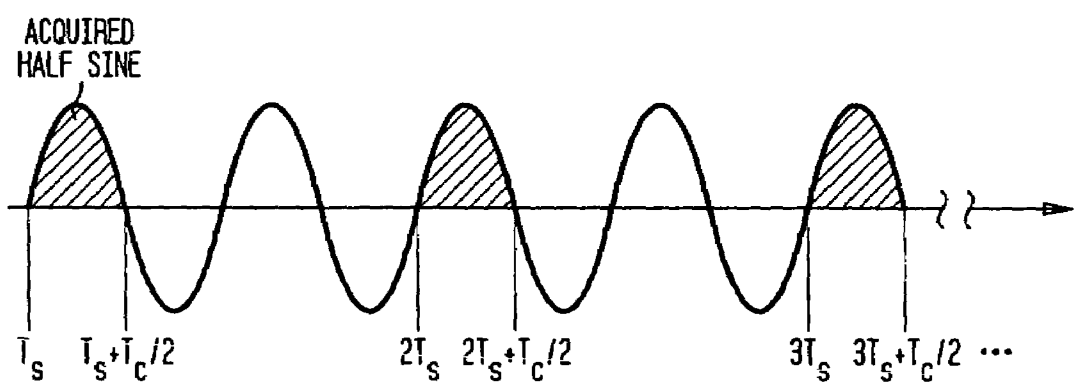

FIG. 28 illustrates how certain portions of a carrier signal or sine waveform are selected for processing according to an embodiment of the present invention.

Figure 29:
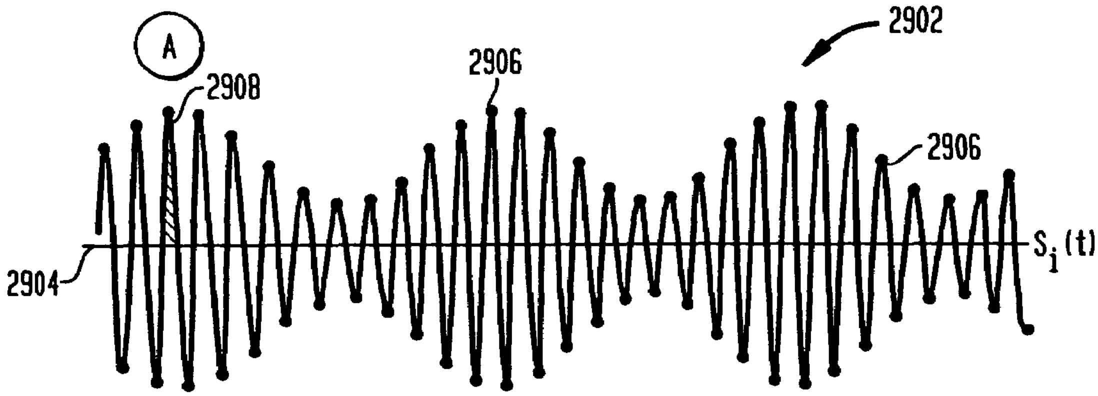

FIG. 29 illustrates an example double sideband large carrier AM waveform.

Figure 30:
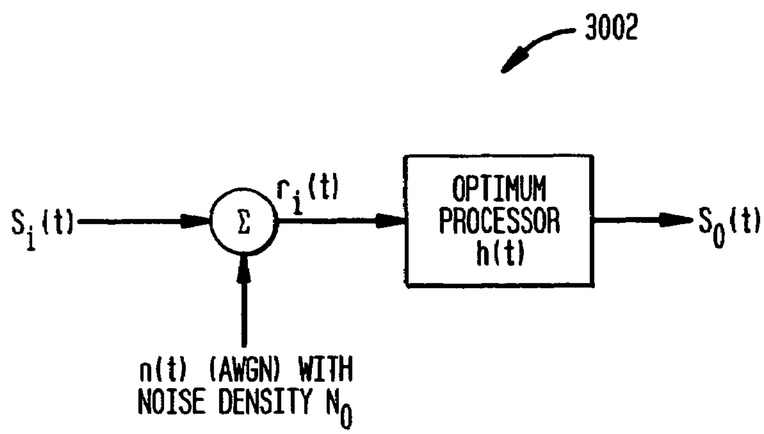

FIG. 30 illustrates a block diagram of an example optimum processor system.

Figure 31:
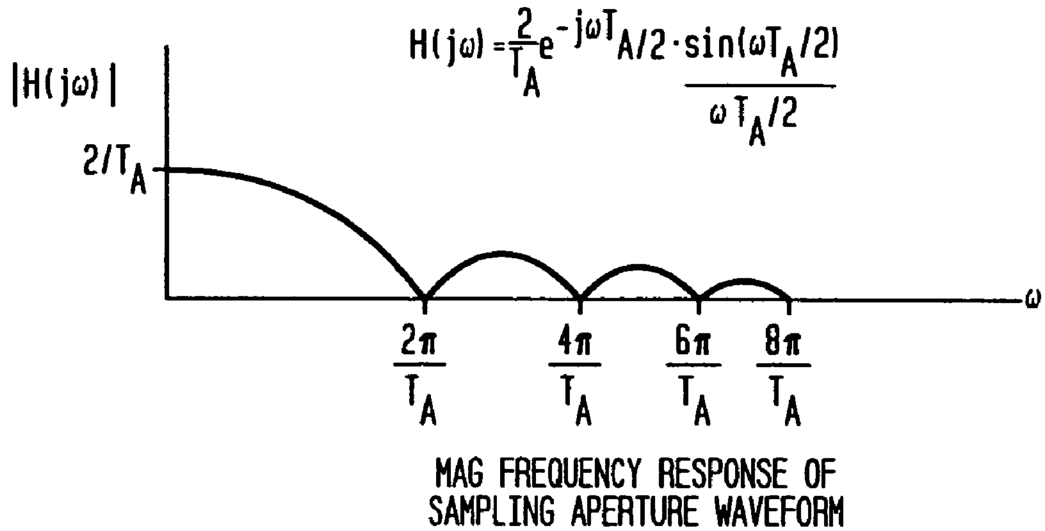

FIG. 31 illustrates the frequency response of an optimum processor according to an embodiment of the present invention.

Figure 32:
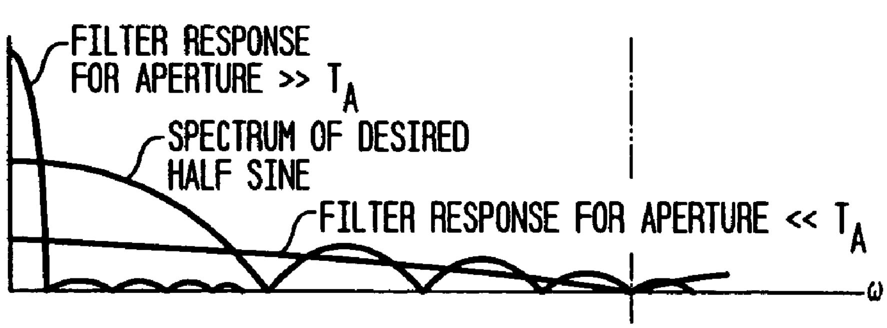

FIG. 32 illustrates example frequency responses for a processor at various apertures.

Figure 33:
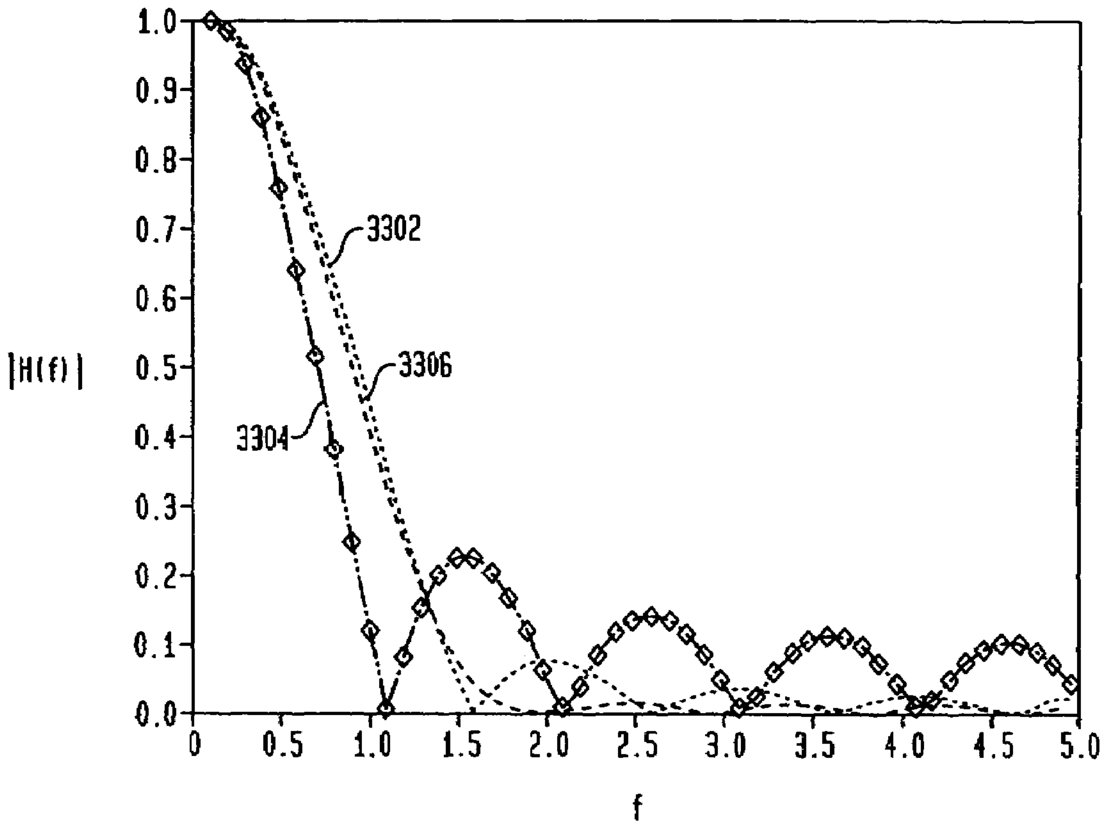

FIG. 33 illustrates differences between the transform of an ideal impulse response (half sine) and a rectangular sample aperture.

Figure 34:
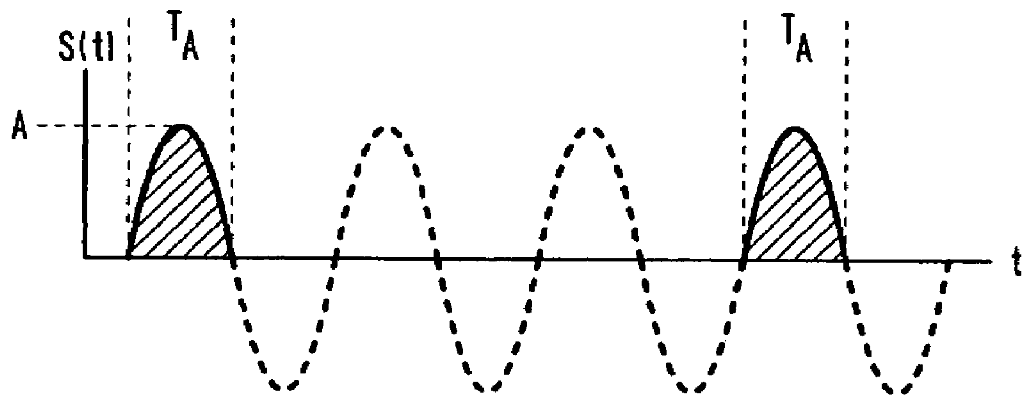
Figure 35:
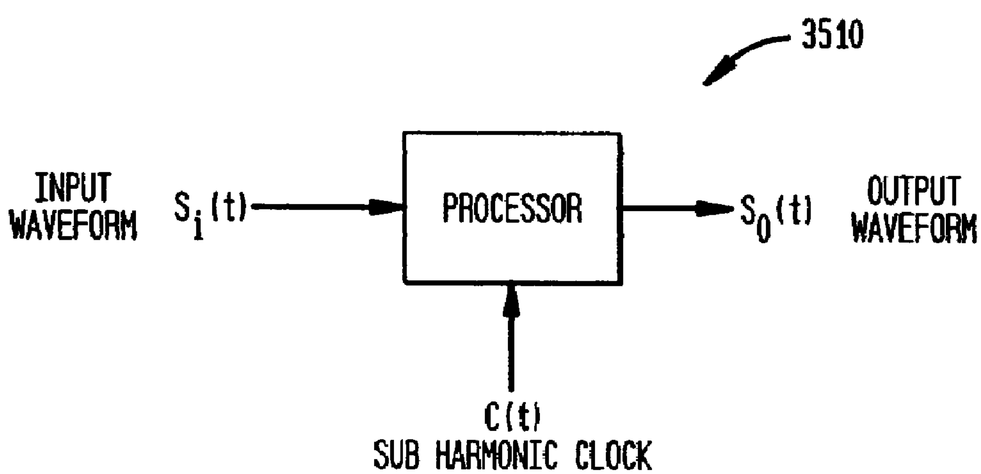

FIGS. 34-35 illustrates an example processor embodiment according to the present invention.

Figure 36A:
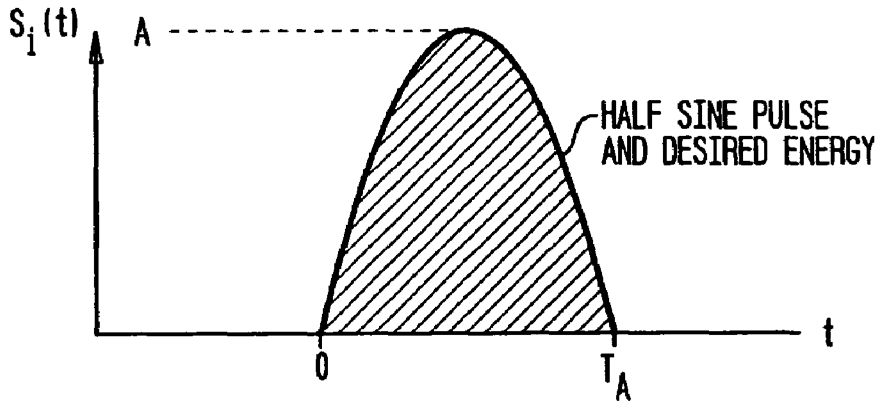
Figure 36B:
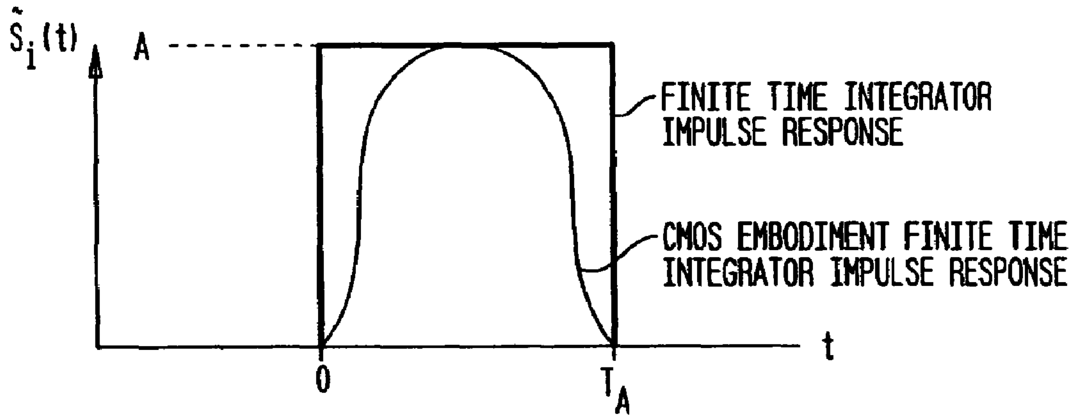

FIGS. 36A-B illustrate example impulse responses of a matched filter processor and a finite time integrator.

Figure 37:
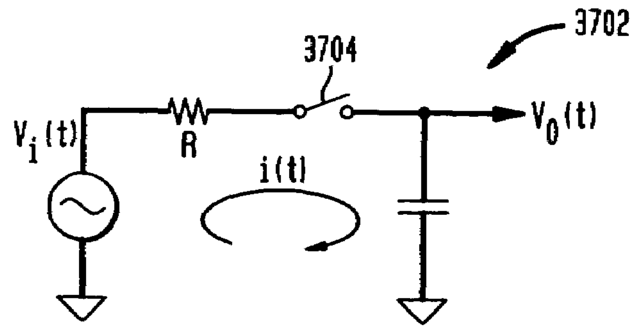

FIG. 37 illustrates a basic circuit for an RC processor according to an embodiment of the present invention.

Figure 38:
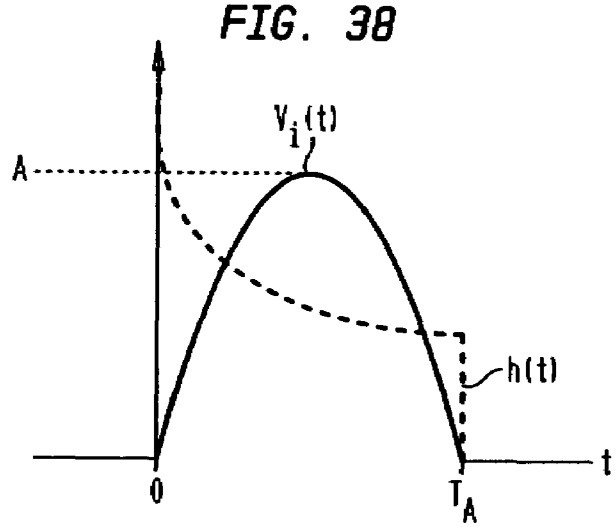
Figure 39:
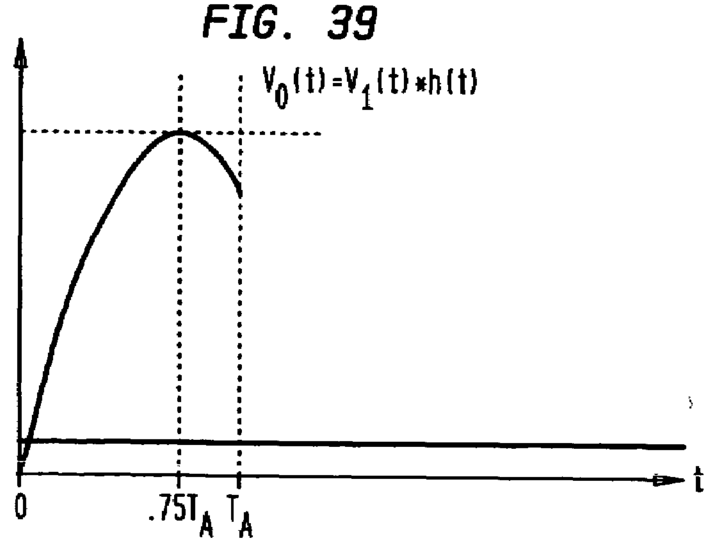

FIGS. 38-39 illustrate example plots of voltage signals.

Figure 40:
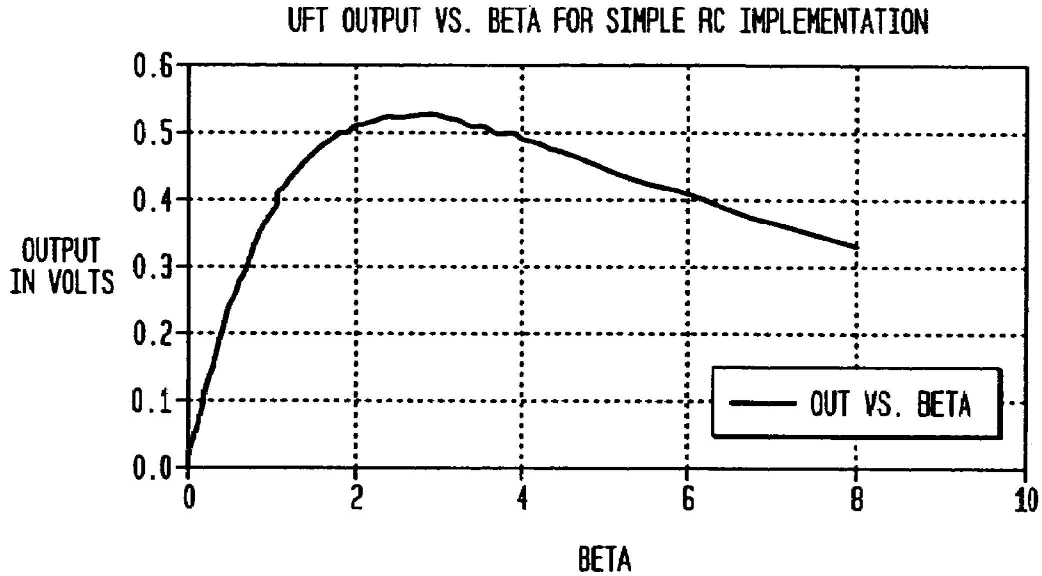
Figure 41:
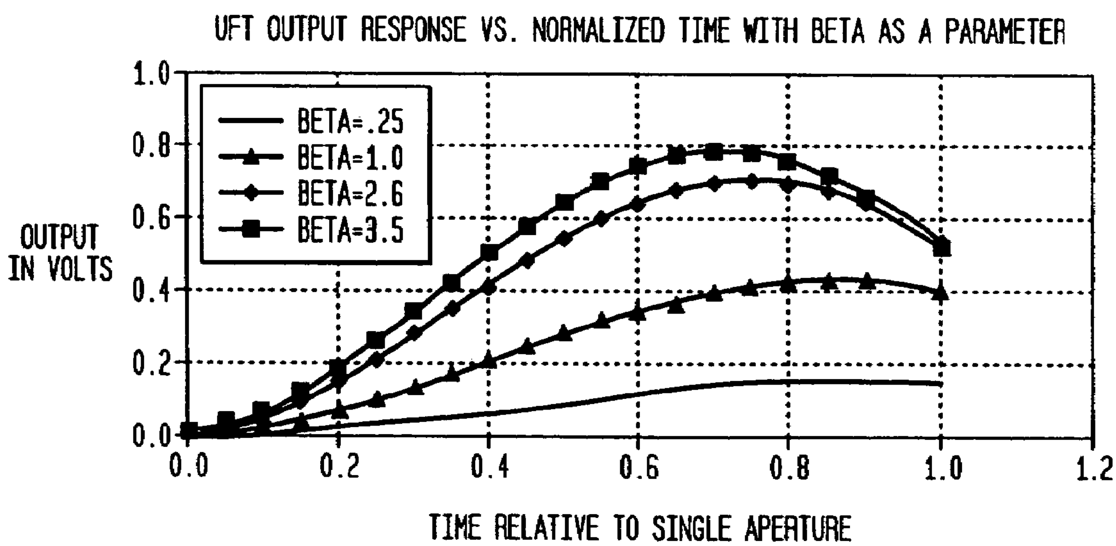
Figure 42:
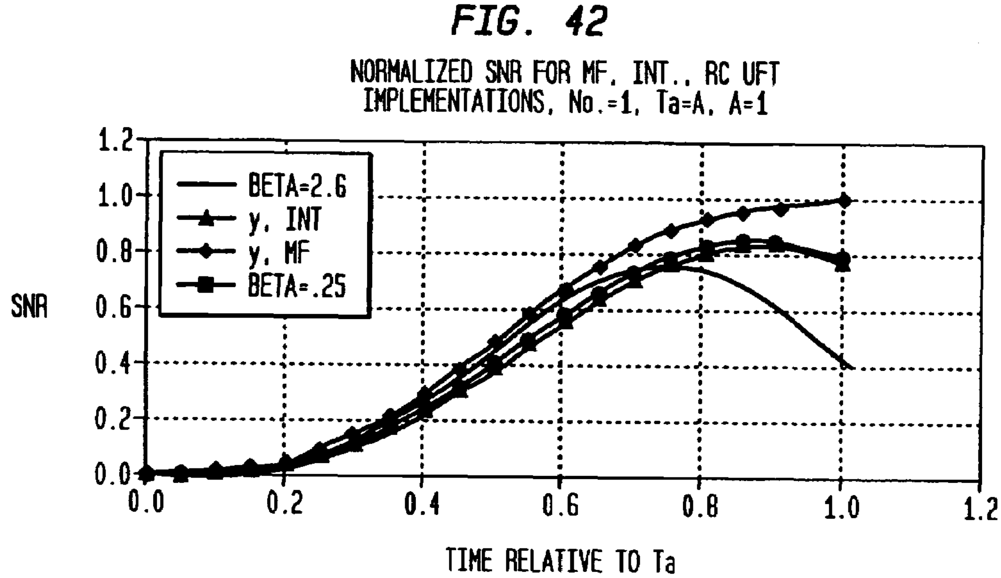

FIGS. 40-42 illustrate the various characteristics of a processor according to an embodiment of the present invention.

Figure 43:
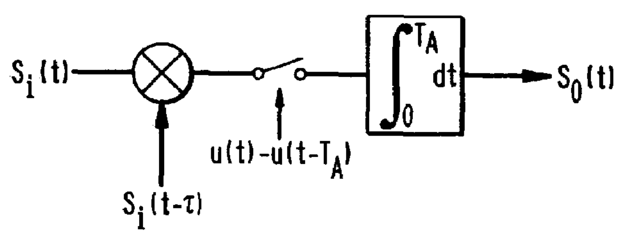
Figure 44:
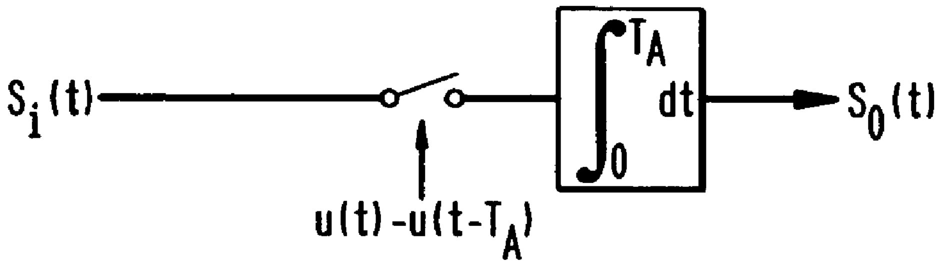
Figure 45:
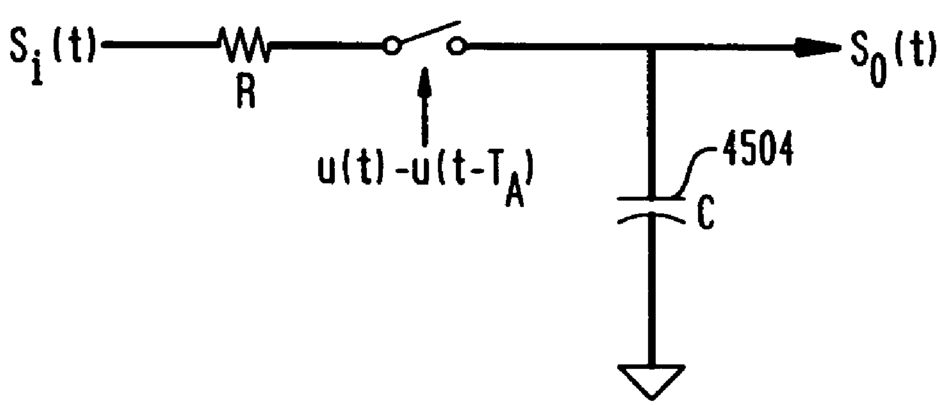

FIGS. 43-45 illustrate example processor embodiments according to the present invention.

Figure 46:
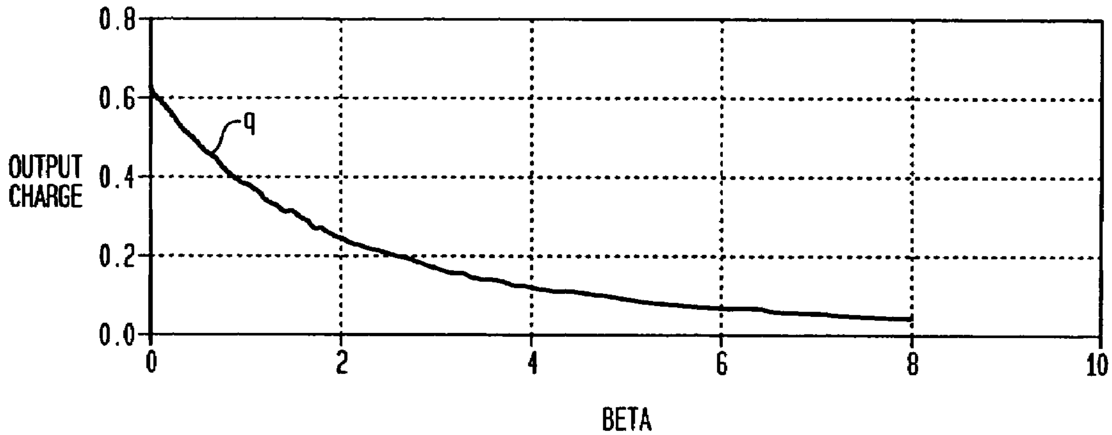

FIG. 46 illustrates the relationship between beta and the output charge of a processor according to an embodiment of the present invention.

Figure 47A:
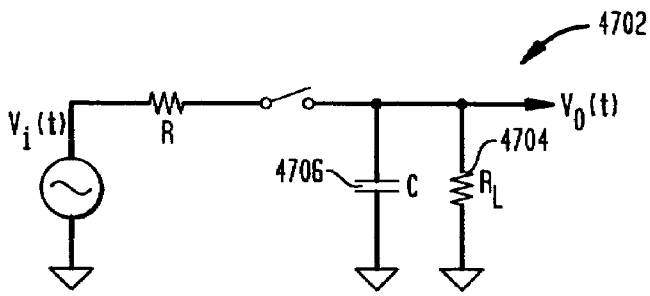

FIG. 47A illustrates an RC processor according to an embodiment of the present invention coupled to a load resistance.

Figure 47B:
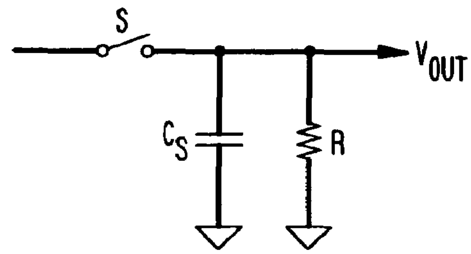

FIG. 47B illustrates an example implementation of the present invention.

Figure 47C:
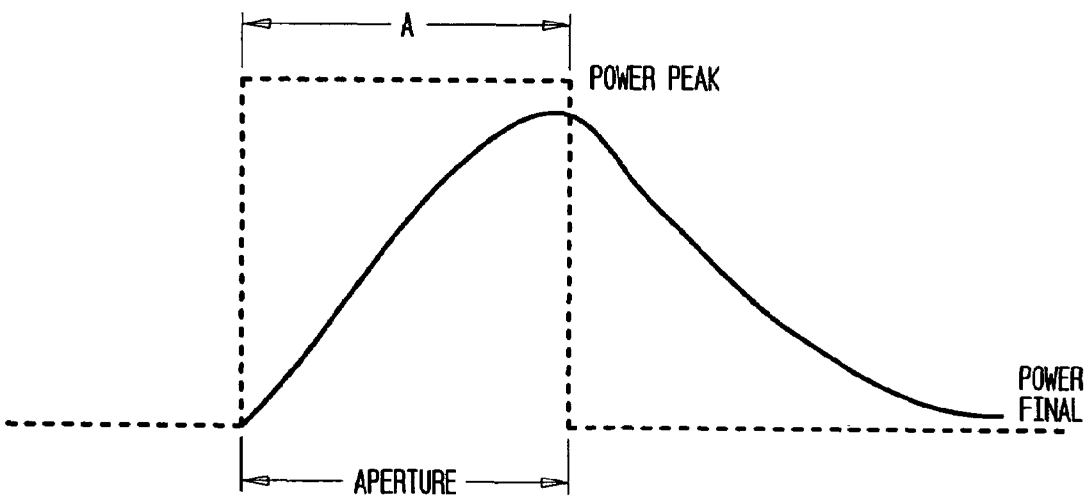

FIG. 47C illustrates an example charge/discharge timing diagram according to an embodiment of the present invention.

Figure 47D:
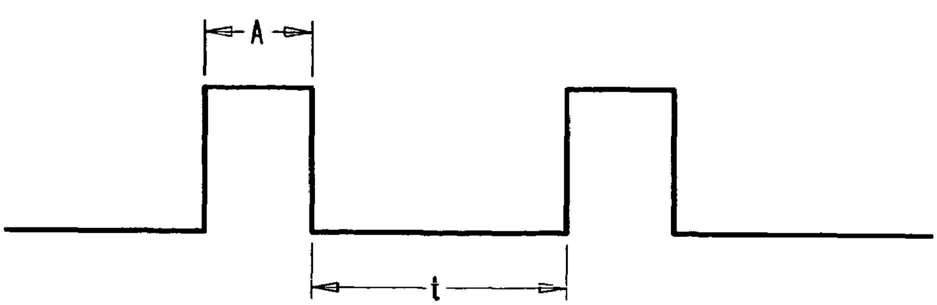

FIG. 47D illustrates example energy transfer pulses according to an embodiment of the present invention.

Figure 48:
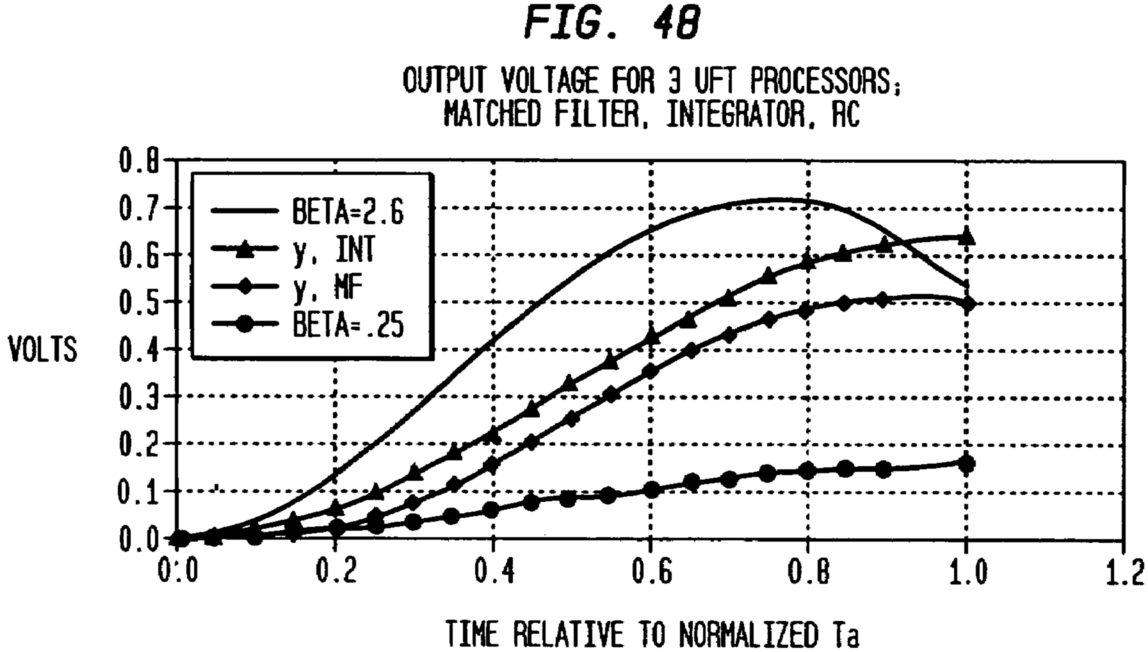

FIG. 48 illustrates example performance characteristics of an embodiment of the present invention.

Figure 49A:
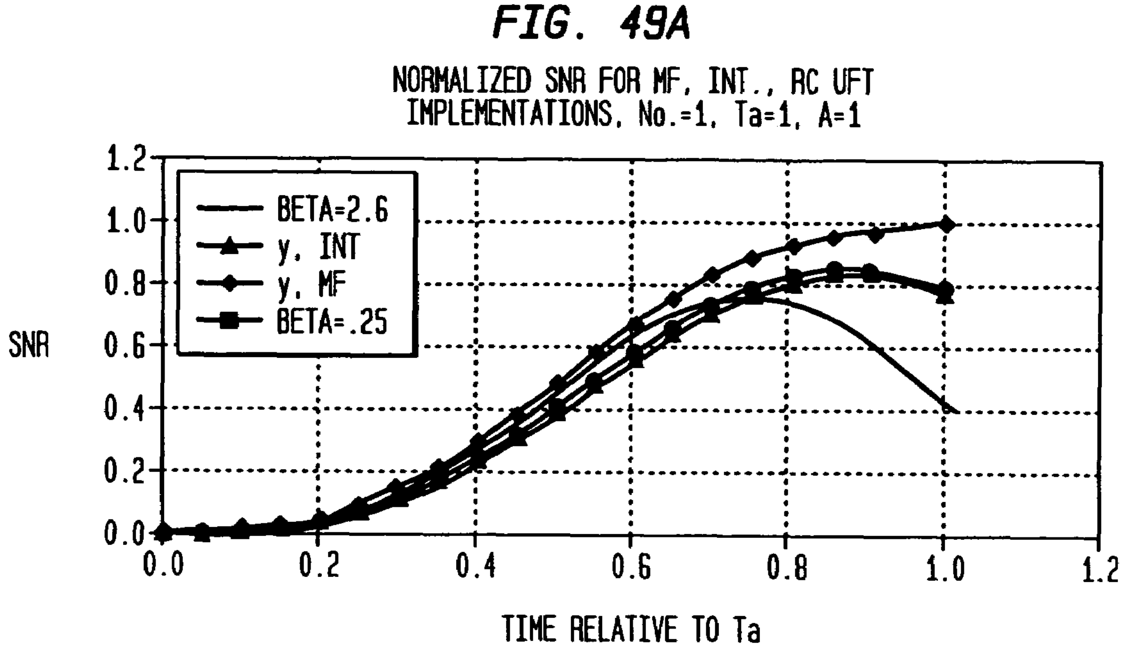

FIG. 49A illustrates example performance characteristics of an embodiment of the present invention.

Figure 49B:
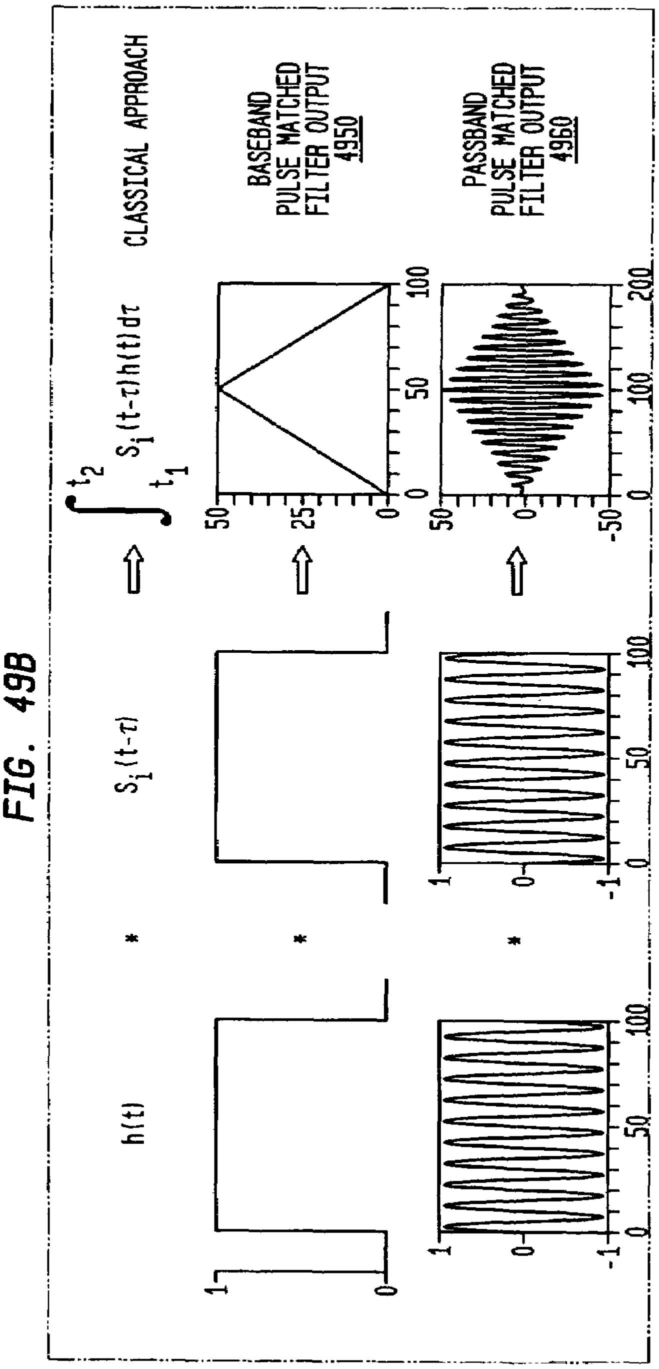

FIG. 49B illustrates example waveforms for elementary matched filters.

Figure 49C:
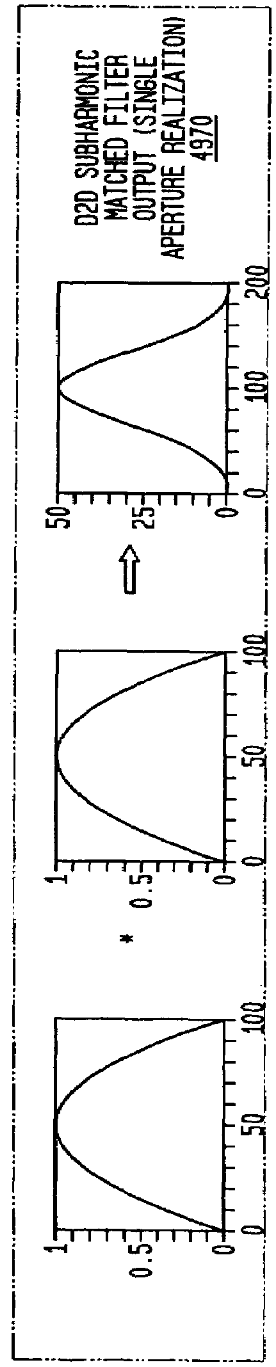

FIG. 49C illustrates a waveform for an embodiment of a UFT subharmonic matched filter of the present invention.

Figure 49D:
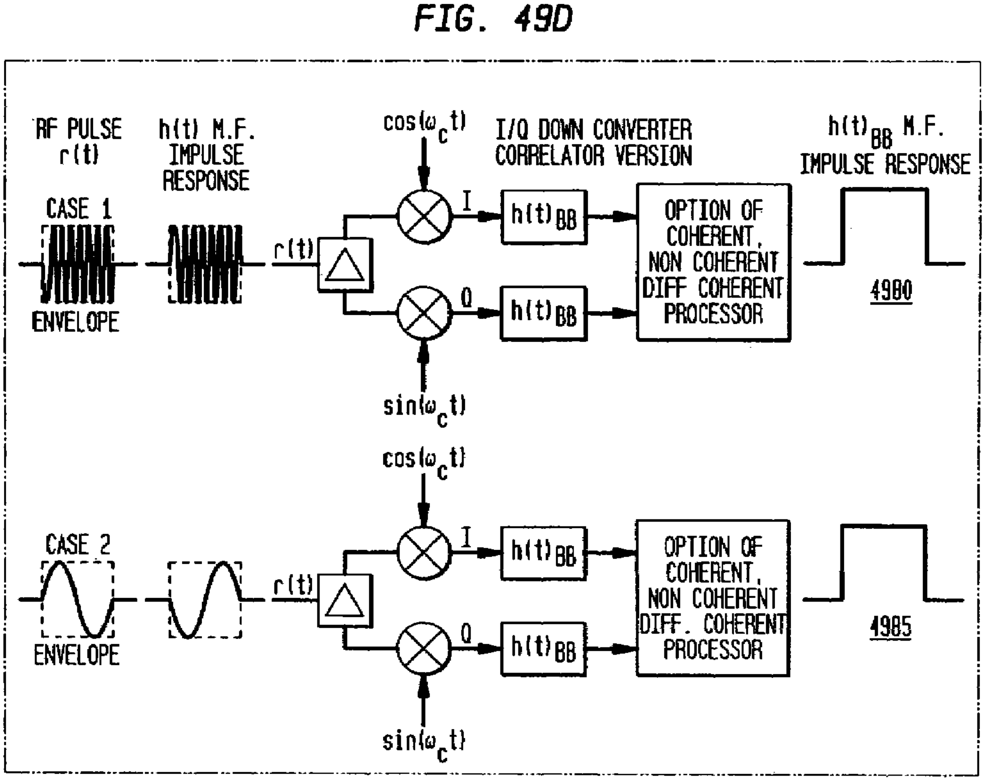

FIG. 49D illustrates example embodiments, of complex matched filter/correlator processor.

Figure 49E:
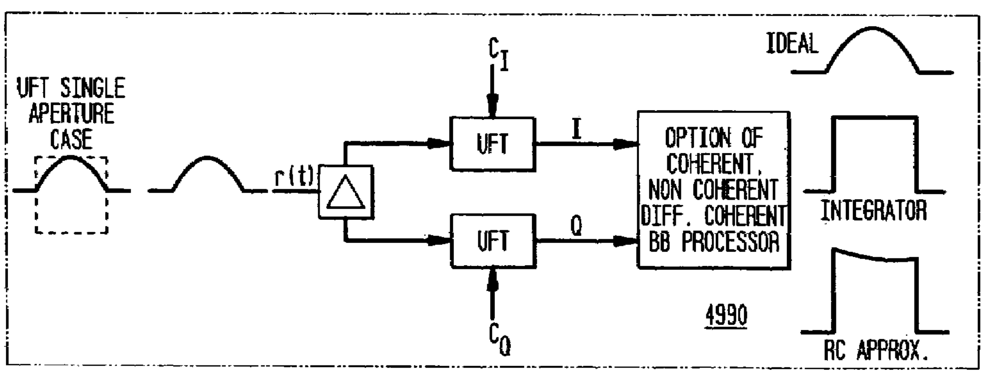

FIG. 49E illustrates an embodiment of a complex matched filter/correlator processor of the present invention.

FIG. 49F illustrates an embodiment of the decomposition of a non-ideal correlator alignment into an ideally aligned UFT coorrelator component of the present invention.

Figure 50A:
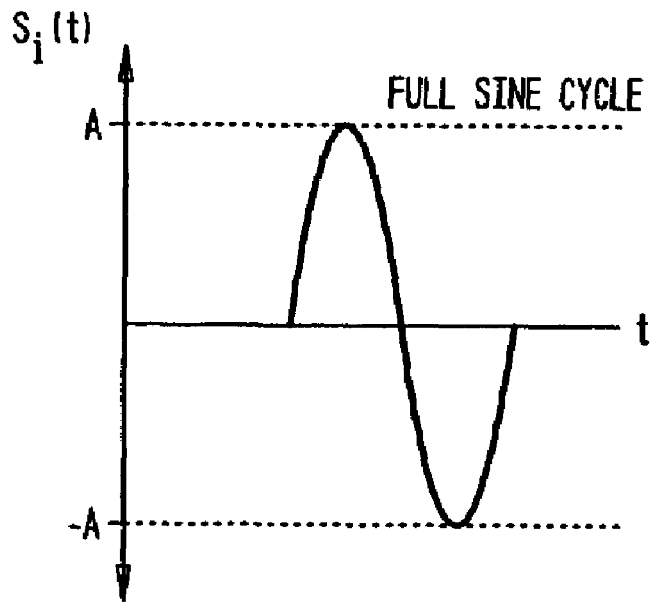
Figure 50B:
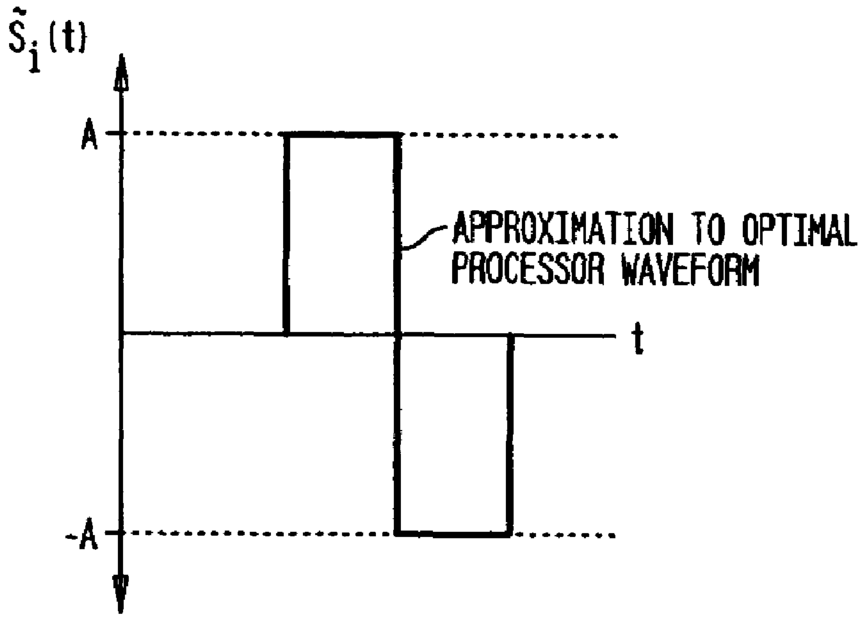

FIGS. 50A-50B illustrate example processor waveforms according to an embodiment of the present invention.

Figure 51:
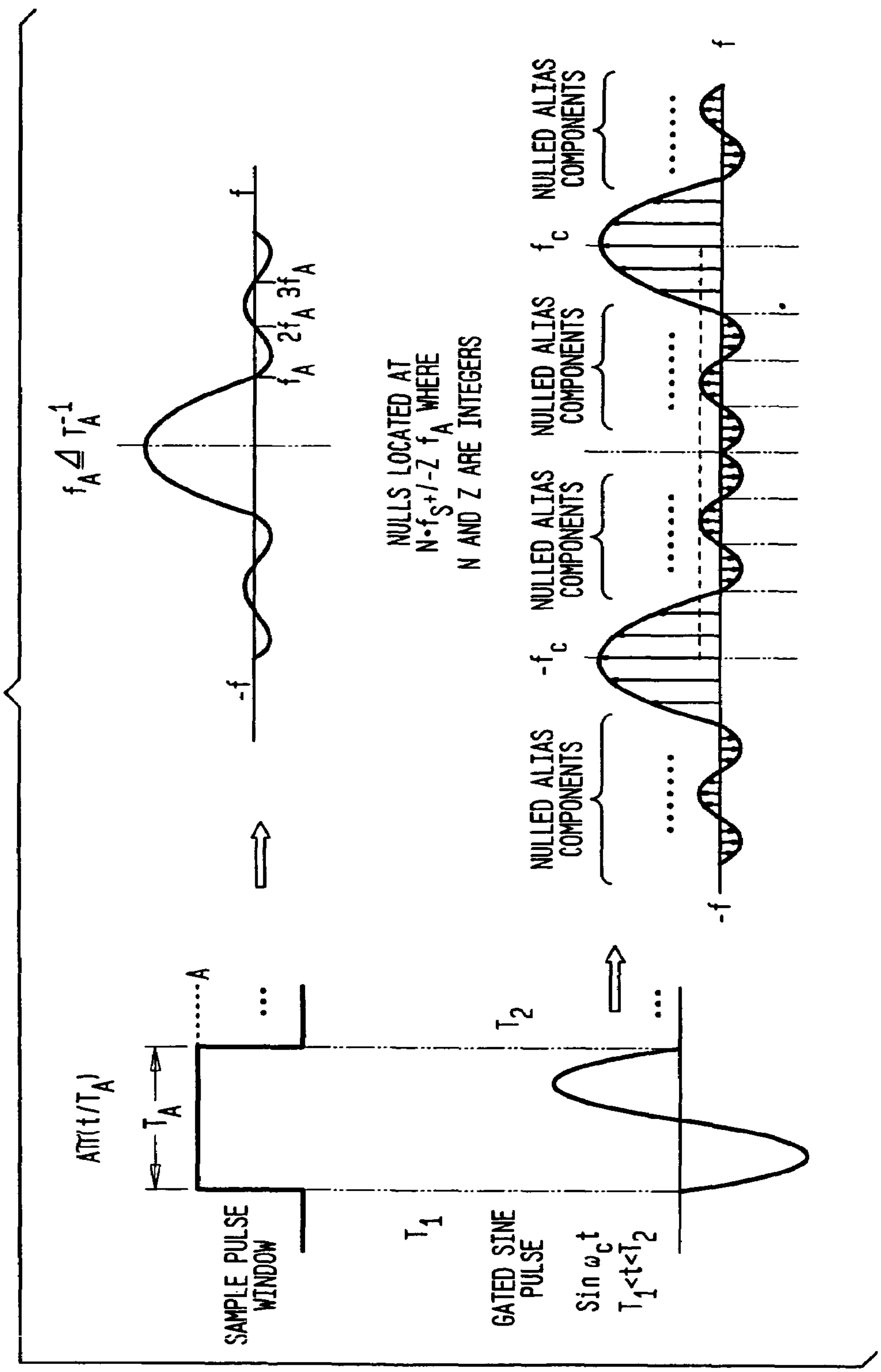

FIG. 51 illustrates the Fourier transforms of example waveforms waveforms according to an embodiment of the present invention.

Figure 52:
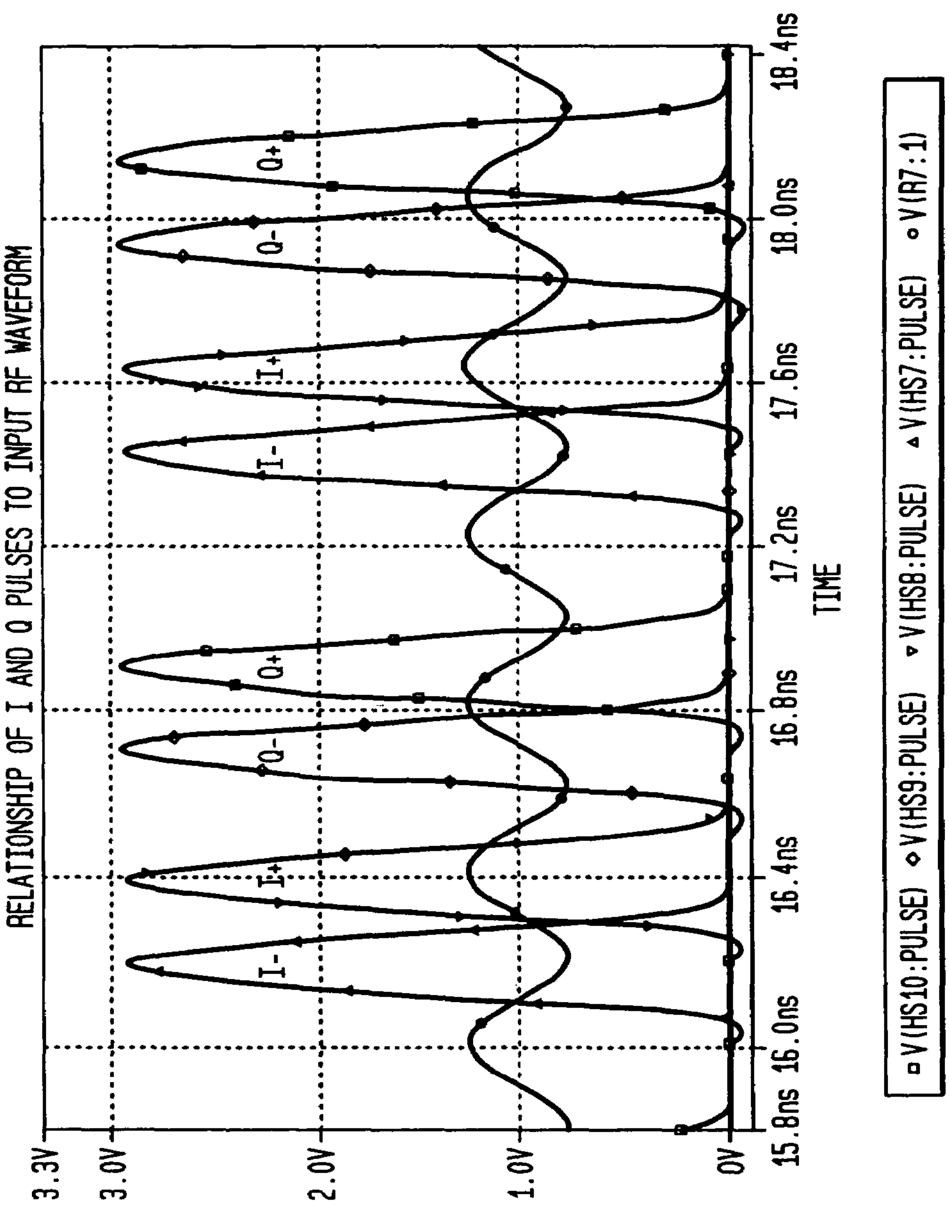
Figure 53:
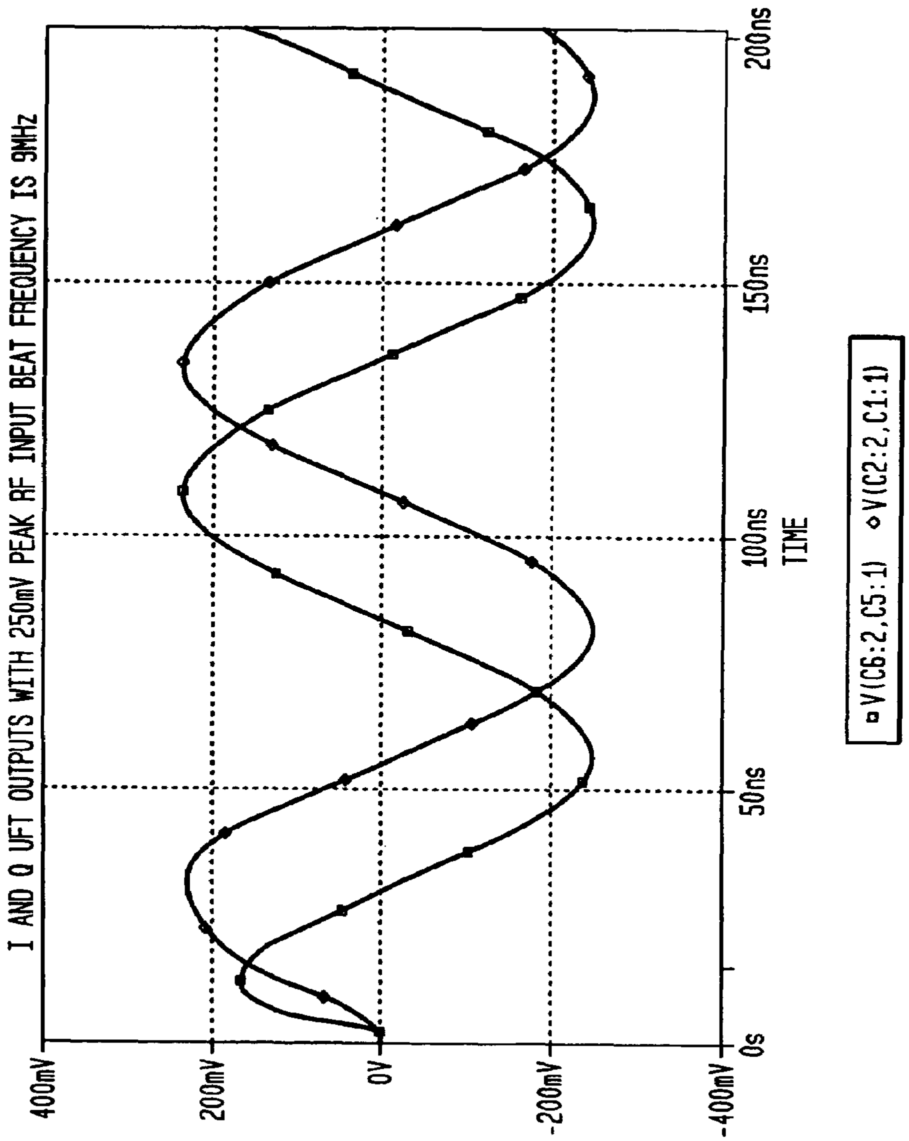

FIGS. 52-53 illustrates actual waveforms from an embodiment of the present invention.

Figure 54:
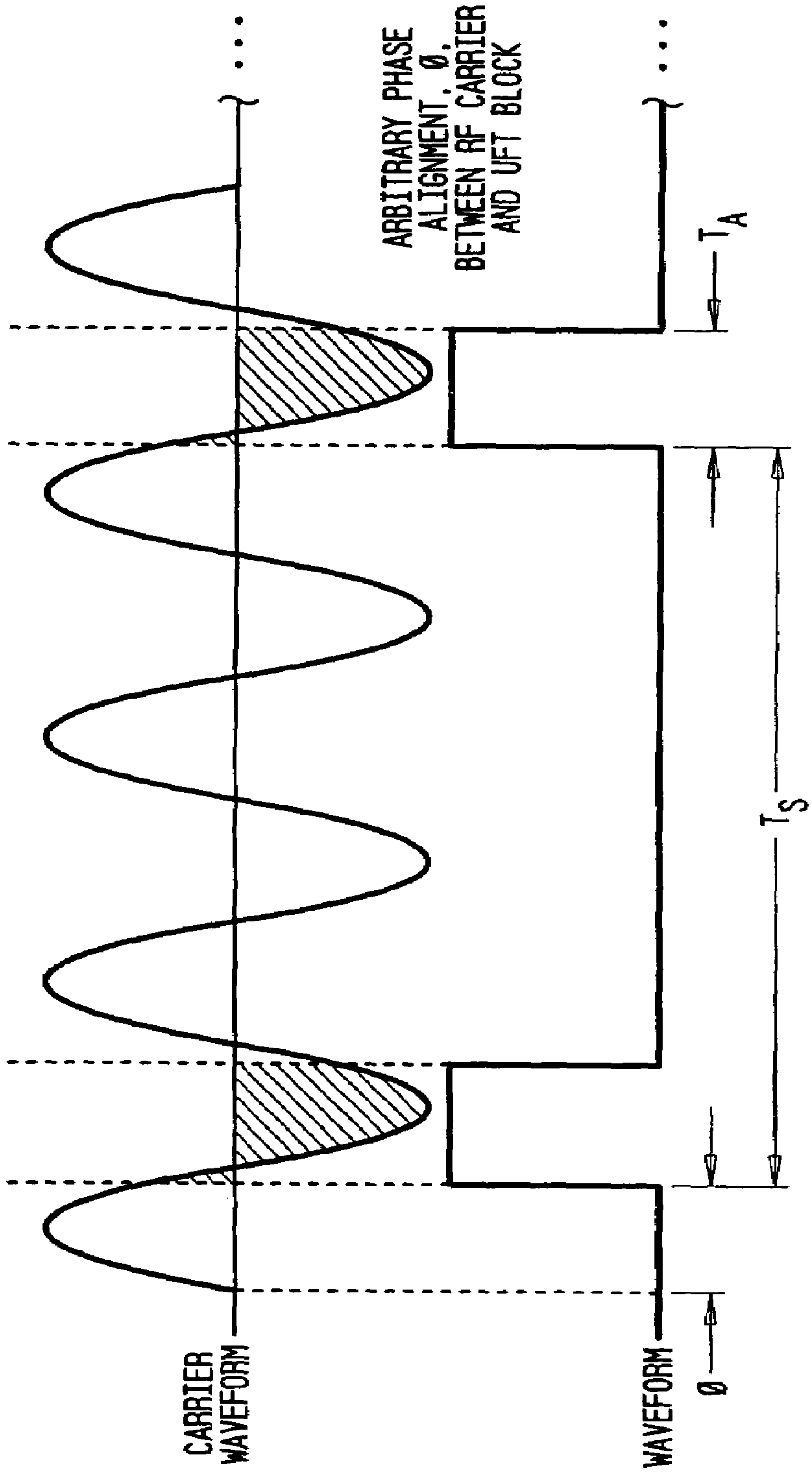

FIG. 54 illustrates a relationship between an example UFT waveform and an example carrier waveform.

Figure 55:
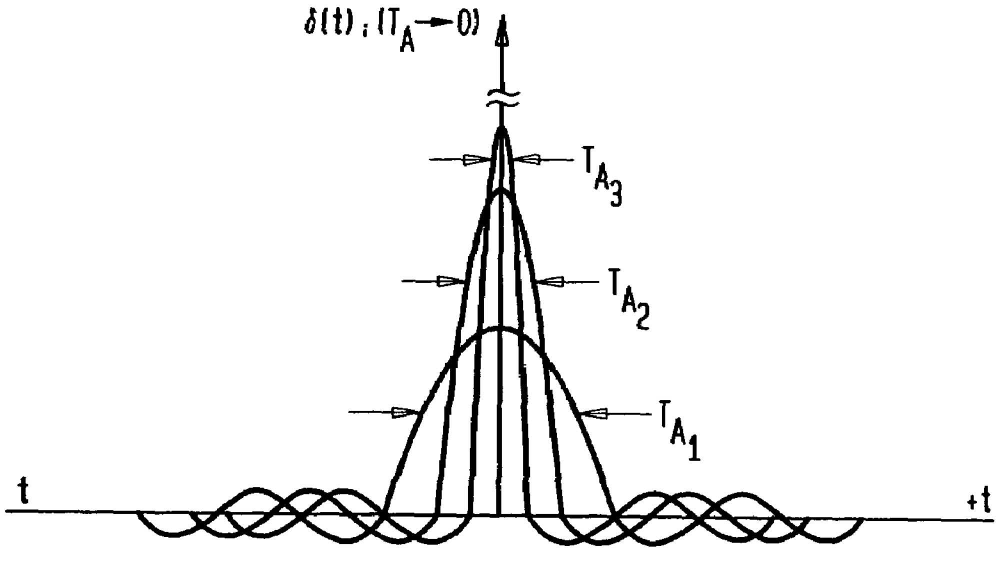

FIG. 55 illustrates example impulse samplers having various apertures.

Figure 56:
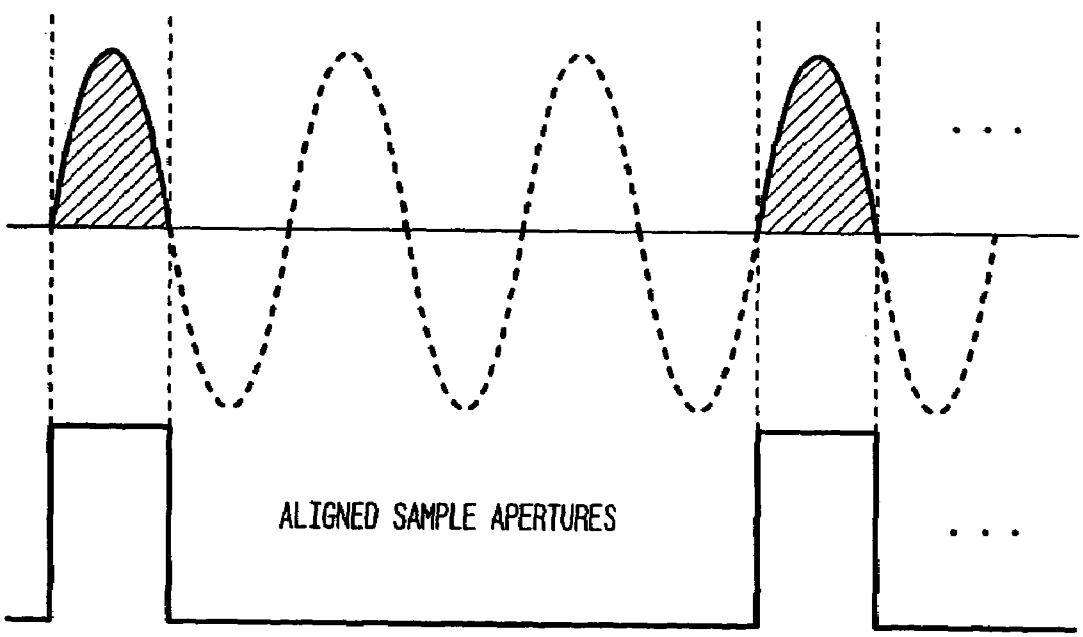

FIG. 56 illustrates the allingment of sample apertures according to an embodiment of the present invention.

Figure 57:
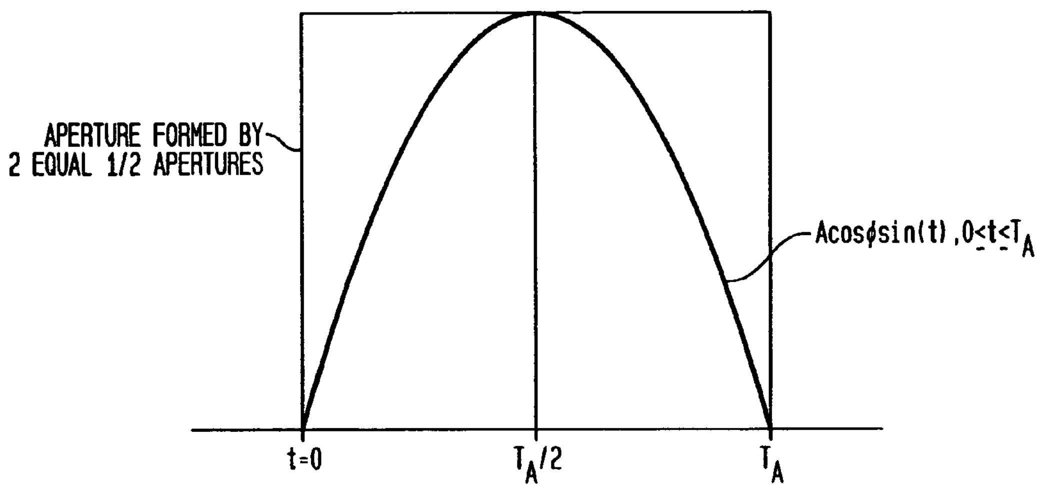

FIG. 57 illustrates an ideal aperture according to an embodiment of the present invention.

Figure 58:
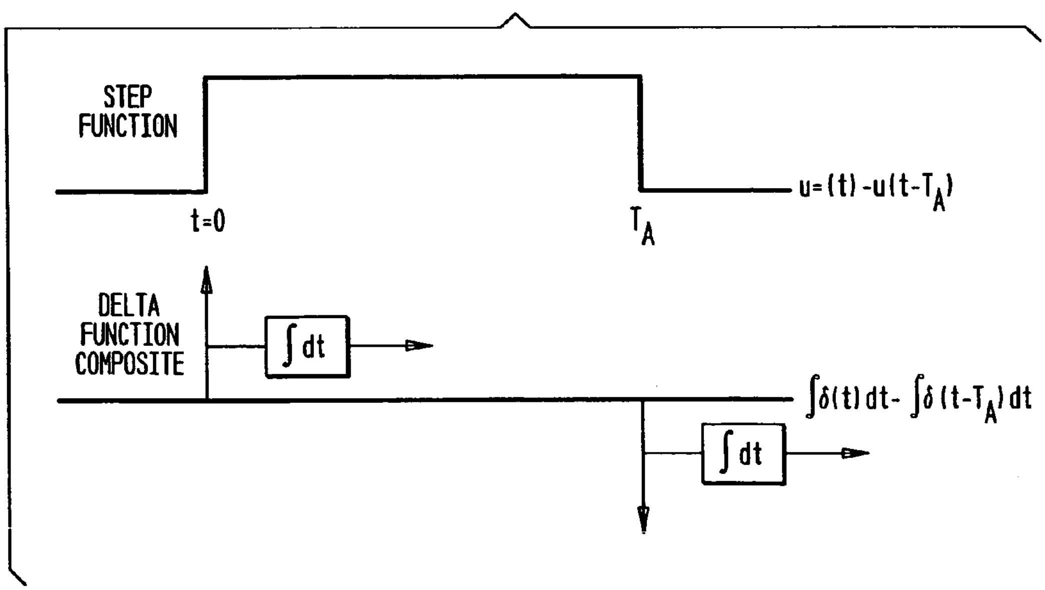

FIG. 58 illustrates the relationship of a step function and delta functions.

Figures 59, 60:
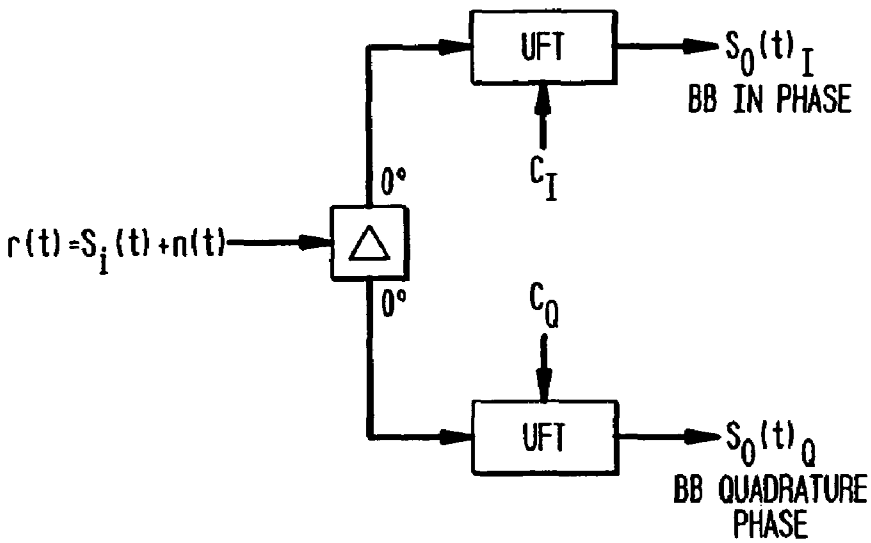

FIG. 59 illustrates an embodiment of a receiver with bandpass filter for complex down-converting of the present invention.

FIG. 60 illustrates Fourier transforms used to analyze a clock embodiment in accordance with the present invention.

Figure 61:
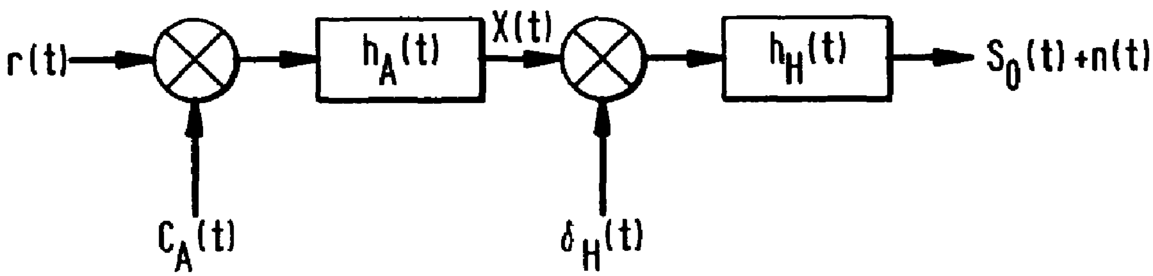

FIG. 61 illustrates an acquistion and hold processor according to an embodiment of the present invention.

Figure 62:
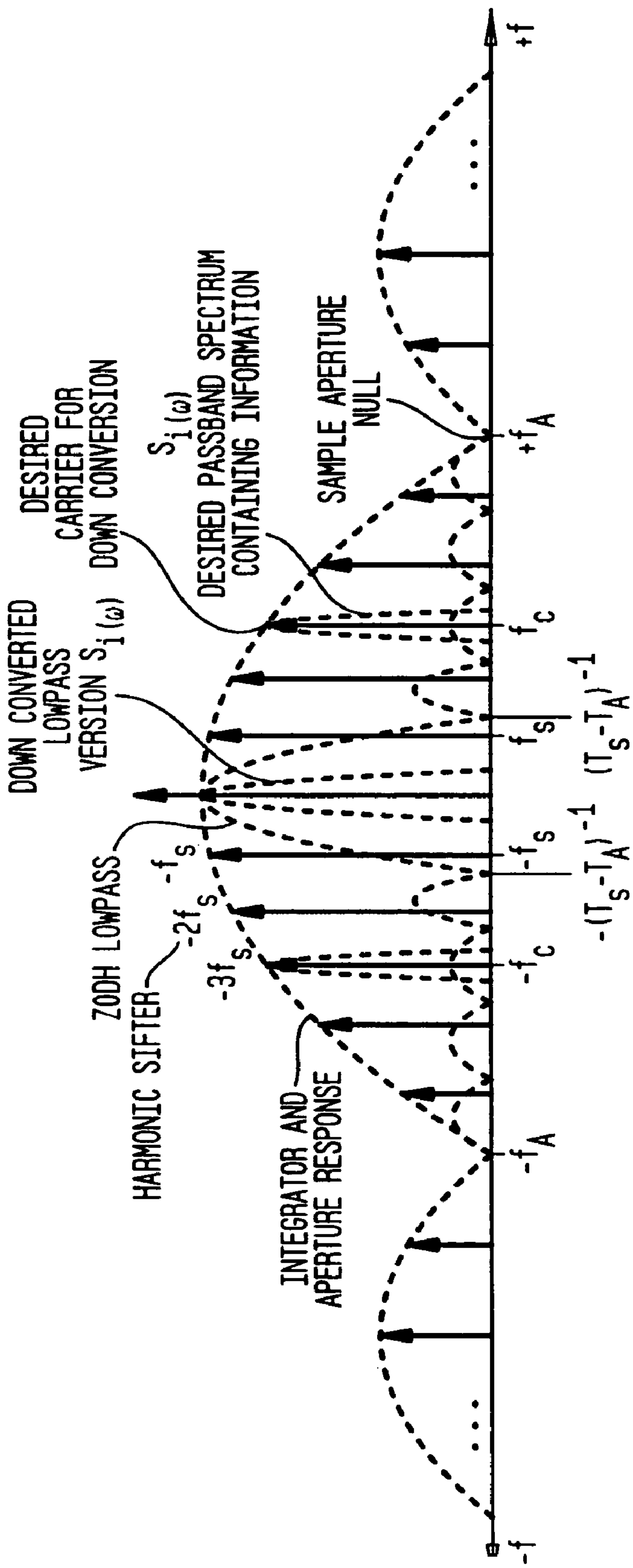
Figure 63:
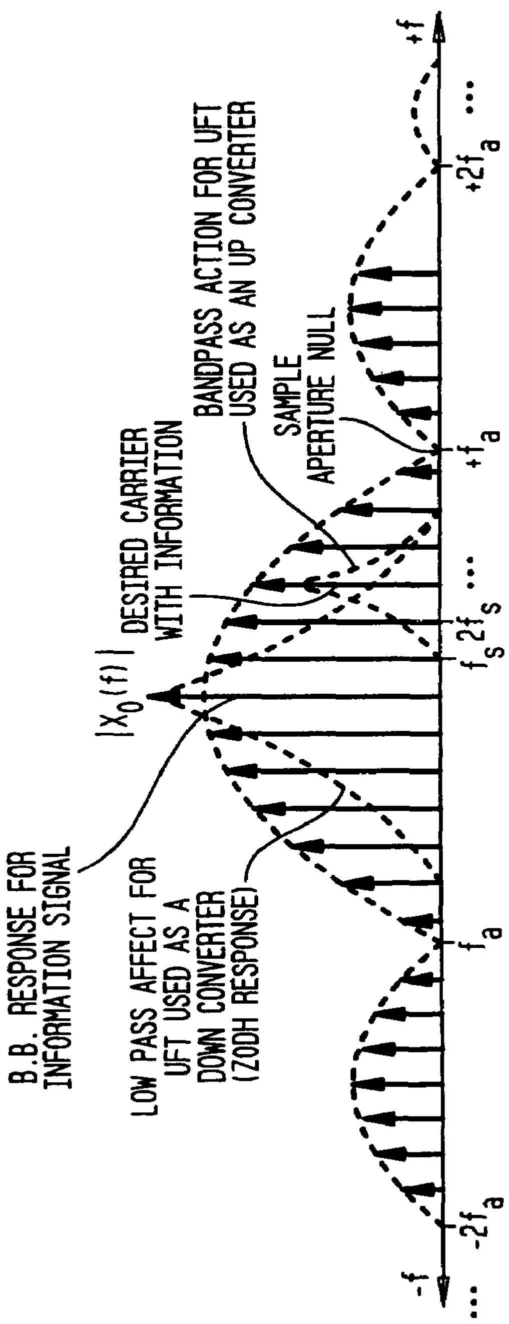

FIGS. 62-63 illustrate frequency representations of transforms according to an embodiment of the present invention.

Figure 64:
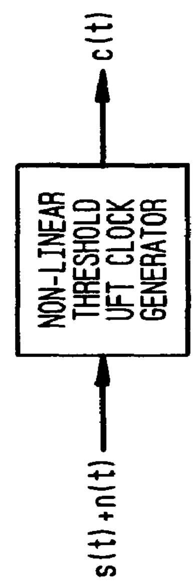

FIG. 64 illustrates an example clock generator.

Figure 65:
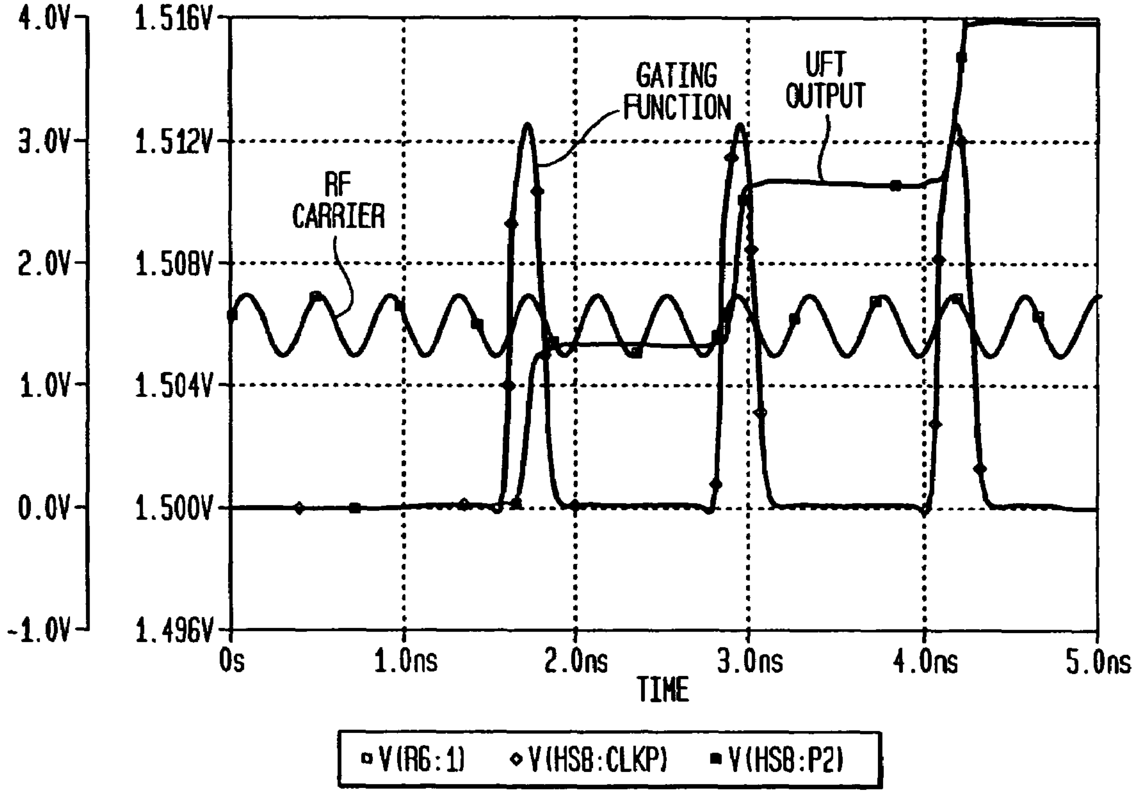

FIG. 65 illustrates the down-conversion of an electromagnetic signal according to an embodiment of the present invention.

Figure 66:
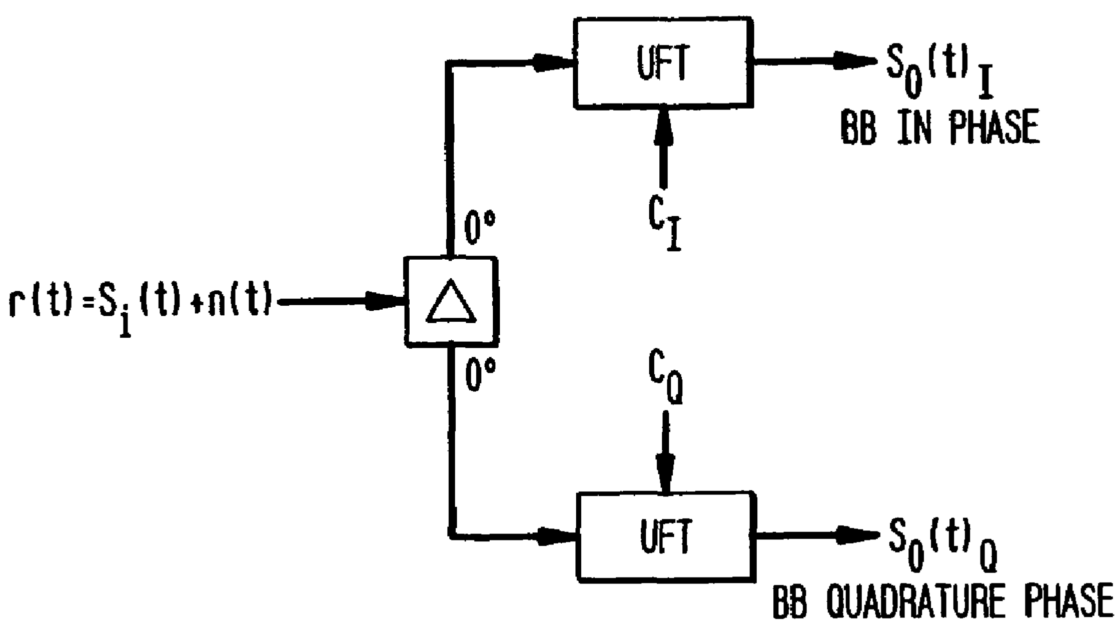

FIG. 66 illustrates a receiver according to an embodiment of the present invention.

Figure 67:
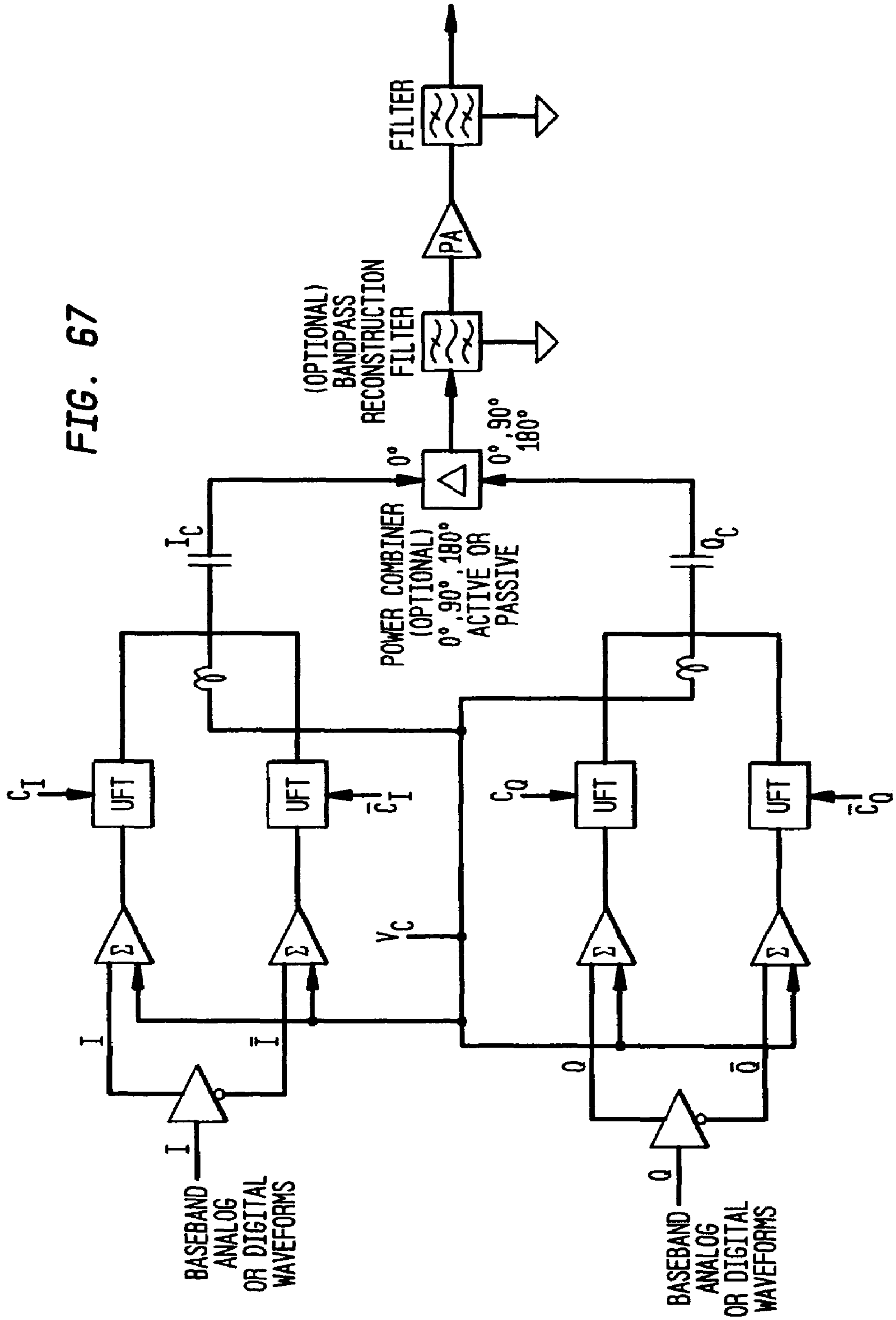

FIG. 67 illustrates a vector modulator according to an embodiment of the present invention.

Figure 68:
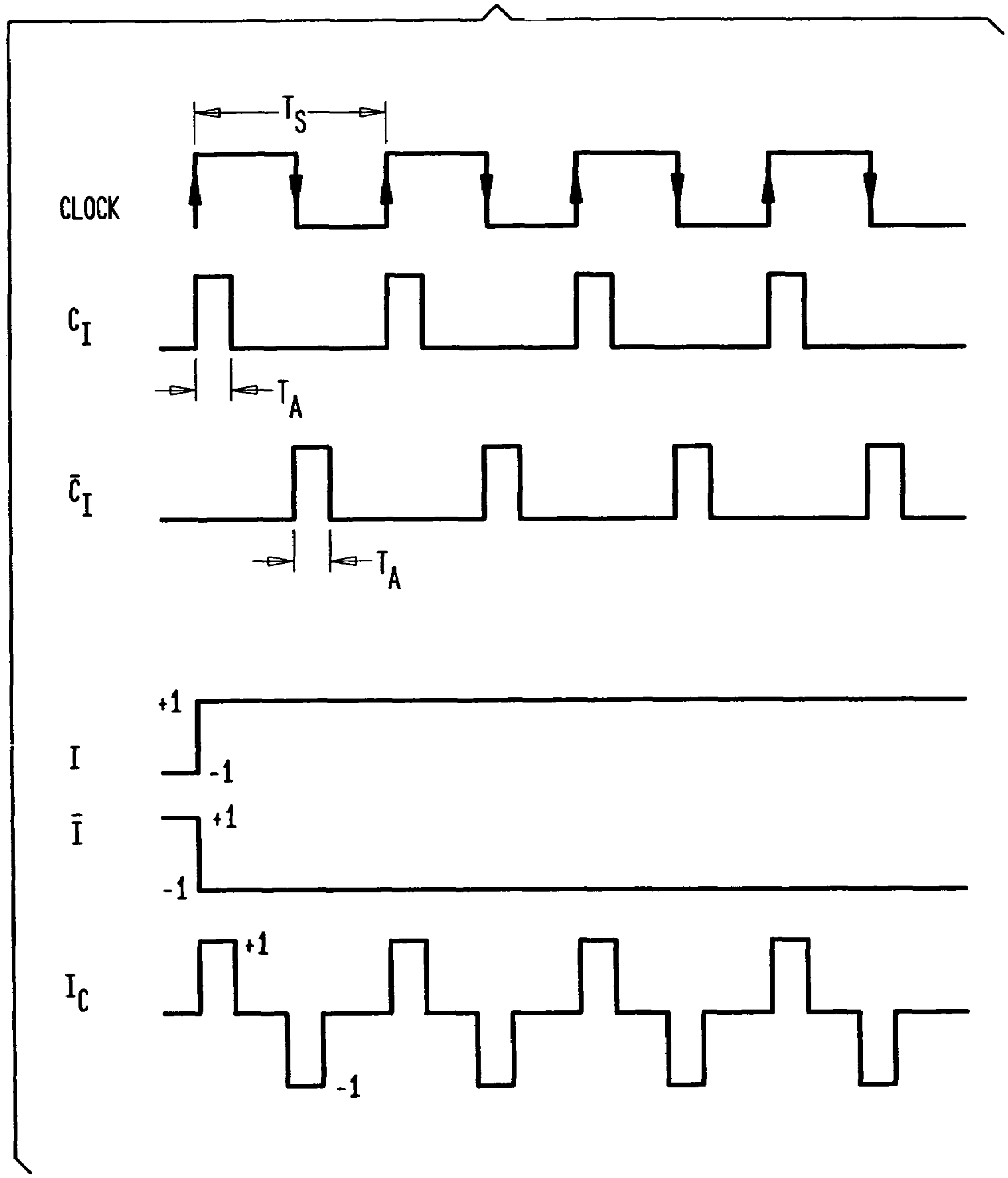

FIG. 68 illustrates example waveforms for the vector modulator of FIG. 67.

Figure 69:
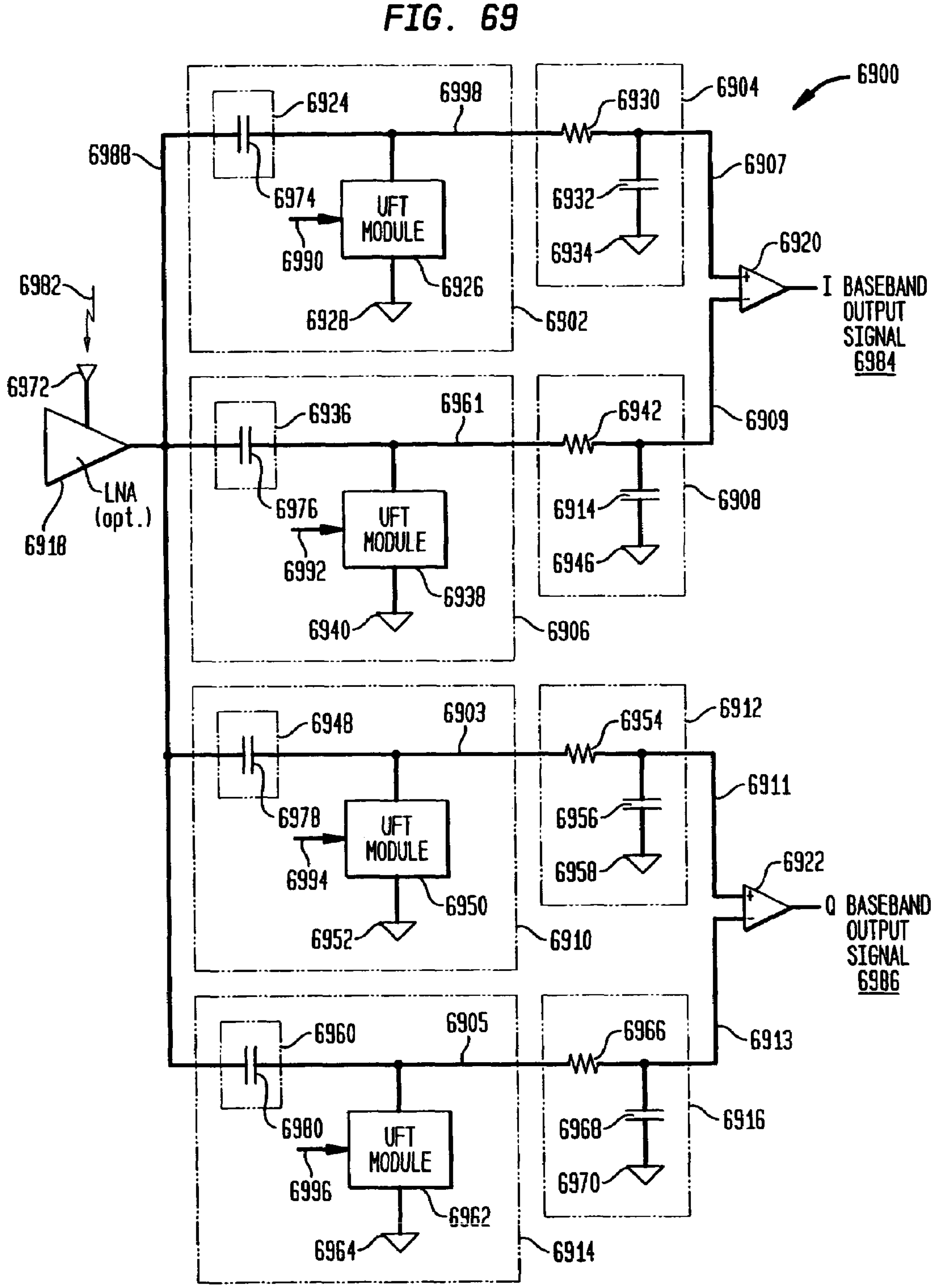

FIG. 69 illustrates an exemplary I/Q modulation receiver, according to an embodiment of the present invention.

Figure 70:
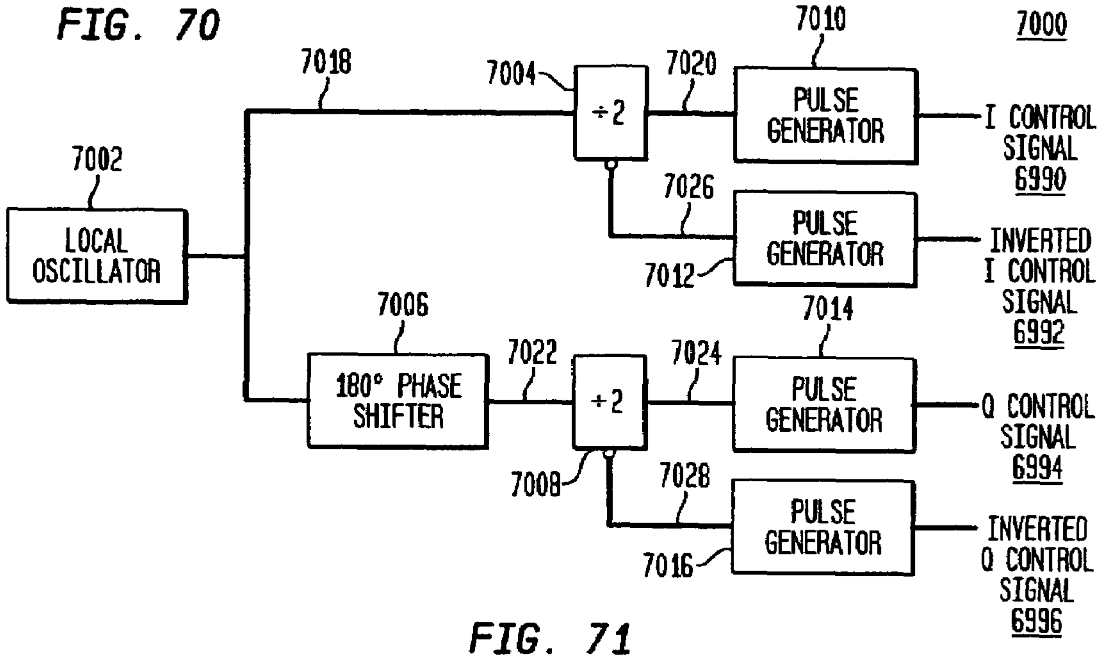

FIG. 70 illustrates a I/Q modulation control signal generator, according to an embodiment of the present invention.

Figure 71:
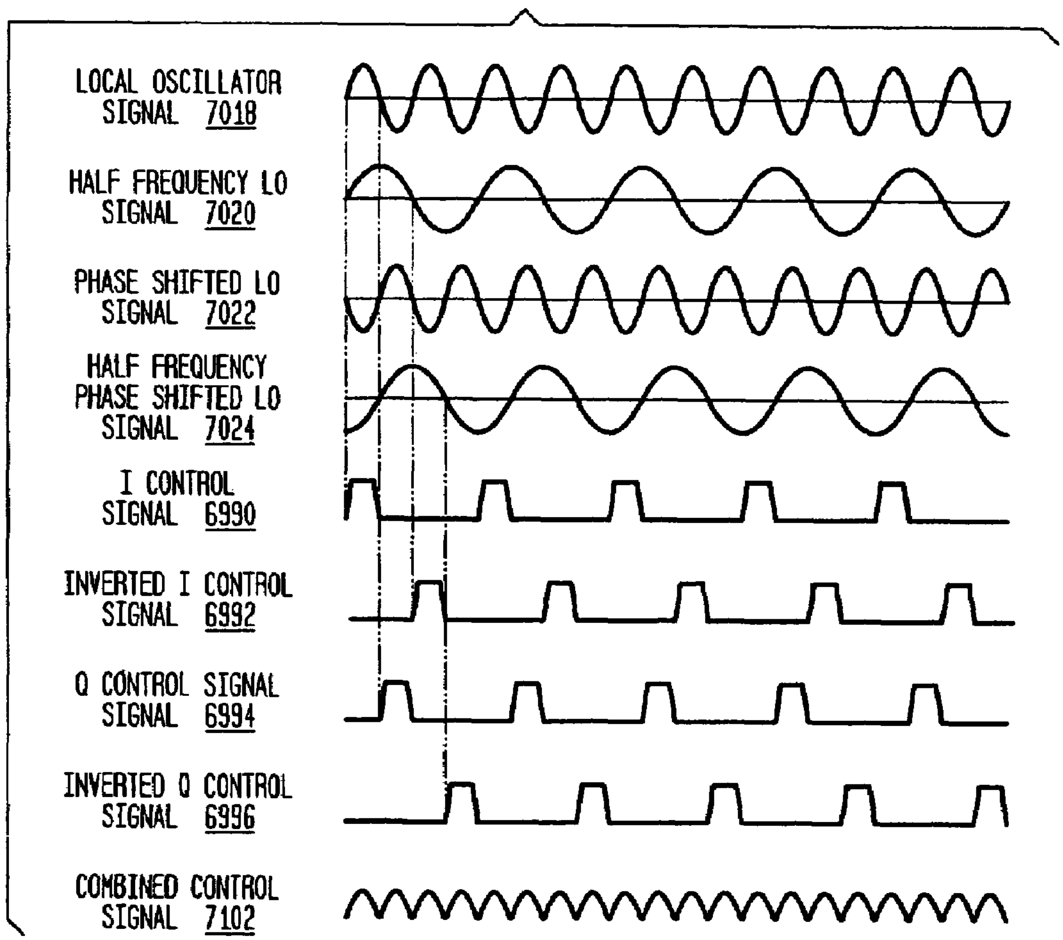

FIG. 71 illustrates example waveforms related to the I/Q modulation control signal generator of FIG. 70.

Figure 72:
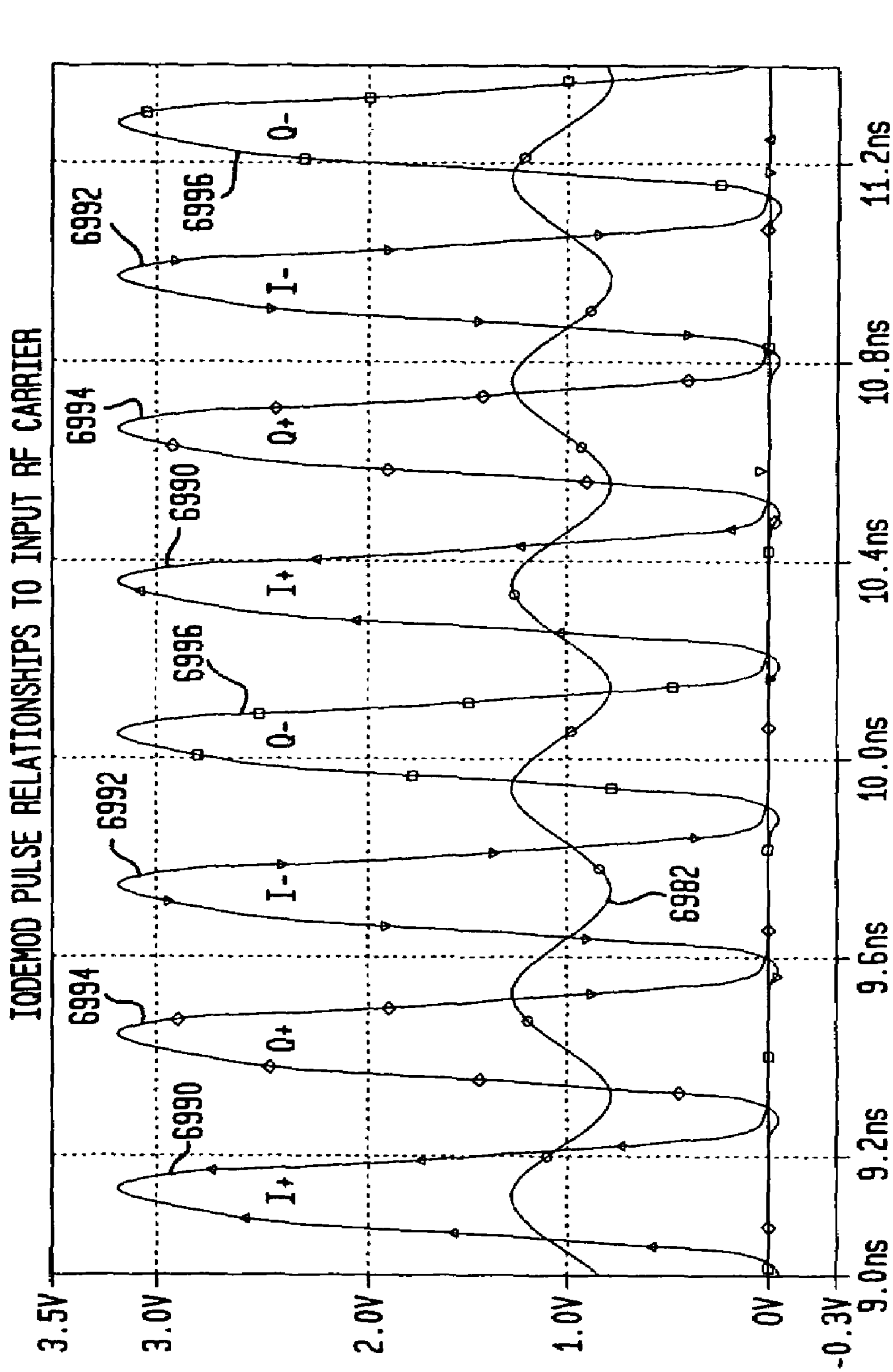

FIG. 72 illustrates example control signal waveforms overlaid upon an example input RF signal.

Figure 73:
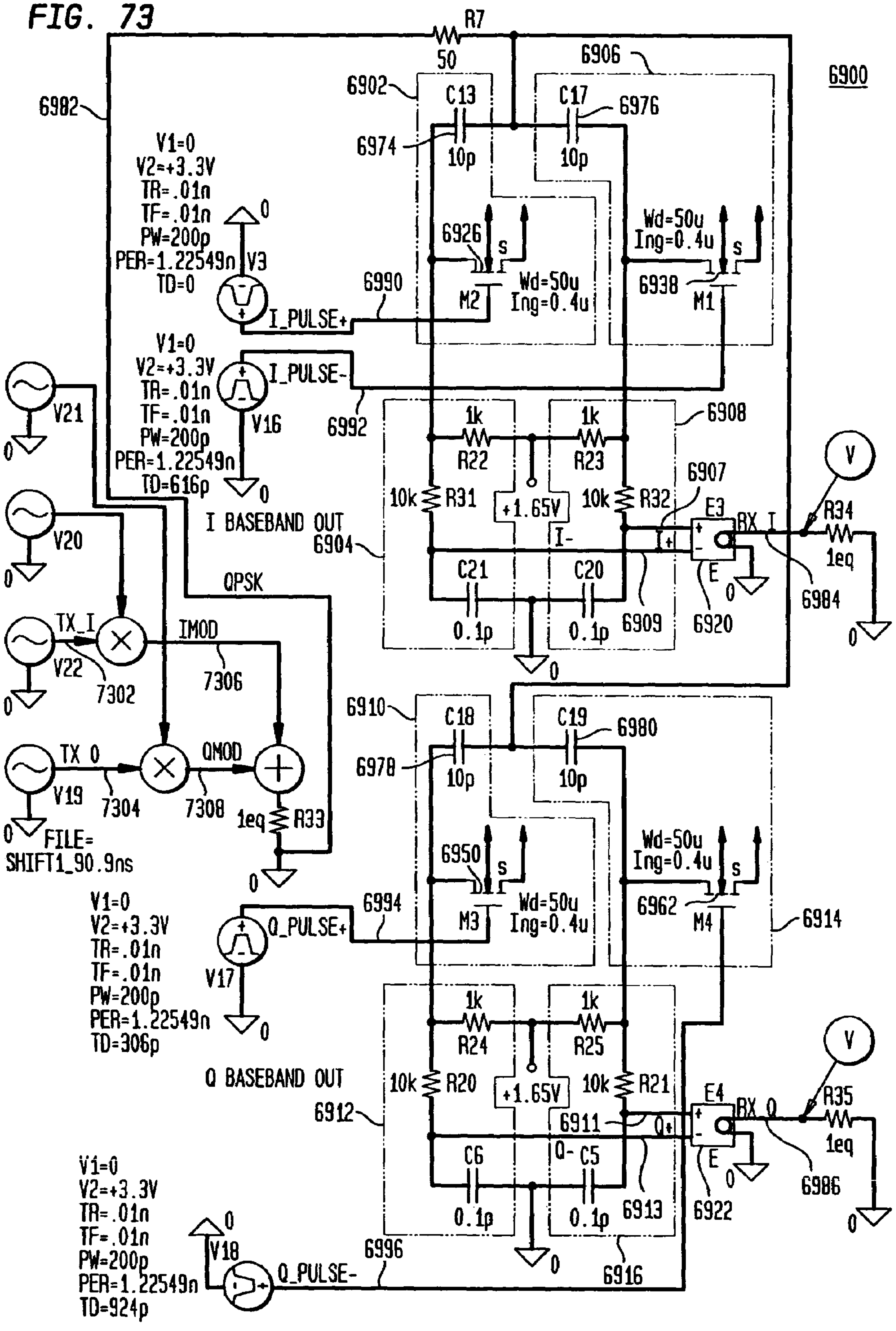

FIG. 73 illustrates a I/Q modulation receiver circuit diagram, according to an embodiment of the present invention.

FIGS. 74-84 illustrate example waveforms related to a receiver implemented in accordance with the present invention.

Figure 85:
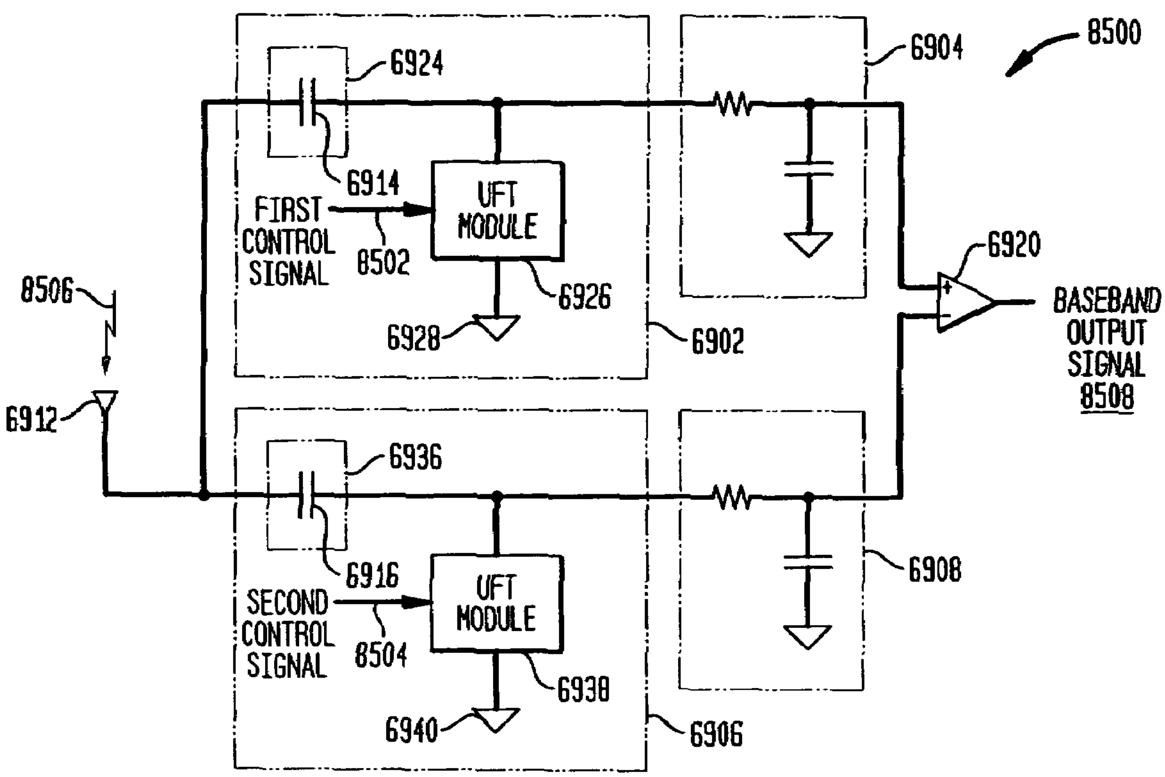

FIG. 85 illustrates a single channel receiver, according to an embodiment of the present invention.

Figure 86:
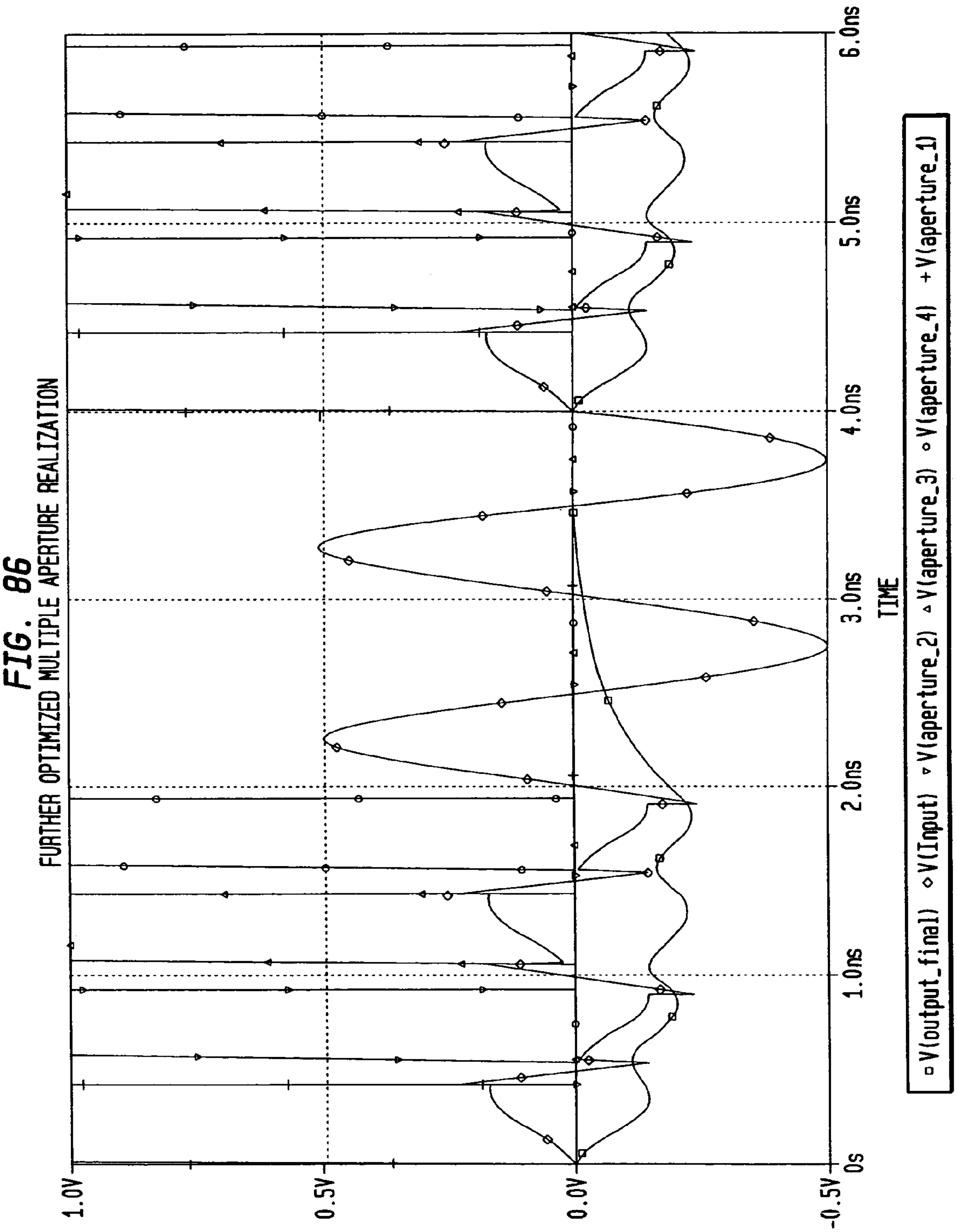
Figure 153:
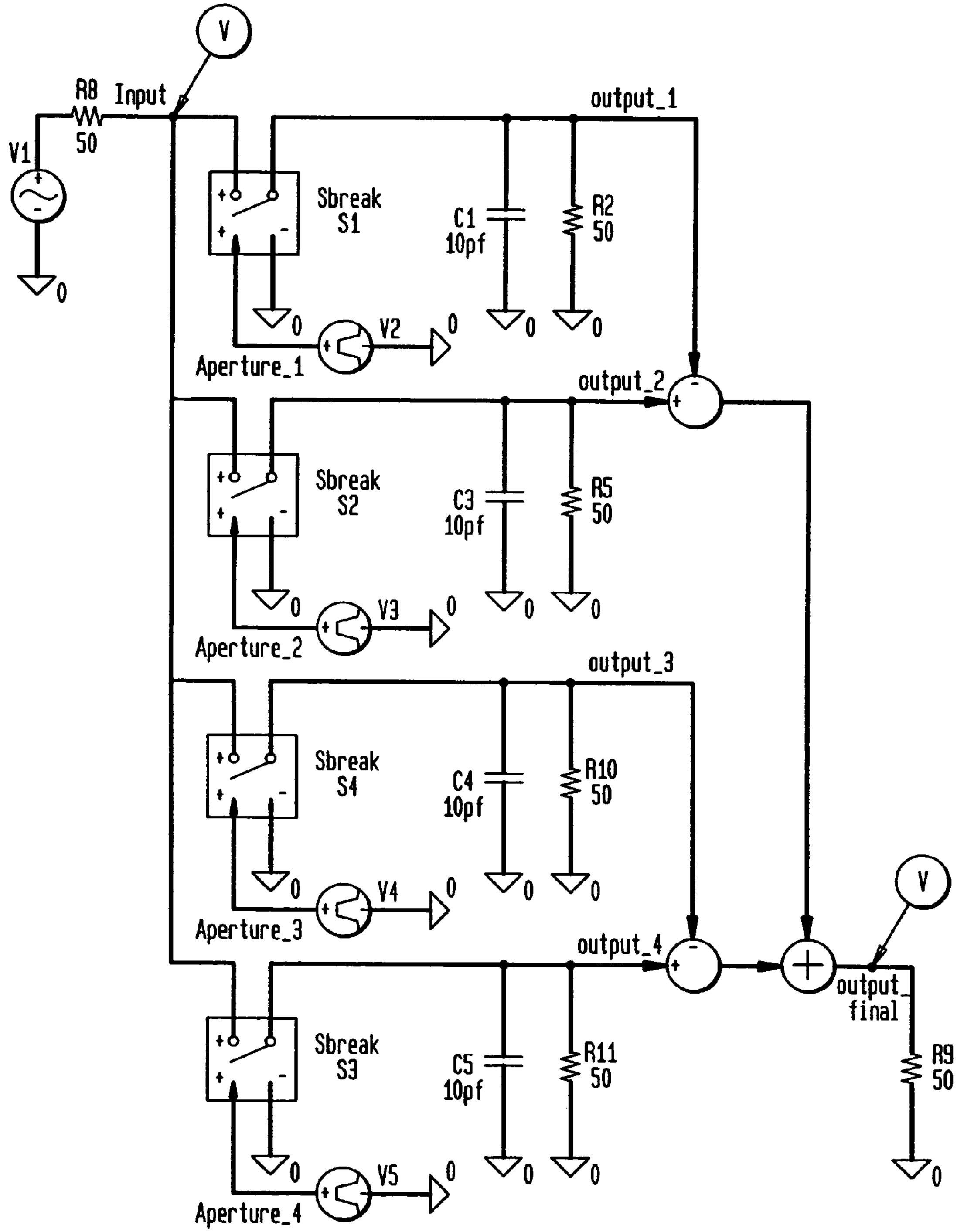

FIG. 86 illustrates exemplary waveforms associated with quad aperture implementations of the receiver of FIG. 153, according to embodiments of the present invention.

Figure 87:
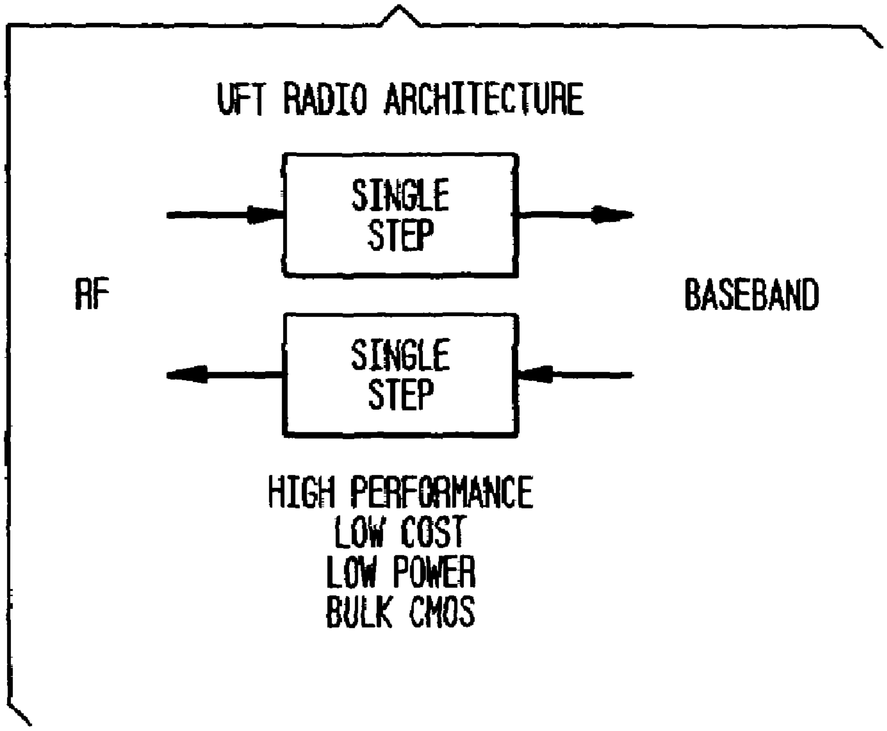

FIG. 87 illustrates a high-level example UFT module radio architecture, according to an embodiment of the present invention.

Figure 88:
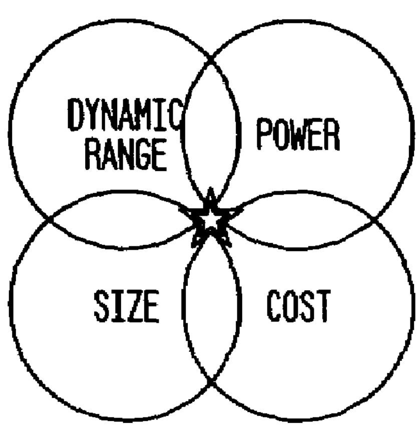

FIG. 88 illustrates wireless design considerations.

FIG. 89 illustrates noise figure calculations based on RMS voltage and current noise specifications.

Figure 90A:
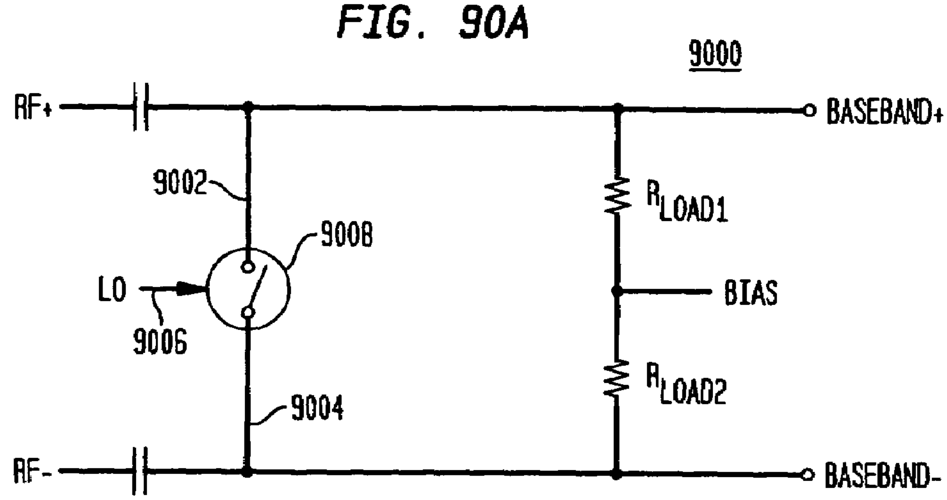

FIG. 90A illustrates an example differential input, differential output receiver configuration, according to an embodiment of the present invention.

Figure 90B:
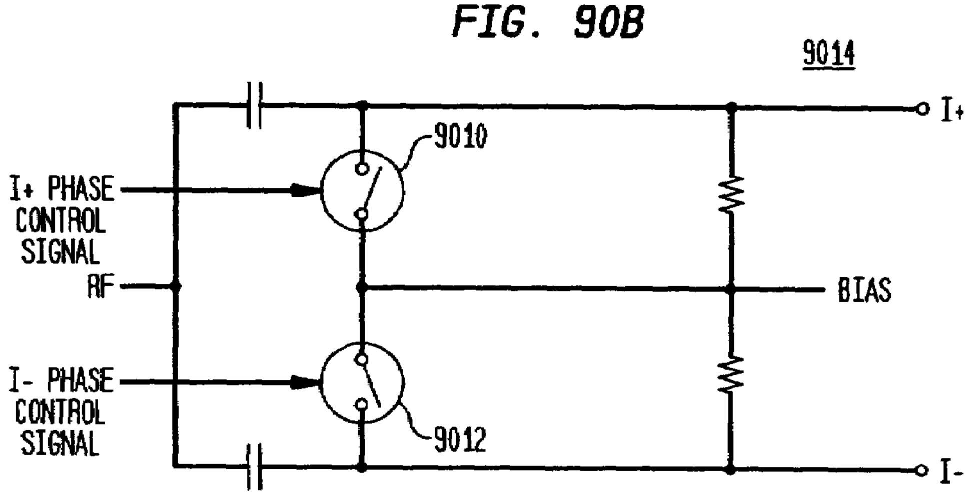

FIG. 90B illustrates a example receiver implementation, configured as an I-phase channel, according to an embodiment of the present invention.

Figure 90C:
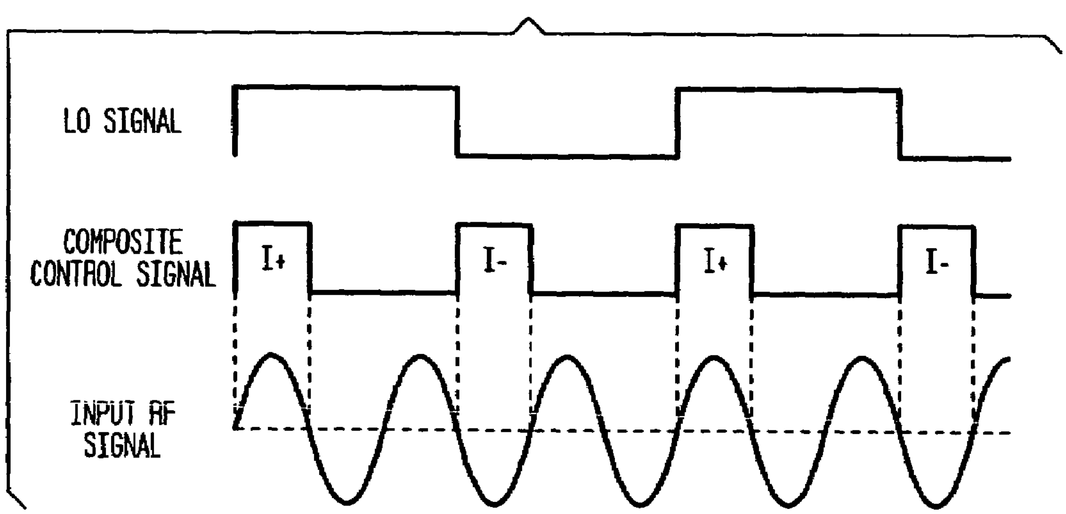

FIG. 90C illustrates example waveforms related to the receiver of FIG. 90B.

Figure 90D:
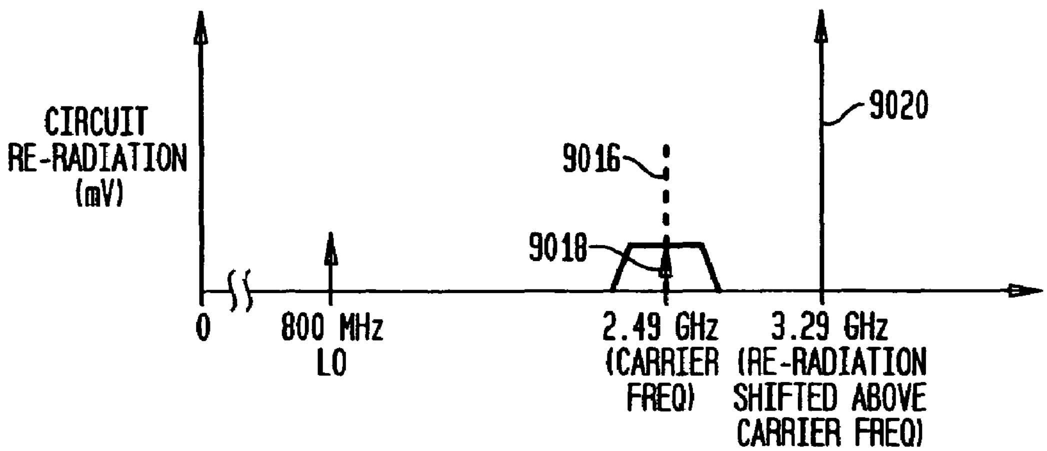

FIG. 90D illustrates an example re-radiation frequency spectrum related to the receiver of FIG. 90B, according to an embodiment of the present invention.

Figure 90F:
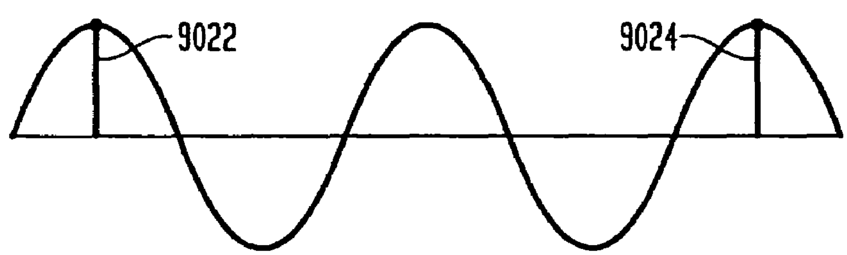
Figure 90G:
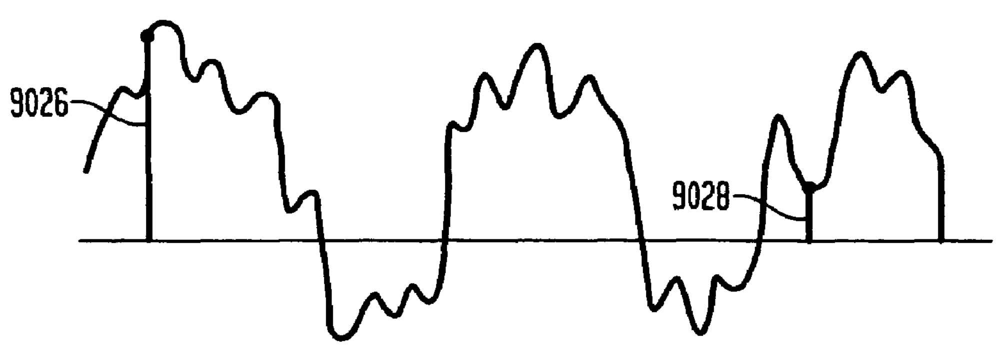
Figure 90E:
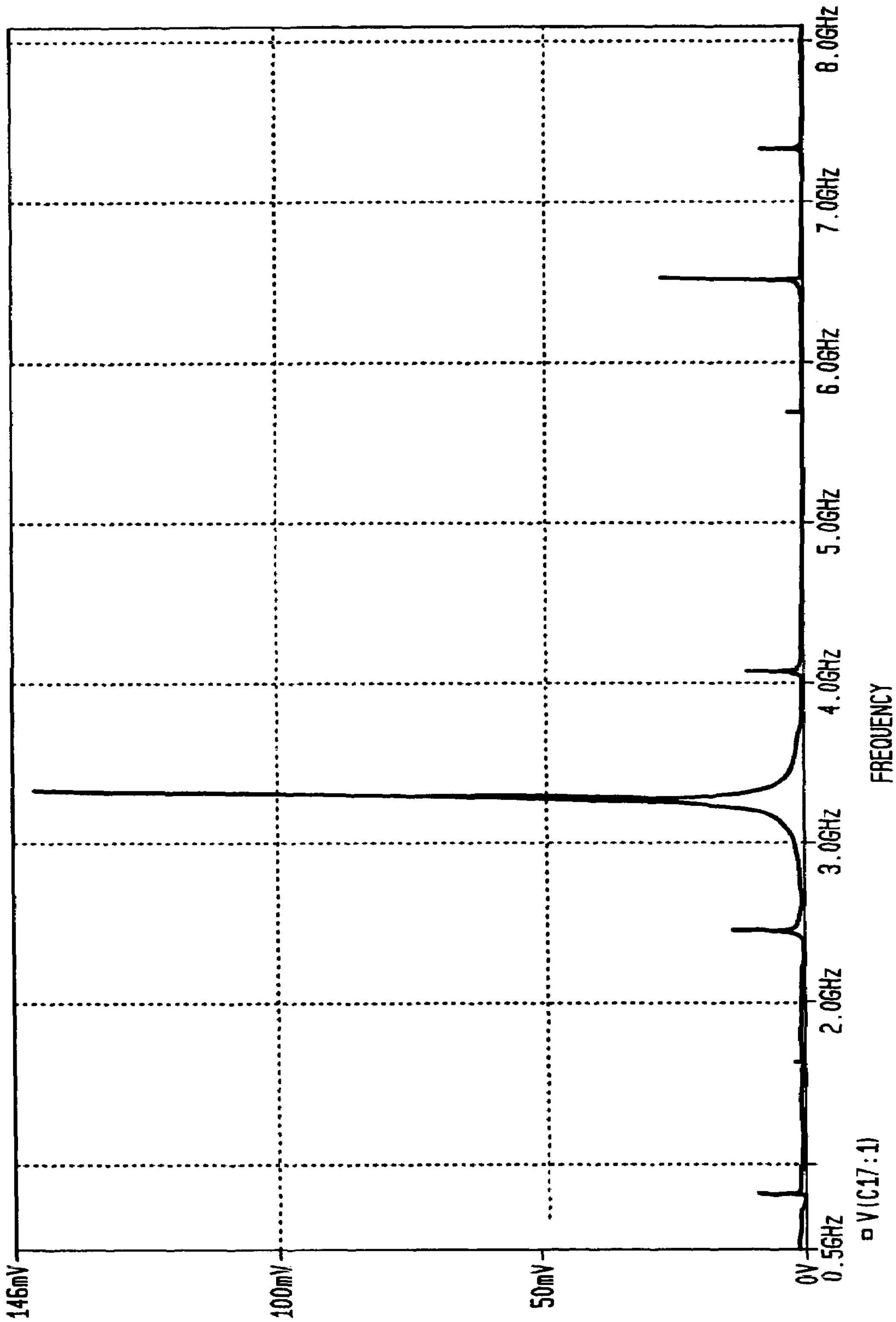

FIG. 90E illustrates an example re-radiation frequency spectral plot related to the receiver of FIG. 90B, according to an embodiment of the present invention.

FIG. 90F illustrates example impulse sampling of an input signal.

FIG. 90G illustrates example impulse sampling of an input signal in a environment with more noise relative to that of FIG. 90F.

Figure 91:
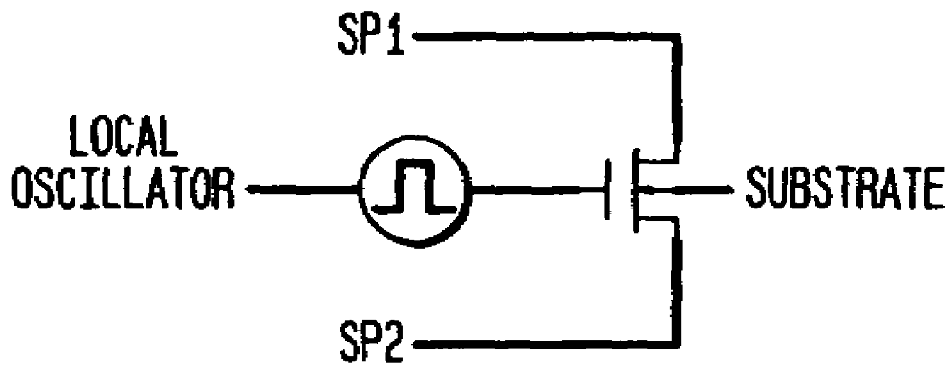

FIG. 91 illustrates an example integrated circuit conceptual schematic, according to an embodiment of the present invention.

Figure 92:
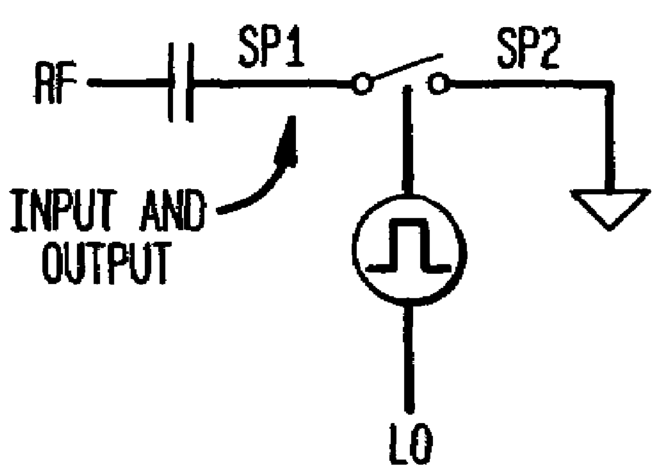

FIG. 92 illustrates an example receiver circuit architecture, according to an embodiment of the present invention.

Figure 93:
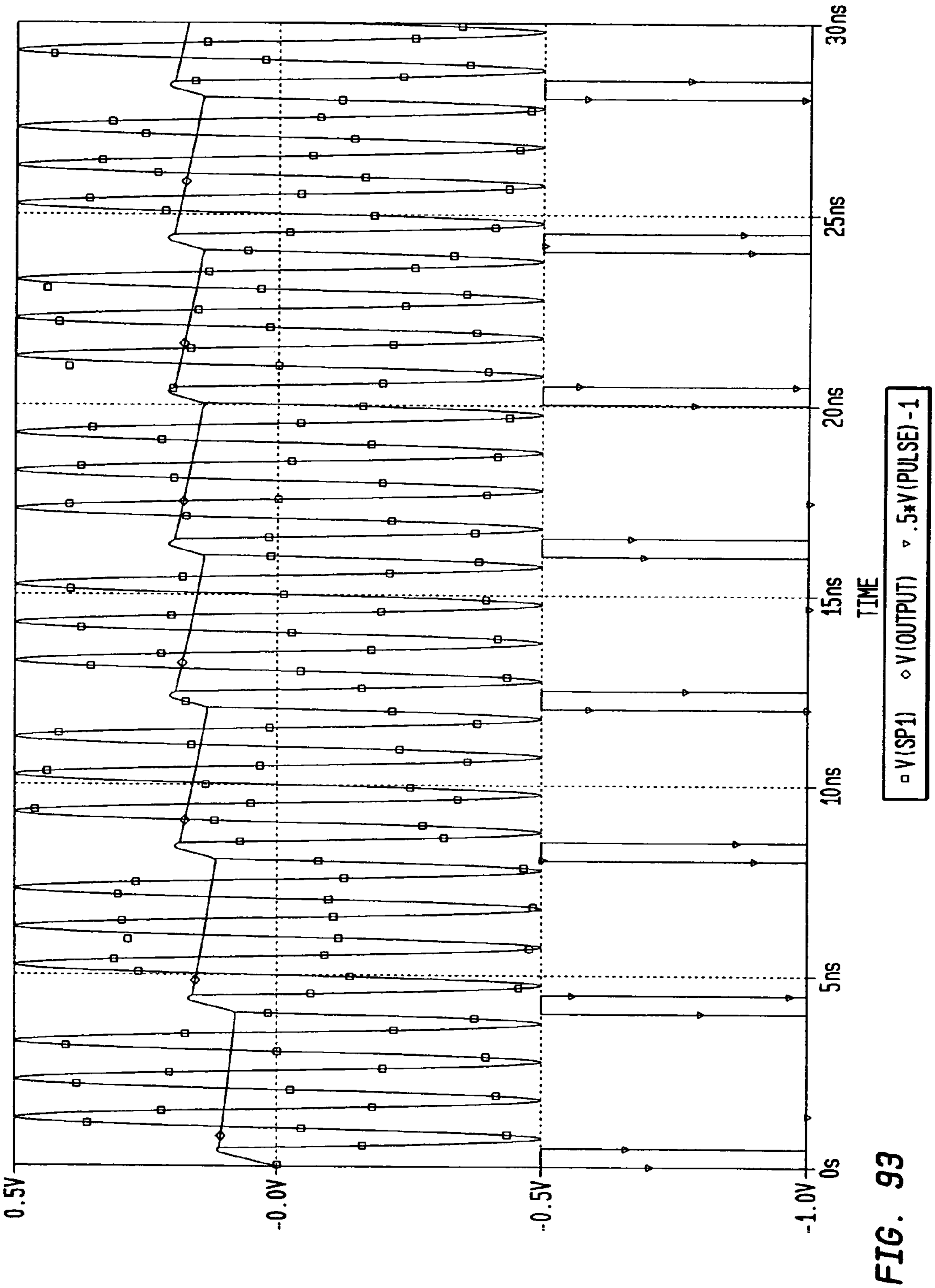

FIG. 93 illustrates example waveforms related to the receiver of FIG. 92, according to an embodiment of the present invention.

FIG. 94 illustrates DC equations, according to an embodiment of the present invention.

FIG. 95 illustrates an example receiver circuit, according to an embodiment of the present invention.

Figure 96:
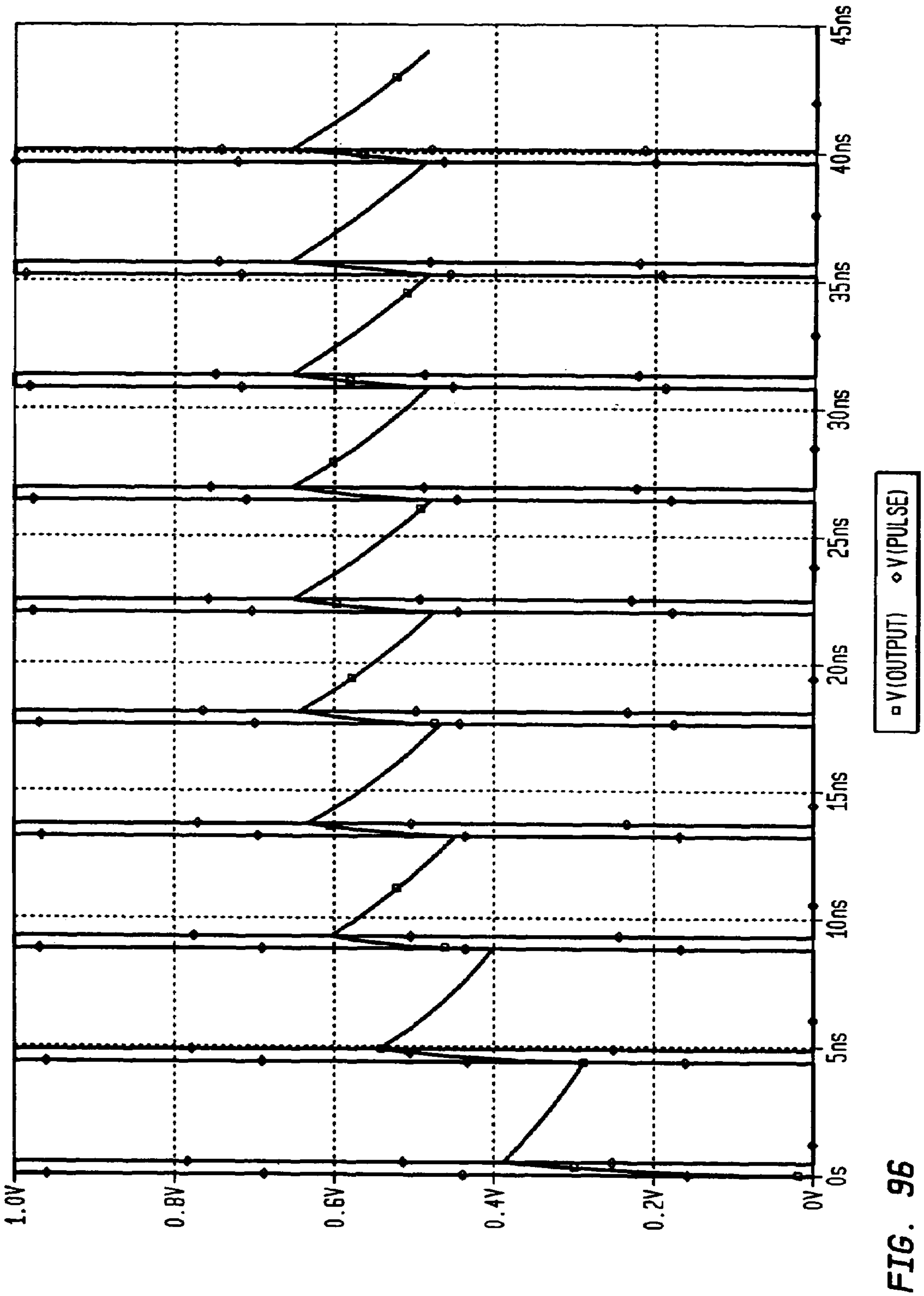

FIG. 96 illustrates example waveforms related to the receiver of FIG. 95.

Figure 97:
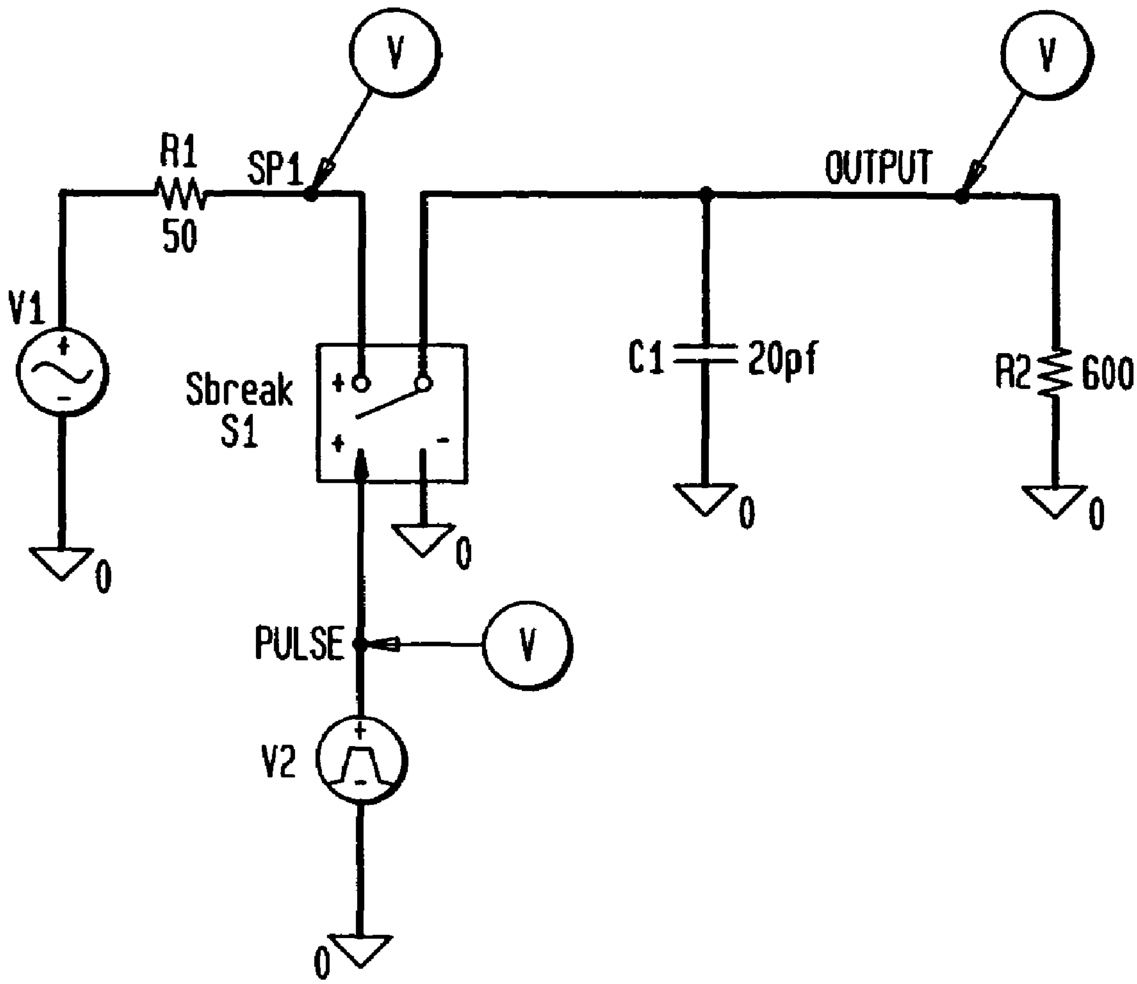

FIG. 97 illustrates an example receiver circuit, according to an embodiment of the present invention.

Figure 98:
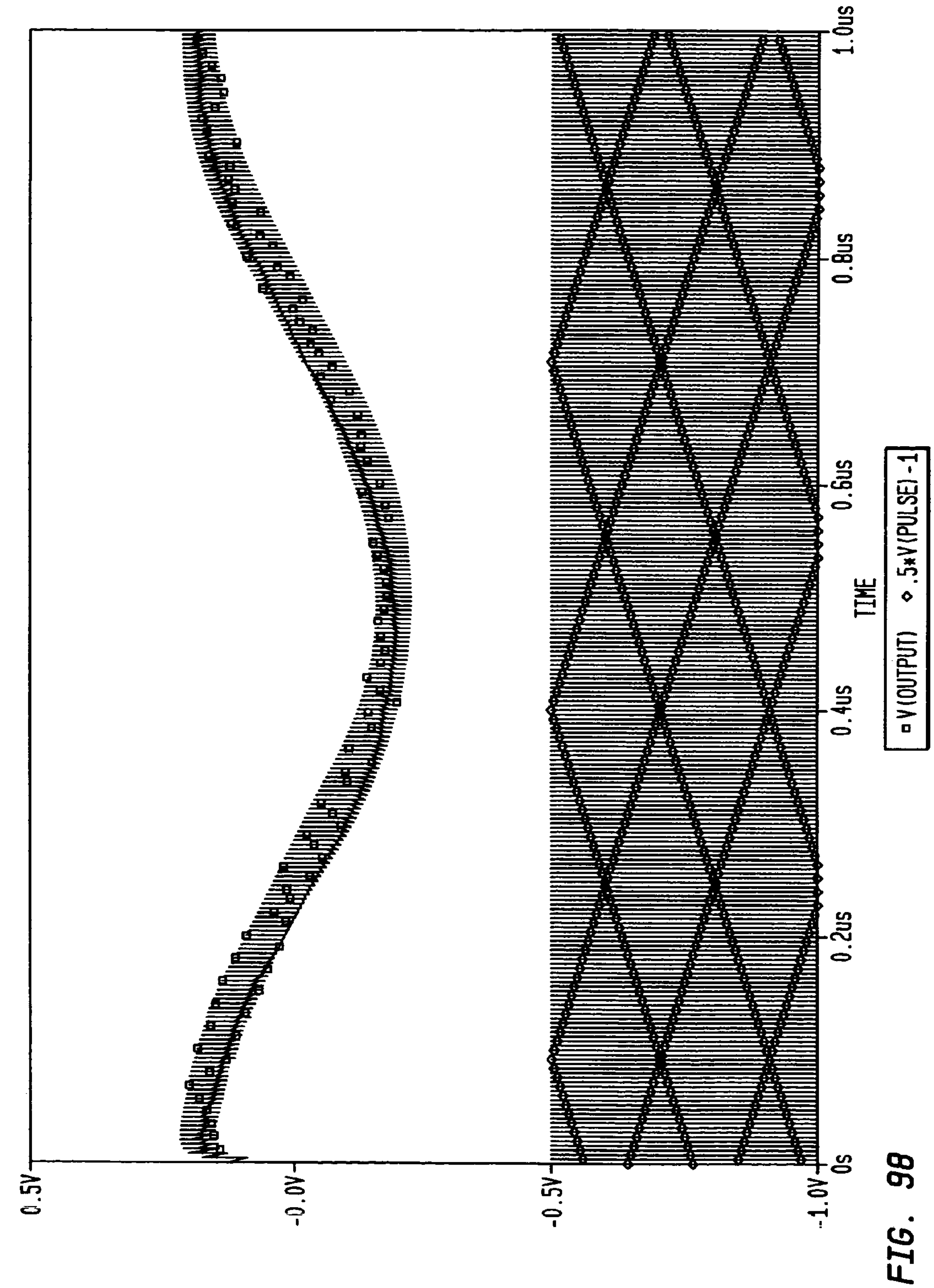
Figure 99:
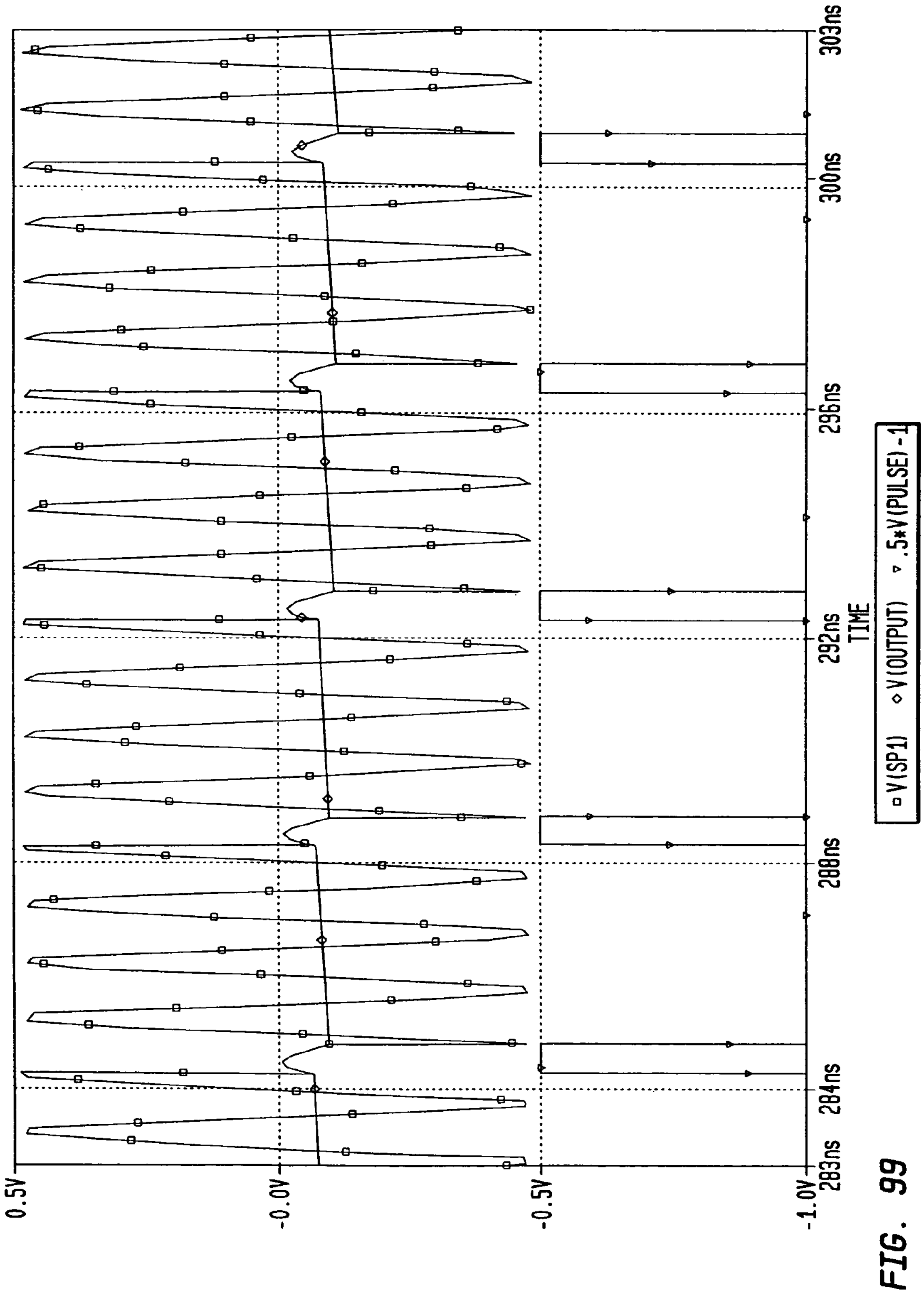

FIGS. 98 and 99 illustrate example waveforms related to the receiver of FIG. 97.

Figures 102, 103:
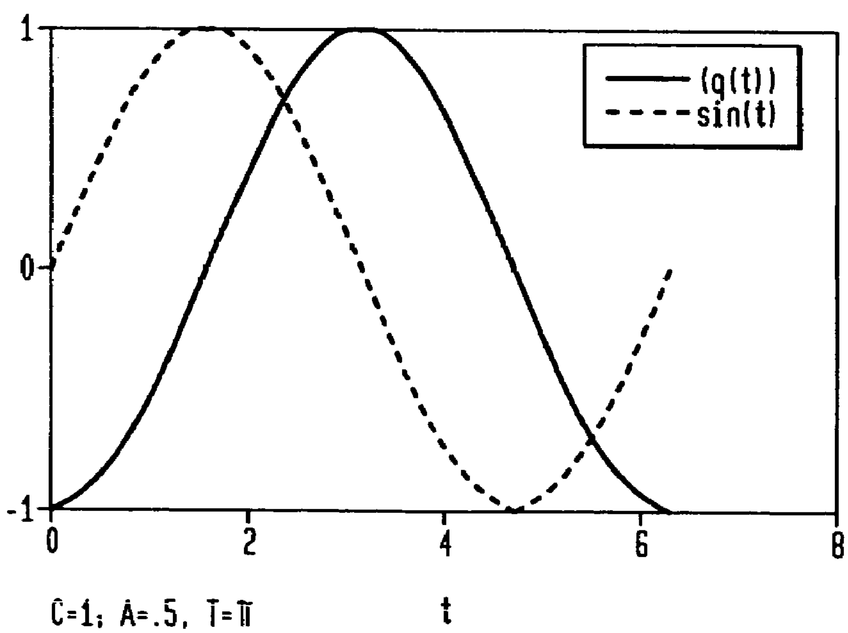

FIGS. 100-102 illustrate equations and information related to charge transfer.

FIG. 103 illustrates a graph related to the equations of FIG. 102.

Figure 104:
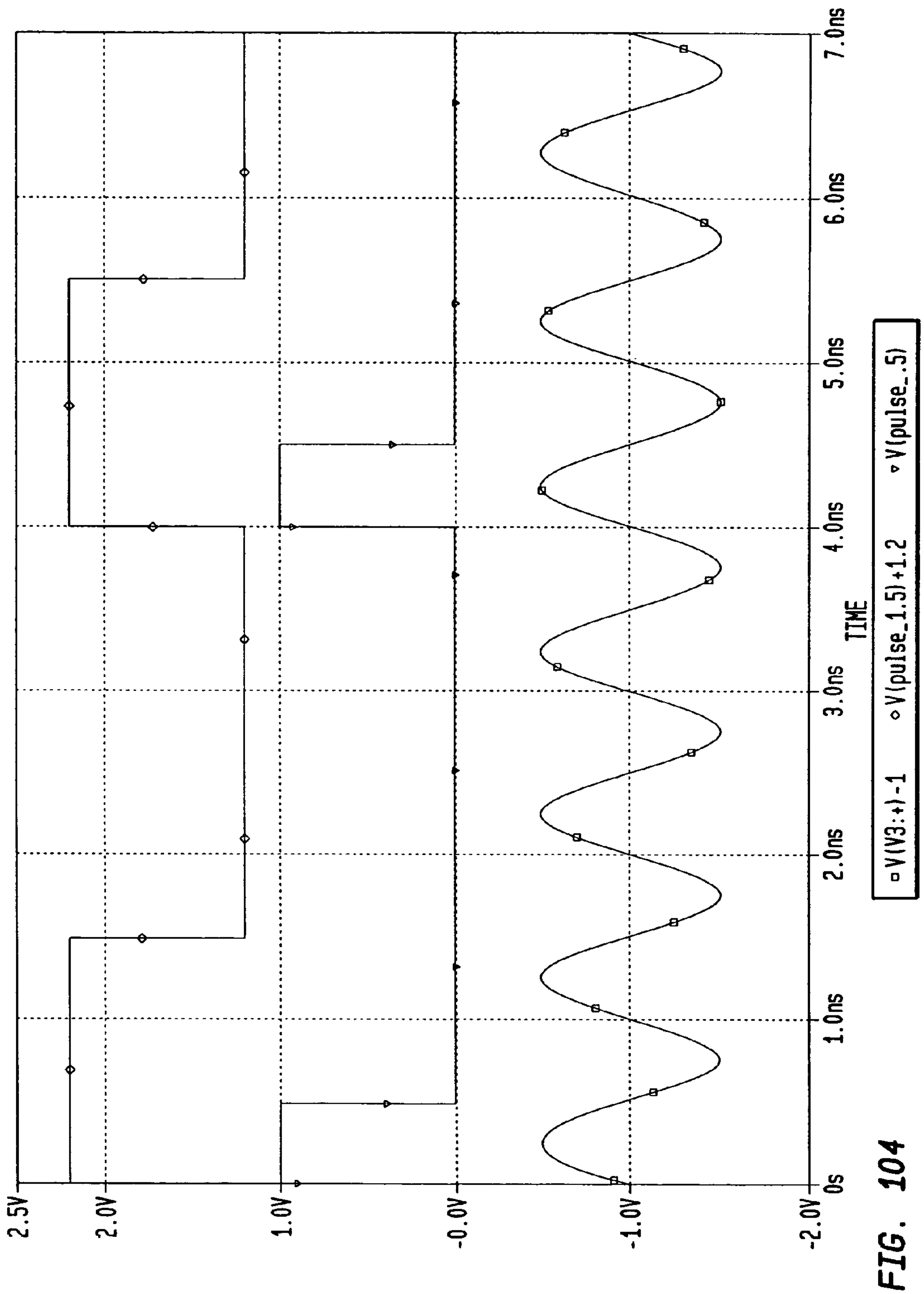

FIG. 104 illustrates example control signal waveforms and an example input signal waveform, according to embodiments of the present invention.

Figure 105:
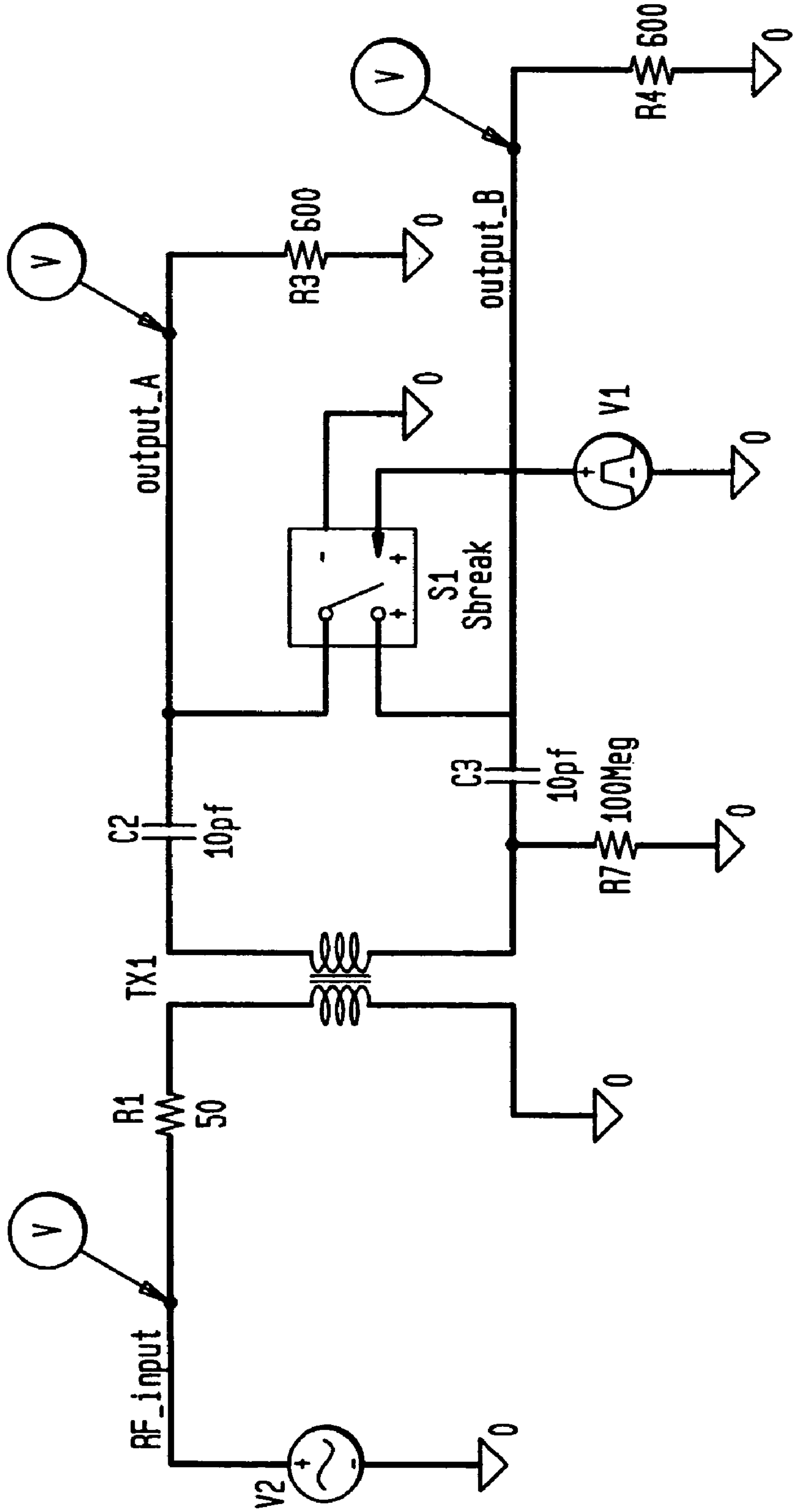

FIG. 105 illustrates an example differential output receiver, according to an embodiment of the present invention.

Figure 106:
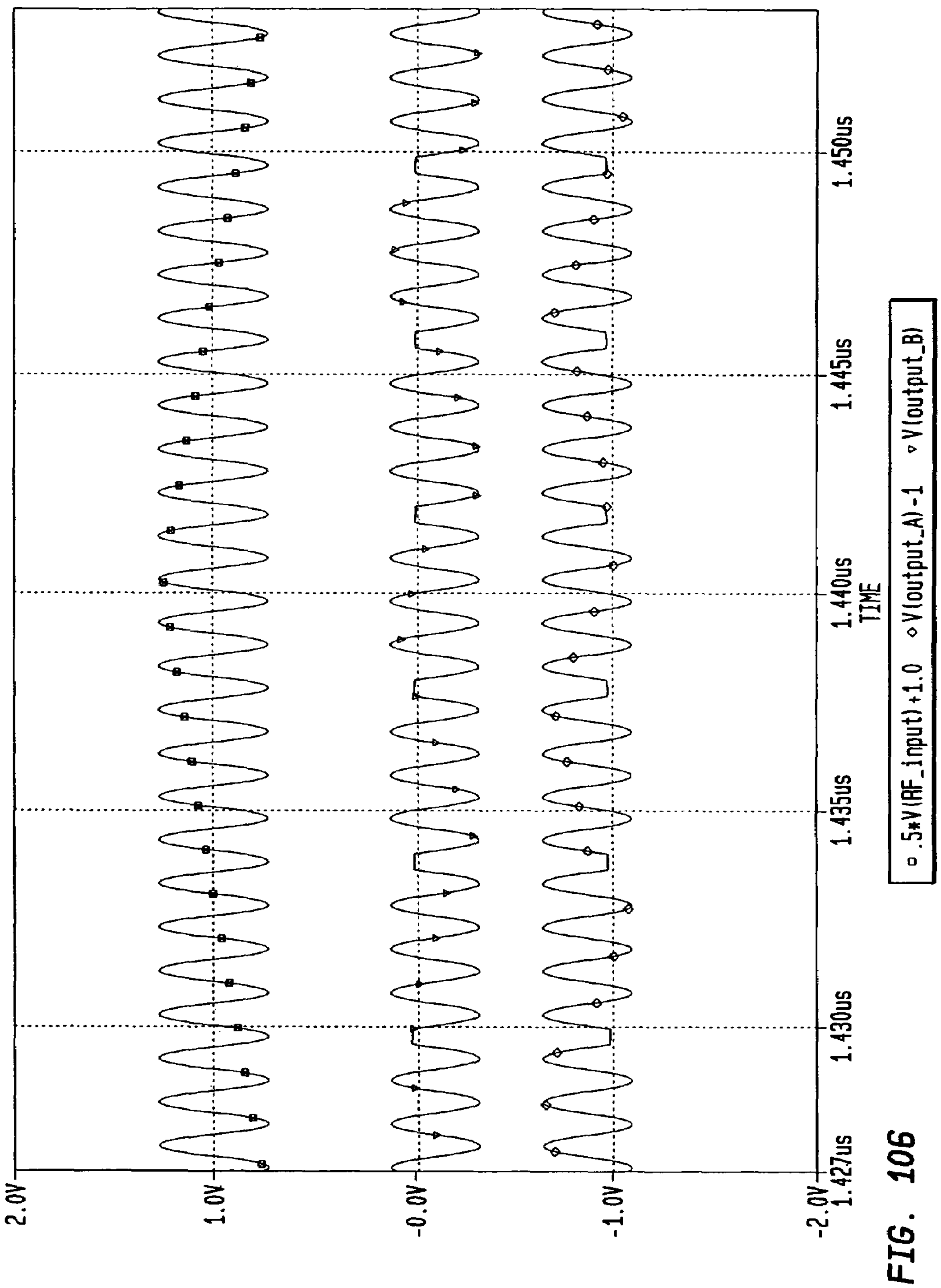

FIG. 106 illustrates example waveforms related to the receiver of FIG. 105.

Figure 107:
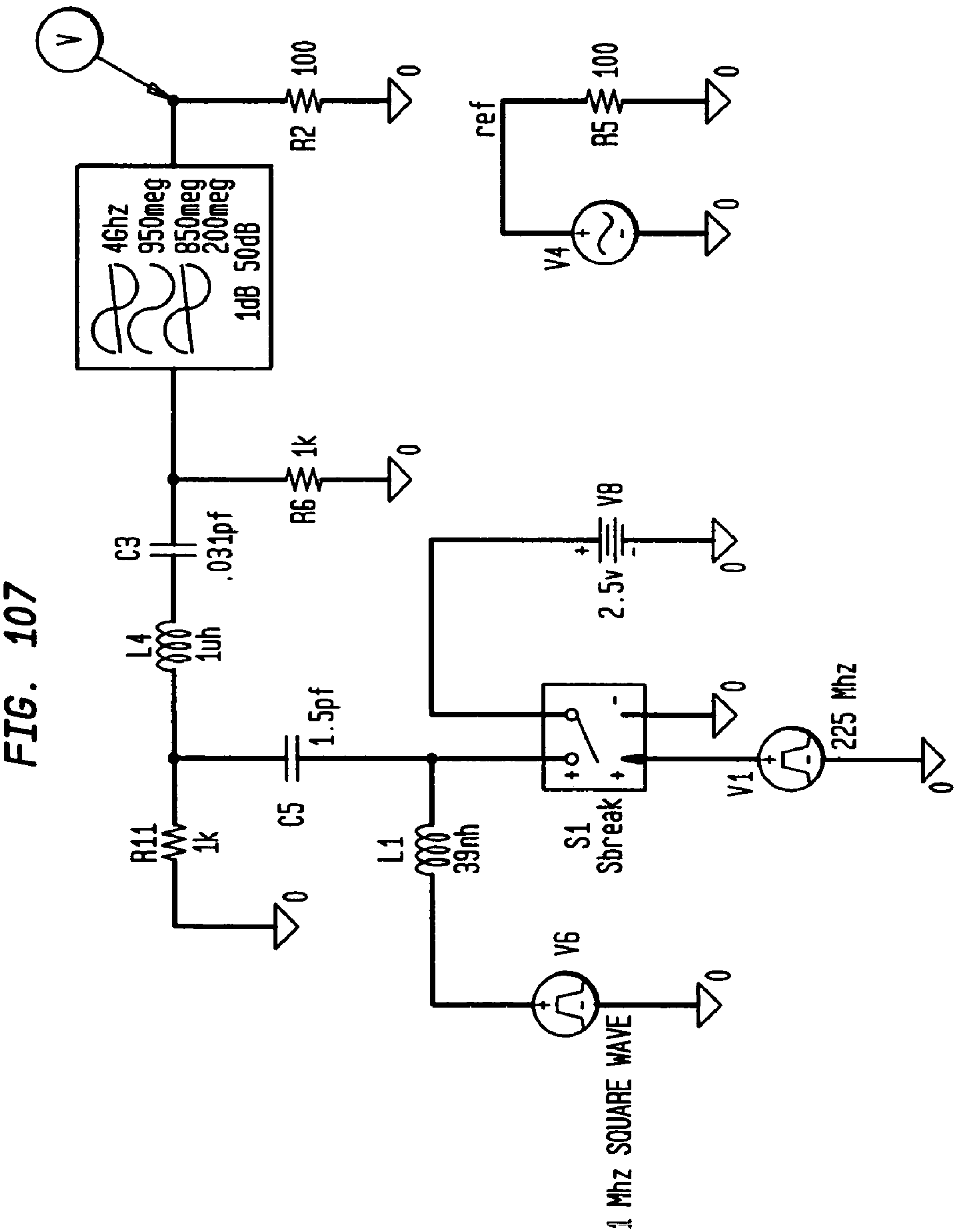

FIG. 107 illustrates an example transmitter circuit, according to an embodiment of the present invention.

Figure 108:
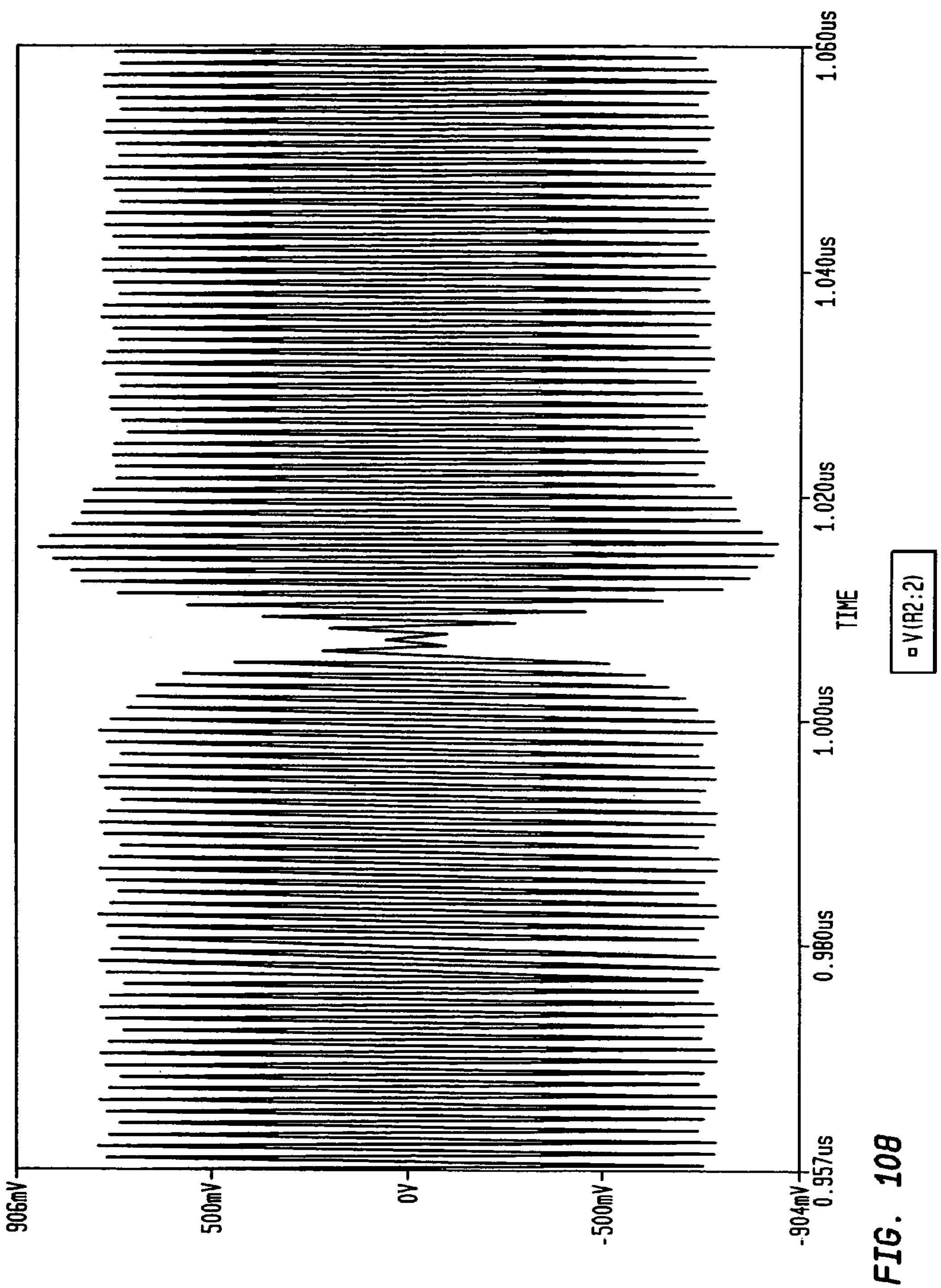

FIG. 108 illustrates example waveforms related to the transmitter of FIG. 107.

Figure 109:
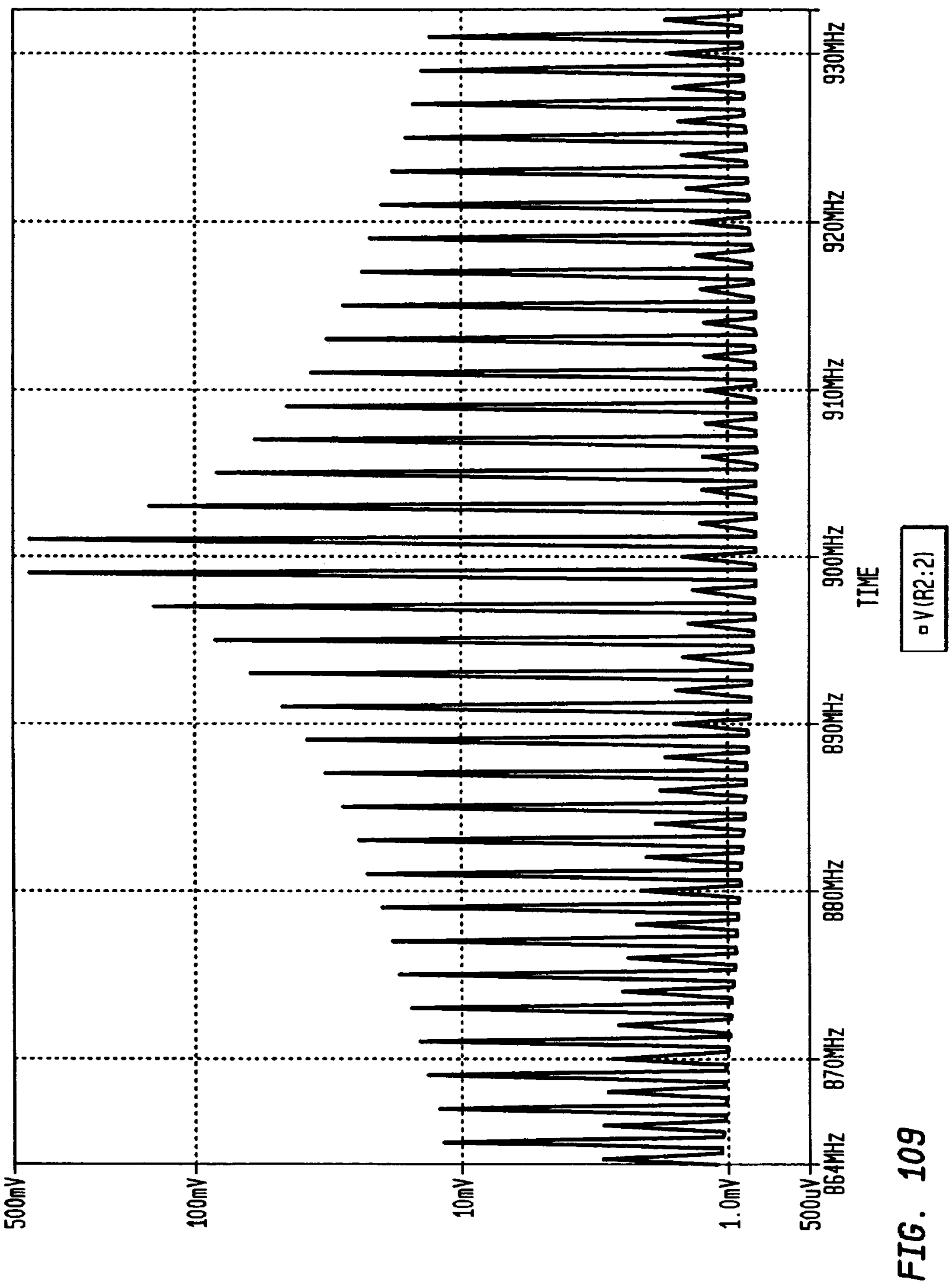

FIG. 109 illustrates an example frequency spectrum related to the transmitter of FIG. 107.

Figure 110:
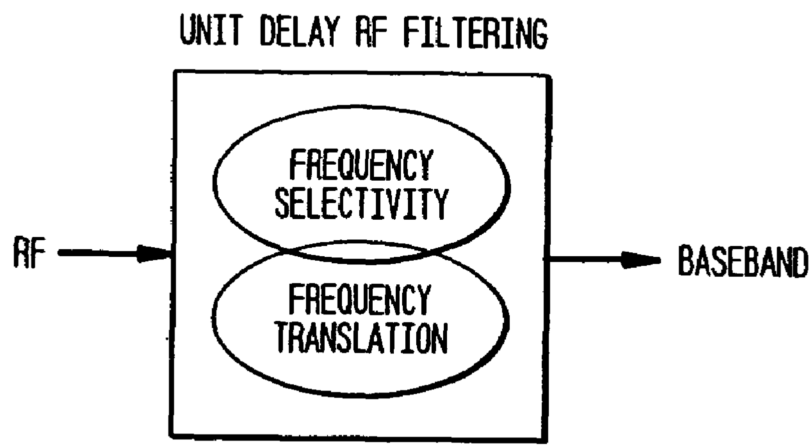

FIG. 110 illustrates an intersection of frequency selectivity and frequency translation, according to an embodiment of the present invention.

Figure 111:
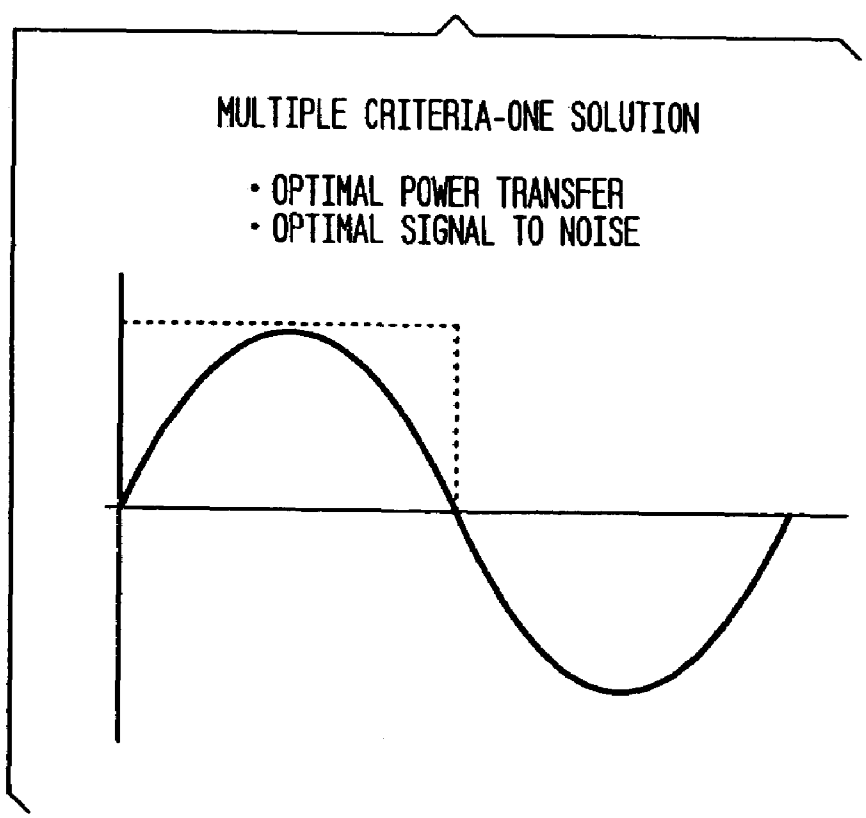

FIG. 111 illustrates a multiple criteria, one solution aspect of the present invention.

Figure 112:
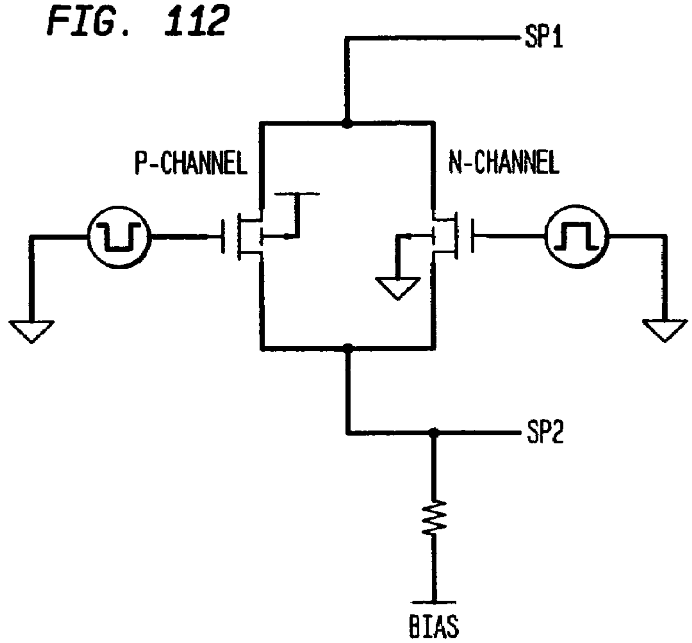

FIG. 112 illustrates an example complementary PET switch structure, according to an embodiment of the present invention.

Figure 113:
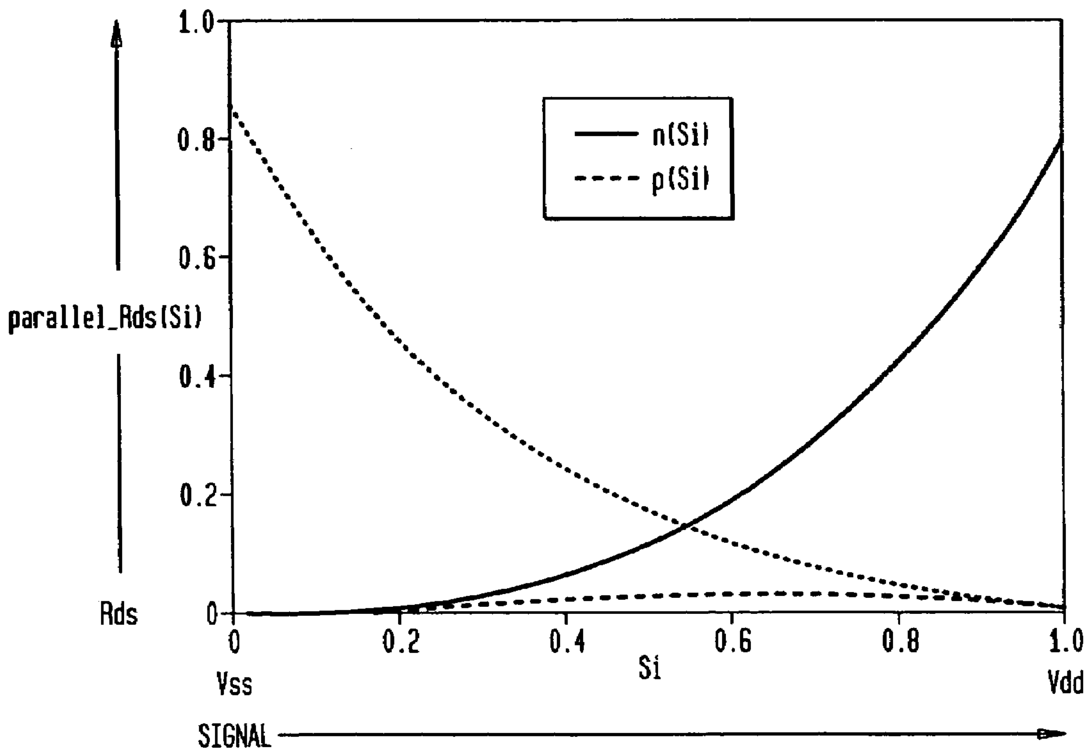

FIG. 113 illustrates example waveforms related to the complementary FET switch structure of FIG. 112.

Figure 114:
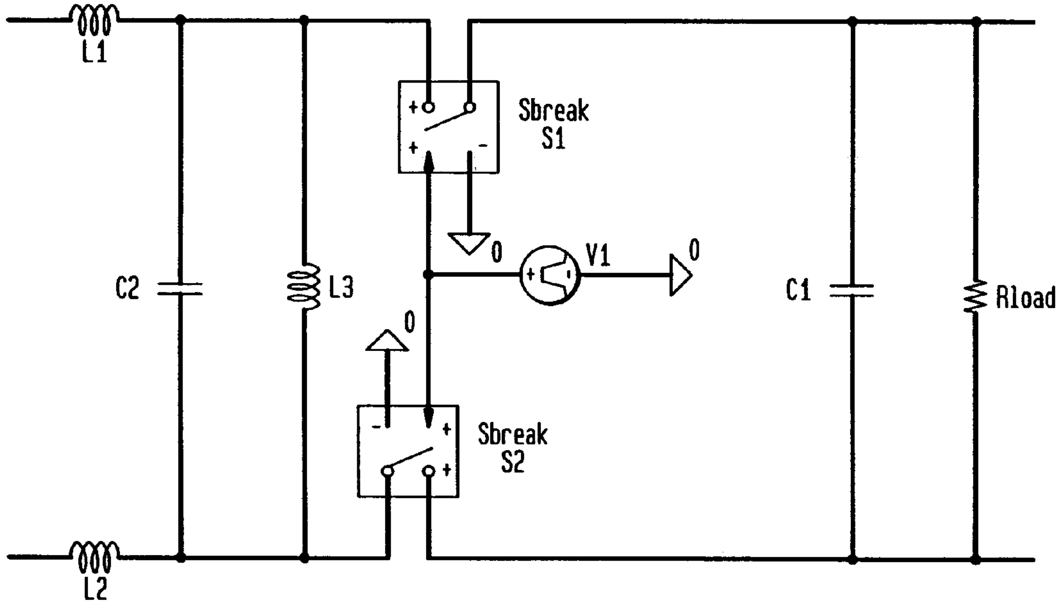

FIG. 114 illustrates an example differential configuration, according to an embodiment of the present invention.

Figure 115:
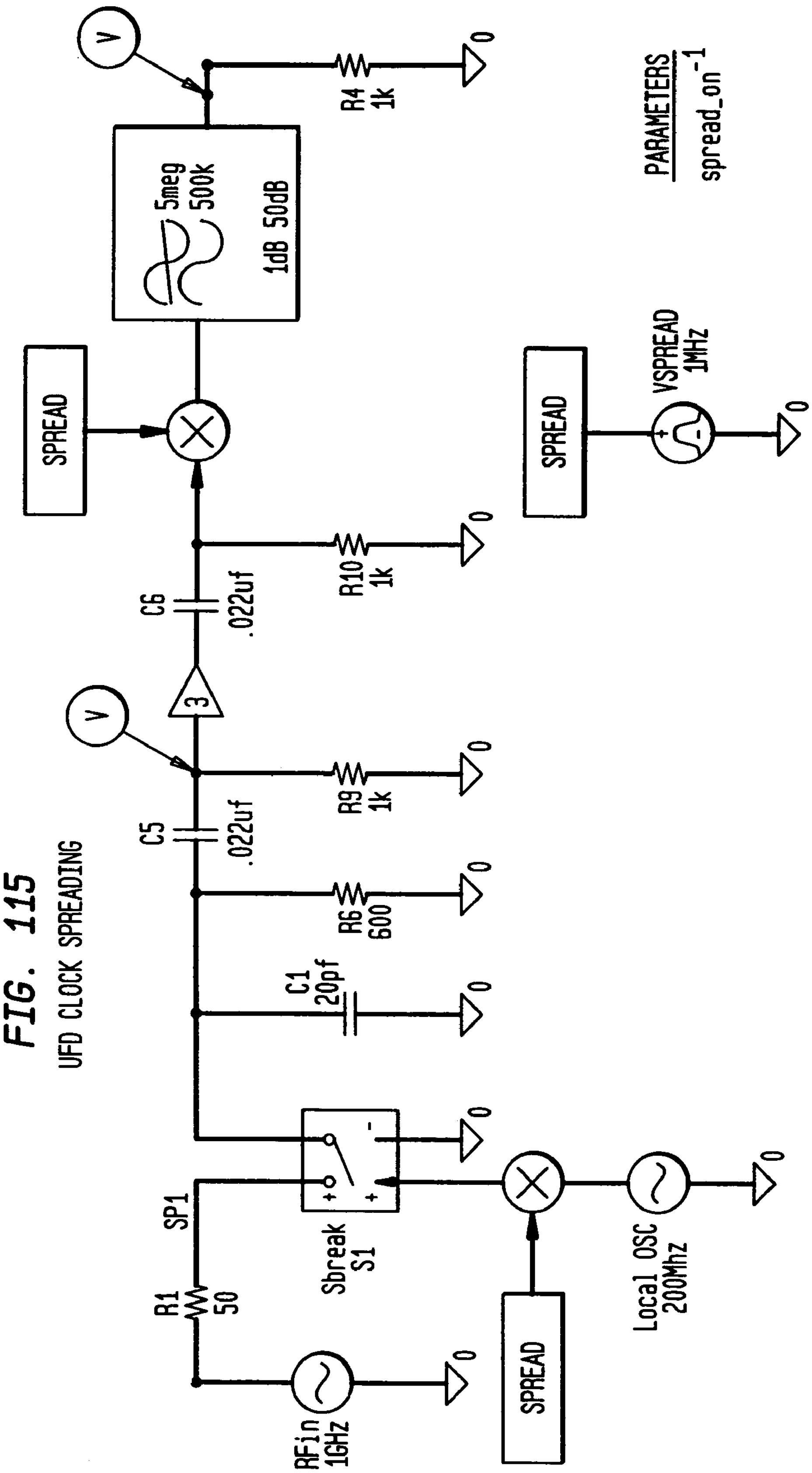

FIG. 115 illustrates an example receiver implementing clock spreading, according to an embodiment of the present invention.

Figure 116:
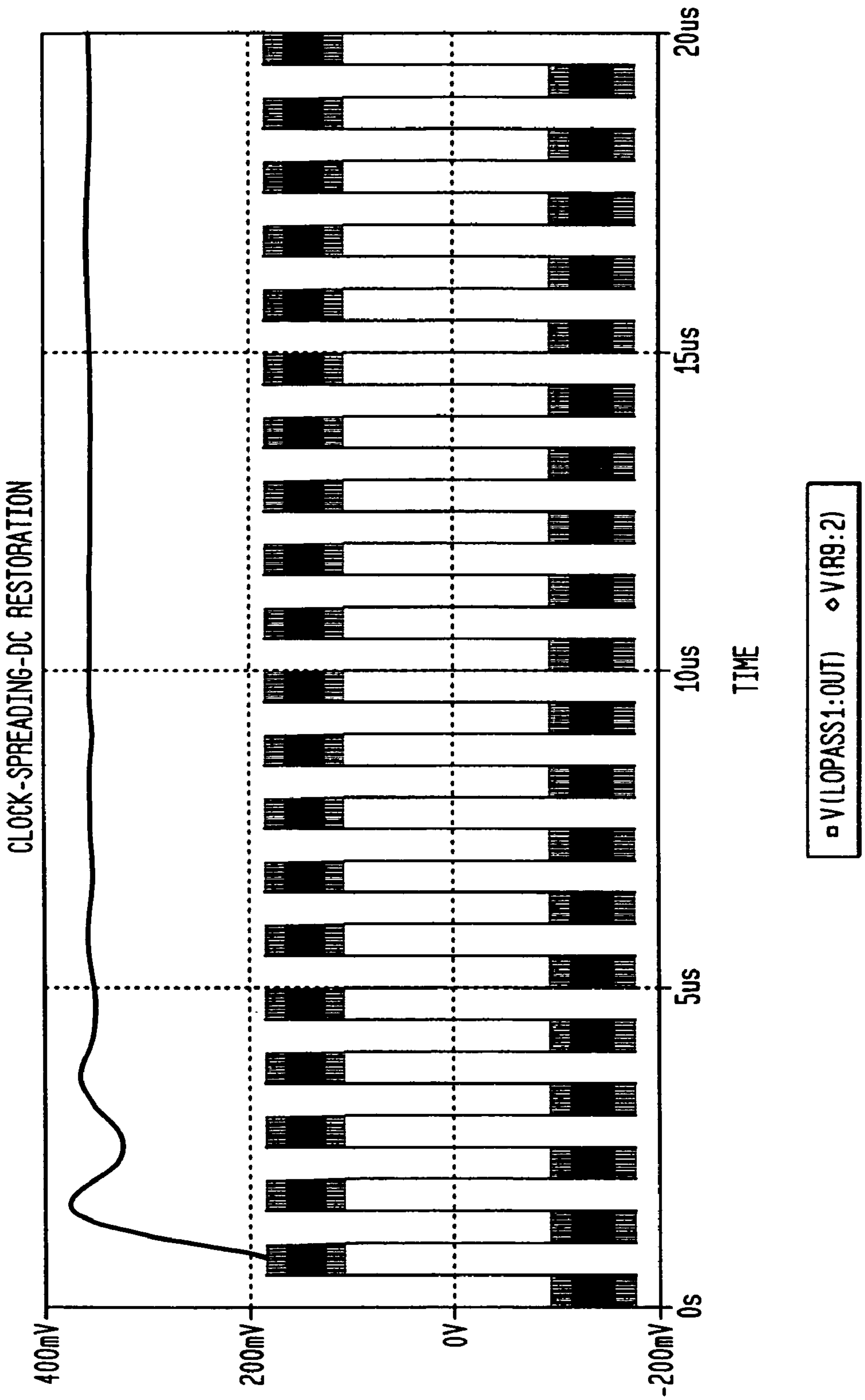

FIG. 116 illustrates example waveforms related to the receiver of FIG. 115.

Figure 117:
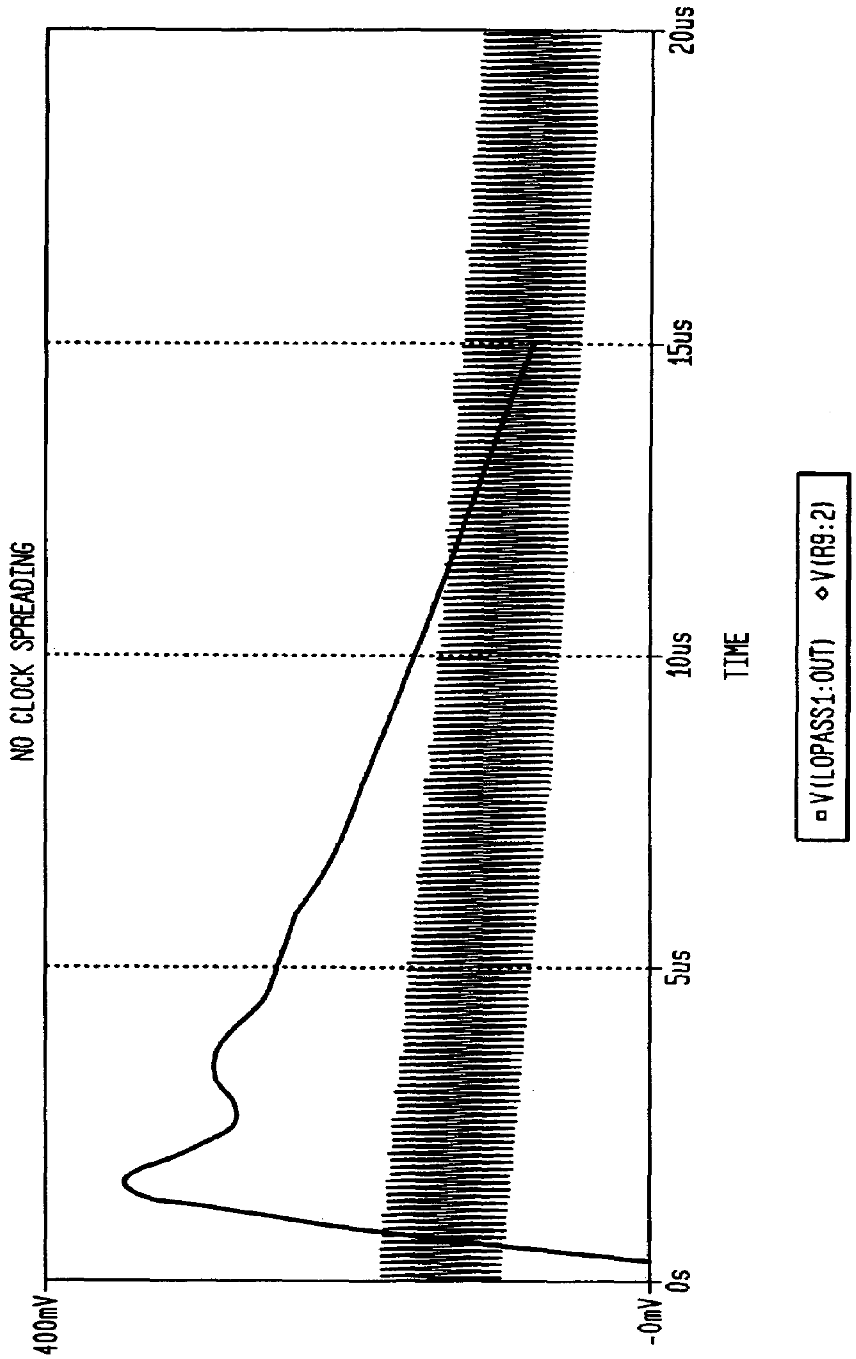

FIG. 117 illustrates waveforms related to the receiver of FIG. 115 implemented without clock spreading, according to an embodiment of the present invention.

Figure 118:
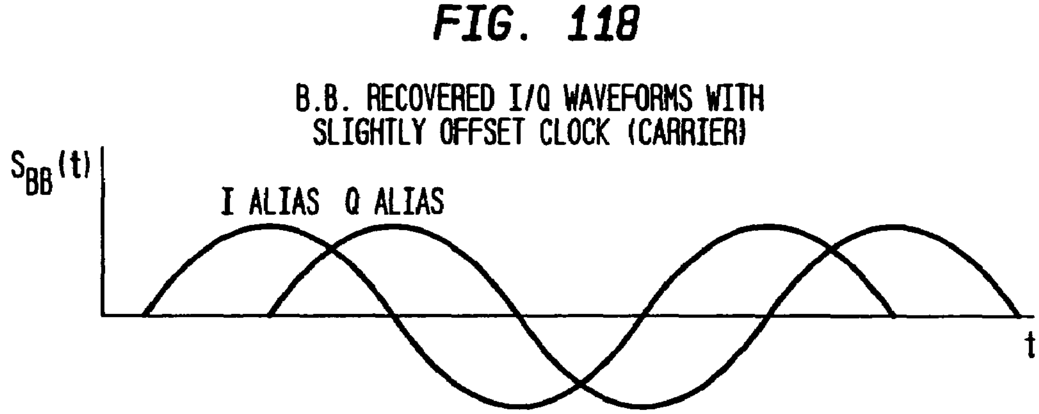

FIG. 118 illustrates an example recovered I/Q waveforms, according to an embodiment of the present invention.

Figure 119:
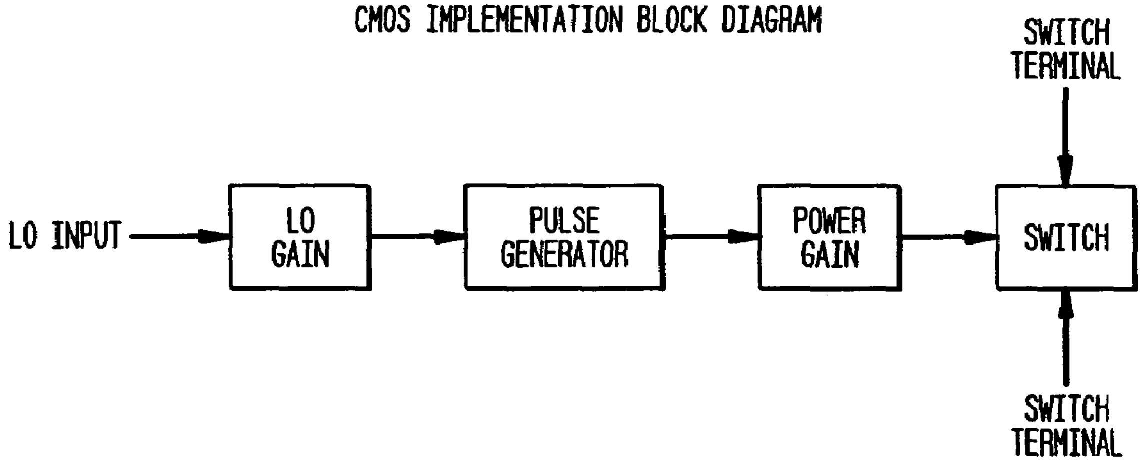

FIG. 119 illustrates an example CMOS implementation, according to an embodiment of the present invention.

Figure 120:
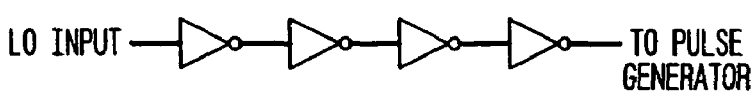

FIG. 120 illustrates an example LO gain stage of FIG. 119 at a gate level, according to an embodiment of the present invention.

Figure 121:
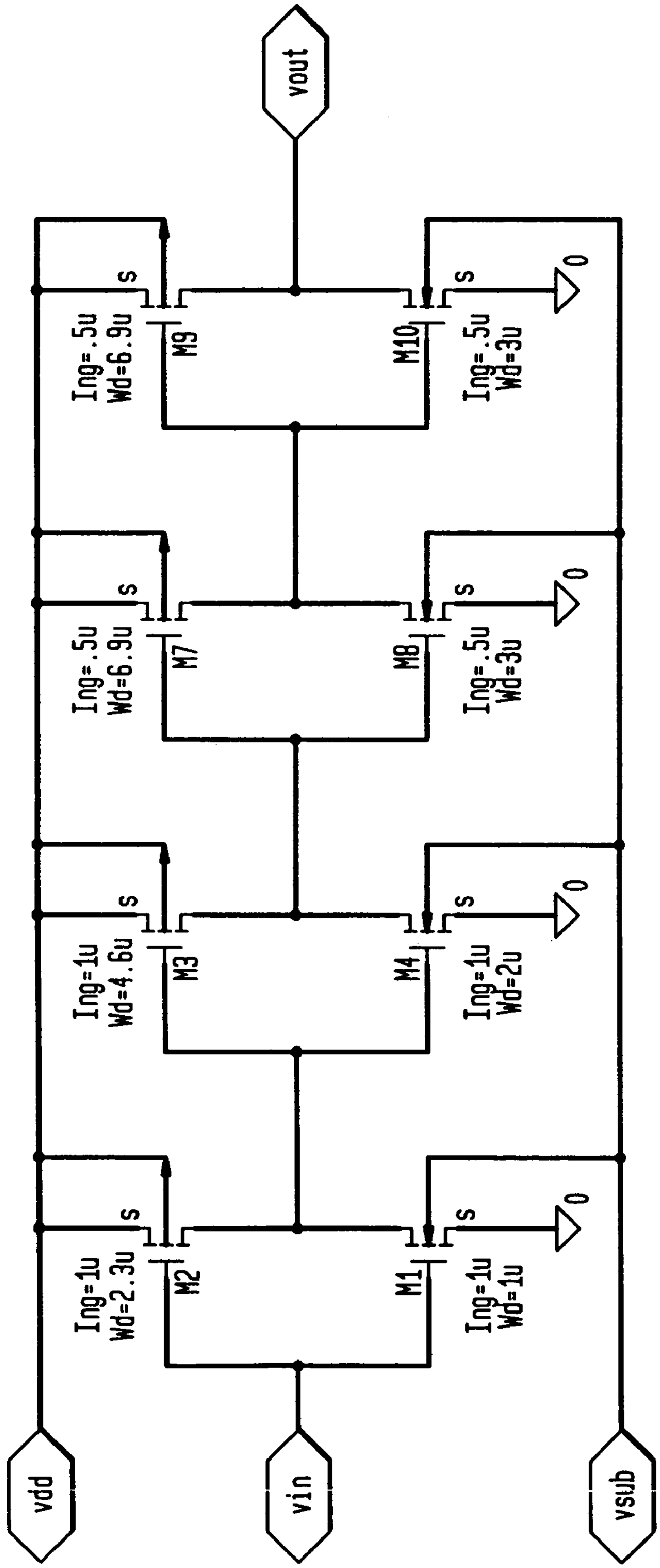

FIG. 121 illustrates an example LO gain stage of FIG. 119 at a transistor level, according to an embodiment of the present invention.

Figure 122:
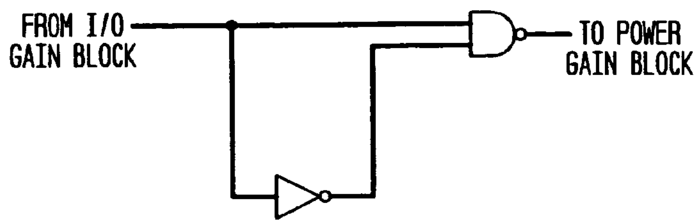

FIG. 122 illustrates an example pulse generator of FIG. 119 at a gate level, according to an embodiment of the present invention.

Figure 123:
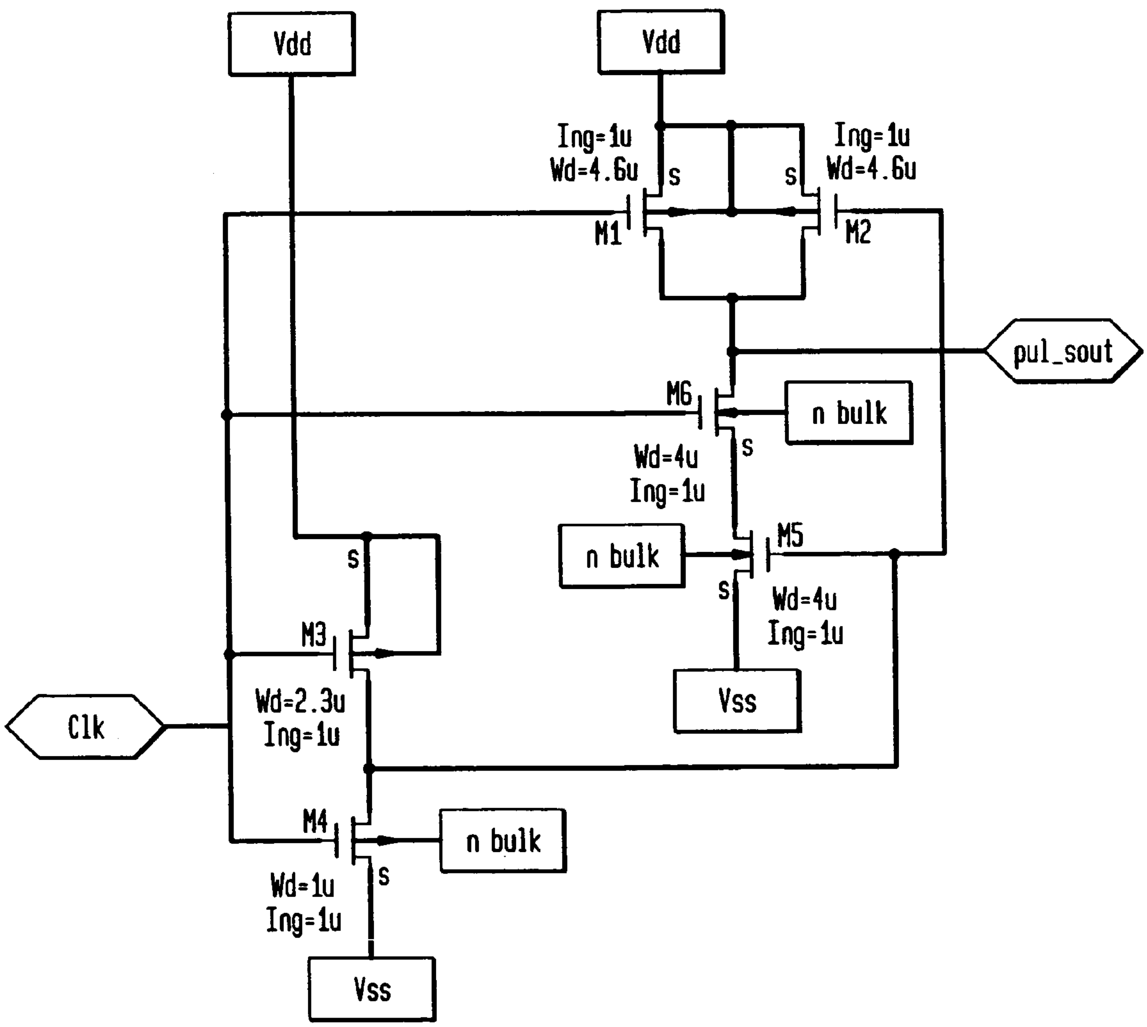

FIG. 123 illustrates an example pulse generator of FIG. 119 at a transistor level, according to an embodiment of the present invention.

Figure 124:
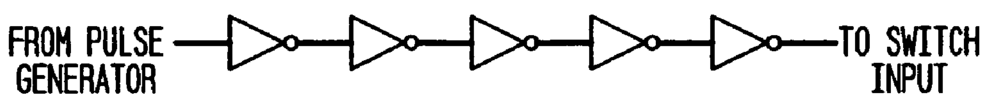

FIG. 124 illustrates an example power gain block of FIG. 119 at a gate level, according to an embodiment of the present invention.

Figure 125:
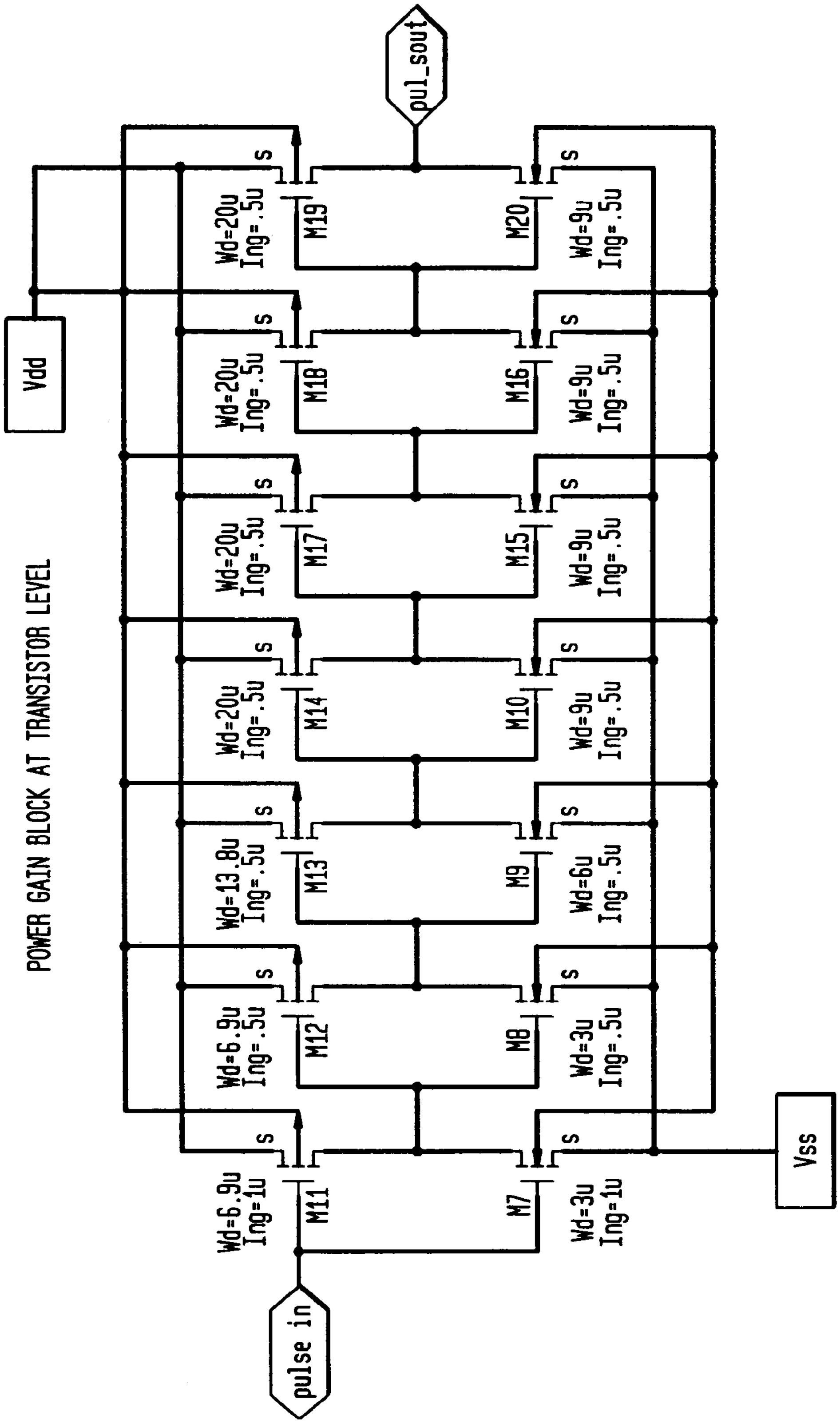

FIG. 125 illustrates an example power gain block of FIG. 119 at a transistor level, according to an embodiment of the present invention.

Figure 126:
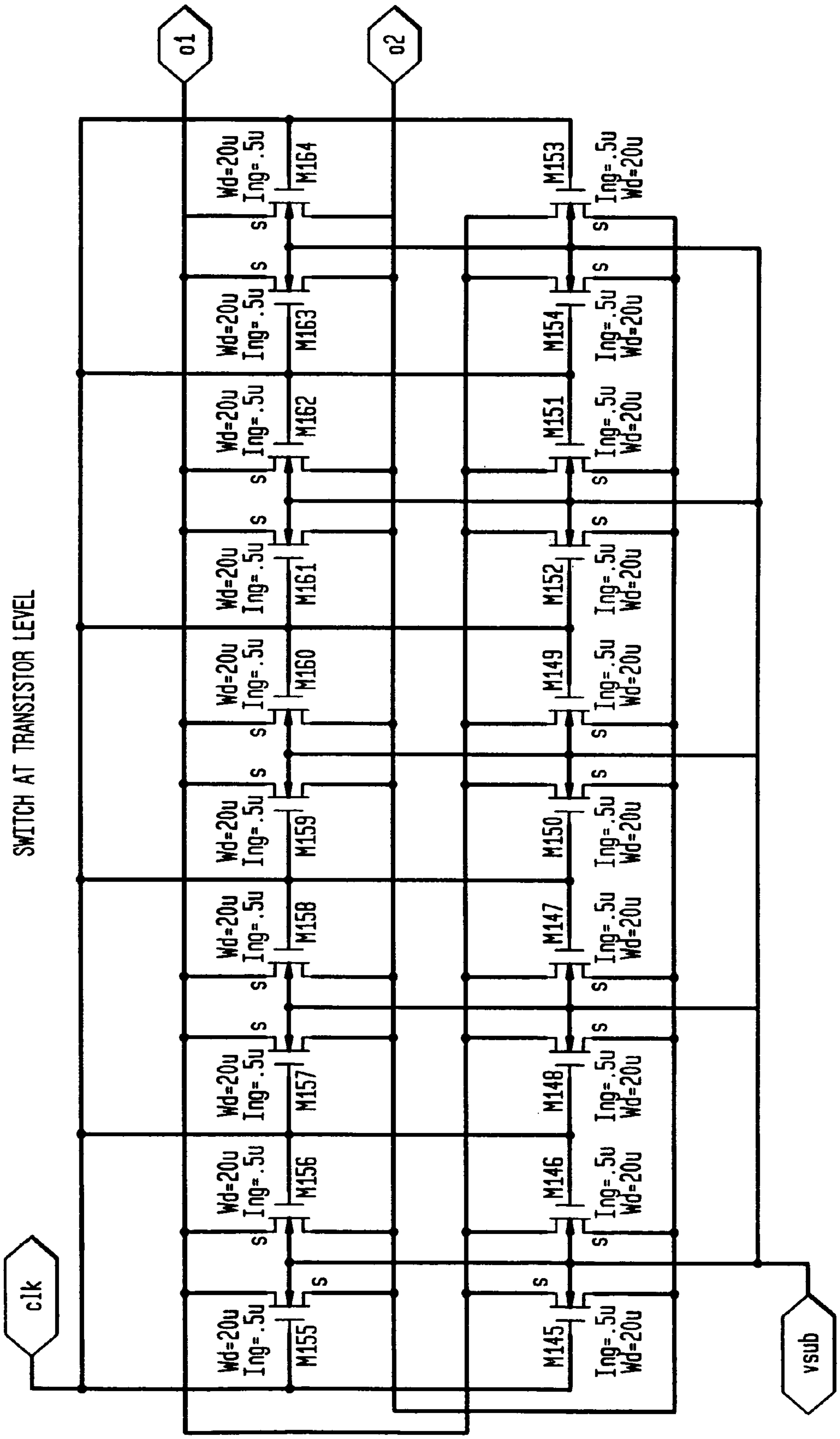

FIG. 126 illustrates an example switch of FIG. 119 at a transistor level, according to an embodiment of the present invention.

Figure 127:
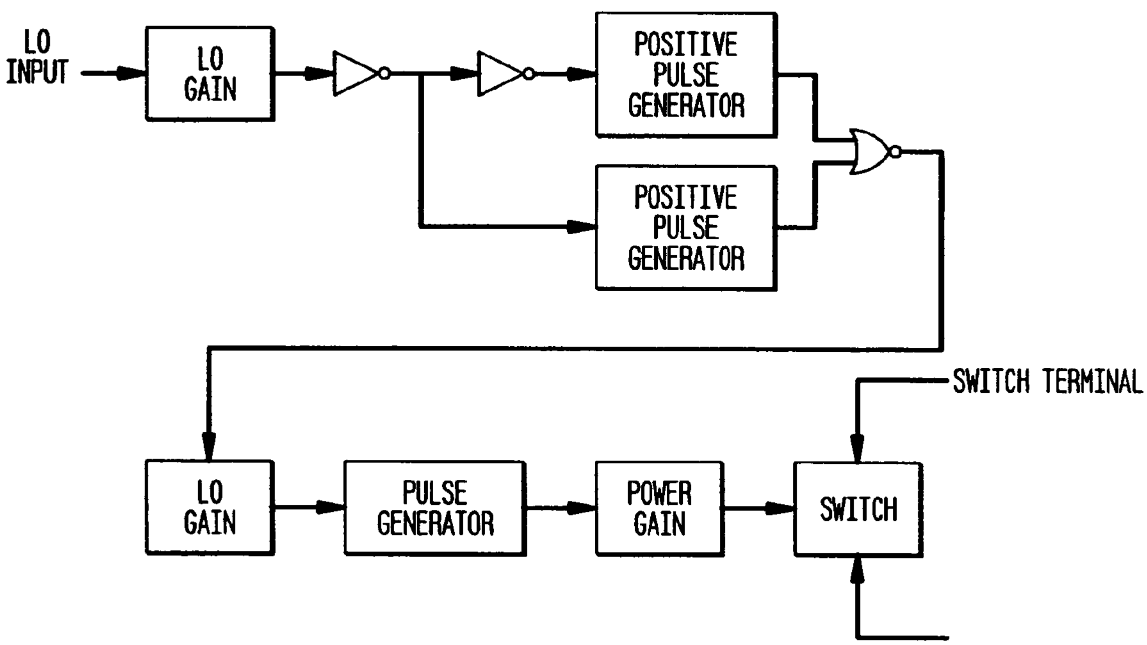

FIG. 127 illustrates an example CMOS "hot clock" block diagram, according to an embodiment of the present invention.

Figure 128:
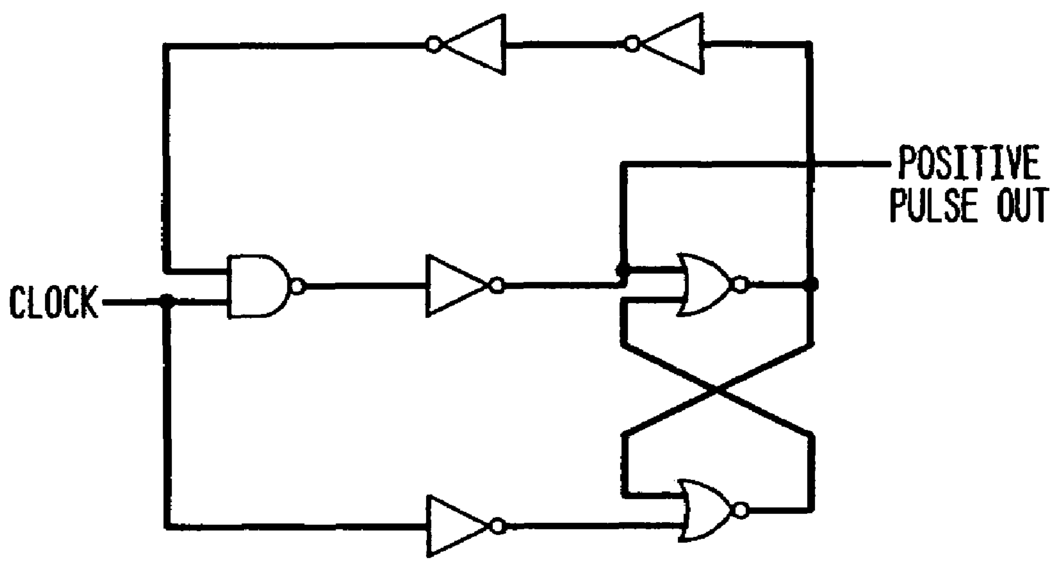

FIG. 128 illustrates an example positive pulse generator of FIG. 127 at a gate level, according to an embodiment of the present invention.

Figure 129:
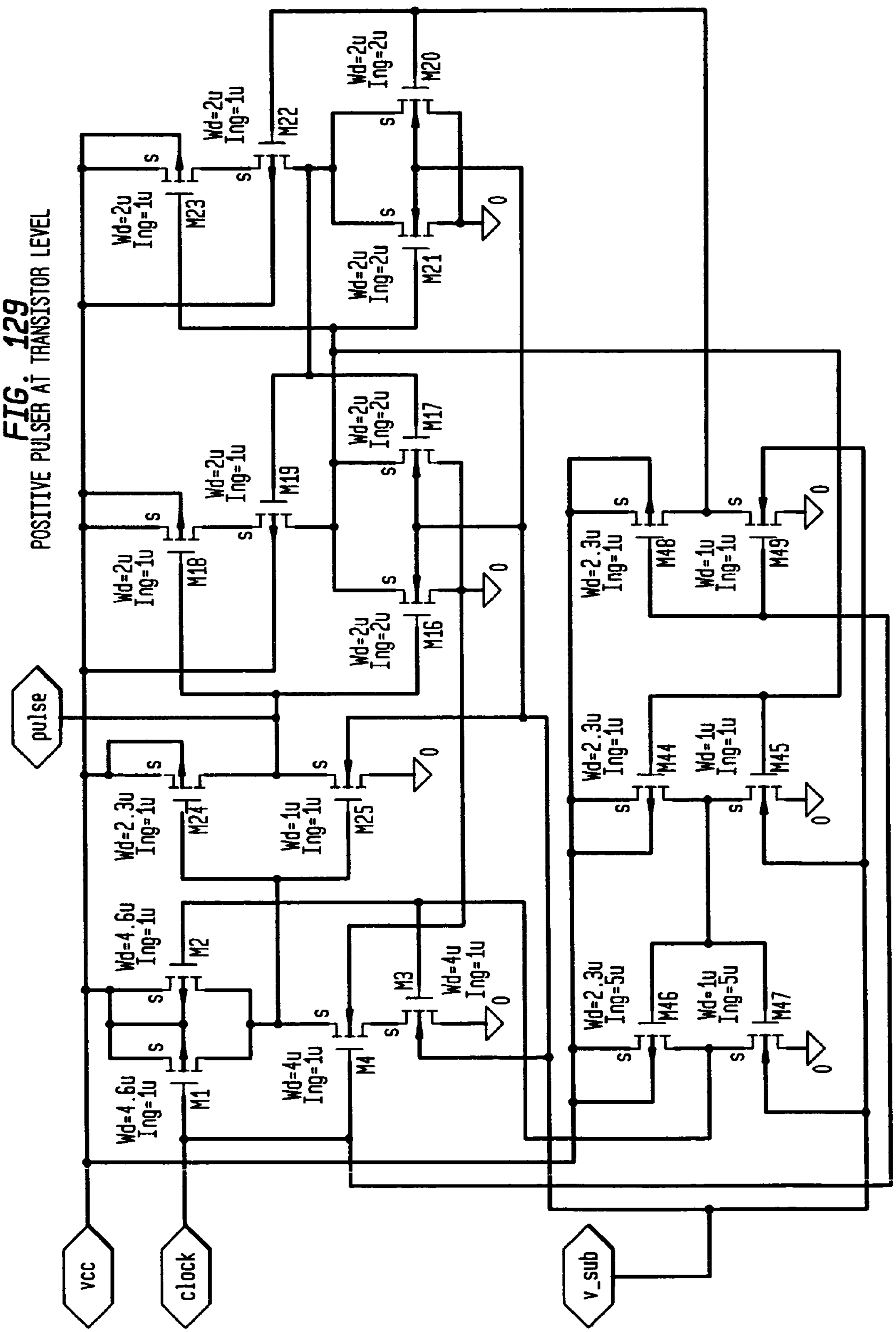

FIG. 129 illustrates an example positive pulse generator of FIG. 127 at a transistor level, according to an embodiment of the present invention.

Figure 130:
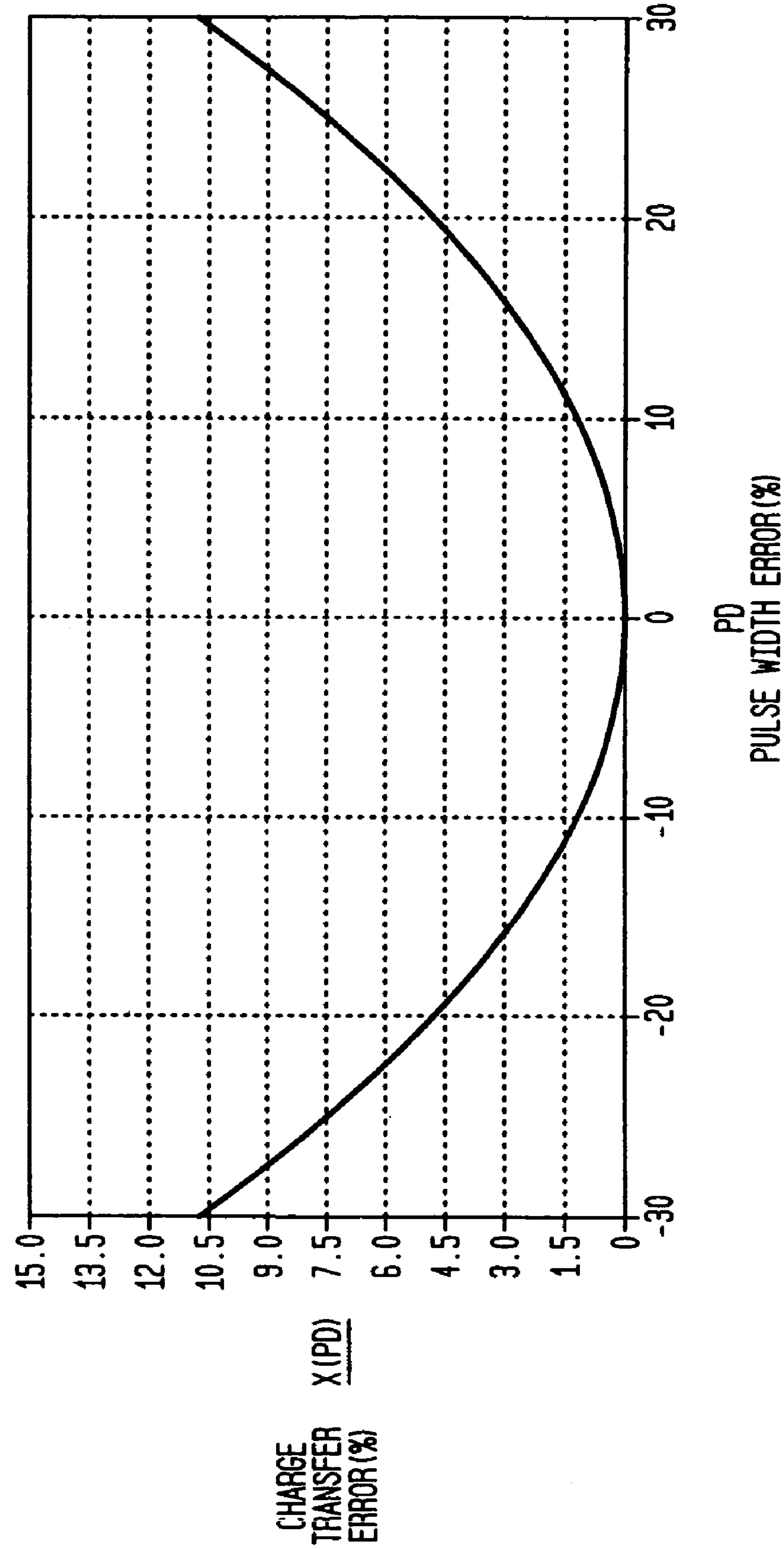

FIG. 130 illustrates pulse width error effect for ½ cycle.

Figure 131:
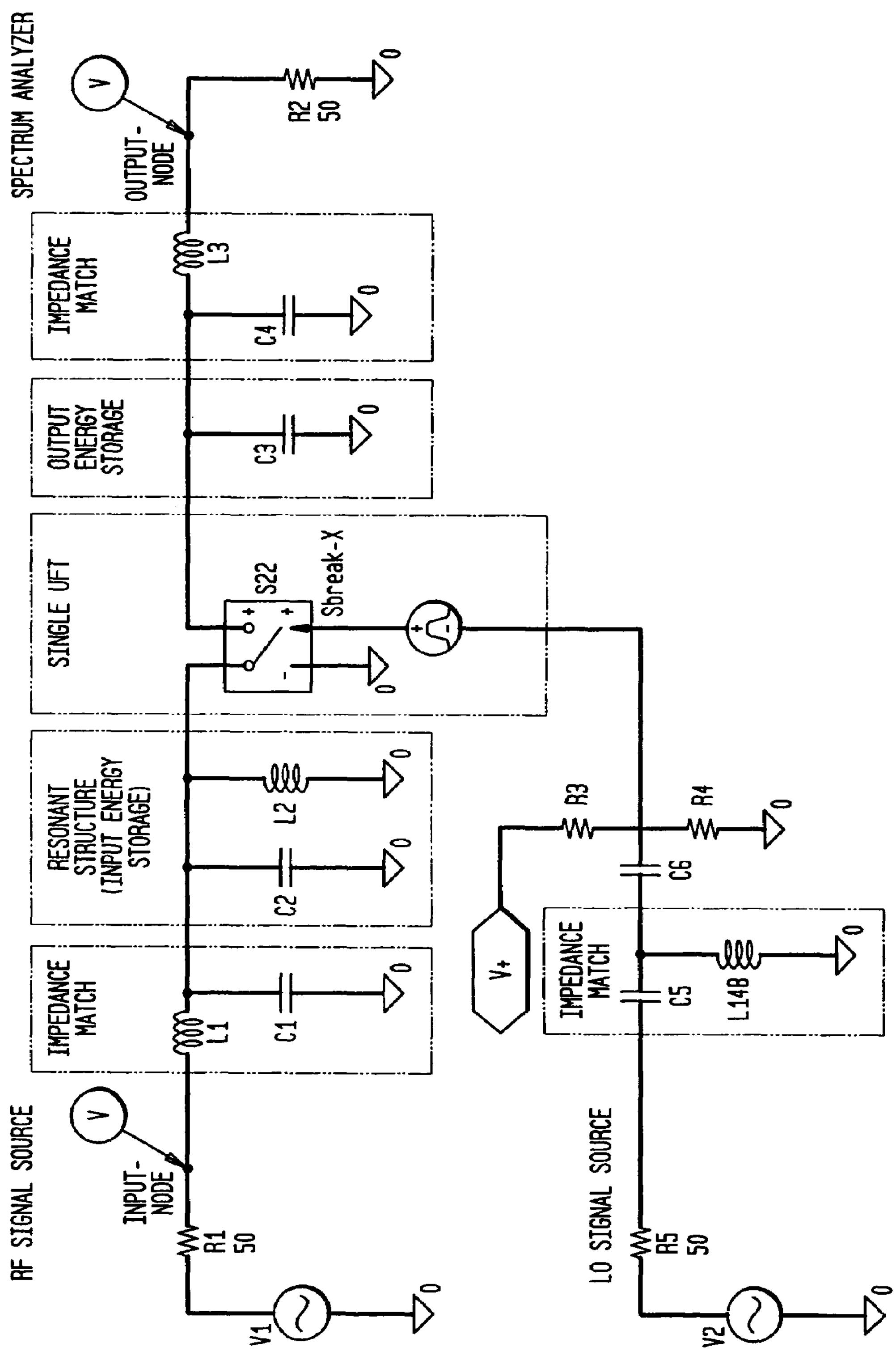

FIG. 131 illustrates an example single-ended receiver circuit implementation, according to an embodiment of the present invention.

Figure 132:
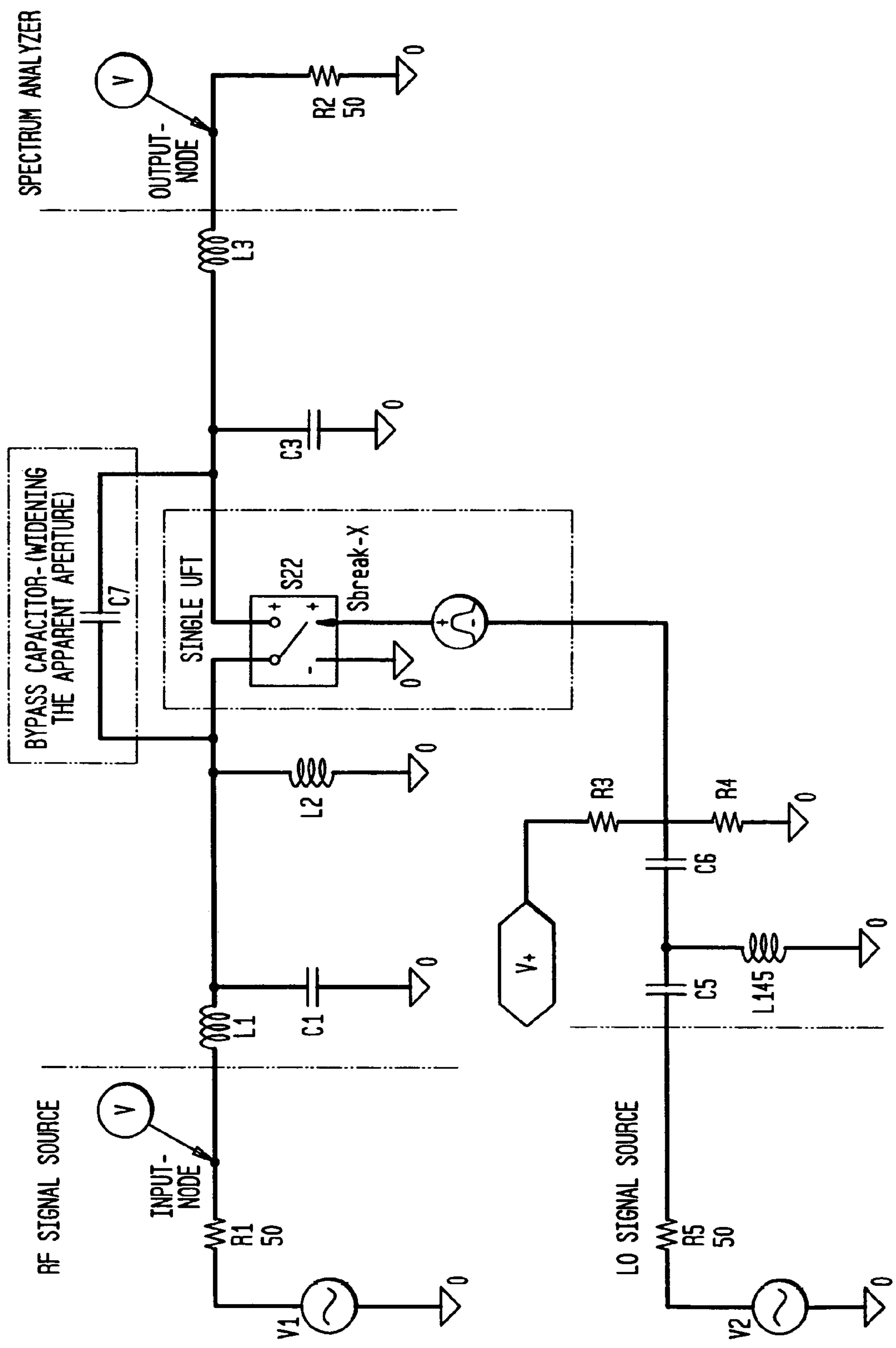

FIG. 132 illustrates an example single-ended receiver circuit implementation, according to an embodiment of the present invention.

Figure 133:
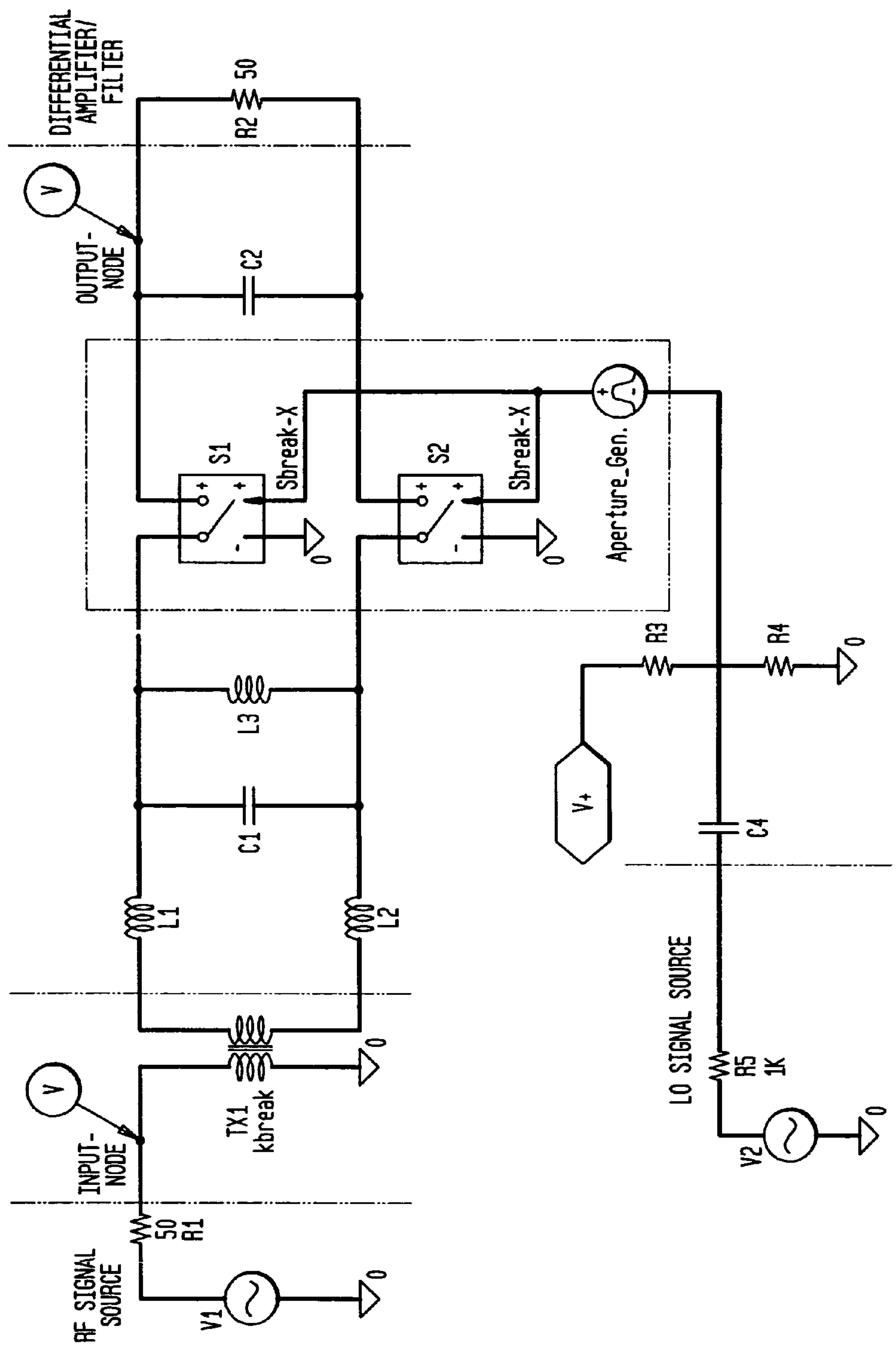

FIG. 133 illustrates an example full differential receiver circuit implementation, according to an embodiment of the present invention.

Figure 134:
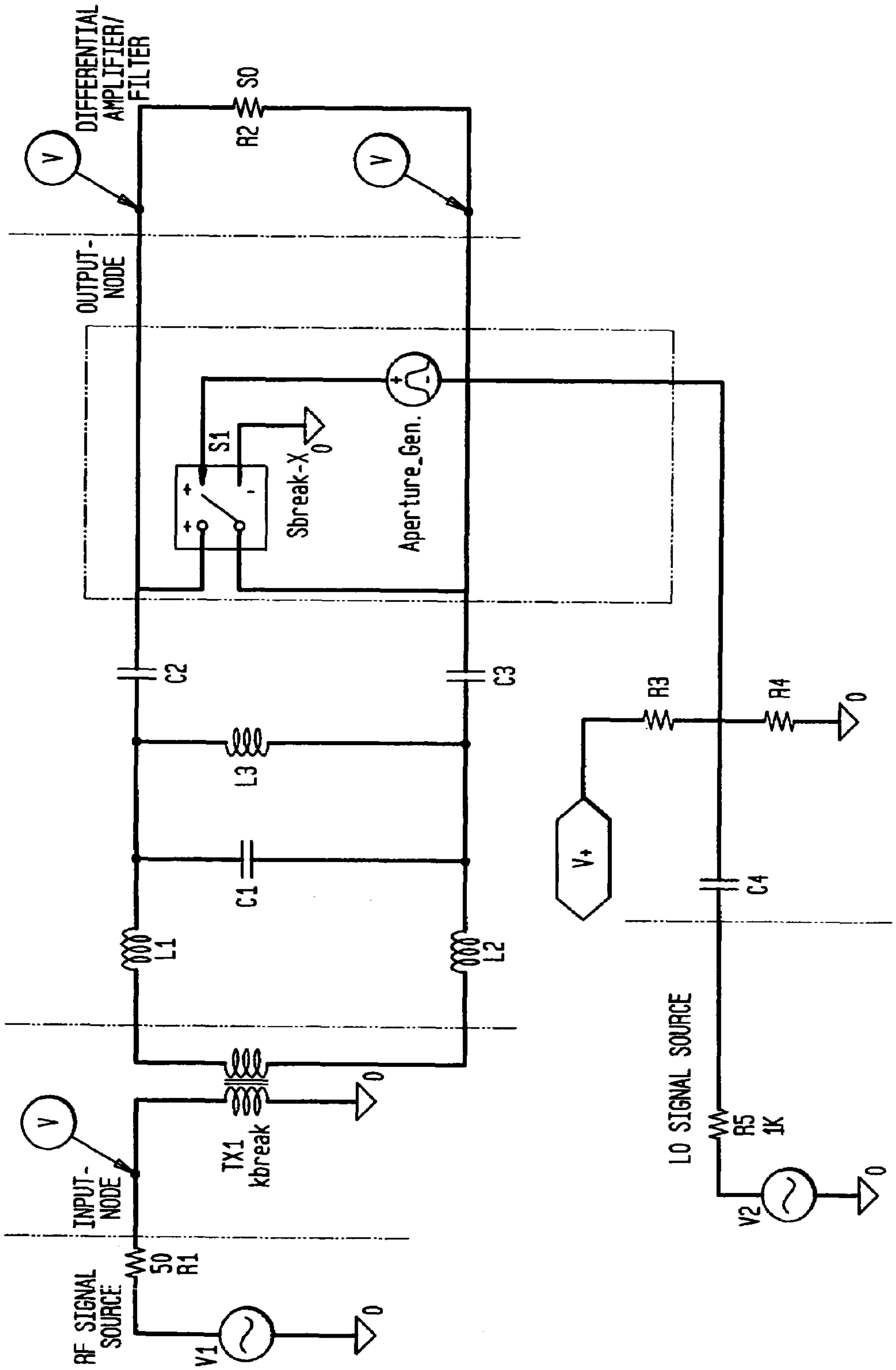

FIG. 134 illustrates an example full differential receiver implementation, according to an embodiment of the present invention.

Figure 135:
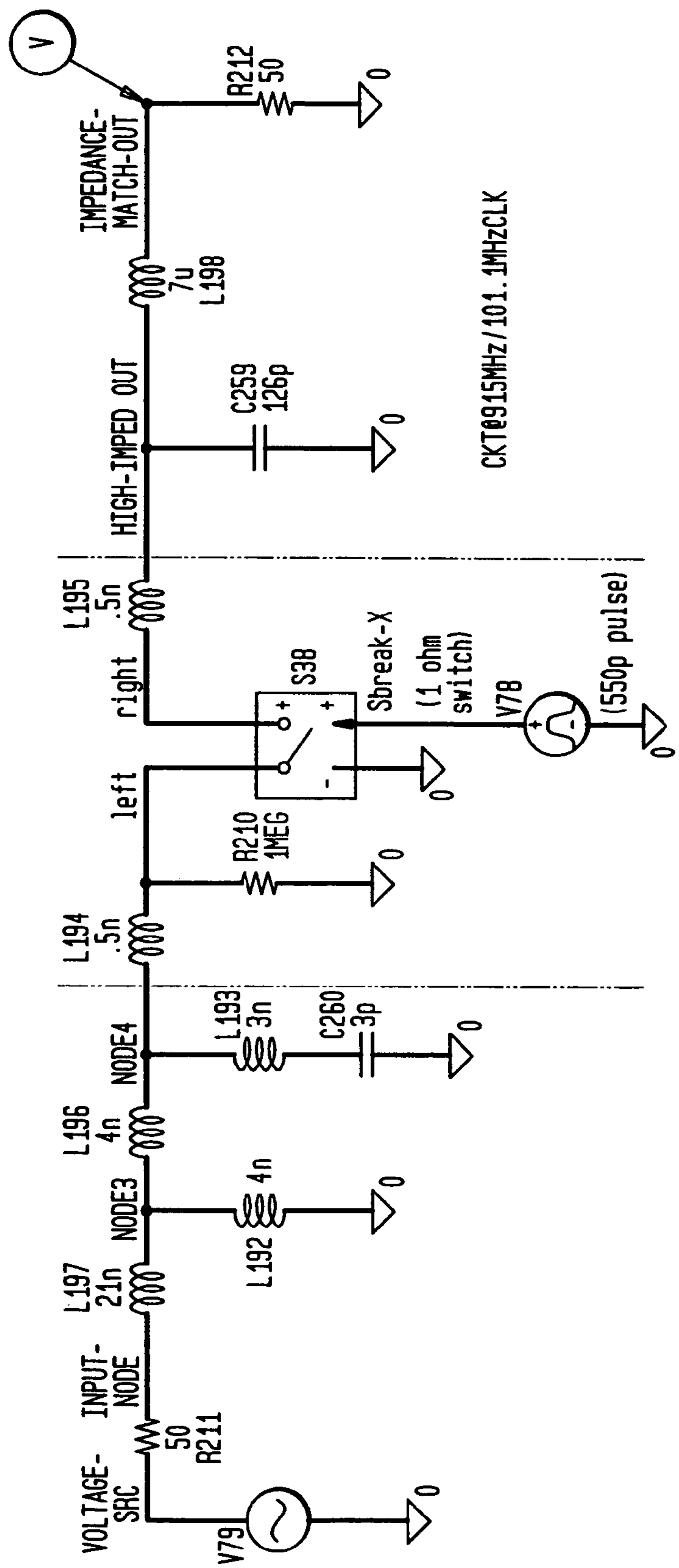

FIG. 135 illustrates an example single-ended receiver implementation, according to an embodiment of the present invention.

Figure 136:
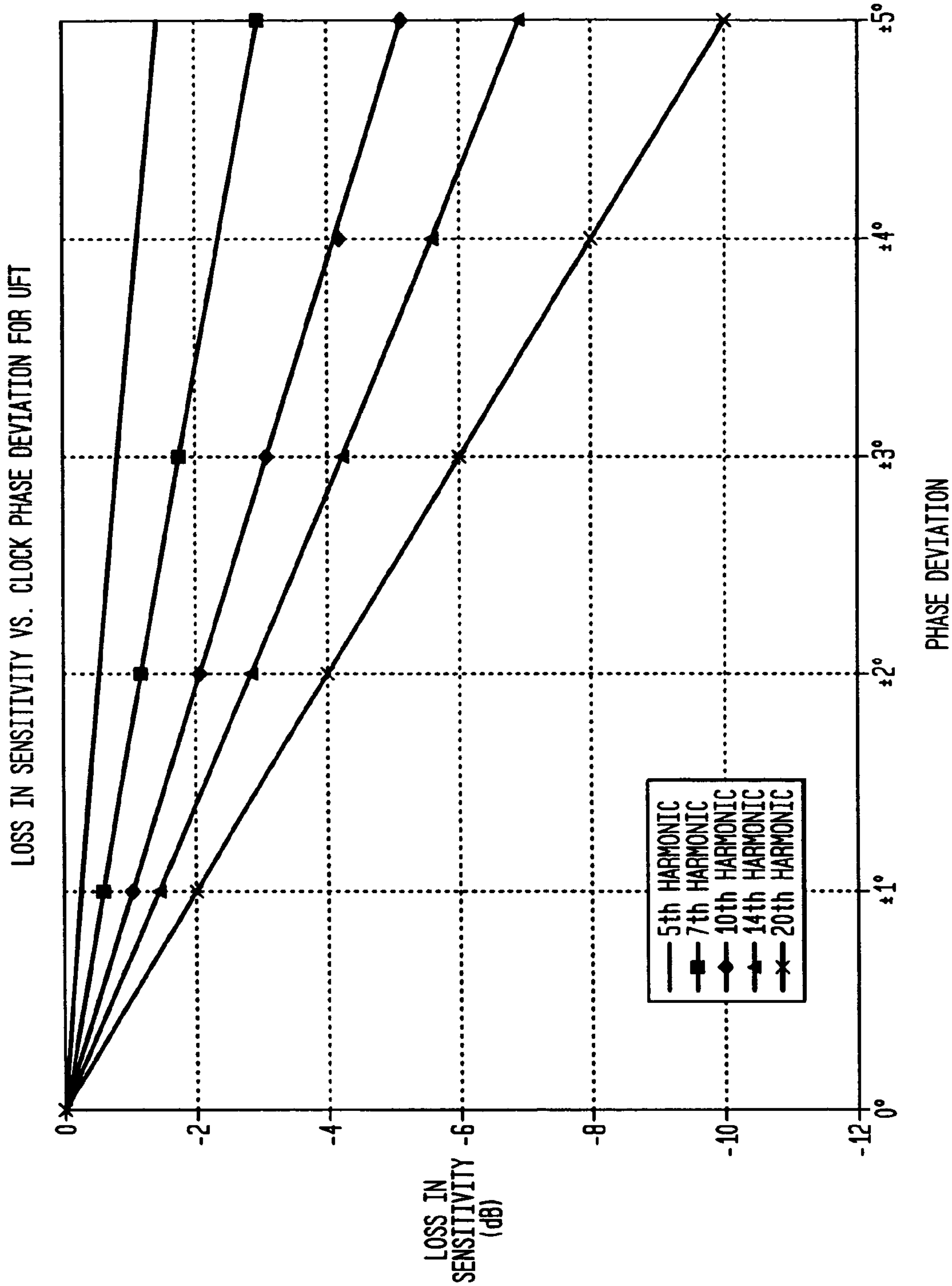

FIG. 136 illustrates a plot of loss in sensitivity vs. clock phase deviation, according to an example embodiment of the present invention.

Figure 137:
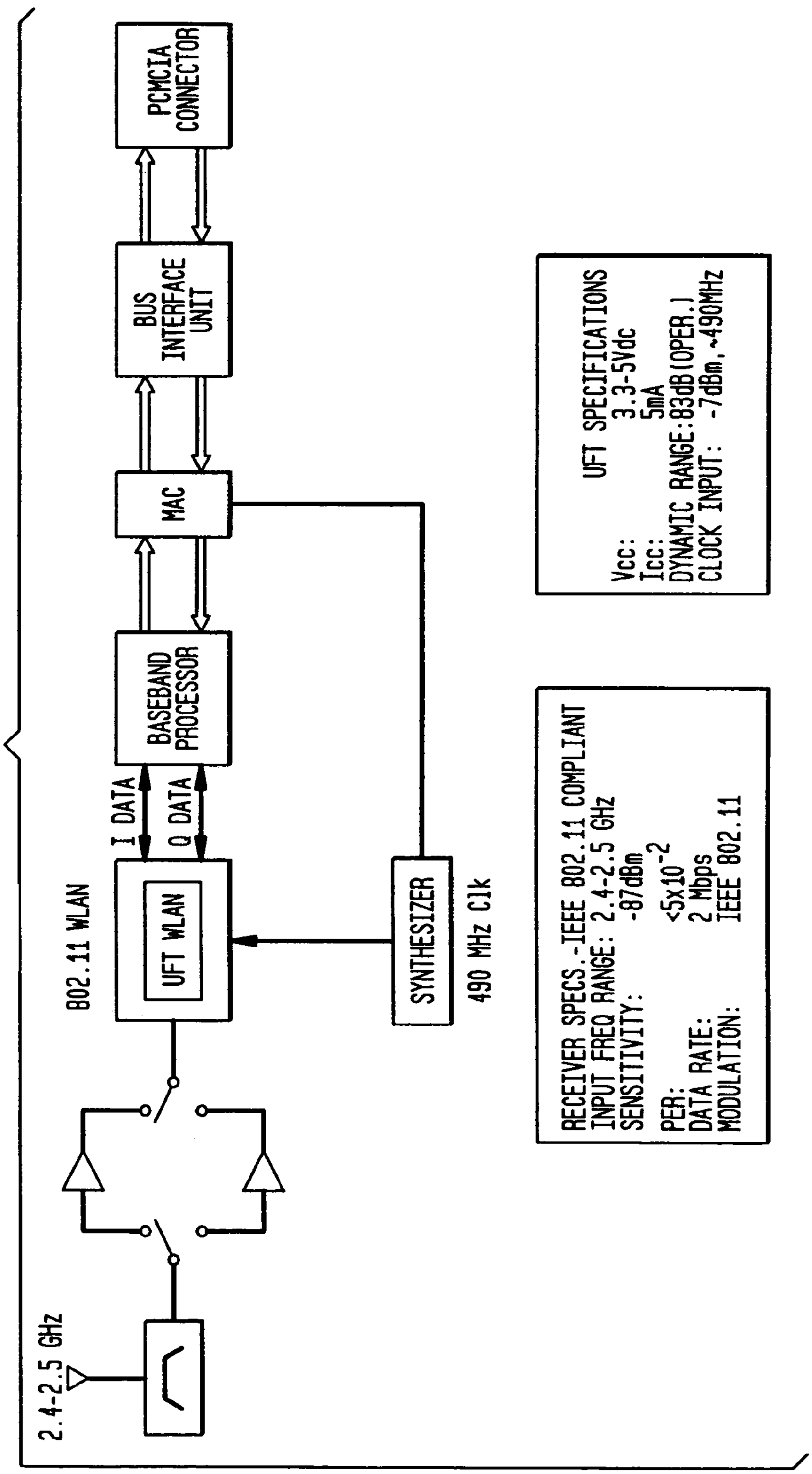
Figure 138:
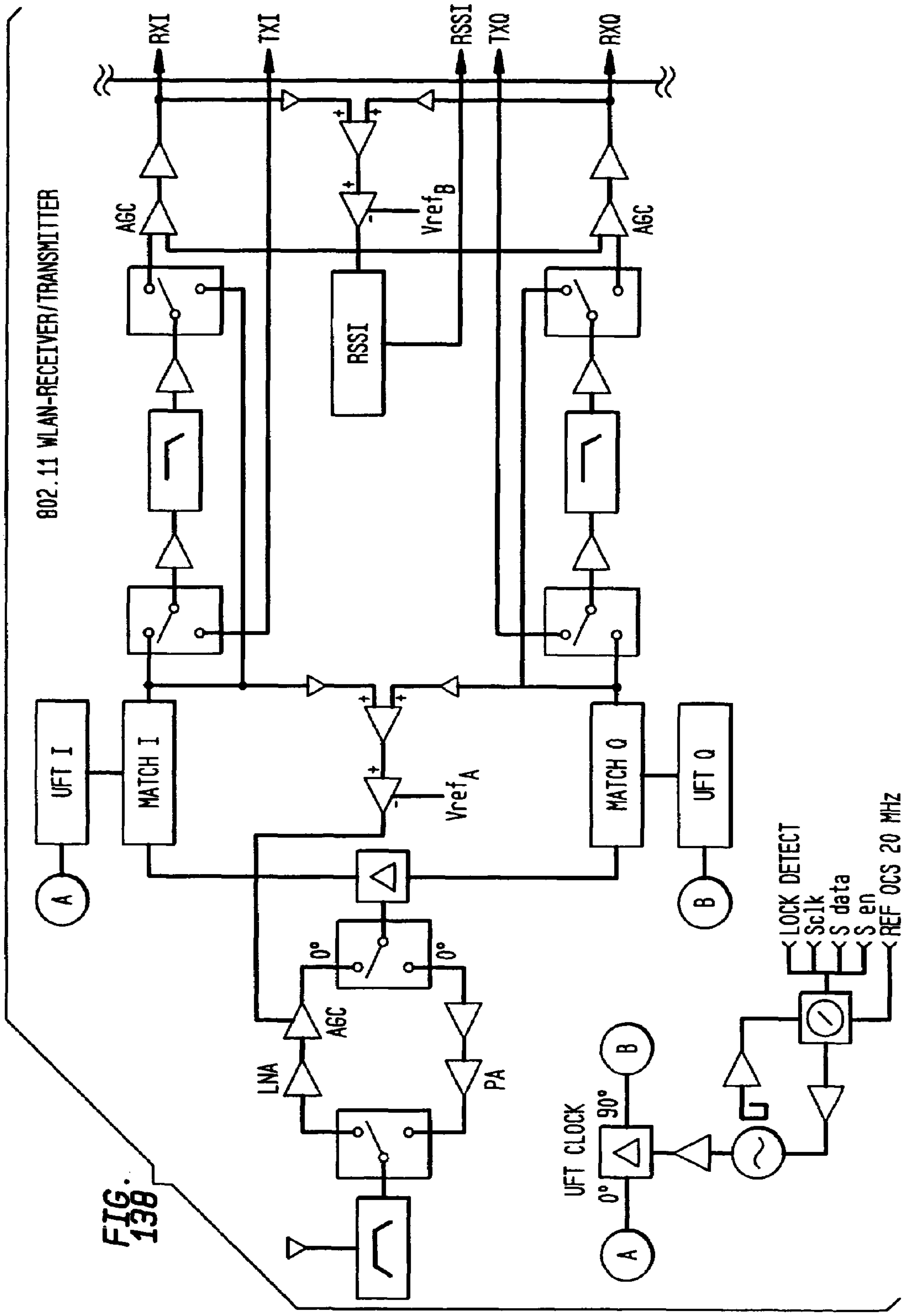

FIGS. 137 and 138 illustrate example 802.11 WLAN receiver/transmitter implementations, according to embodiments of the present invention.

FIG. 139 illustrates 802.11 requirements in relation to embodiments of the present invention.

Figure 140:
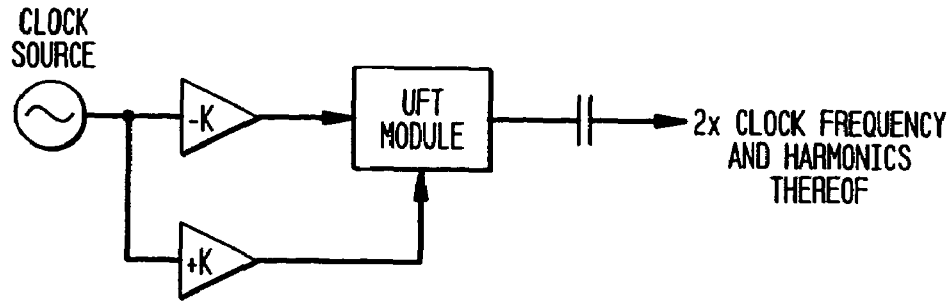

FIG. 140 illustrates an example doubler implementation for phase noise cancellation, according to an embodiment of the present invention.

Figure 141:
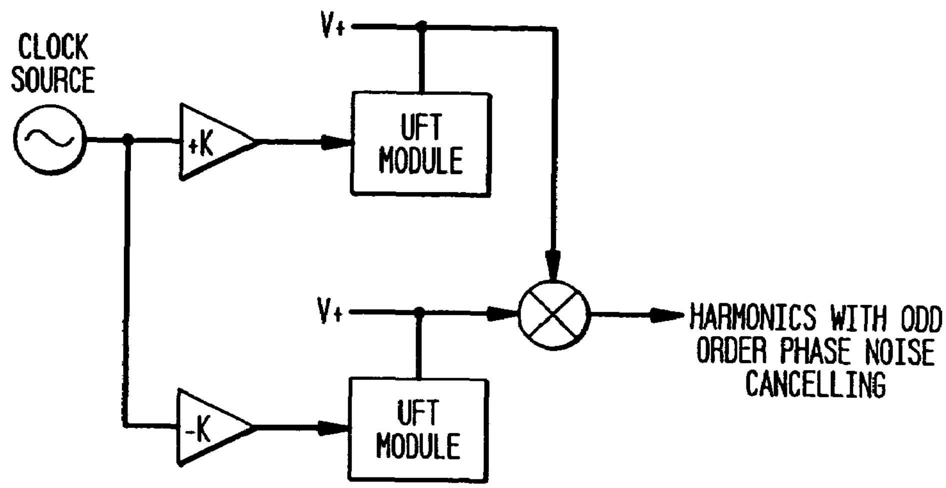

FIG. 141 illustrates an example doubler implementation for phase noise cancellation, according to an embodiment of the present invention.

Figure 142:
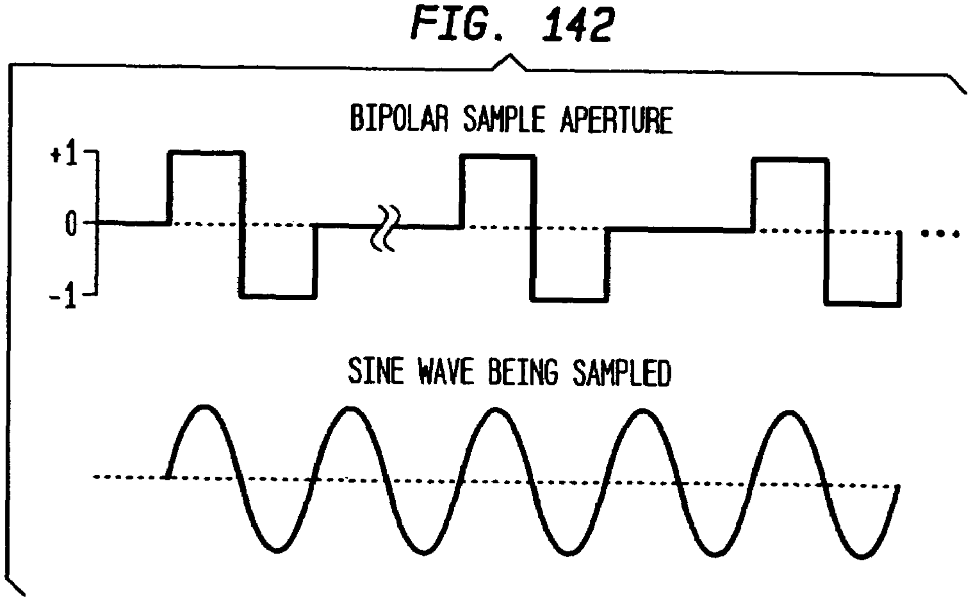

FIG. 142 illustrates a example bipolar sampling aperture, according to an embodiment of the present invention.

Figure 143:
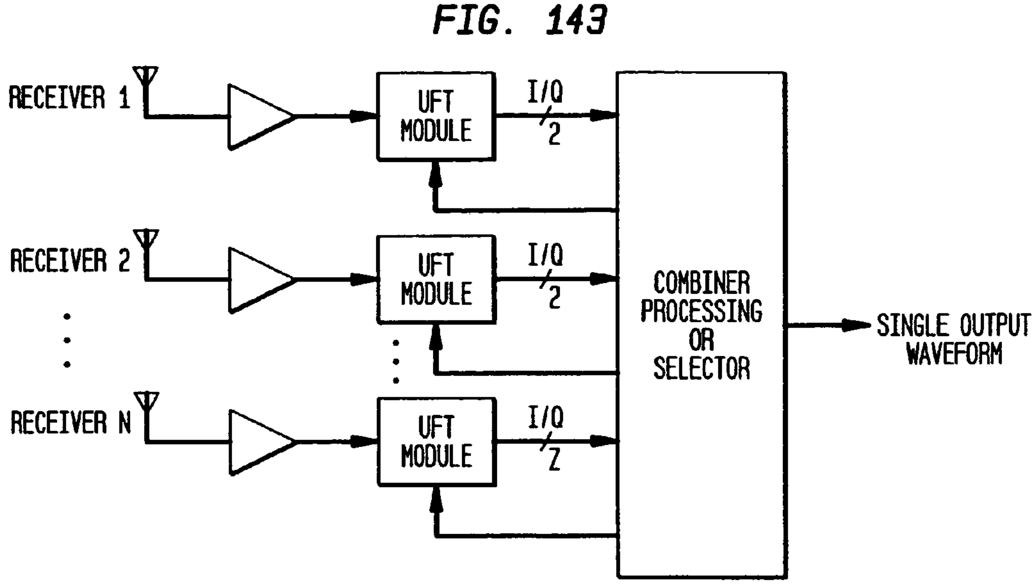

FIG. 143 illustrates an example diversity receiver, according to an embodiment of the present invention.

Figure 144:
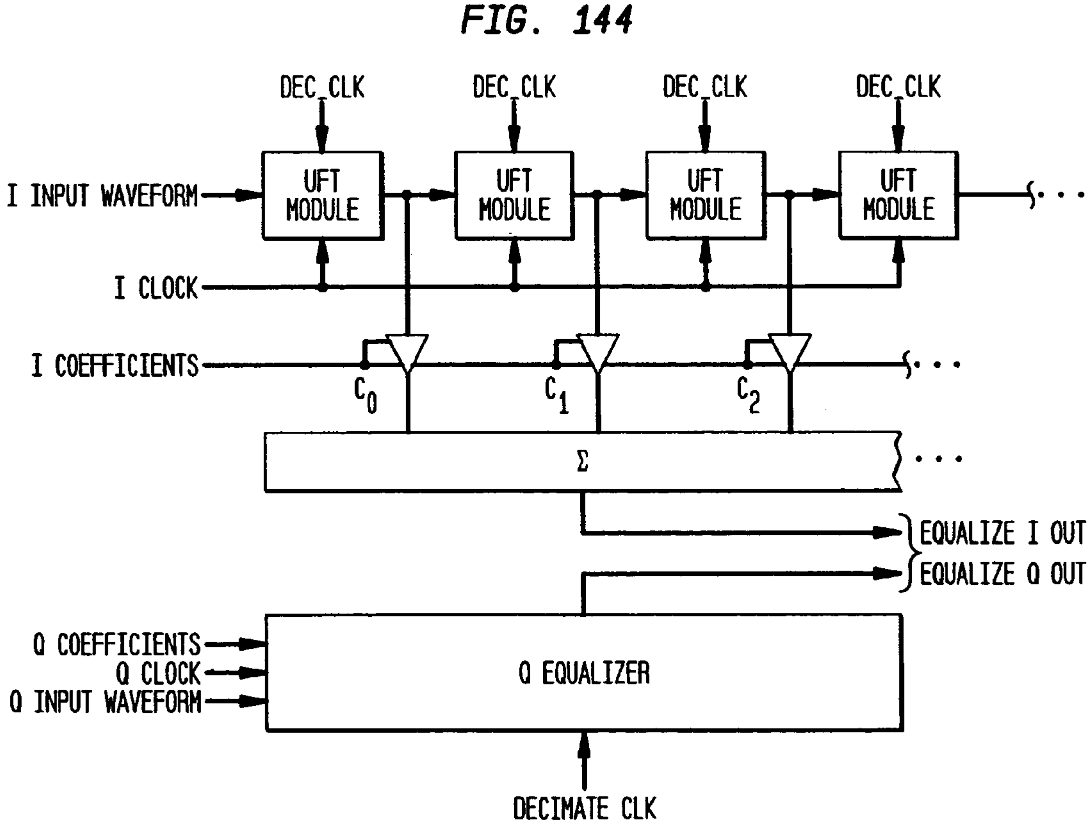

FIG. 144 illustrates an example equalizer implementation, according to an embodiment of the present invention.

Figure 145:
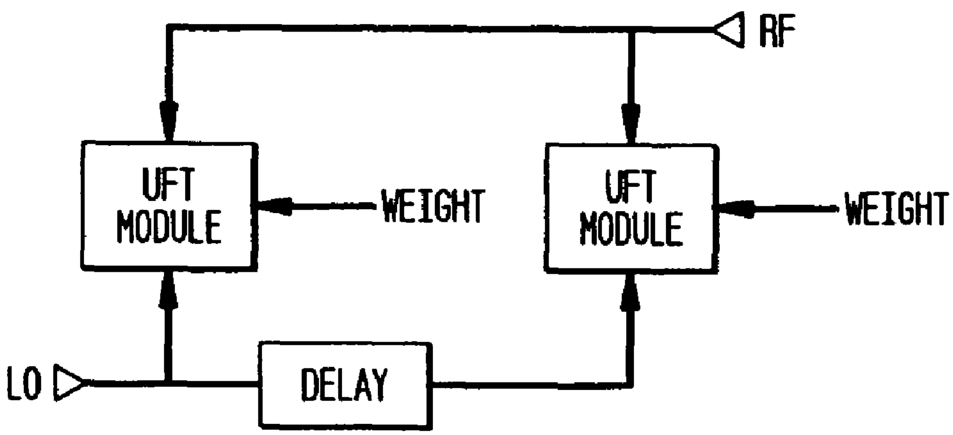

FIG. 145 illustrates an example multiple aperture receiver using two apertures, according to an embodiment of the present invention.

Figure 146:
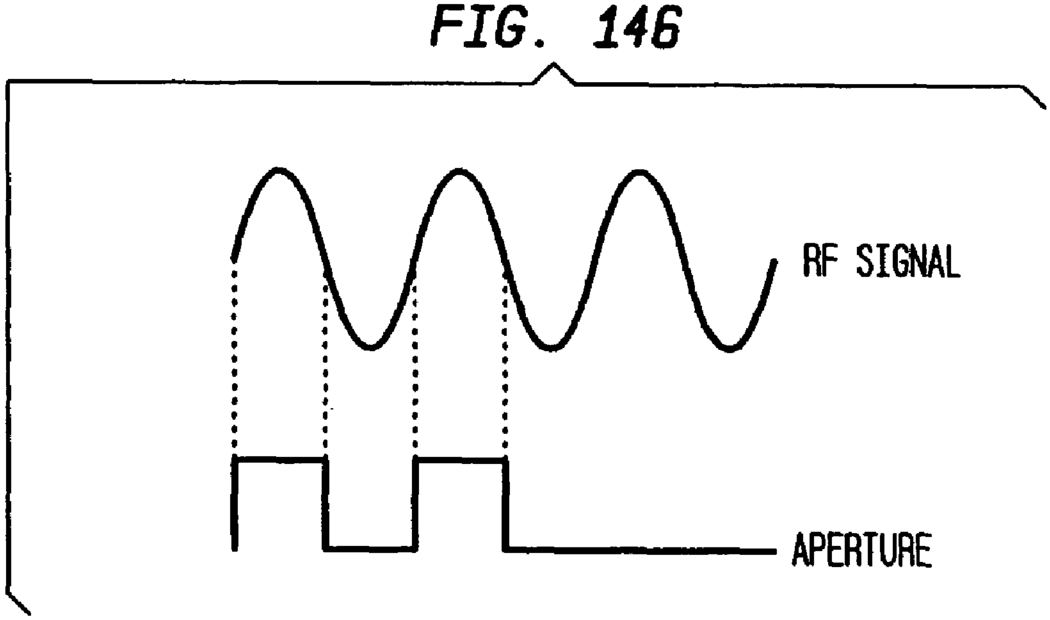

FIG. 146 illustrates exemplary waveforms related to the multiple aperture receiver of FIG. 145, according to an embodiment of the present invention.

Figure 147:
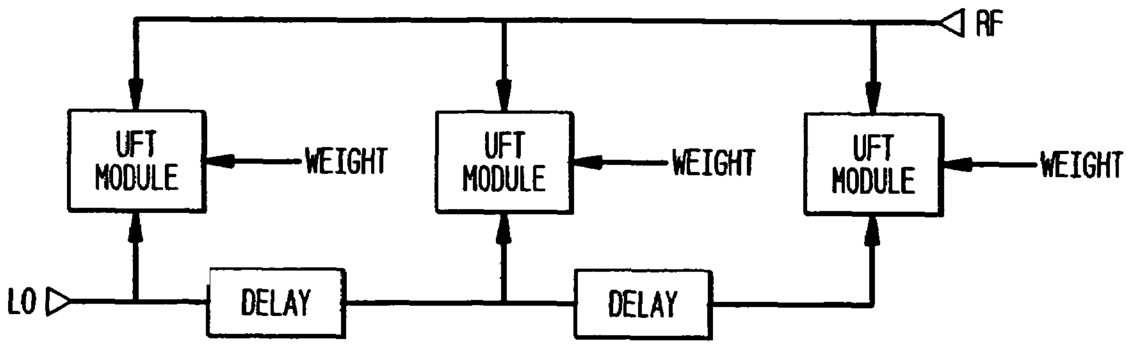

FIG. 147 illustrates an example multiple aperture receiver using three apertures, according to an embodiment of the present invention.

Figure 148:
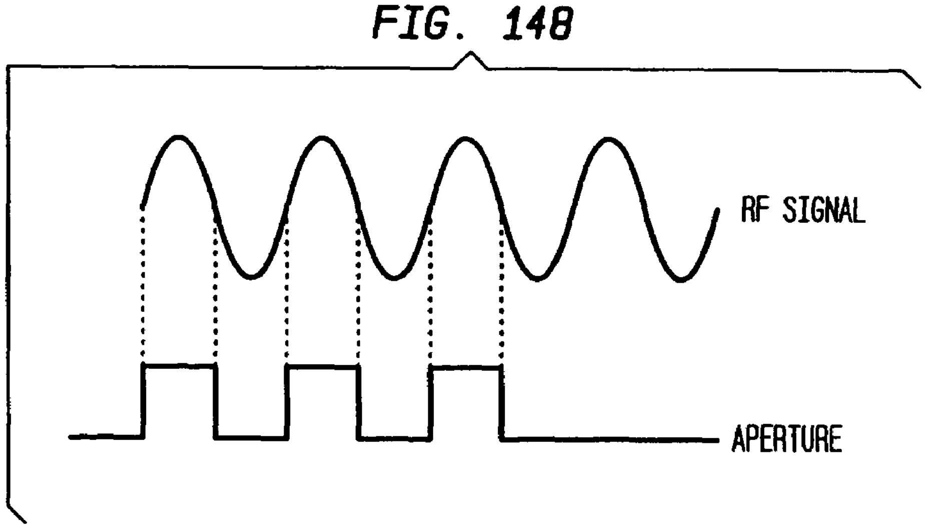

FIG. 148 illustrates exemplary waveforms related to the multiple aperture receiver of FIG. 147, according to an embodiment of the present invention.

Figure 149:
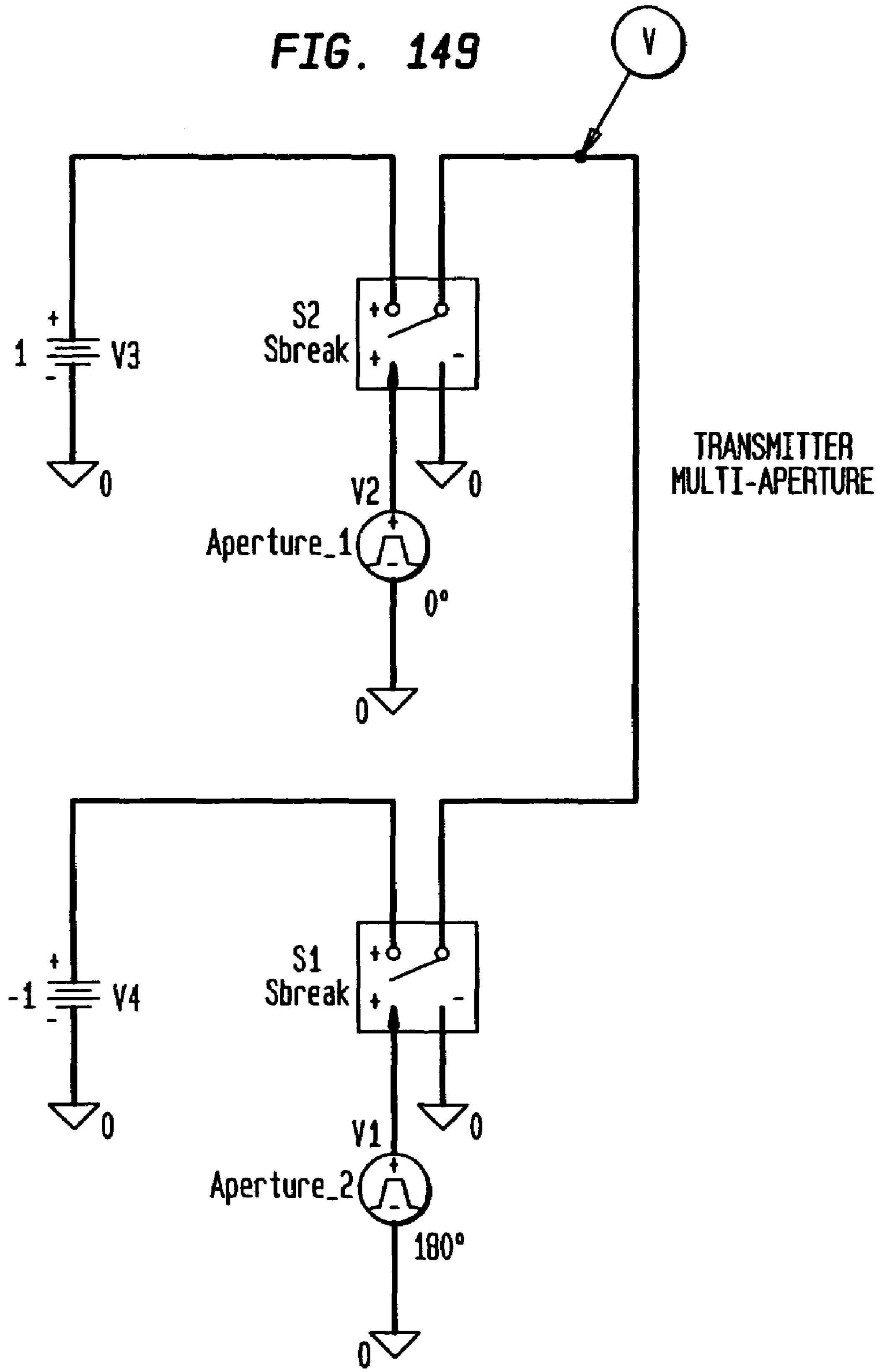

FIG. 149 illustrates an example multiple aperture transmitter, according to an embodiment of the present invention.

Figure 150:
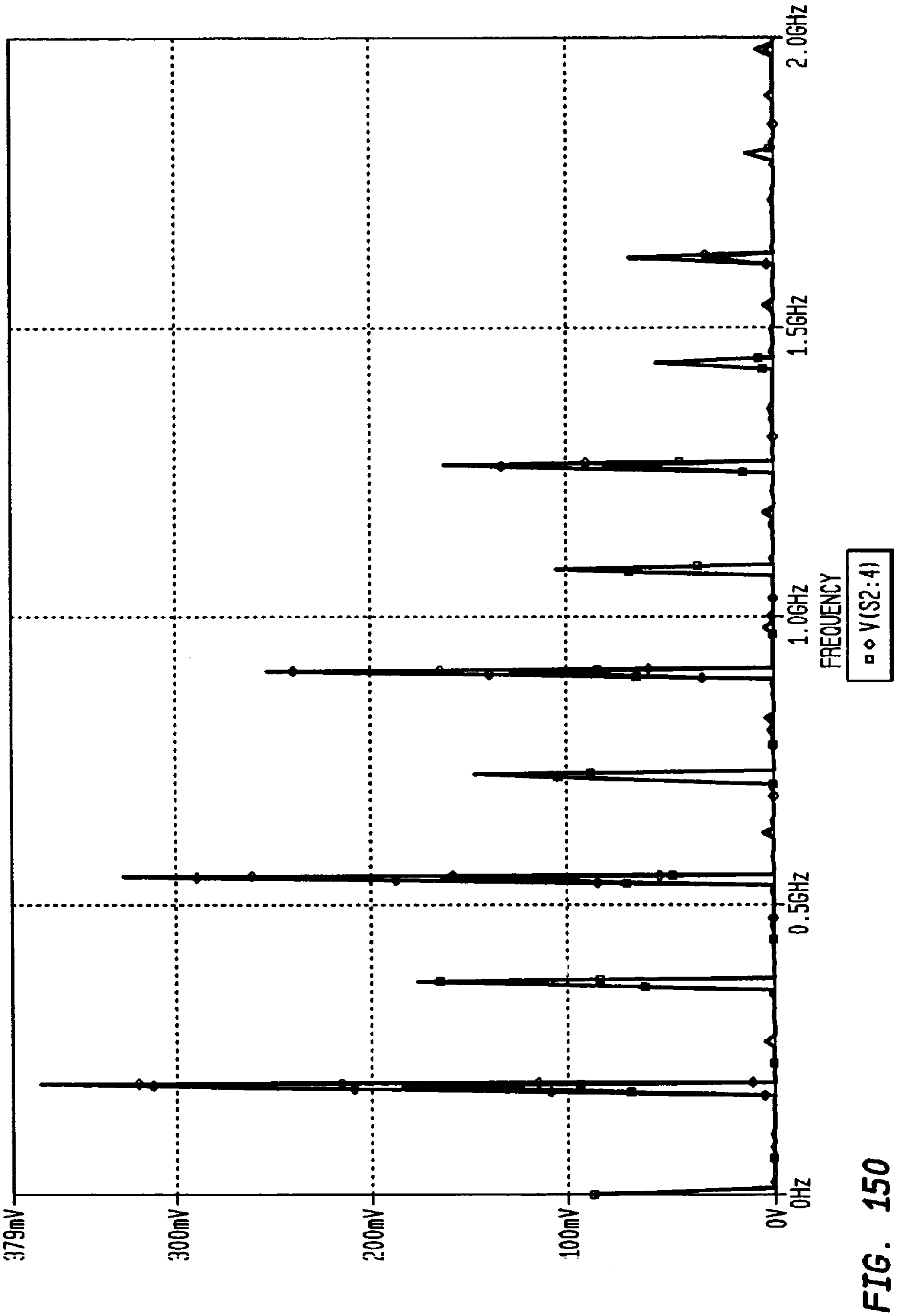

FIG. 150 illustrates example frequency spectrums related to the transmitter of FIG. 149.

Figure 151:
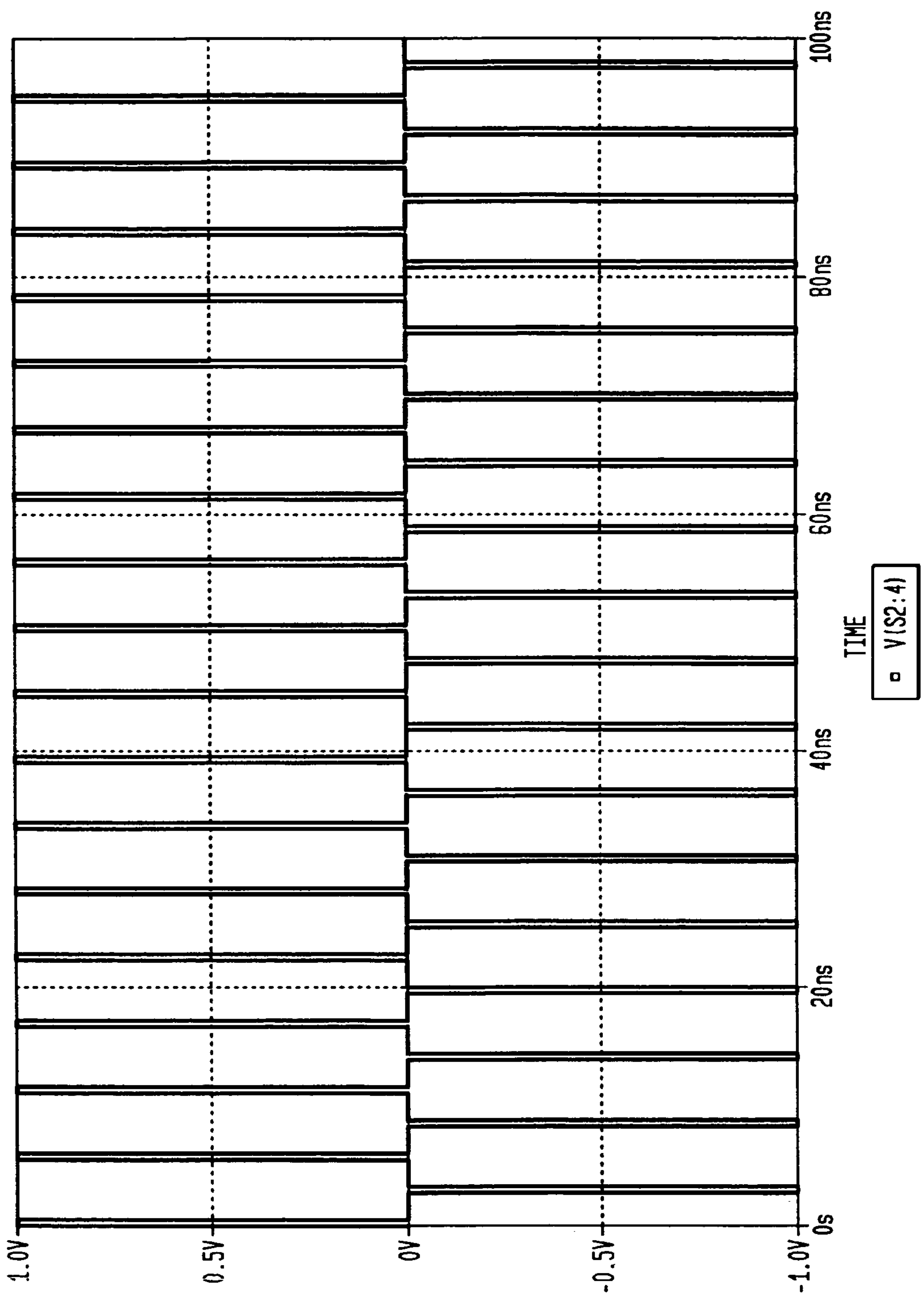

FIG. 151 illustrates an example output waveform in a double aperture implementation of the transmitter of FIG. 149.

Figure 152:
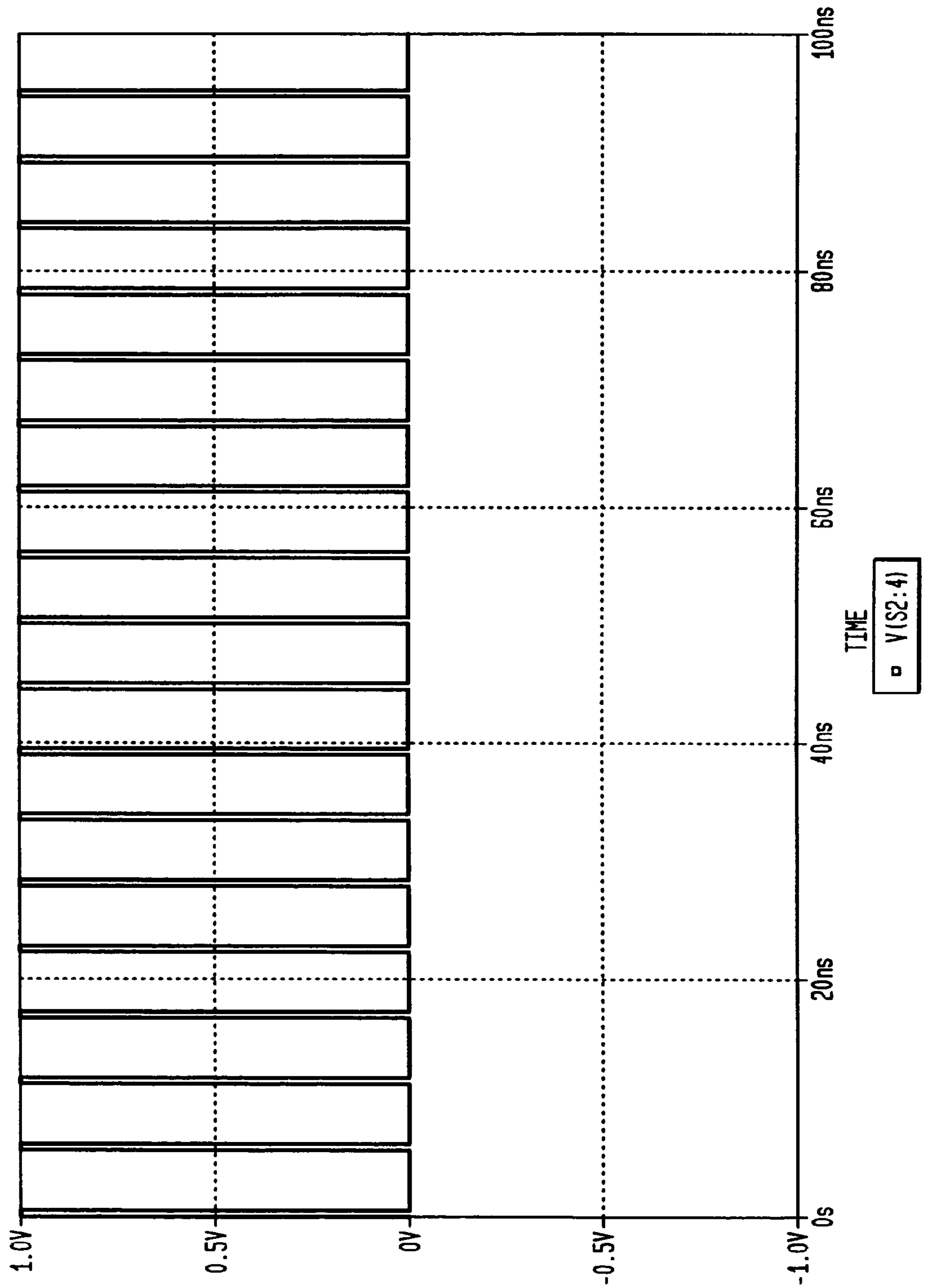

FIG. 152 illustrates an example output waveform in a single aperture implementation of the transmitter of FIG. 149.

FIG. 153 illustrates an example multiple aperture receiver implementation, according to an embodiment of the present invention.

Figure 154:
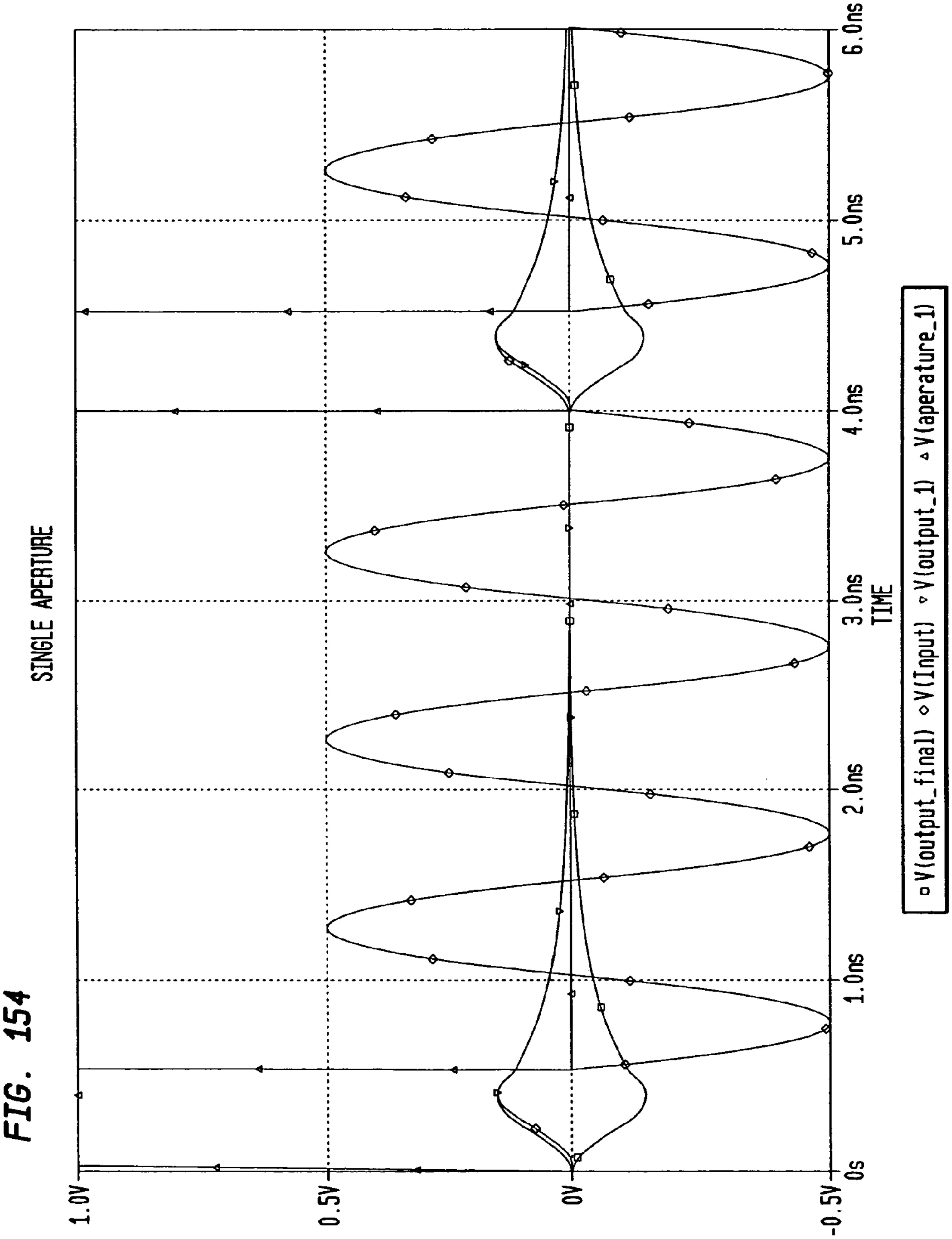

FIG. 154 illustrates exemplary waveforms in a single aperture implementation of the receiver of FIG. 153, according to an embodiment of the present invention.

Figure 155:
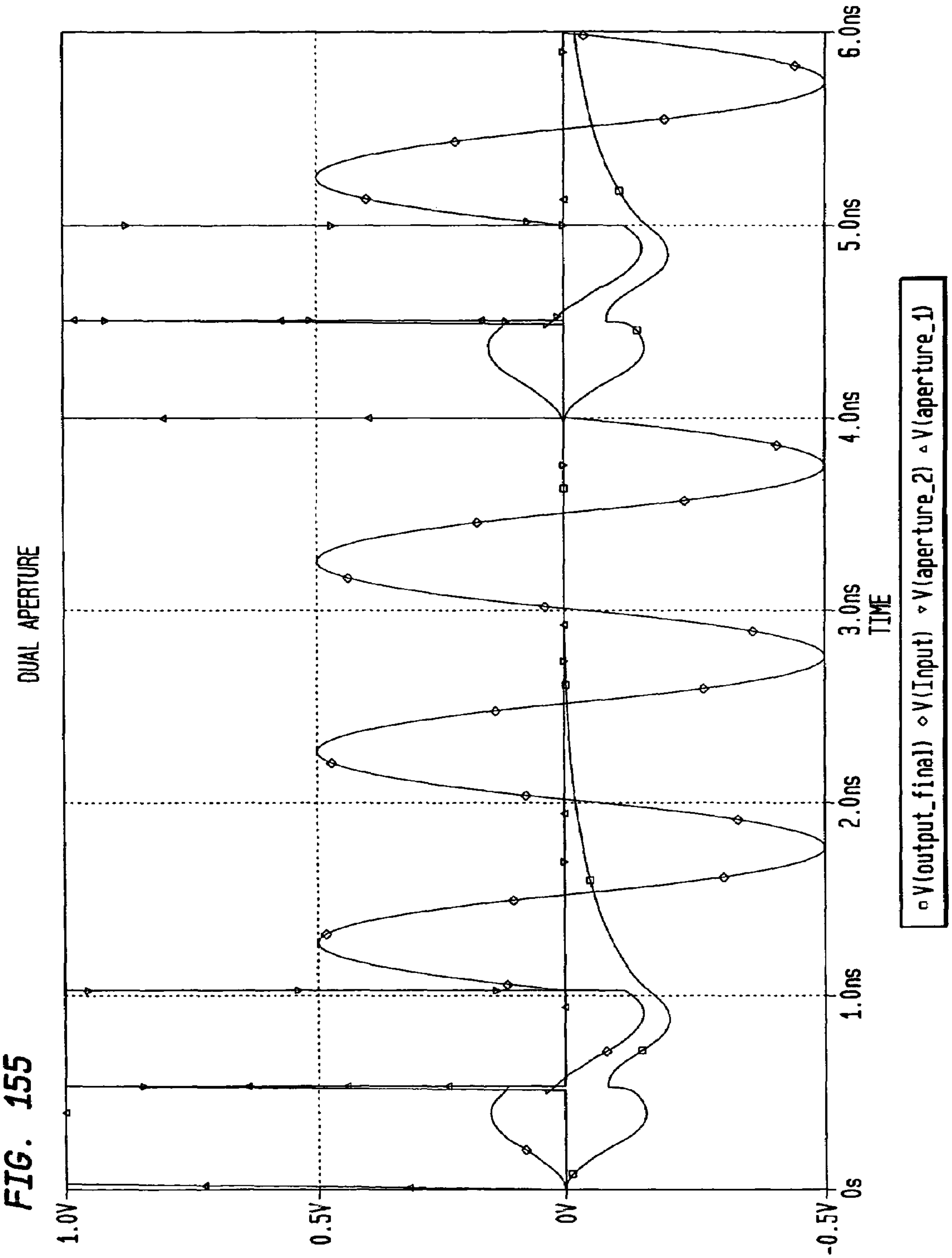

FIG. 155 illustrates exemplary waveforms in a dual aperture implementation of the receiver of FIG. 153, according to an embodiment of the present invention.

Figure 156:
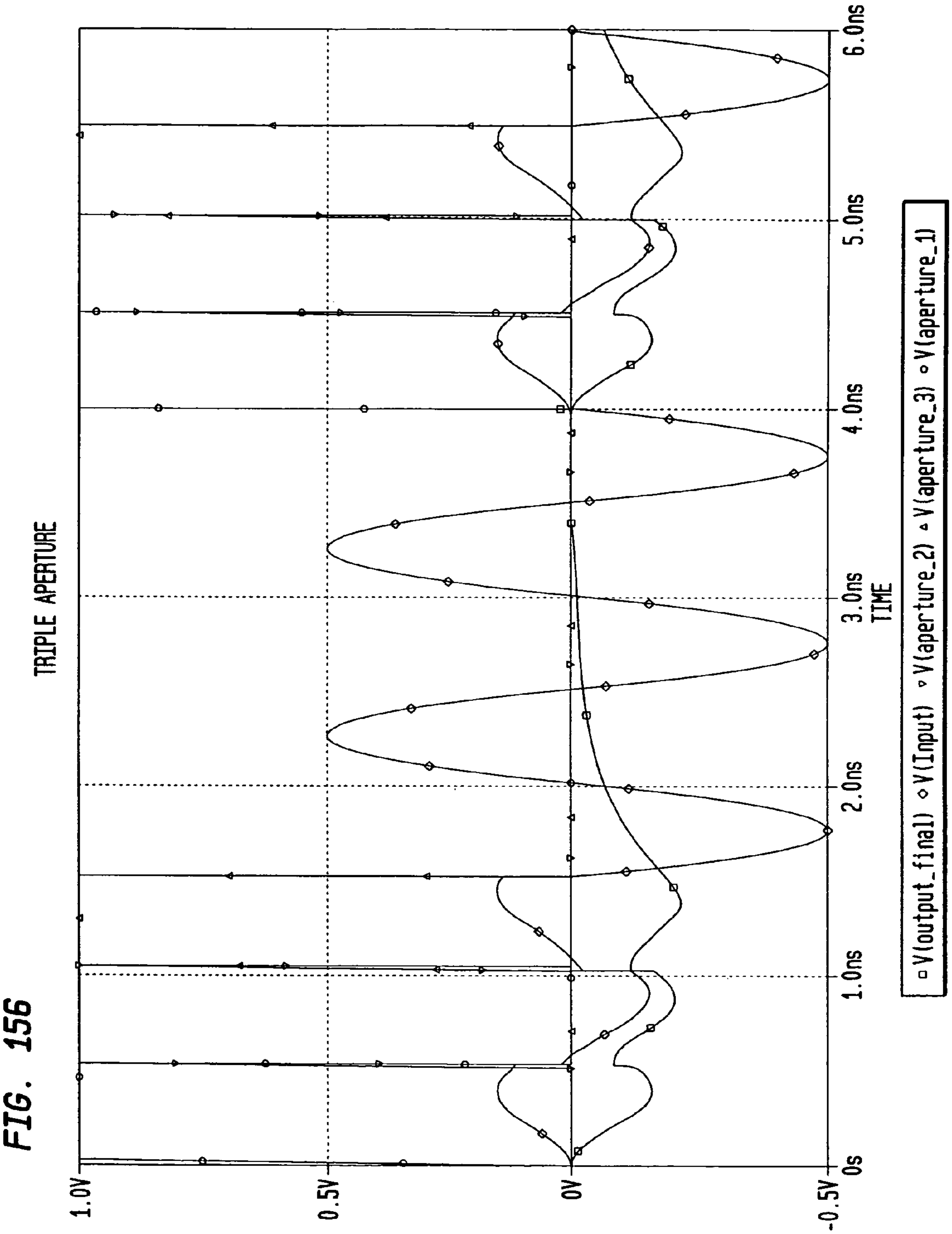

FIG. 156 illustrates exemplary waveforms in a triple aperture implementation of the receiver of FIG. 153, according to an embodiment of the present invention.

Figure 157:
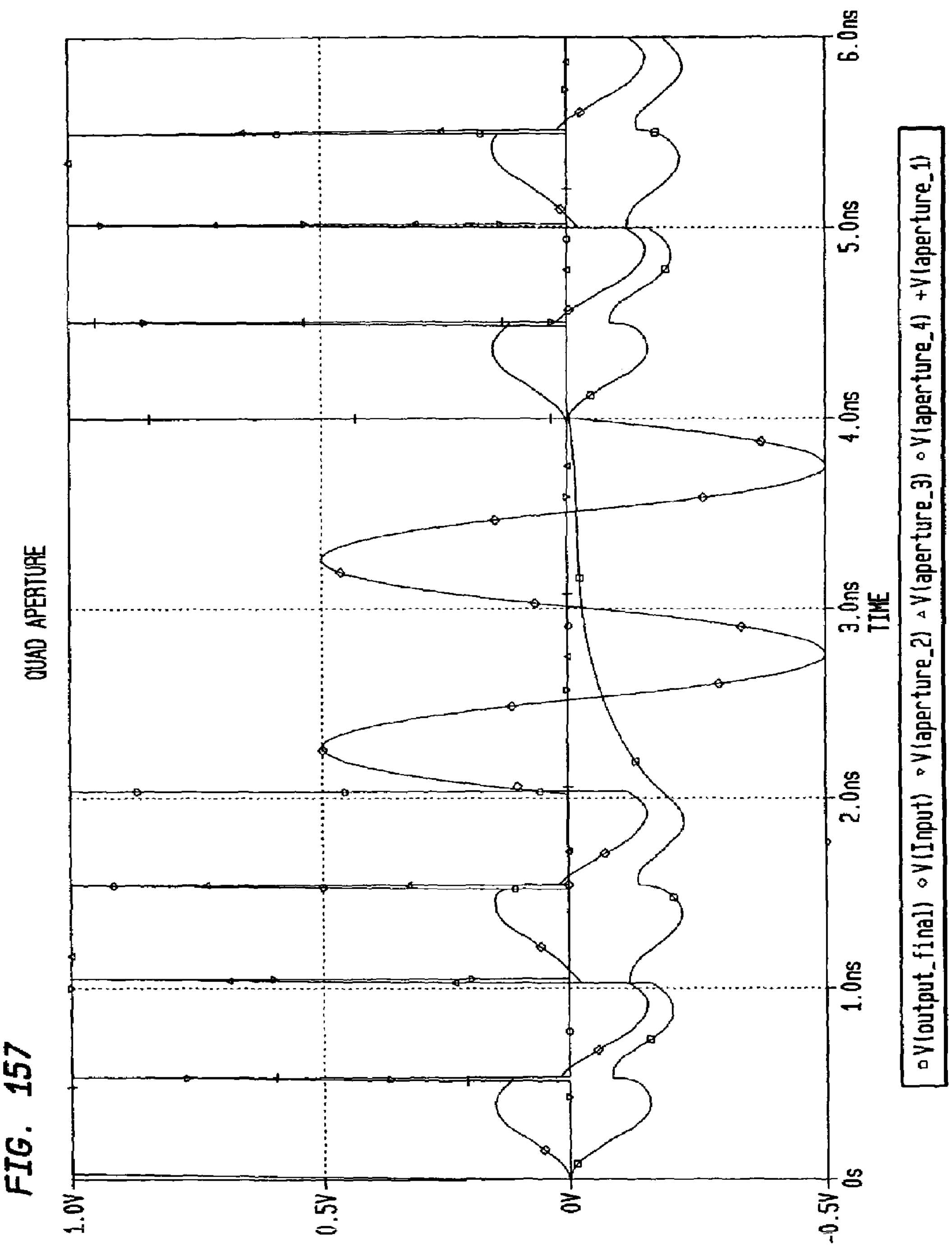

FIG. 157 illustrates exemplary waveforms in quad aperture implementations of the receiver of FIG. 153, according to embodiments of the present invention.

Figure 158:
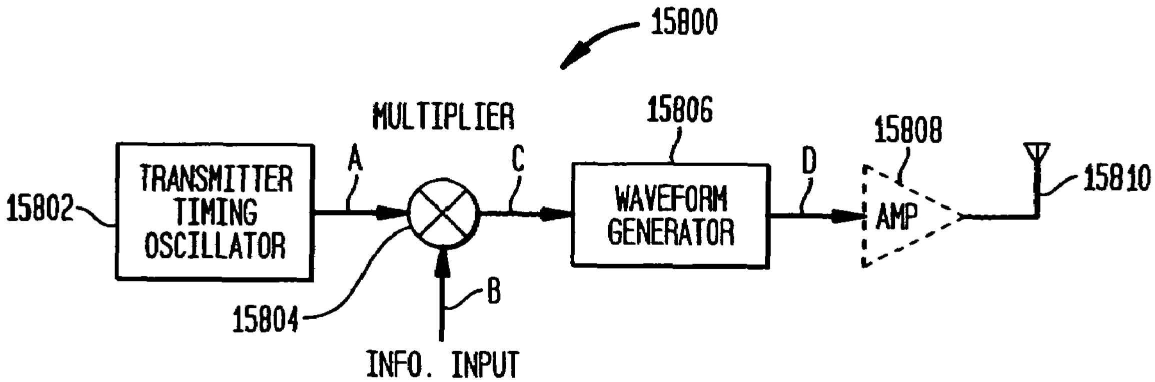
Figure 159:
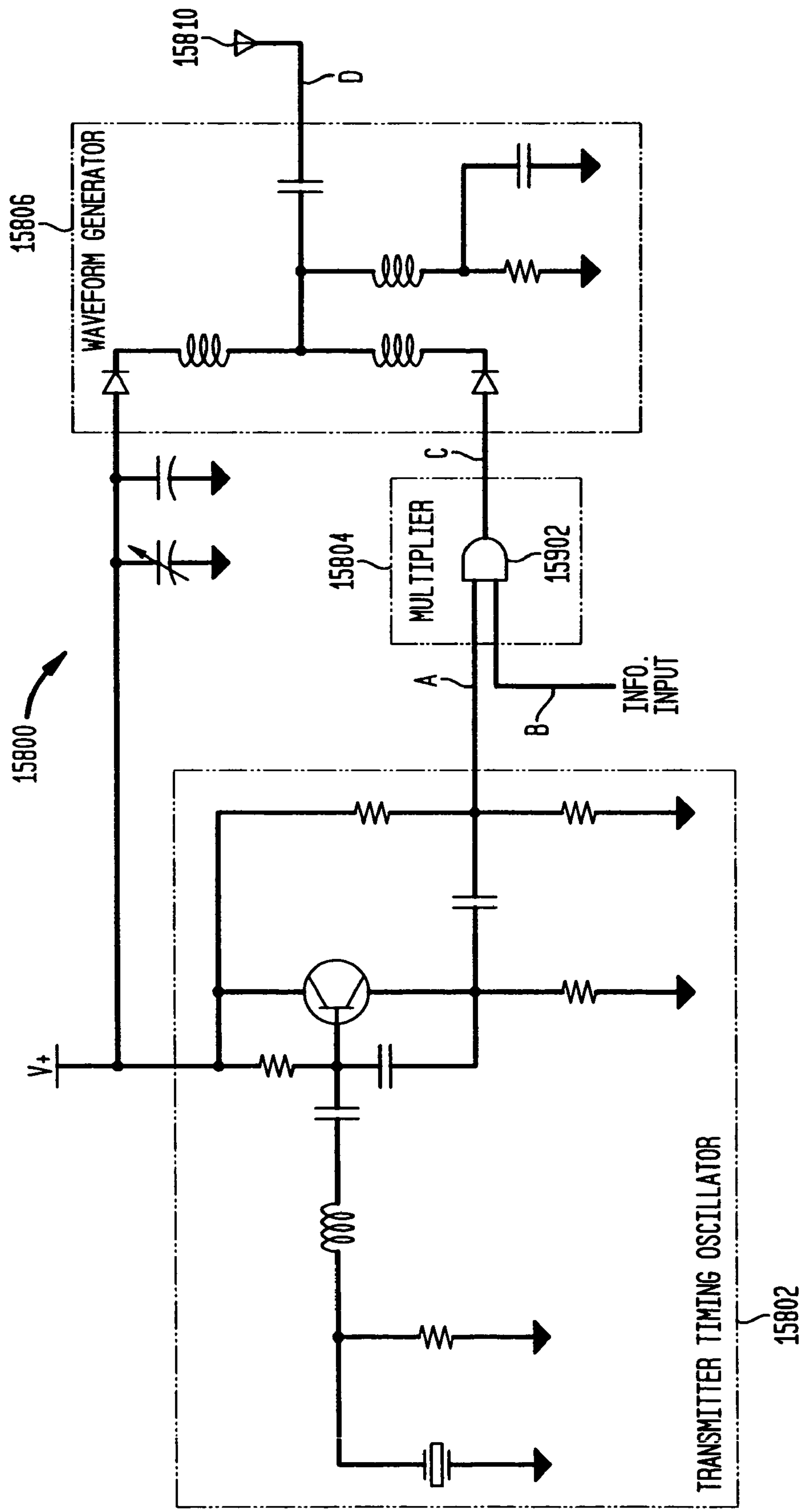
Figure 160A:
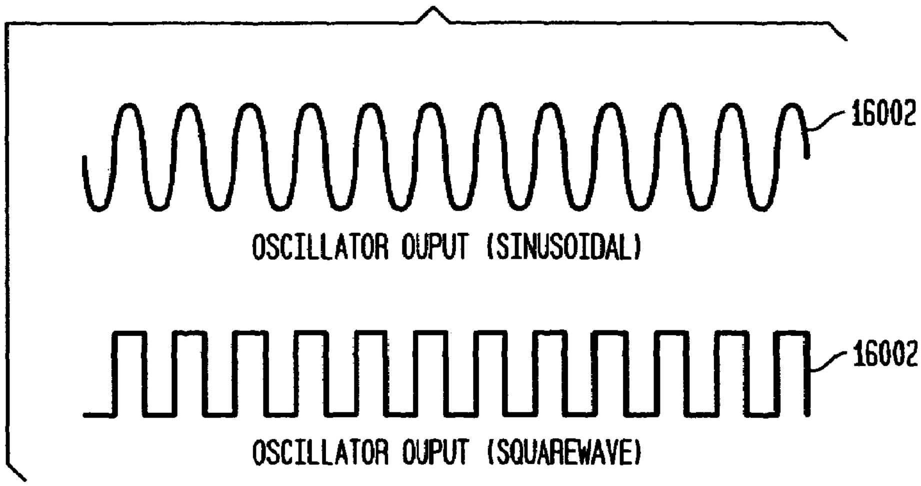
Figure 160B:
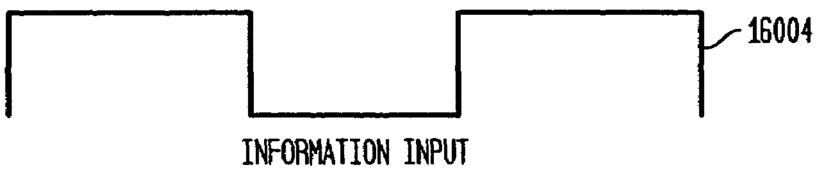
Figure 160C:
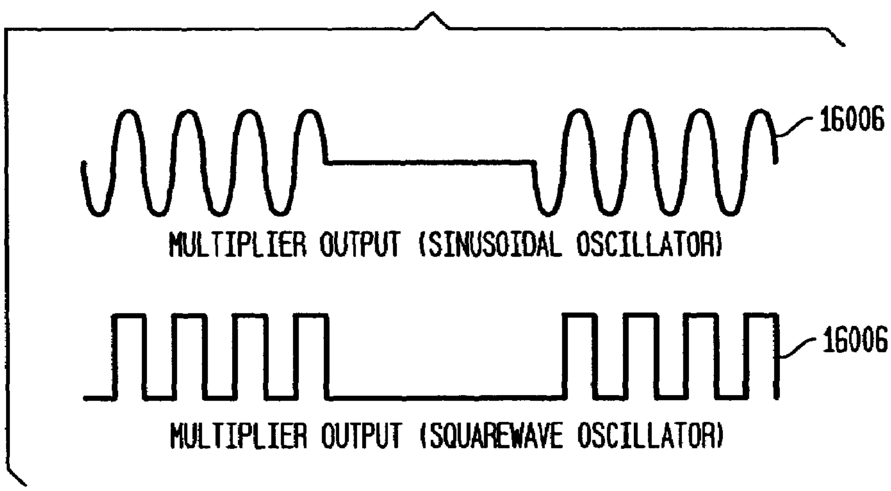
Figure 160D:
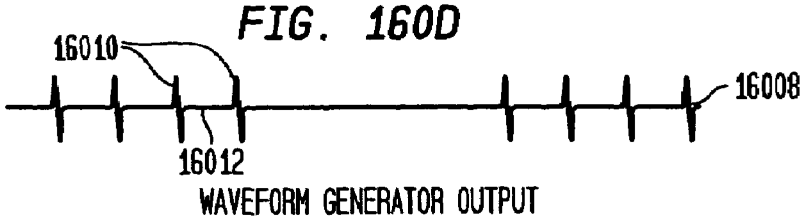

FIGS. 158 and 159 illustrate the amplitude and pulse width modulated transmitter according to embodiments of the present invention.

FIGS. 160A-160D, 161 and 162 illustrate example signal diagrams associated with the amplitude and pulse width modulated transmitter according to embodiments of the present invention.

Figure 163:
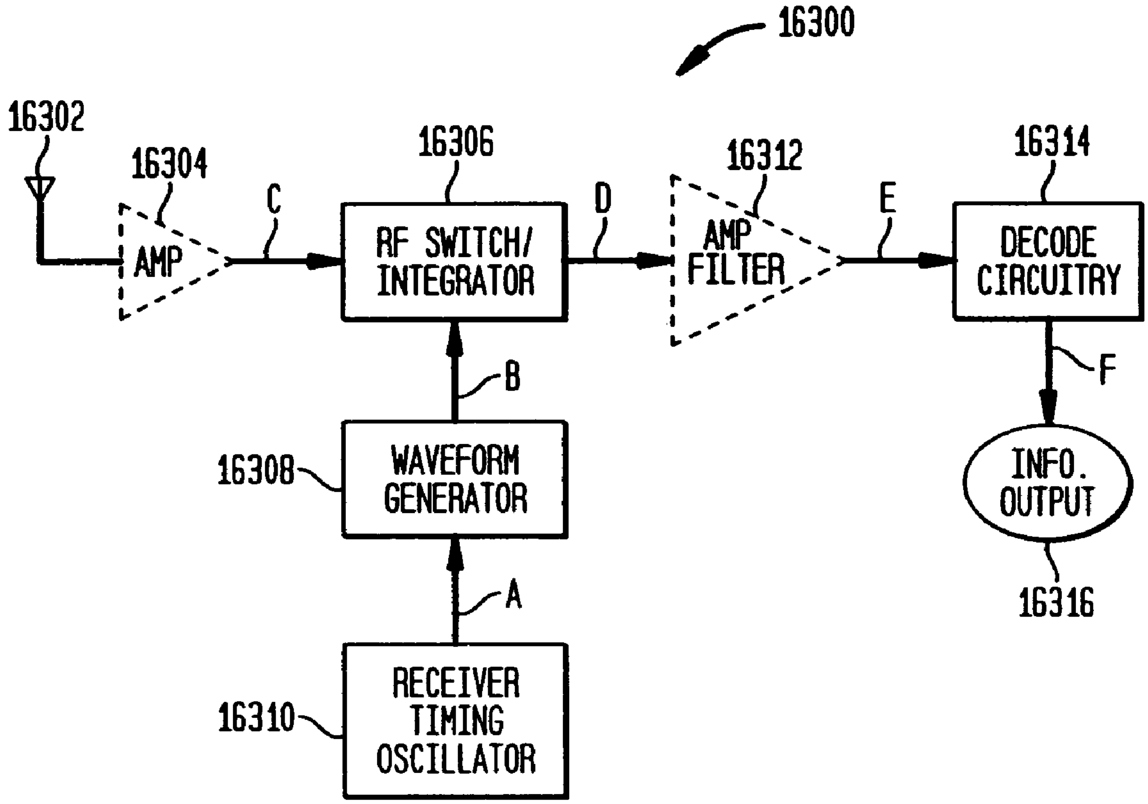
Figure 164A:
Figure 164B:
Figure 164C:
Figure 164D:
Figure 164E:
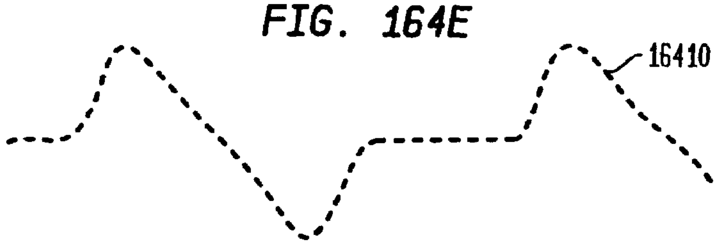
Figure 164G:
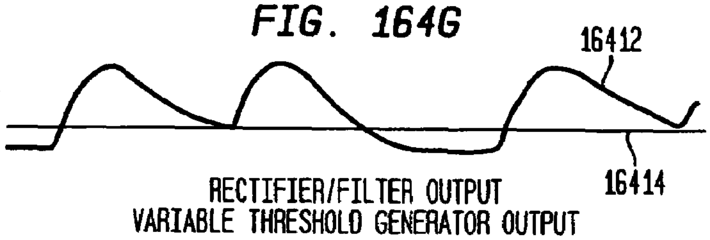
Figure 164F:
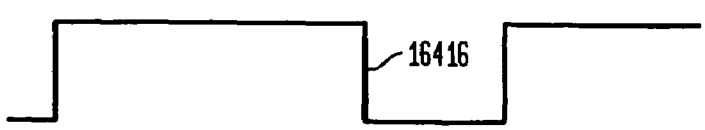

FIG. 163 shows an embodiment of a receiver block diagram to recover the amplitude or pulse width modulated information.

FIG. 164A-164G illustrates example signal diagrams associated with a waveform generator according to embodiments of the present invention.

Figure 165:
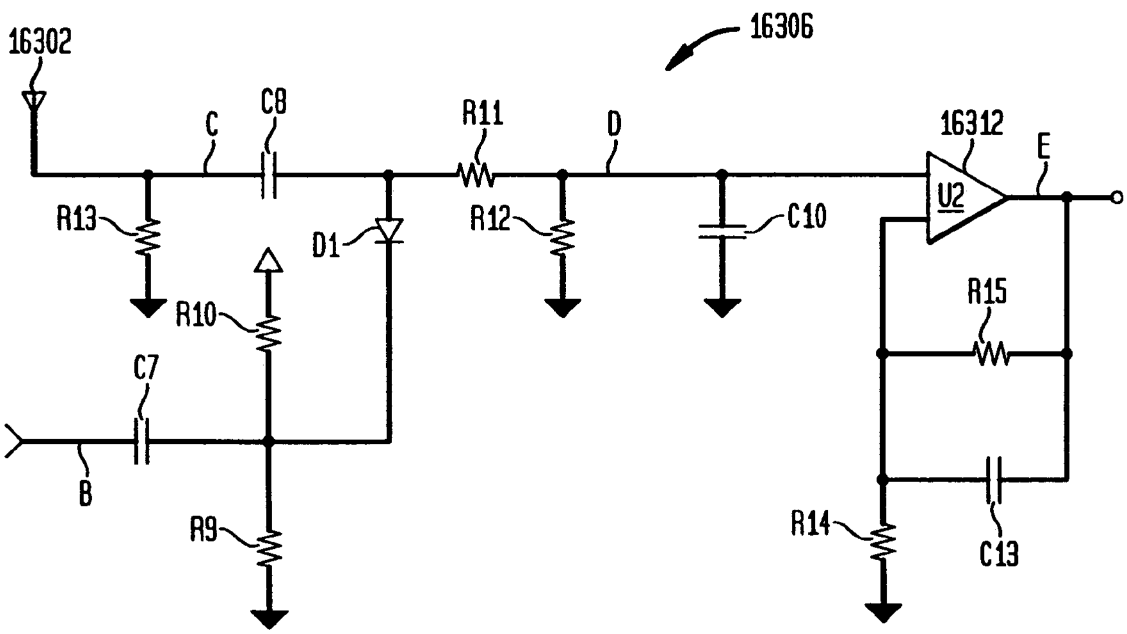
Figure 166:
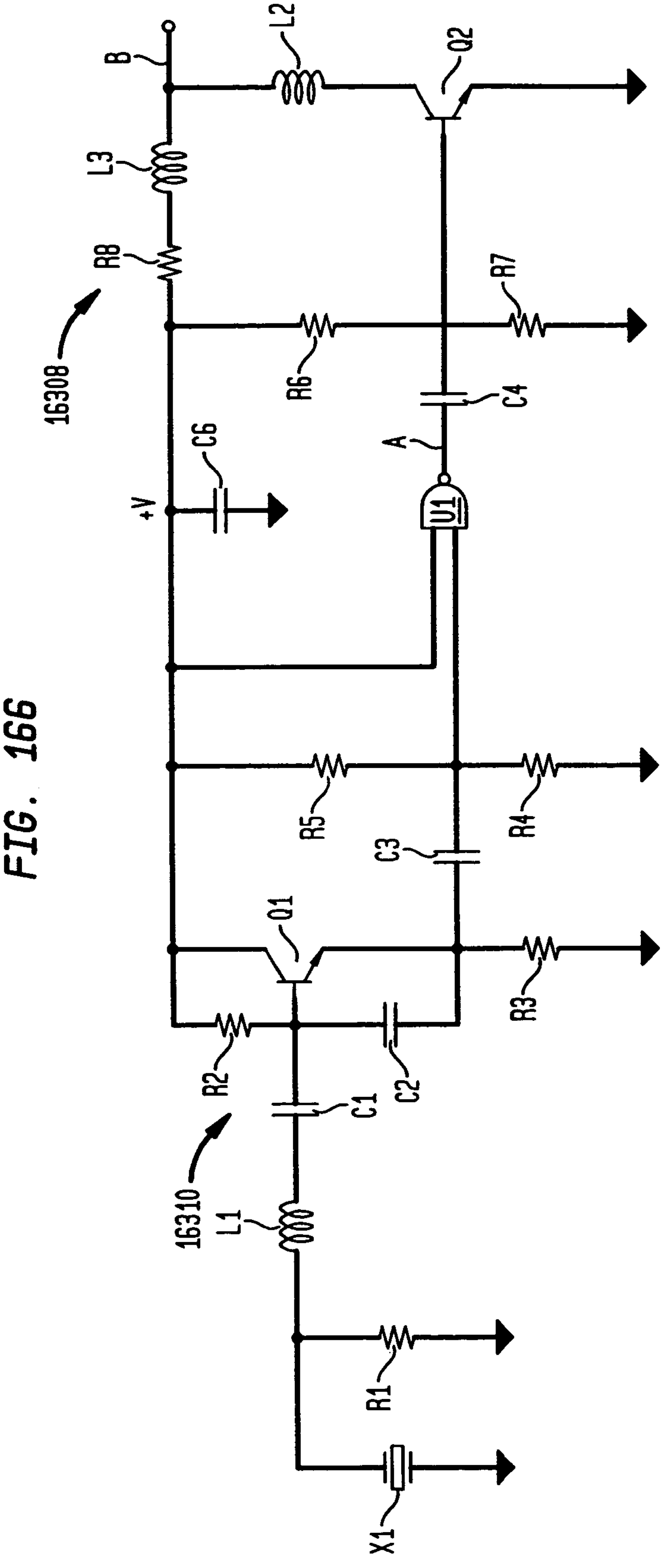
Figure 167:
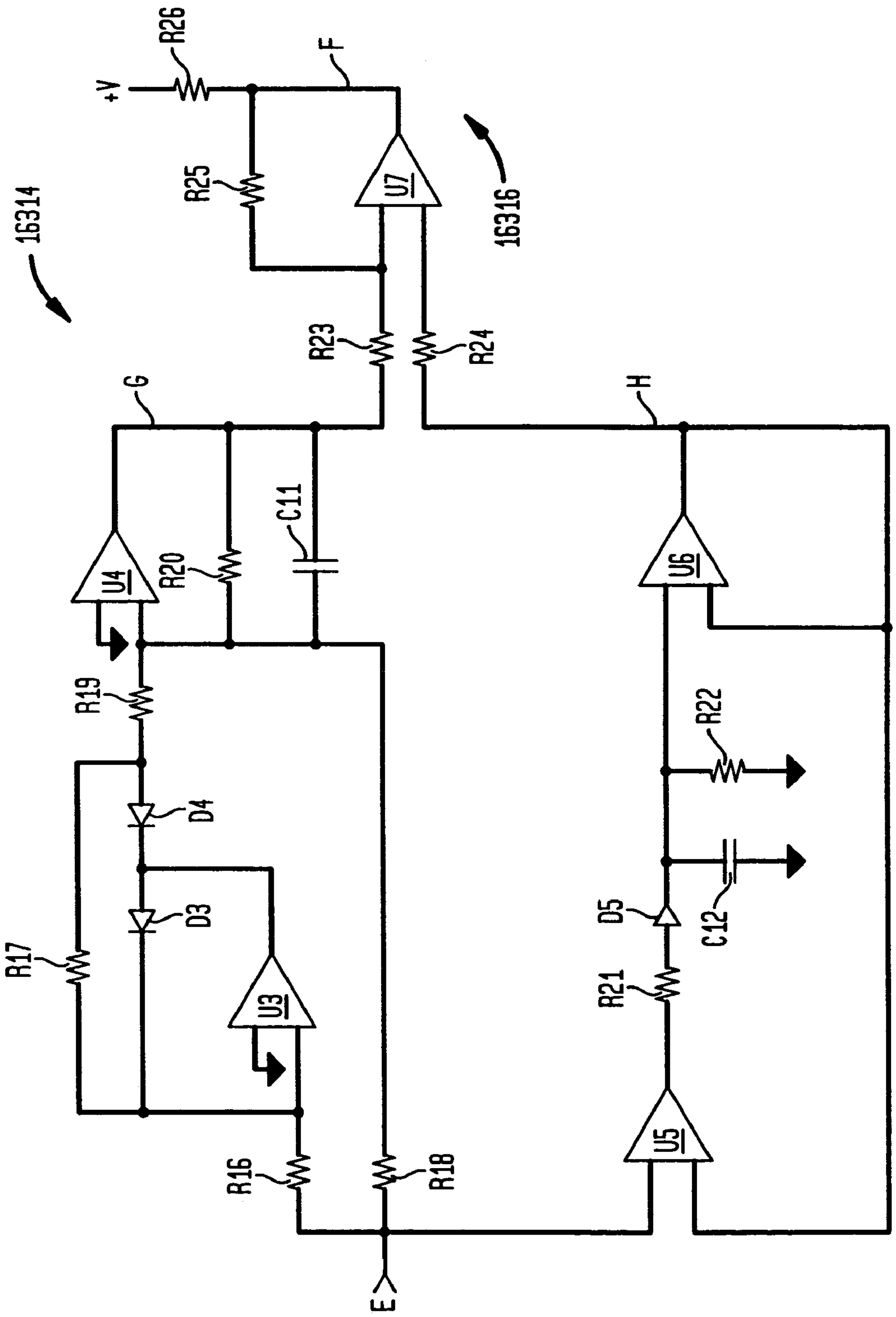

FIGS. 165-167 are example schematic diagrams illustrating various circuits employed in the receiver of FIG. 163.

FIGS. 168-171 illustrate time and frequency domain diagrams of alternative transmitter output waveforms.

Figure 172:
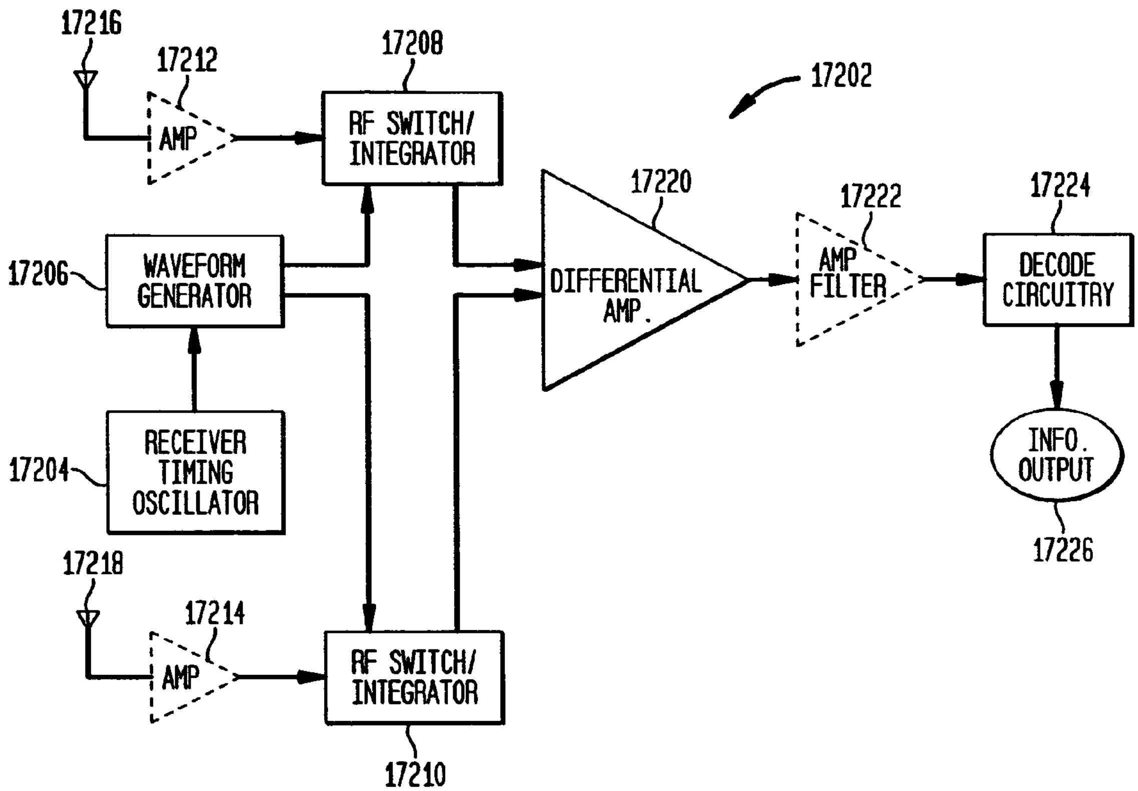
Figure 173:
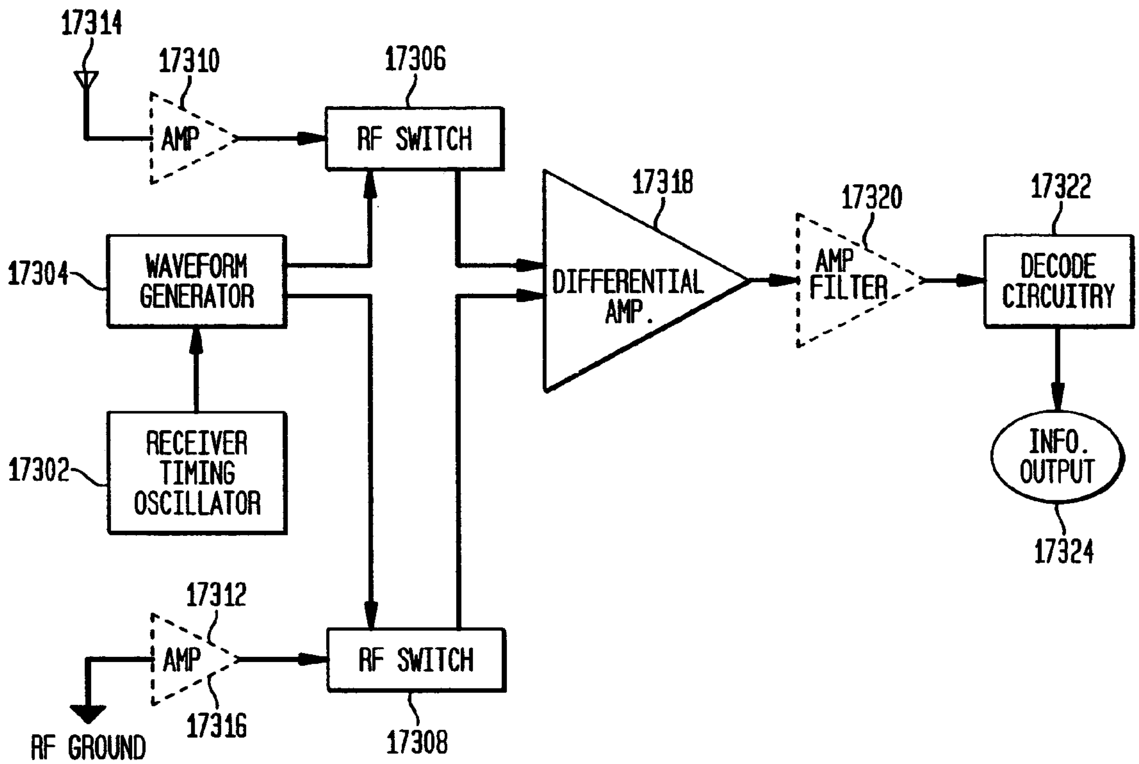

FIGS. 172 and 173 illustrate differential receivers in accord with embodiments of the present invention.

Figure 174:
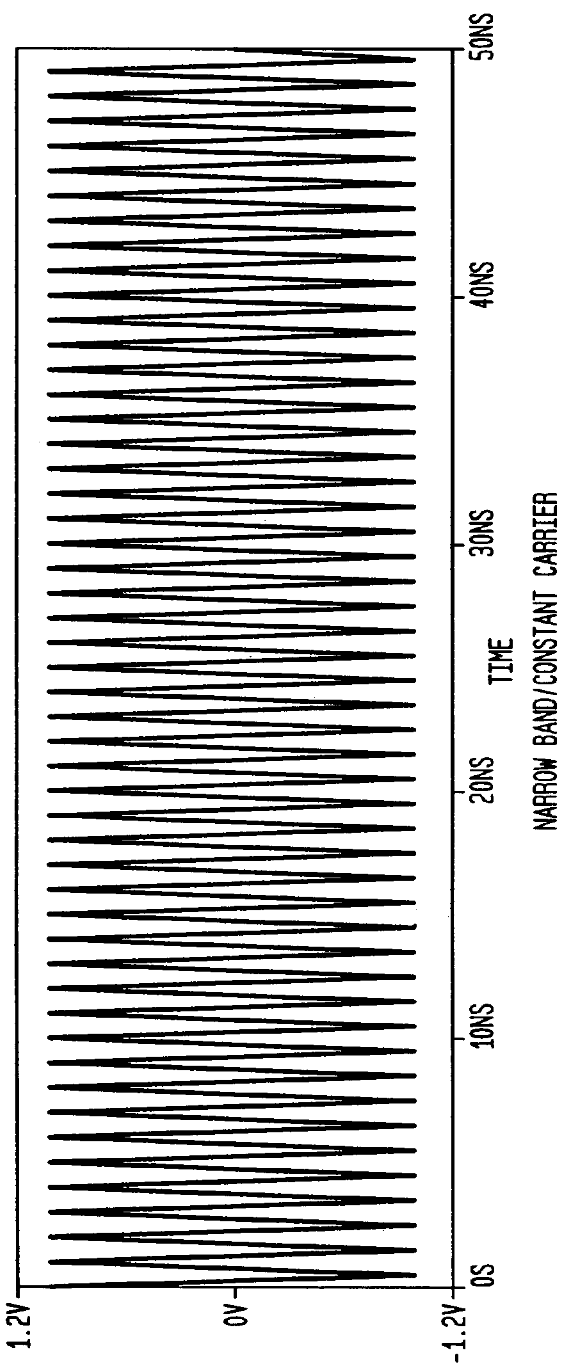
Figure 175:
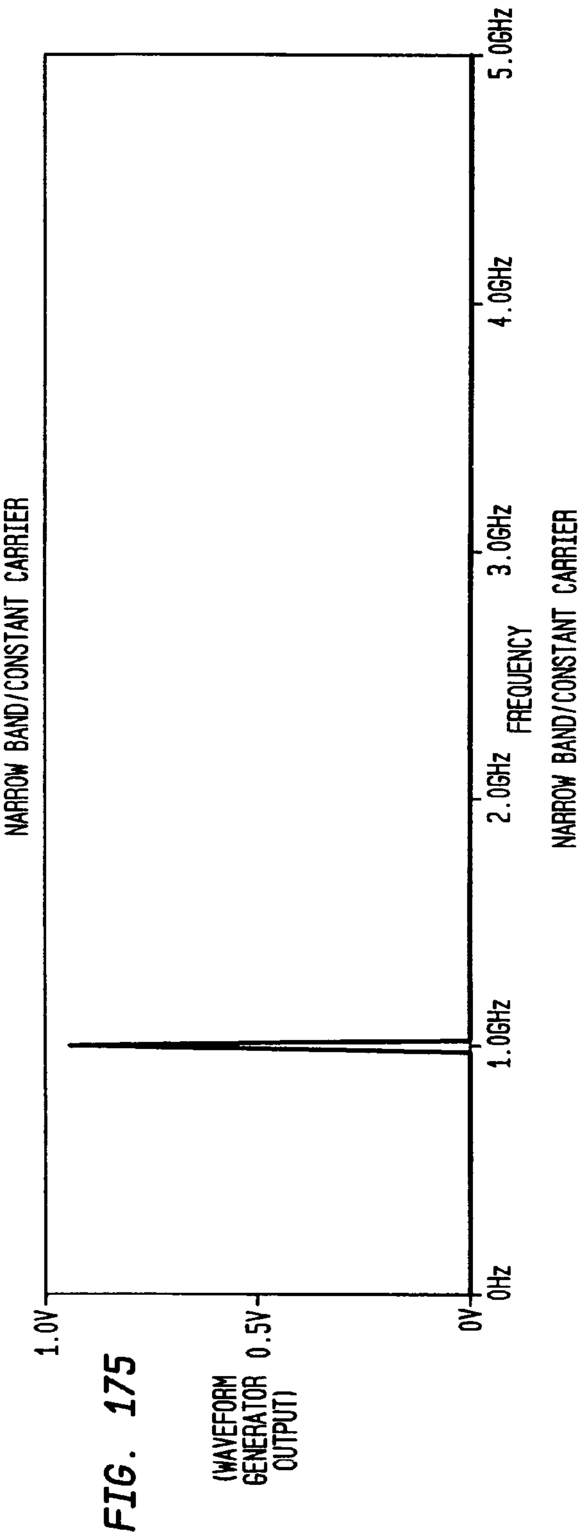

FIGS. 174 and 175 illustrate time and frequency domains for a narrow bandwidth/constant carrier signal in accord with an embodiment of the present invention.

DETAILED DESCRIPTION OF THE INVENTION

1. Introduction
2. Universal Frequency Translation
2.1. Frequency Down-Conversion
2.2. Optional Energy Transfer Signal Module
2.3. Impedance Matching
2.4. Frequency Up-Conversion
2.5. Enhanced Signal Reception
2.6. Unified Down-Conversion and Filtering
3. Example Embodiments of the Invention
3.1. Receiver Embodiments
3.3.1. In-Phase/Quadrature-Phase (I/Q) Modulation Mode Receiver Embodiments
3.1.2. Other Receiver Embodiments
3.2. Transmitter Embodiments
3.2.1. In-Phase/Quadrature-Phase (I/Q) Modulation Mode Transmitter Embodiments
3.3.2. Other Transmitter Embodiments
3.3. Transceiver Embodiments
3.4. Other Embodiments
4. Mathematical Description of the Present Invention
4.1. Overview
4.2. High Level Description of a Matched Filtering/Correlating Characterization/Embodiment of the Invention
4.3. High Level Description of a Finite Time Integrating Characterization/ Embodiment of the Invention
4.4. High Level Description of an RC Processing Characterization/Embodiment of the Invention
4.5. Representation of a Power Signal as a Sum of Energy Signals
4.5.1. De-Composition of a Sine Wave into an Energy Signal Representation
4.5.2. Decomposition of Sine Waveforms
4.6. Matched Filtering/Correlating Characterization/Embodiment
4.6.1. Time Domain Description
4.6.2. Frequency Domain Description
4.7. Finite Time Integrating Characterization/Embodiment
4.8. RC Processing Characterization/Embodiment
4.9. Charge Transfer and Correlation
4.10. Load Resistor Consideration
4.11. Signal-To-Noise Ratio Comparison of the Various Embodiments
4.12. Carrier Offset and Phase Skew Characteristics of Embodiments of the Present Invention
4.13. Multiple Aperture Embodiments of the Present Invention
4.14. Mathematical Transform Describing Embodiments of the Present Invention
4.14.1. Overview
4.14.2. The Kernel for Embodiments of the Invention
4.14.3. Waveform Information Extraction
4.15. Proof Statement for UFT Complex Downconverter Embodiment of the Present Invention
4.16. Acquisition and Hold Processor Embodiment
4.17. Comparison of the UFT Transform to the Fourier Sine and Cosine Transforms
4.18. Conversion, Fourier Transform, and Sampling Clock Considerations
4.19. Phase Noise Multiplication
4.20. AM-PM Conversion and Phase Noise
4.21. Pulse Accumulation and System Time Constant
4.21.1. Pulse Accumulation
4.21.2. Pulse Accumulation by Correlation
4.22. Energy Budget Considerations
4.23. Energy Storage Networks
4.24. Impedance Matching
4.25. Time Domain Analysis
4.26. Complex Passband Waveform Generation Using the Present Invention Cores 4.27. Example Embodiments of the Invention
4.27.1. Example I/Q Modulation Receiver Embodiment
4.27.2. Example I/Q Modulation Control Signal Generator Embodiments
4.27.3. Detailed Example I/Q Modulation Receiver Embodiment with Exemplary Waveforms
4.27.4. Example Single Channel Receiver Embodiment
4.27.5. Example Automatic Gain Control (AGC) Embodiment
4.27.6. Other Example Embodiments
5. Architectural Features of the Invention
6. Additional Benefits of the Invention
6.1. Compared to an Impulse Sampler
6.2. Linearity
6.3. Optimal Power Transfer into a Scalable Output Impedance
6.4. System Integration
6.5. Fundamental or Sub-Harmonic Operation
6.6. Frequency Multiplication and Signal Gain
6.7. Controlled Aperture Sub-Harmonic Matched Filter Features
6.71. Non-Negligible Aperture
6.7.2. Bandwidth
6.7.3. Architectural Advantages of a Universal Frequency Down-Converter
6.7.4. Complimentary FET Switch Advantages
6.7.5. Differential Configuration Characteristics
6.7.6. Clock Spreading Characteristics
6.7.7. Controlled Aperture Sub Harmonic Matched Filter Principles
6.7.8. Effects of Pulse Width Variation
6.8. Conventional Systems
6.8.1. Heterodyne Systems
6.8.2. Mobile Wireless Devices
6.9. Phase Noise Cancellation
6.10. Multiplexed UFD
6.11. Sampling Apertures
6.12. Diversity Reception and Equalizers
7. Conclusions
8. Glossary of Terms
9. Conclusion 1. Introduction The present invention is directed to the down-conversion and up-conversion of an electromagnetic signal using a universal frequency translation (UFT) module, transforms for same, and applications thereof. The systems described herein each may include one or more receivers, transmitters, and transceivers. According to embodiments of the invention, at least some of these receivers, transmitters, and transceivers are implemented using universal frequency translation (UFT) modules. The UFT modules perform frequency translation operations. Embodiments of the present invention incorporating various applications of the UFT module are described below.

Systems that transmit and receive EM signals using UFT modules exhibit multiple advantages. These advantages include, but are not limited to, lower power consumption, longer power source life, fewer parts, lower cost, less tuning, and more effective signal transmission and reception. These systems can receive and transmit signals across a broad frequency range. The structure and operation of embodiments of the UFT module, and various applications of the same are described in detail in the following sections, and in the referenced documents.

2. Universal Frequency Translation

The present invention is related to frequency translation, and applications of same. Such applications include, but are not limited to, frequency down-conversion, frequency up-conversion, enhanced signal reception, unified down-conversion and filtering, and combinations and applications of same.

Figure 1A:
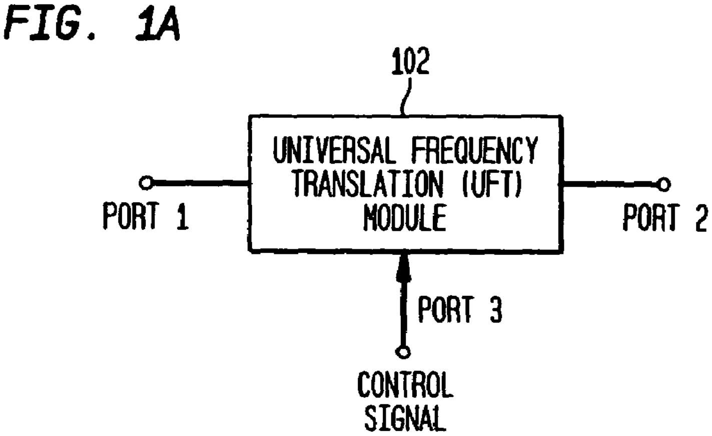
FIG. 1A is a block diagram of a universal frequency translation (UFT) module according to an embodiment of the invention.

FIG. 1A illustrates a universal frequency translation (UFT) module 102 according to embodiments of the invention. (The UFT module is also sometimes called a universal frequency translator, or a universal translator.)

As indicated by the example of FIG. 1A, some embodiments of the UFT module 102 include three ports (nodes), designated in FIG. 1A as Port 1, Port 2, and Port 3. Other UFT embodiments include other than three ports.

Generally, the UFT module 102 (perhaps in combination with other components) operates to generate an output signal from an input signal, where the frequency of the output signal differs from the frequency of the input signal. In other words, the UFT module 102 (and perhaps other components) operates to generate the output signal from the input signal by translating the frequency (and perhaps other characteristics) of the input signal to the frequency (and perhaps other characteristics) of the output signal.

Figure 1B:
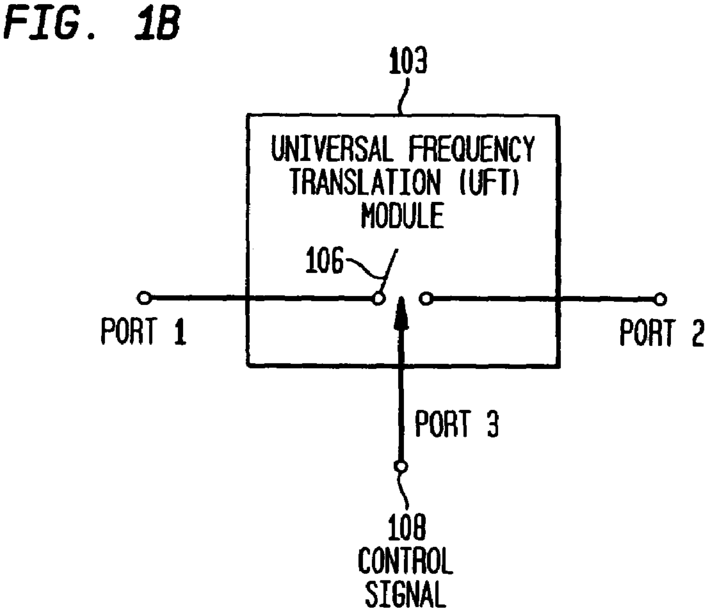
FIG. 1B is a more detailed diagram of a universal frequency translation (UFT) module according to an embodiment of the invention.

An example embodiment of the UFT module 103 is generally illustrated in FIG. 1B. Generally, the UFT module 103 includes a switch 106 controlled by a control signal 108. The switch 106 is said to be a controlled switch.

Figure 2:
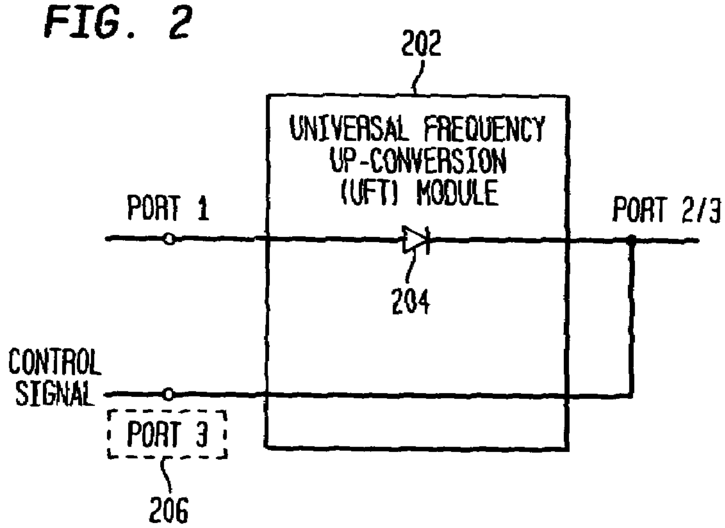
FIG. 2 is a block diagram of a universal frequency translation (UFT) module according to an alternative embodiment of the invention.

As noted above, some UFT embodiments include other than three ports. For example, and without limitation, FIG. 2 illustrates an example UFT module 202. The example UFT module 202 includes a diode 204 having two ports, designated as Port 1 and Port 2/3. This embodiment does not include a third port, as indicated by the dotted line around the "Port 3" label.

The UFT module is a very powerful and flexible device. Its flexibility is illustrated, in part, by the wide range of applications in which it can be used. Its power is illustrated, in part, by the usefulness and performance of such applications.

Figure 1C:
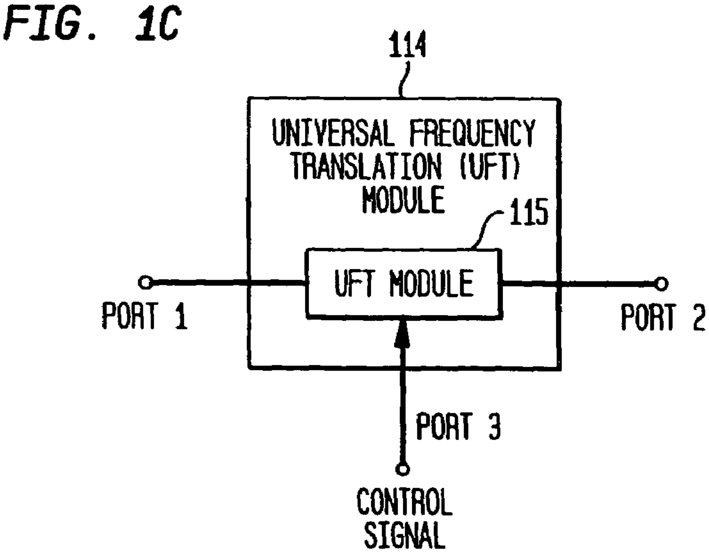
FIG. 1C illustrates a UFT module used in a universal frequency down-conversion (UFD) module according to an embodiment of the invention.

For example, a UFT module 115 can be used in a universal frequency down-conversion (UFD) module 114, an example of which is shown in FIG. 1C. In this capacity, the UFT module 115 frequency down-converts an input signal to an output signal.

Figure 1D:
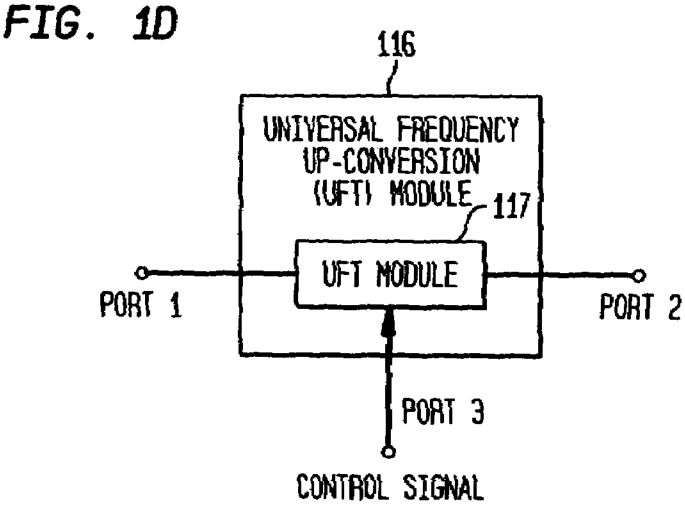
FIG. 1D illustrates a UFT module used in a universal frequency up-conversion (UFU) module according to an embodiment of the invention.

As another example, as shown in FIG. 1D, a UFT module 117 can be used in a universal frequency up-conversion (UFU) module 116. In this capacity, the UFT module 117 frequency up-converts an input signal to an output signal.

These and other applications of the UFT module are described below. Additional applications of the UFT module will be apparent to persons skilled in the relevant art(s) based on the teachings contained herein. In some applications, the UFT module is a required component. In other applications, the UFT module is an optional component.

2.1. Frequency Down-Conversion

The present invention is directed to systems and methods of universal frequency down-conversion, and applications of same.

In particular, the following discussion describes down-converting using a Universal Frequency Translation Module. The down-conversion of an EM signal by aliasing the EM signal at an aliasing rate is fully described in U.S. Pat. No. 6,061,551 entitled "Method and System for Down-Converting Electromagnetic Signals," assigned to the assignee of the present invention, the full disclosure of which is incorporated herein by reference. A relevant portion of the above-mentioned patent is summarized below to describe down-converting an input signal to produce a down-converted signal that exists at a lower frequency or a baseband signal. The frequency translation aspects of the invention are further described in other documents referenced above, such as application Ser. No. 09/550,644, entitled "Method and System for Down-converting an Electromagnetic Signal, and Transforms for Same, and Aperture Relationships."

Figure 3A:
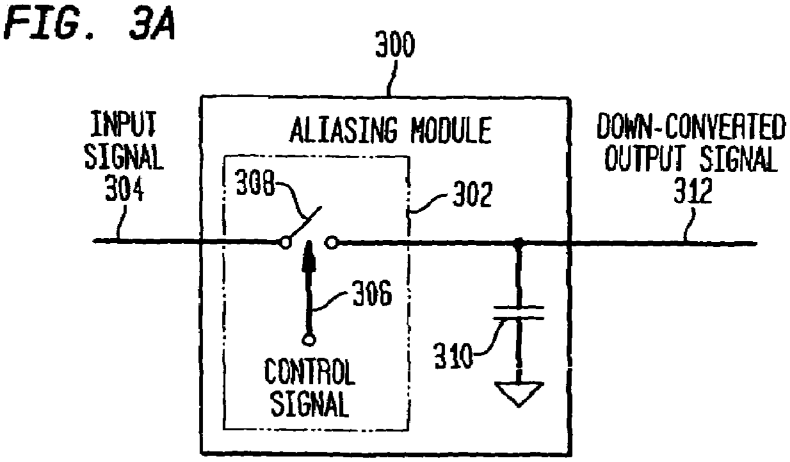
FIGS. 3A and 3G are example aliasing modules according to embodiments of the invention.
Figure 3B:
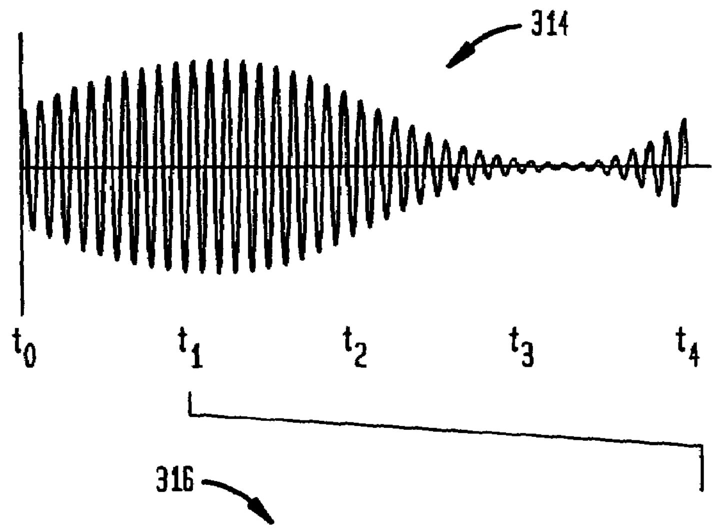
FIGS. 3B-3F are example waveforms used to describe the operation of the aliasing modules of FIGS. 3A and 3G.
Figure 3C:
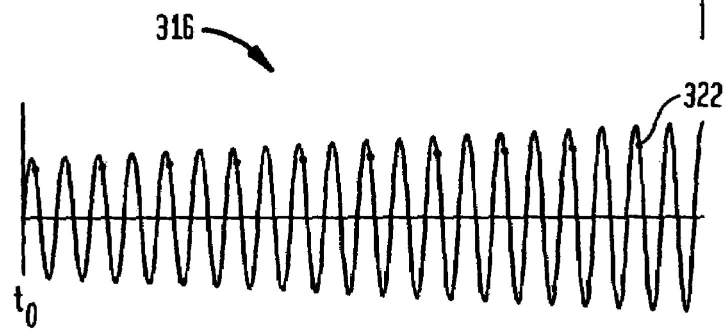

FIG. 3A illustrates an aliasing module 300 for down-conversion using a universal frequency translation (UFT) module 302 which down-converts an EM input signal 304. In particular embodiments, aliasing module 300 includes a switch 308 and a capacitor 310 (or integrator). (In embodiments, the UFT module is considered to include the switch and integrator.) The electronic alignment of the circuit components is flexible. That is, in one implementation, the switch 308 is in series with input signal 304 and capacitor 310 is shunted to ground (although it may be other than ground in configurations such as differential mode). In a second implementation (see FIG. 3G), the capacitor 310 is in series with the input signal 304 and the switch 308 is shunted to ground (although it may be other than ground in configurations such as differential mode). Aliasing module 300 with UFT module 302 can be tailored to down-convert a wide variety of electromagnetic signals using aliasing frequencies that are well below the frequencies of the EM input signal 304.

In one implementation, aliasing module 300 down-converts the input signal 304 to an intermediate frequency (IF) signal. In another implementation, the aliasing module 300 down-converts the input signal 304 to a demodulated baseband signal. In yet another implementation, the input signal 304 is a frequency modulated (FM) signal, and the aliasing module 300 down-converts it to a non-FM signal, such as a phase modulated (PM) signal or an amplitude modulated (AM) signal. Each of the above implementations is described below.

In an embodiment, the control signal 306 includes a train of pulses that repeat at an aliasing rate that is equal to, or less than, twice the frequency of the input signal 304. In this embodiment, the control signal 306 is referred to herein as an aliasing signal because it is below the Nyquist rate for the frequency of the input signal 304. Preferably, the frequency of control signal 306 is much less than the input signal 304.

Figure 3D:
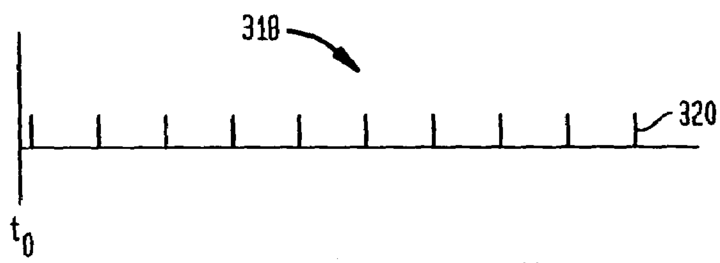
Figure 3E:
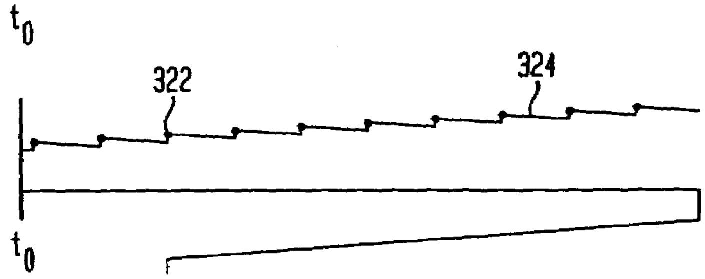

A train of pulses 318 as shown in FIG. 3D controls the switch 308 to alias the input signal 304 with the control signal 306 to generate a down-converted output signal 312. More specifically, in an embodiment, switch 308 closes on a first edge of each pulse 320 of FIG. 3D and opens on a second edge of each pulse. When the switch 308 is closed, the input signal 304 is coupled to the capacitor 310, and charge is transferred from the input signal to the capacitor 310. The charge stored during successive pulses forms down-converted output signal 312.

Exemplary waveforms are shown in FIGS. 3B-3F.

FIG. 3B illustrates an analog amplitude modulated (AM) carrier signal 314 that is an example of input signal 304. For illustrative purposes, in FIG. 3C, an analog AM carrier signal portion 316 illustrates a portion of the analog AM carrier signal 314 on an expanded time scale. The analog AM carrier signal portion 316 illustrates the analog AM carrier signal 314 from time $t_0$ to time $t_1$.

FIG. 3D illustrates an exemplary aliasing signal 318 that is an example of control signal 306. Aliasing signal 318 is on approximately the same time scale as the analog AM carrier signal portion 316. In the example shown in FIG. 3D, the aliasing signal 318 includes a train of pulses 320 having negligible apertures that tend towards zero (the invention is not limited to this embodiment, as discussed below). The pulse aperture may also be referred to as the pulse width as will be understood by those skilled in the art(s). The pulses 320 repeat at an aliasing rate, or pulse repetition rate of aliasing signal 318. The aliasing rate is determined as described below, and further described in U.S. Pat. No. 6,061,551 entitled "Method and System for Down-Converting Electromagnetic Signals."

Figure 3F:
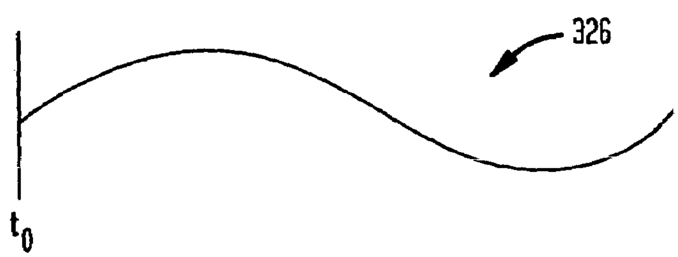
Figure 3G:
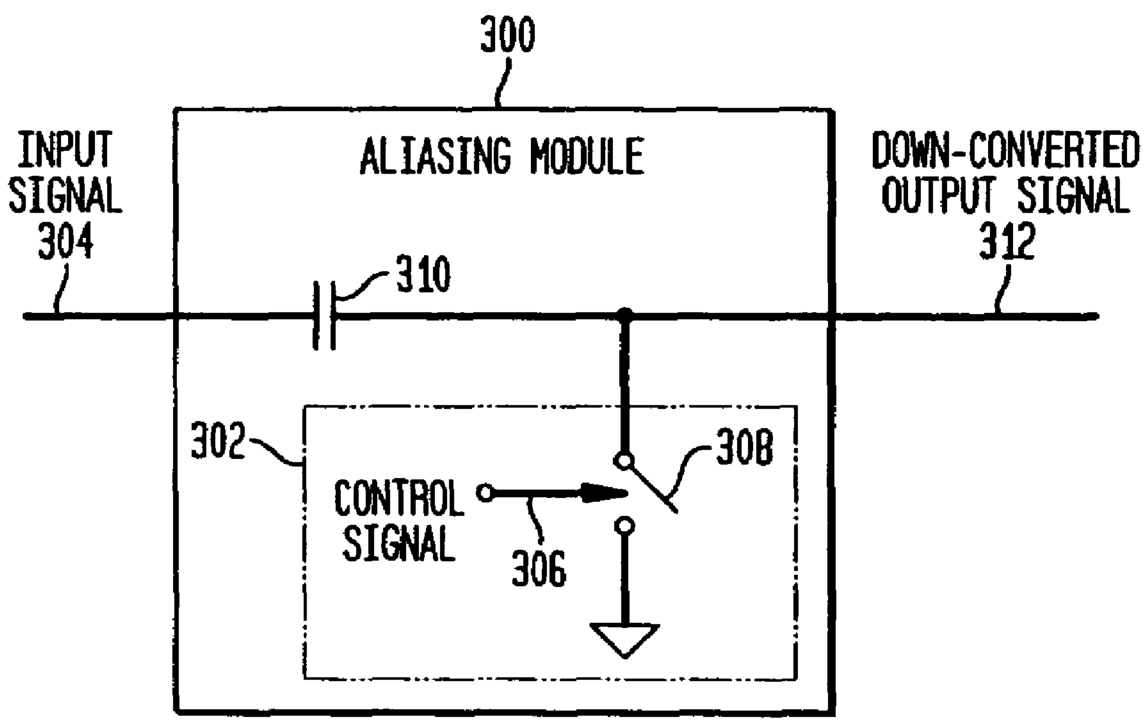

As noted above, the train of pulses 320 (i.e., control signal 306) control the switch 308 to alias the analog AM carrier signal 316 (i.e., input signal 304) at the aliasing rate of the aliasing signal 318. Specifically, in this embodiment, the switch 308 closes on a first edge of each pulse and opens on a second edge of each pulse. When the switch 308 is closed, input signal 304 is coupled to the capacitor 310, and charge is transferred from the input signal 304 to the capacitor 310. The charge transferred during a pulse is referred to herein as an under-sample. Exemplary under-samples 322 form down-converted signal portion 324 (FIG. 3E) that corresponds to the analog AM carrier signal portion 316 (FIG. 3C) and the train of pulses 320 (FIG. 3D). The charge stored during successive under-samples of AM carrier signal 314 form the down-converted signal 324 (FIG. 3E) that is an example of down-converted output signal 312 (FIG. 3A). In FIG. 3F, a demodulated baseband signal 326 represents the demodulated baseband signal 324 after filtering on a compressed time scale. As illustrated, down-converted signal 326 has substantially the same "amplitude envelope" as AM carrier signal 314. Therefore, FIGS. 3B-3F illustrate down-conversion of AM carrier signal 314.

The waveforms shown in FIGS. 3B-3F are discussed herein for illustrative purposes only, and are not limiting. Additional exemplary time domain and frequency domain drawings, and exemplary methods and systems of the invention relating thereto, are disclosed in U.S. Pat. No. 6,061,551 entitled "Method and System for Down-Converting Electromagnetic Signals."

The aliasing rate of control signal 306 determines whether the input signal 304 is down-converted to an IF signal, down-converted to a demodulated baseband signal, or down-converted from an FM signal to a PM or an AM signal. Generally, relationships between the input signal 304, the aliasing rate of the control signal 306, and the down-converted output signal 312 are illustrated below:

(Freq. of input signal 304)=$n$•(Freq. of control signal 306)±(Freq. of down-converted output signal 312).

For the examples contained herein, only the "+" condition will be discussed. Example values of n include, but are not limited to, n={0.5, 1, 2, 3, 4, . . . }.

When the aliasing rate of control signal 306 is off-set from the frequency of input signal 304, or off-set from a harmonic or sub-harmonic thereof, input signal 304 is down-converted to an IF signal. This is because the under-sampling pulses occur at different phases of subsequent cycles of input signal 304. As a result, the under-samples form a lower frequency oscillating pattern. If the input signal 304 includes lower frequency changes, such as amplitude, frequency, phase, etc., or any combination thereof, the charge stored during associated under-samples reflects the lower frequency changes, resulting in similar changes on the down-converted IF signal. For example, to down-convert a 901 MHZ input signal to a 1 MHZ IF signal, the frequency of the control signal 306 would be calculated as follows:

$$(\text{Freq}_{input}-\text{Freq}_{IF})/n=\text{Freq}_{control}$$

$$(901\text{ MHZ}-1\text{ MHZ})/n=900/n$$

For n={0.5, 1, 2, 3, 4, . . . }, the frequency of the control signal 306 would be substantially equal to 1.8 GHz, 900 MHZ, 450 MHZ, 300 MHZ, 225 MHZ, etc.

Exemplary time domain and frequency domain drawings, illustrating down-conversion of analog and digital AM, PM and FM signals to IF signals, and exemplary methods and systems thereof, are disclosed in U.S. Pat. No. 6,061,551 entitled "Method and System for Down-Converting Electromagnetic Signals."

Alternatively, when the aliasing rate of the control signal 306 is substantially equal to the frequency of the input signal 304, or substantially equal to a harmonic or sub-harmonic thereof, input signal 304 is directly down-converted to a demodulated baseband signal. This is because, without modulation, the under-sampling pulses occur at the same point of subsequent cycles of the input signal 304. As a result, the under-samples form a constant output baseband signal. If the input signal 304 includes lower frequency changes, such as amplitude, frequency, phase, etc., or any combination thereof, the charge stored during associated under-samples reflects the lower frequency changes, resulting in similar changes on the demodulated baseband signal. For example, to directly down-convert a 900 MHZ input signal to a demodulated baseband signal (i.e., zero IF), the frequency of the control signal 306 would be calculated as follows:

$$(\text{Freq}_{input}-\text{Freq}_{IF})/n=\text{Freq}_{control}$$

$$(900\text{ MHZ}-0\text{ MHZ})/n=900\text{ MHZ}/n$$

For n={0.5, 1, 2, 3, 4, . . . }, the frequency of the control signal 306 should be substantially equal to 1.8 GHz, 900 MHZ, 450 MHZ, 300 MHZ, 225 MHZ, etc.

Exemplary time domain and frequency domain drawings, illustrating direct down-conversion of analog and digital AM and PM signals to demodulated baseband signals, and exemplary methods and systems thereof, are disclosed in U.S. Pat. No. 6,061,551 entitled "Method and System for Down-Converting Electromagnetic Signals."

Alternatively, to down-convert an input FM signal to a non-FM signal, a frequency within the FM bandwidth must be: down-converted to baseband (i.e., zero IF). As an example, to down-convert a frequency shift keying (FSK) signal (a sub-set of FM) to a phase shift keying (PSK) signal (a subset of PM), the mid-point between a lower frequency $F_1$ and an upper frequency $F_2$ (that is, $[(F_1+F_2)\div 2]$) of the FSK signal is down-converted to zero IF. For example, to down-convert an FSK signal having $F_1$ equal to 899 MHZ and $F_2$ equal to 901 MHZ, to a PSK signal, the aliasing rate of the control signal 306 would be calculated as follows:

$$\begin{aligned}\text{Frequency of the input} &= (F_1+F_2)\div 2\\ &= (899\text{ MHZ}+901\text{ MHZ})\div 2\\ &= 900\text{ MHZ}\end{aligned}$$

Frequency of the down-converted signal=0 (i.e., baseband)

$$(\text{Freq}_{input}-\text{Freq}_{IF})/n=\text{Freq}_{control}$$

$$(900\text{ MHZ}-0\text{ MHZ})/n=900\text{ MHZ}/n$$

For n={0.5, 1, 2, 3, 4 . . . }, the frequency of the control signal 306 should be substantially equal to 1.8 GHz, 900 MHZ, 450 MHZ, 300 MHZ, 225 MHZ, etc. The frequency of the down-converted PSK signal is substantially equal to one half the difference between the lower frequency $F_1$ and the upper frequency $F_2$.

As another example, to down-convert a FSK signal to an amplitude shift keying (ASK) signal (a subset of AM), either the lower frequency $F_1$ or the upper frequency $F_2$ of the FSK signal is down-converted to zero IF. For example, to down-convert an FSK signal having $F_1$ equal to 900 MHZ and $F_2$ equal to 901 MHZ, to an ASK signal, the aliasing rate of the control signal 306 should be substantially equal to:

$$(900\text{ MHZ}-0\text{ MHZ})/n=900\text{ MHZ}/n,\text{ or}$$

$$(901\text{ MHZ}-0\text{ MHZ})/n=901\text{ MHZ}/n.$$

For the former case of 900 MHZ/n, and for n={0.5, 1, 2, 3, 4, . . . }, the frequency of the control signal 306 should be substantially equal to 1.8 GHz, 900 MHZ, 450 MHZ, 300 MHZ, 225 MHZ, etc. For the latter case of 901 MHZ/n, and for n={0.5, 1, 2, 3, 4, . . . }, the frequency of the control signal 306 should be substantially equal to 1.802 GHz, 901 MHZ, 450.5 MHZ, 300.333 MHZ, 225.25 MHZ, etc. The frequency of the down-converted AM signal is substantially equal to the difference between the lower frequency $F_1$ and the upper frequency $F_2$ (i.e., 1 MHZ).

Exemplary time domain and frequency domain drawings, illustrating down-conversion of FM signals to non-FM signals, and exemplary methods and systems thereof, are disclosed in U.S. Pat. No. 6,061,551 entitled "Method and System for Down-Converting Electromagnetic Signals."

In an embodiment, the pulses of the control signal 306 have negligible apertures that tend towards zero. This makes the UFT module 302 a high input impedance device. This configuration is useful for situations where minimal disturbance of the input signal may be desired.

In another embodiment, the pulses of the control signal 306 have non-negligible apertures that tend away from zero. This makes the UFT module 302 a lower input impedance device. This allows the lower input impedance of the UFT module 302 to be substantially matched with a source impedance of the input signal 304. This also improves the energy transfer from the input signal 304 to the down-converted output signal 312, and hence the efficiency and signal to noise (s/n) ratio of UFT module 302.

Exemplary systems and methods for generating and optimizing the control signal 306, and for otherwise improving energy transfer and s/n ratio, are disclosed in U.S. Pat. No. 6,061,551 entitled "Method and System for Down-Converting Electromagnetic Signals."

When the pulses of the control signal 306 have non-negligible apertures, the aliasing module 300 is referred to interchangeably herein as an energy transfer module or a gated transfer module, and the control signal 306 is referred to as an energy transfer signal. Exemplary systems and methods for generating and optimizing the control signal 306 and for otherwise improving energy transfer and/or signal to noise ratio in an energy transfer module are described below.

2.2. Optional Energy Transfer Signal Module

Figure 4:
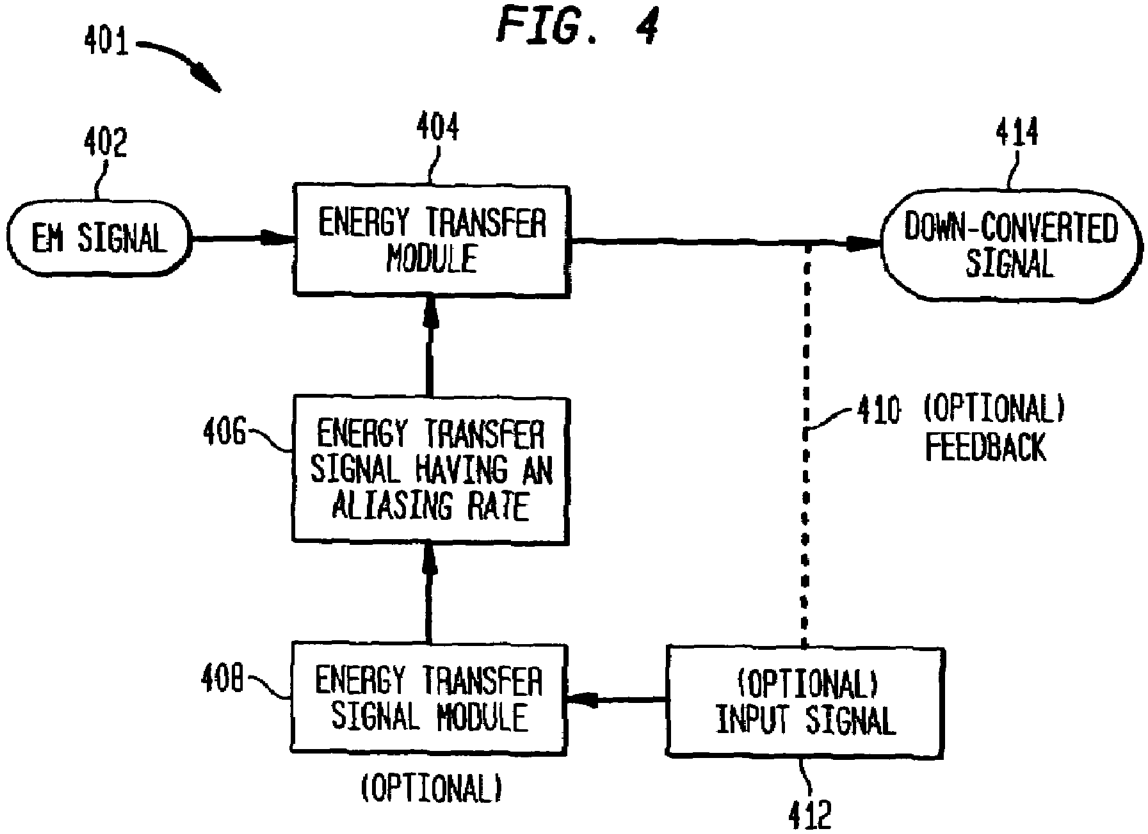
FIG. 4 illustrates an energy transfer system with an optional energy transfer signal module according to an embodiment of the invention.

FIG. 4 illustrates an energy transfer system 401 that includes an optional energy transfer signal module 408, which can perform any of a variety of functions or combinations of functions including, but not limited to, generating the energy transfer signal 406.

Figure 5:
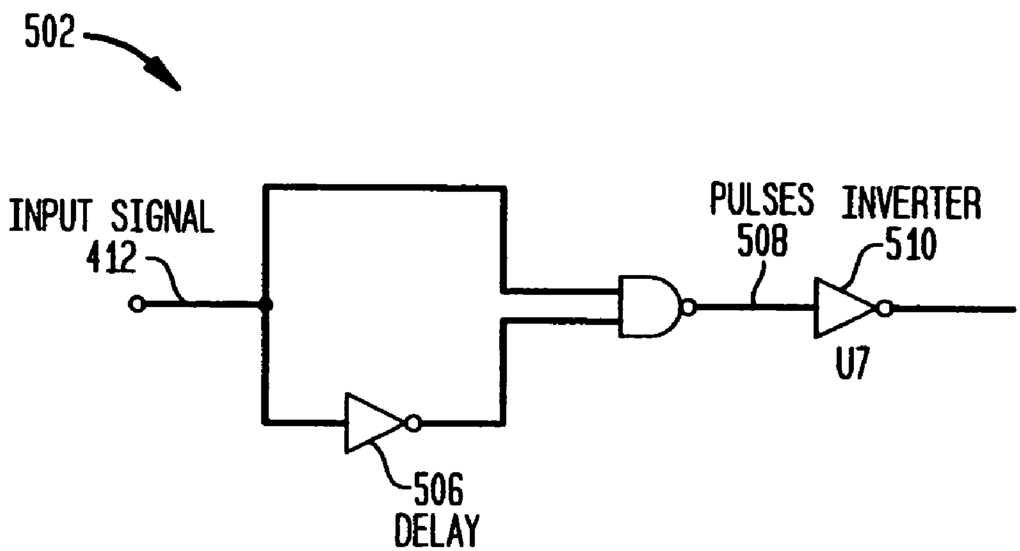
FIG. 5 illustrates an example aperture generator.

In an embodiment, the optional energy transfer signal module 408 includes an aperture generator, an example of which is illustrated in FIG. 5 as an aperture generator 502. The aperture generator 502 generates non-negligible aperture pulses 508 from an input signal 412. The input signal 412 can be any type of periodic signal, including, but not limited to, a sinusoid, a square wave, a saw-tooth wave, etc. Systems for generating the input signal 412 are described below.

The width or aperture of the pulses 508 is determined by delay through the branch 506 of the aperture generator 502. Generally, as the desired pulse width increases, the difficulty in meeting the requirements of the aperture generator 502 decrease (i.e., the aperture generator is easier to implement). In other words, to generate non-negligible aperture pulses for a given EM input frequency, the components utilized in the example aperture generator 502 do not require reaction times as fast as those that are required in an under-sampling system operating with the same EM input frequency.

The example logic and implementation shown in the aperture generator 502 are provided for illustrative purposes only, and are not limiting. The actual logic employed can take many forms. The example aperture generator 502 includes an optional inverter 510, which is shown for polarity consistency with other examples provided herein.

Figure 6B:
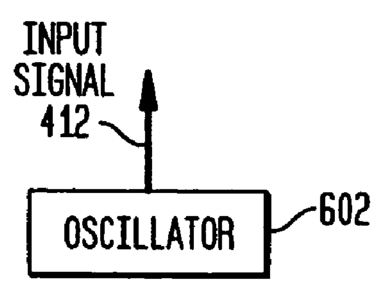
FIG. 6B illustrates an oscillator according to an embodiment of the present invention.
Figure 6A:
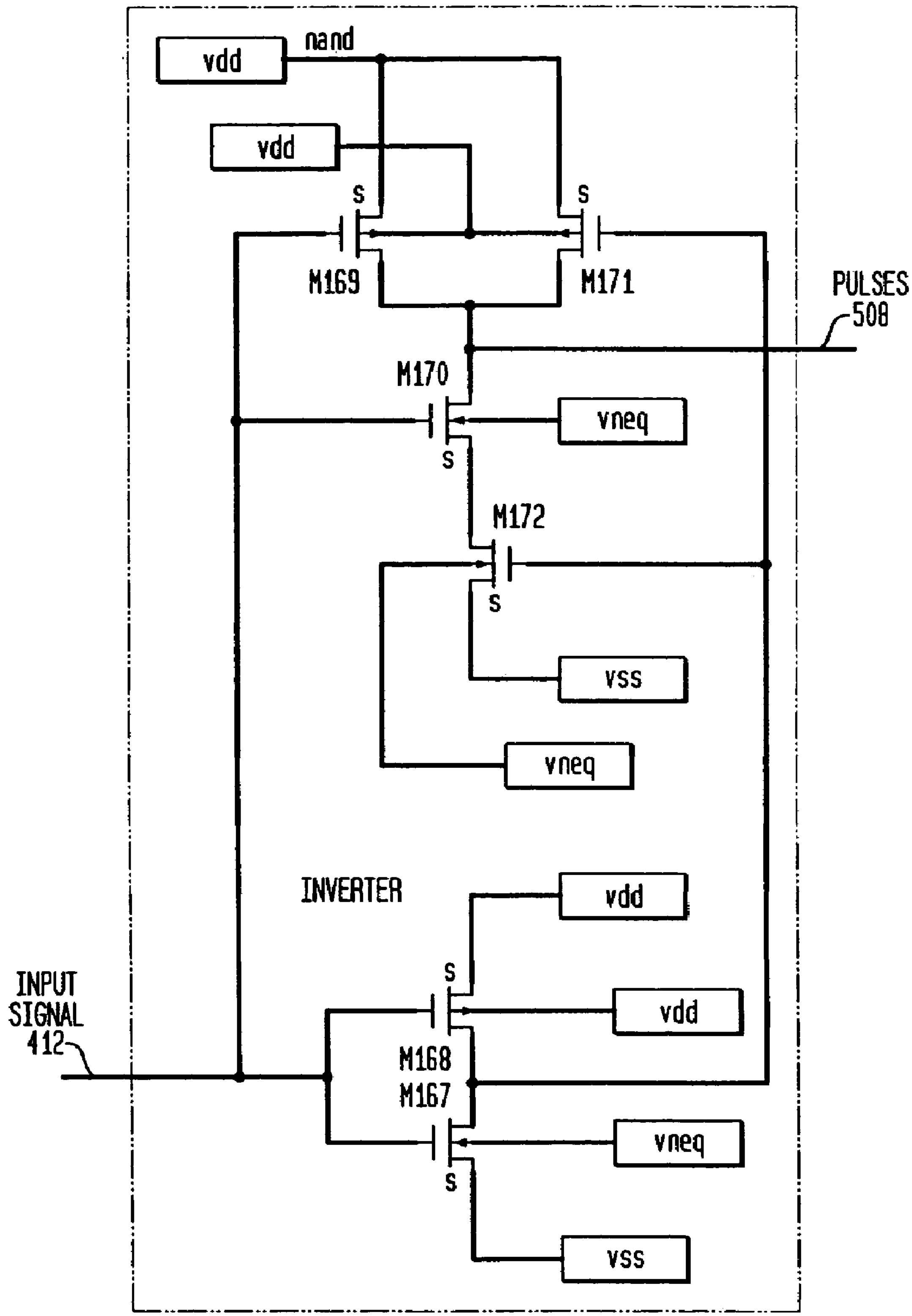
FIG. 6A illustrates an example aperture generator.

An example implementation of the aperture generator 502 is illustrated in FIG. 6A. Additional examples of aperture generation logic are provided in FIGS. 7A and 7B. FIG. 7A illustrates a rising edge pulse generator 702, which generates pulses 508 on rising edges of the input signal 412. FIG. 7B illustrates a falling edge pulse generator 704, which generates pulses 508 on falling edges of the input signal 412.

In an embodiment, the input signal 412 is generated externally of the energy transfer signal module 408, as illustrated in FIG. 4. Alternatively, the input signal 412 is generated internally by the energy transfer signal module 408. The input signal 412 can be generated by an oscillator, as illustrated in FIG. 6B by an oscillator 602. The oscillator 602 can be internal to the energy transfer signal module 408 or external to the energy transfer signal module 408. The oscillator 602 can be external to the energy transfer system 401. The output of the oscillator 602 may be any periodic waveform.

The type of down-conversion performed by the energy transfer system 401 depends upon the aliasing rate of the energy transfer signal 406, which is determined by the frequency of the pulses 508. The frequency of the pulses 508 is determined by the frequency of the input signal 412.

The optional energy transfer signal module 408 can be implemented in hardware, software, firmware, or any combination thereof.

2.3. Impedance Matching

The energy transfer module 300 described in reference to FIG. 3A, above, has input and output impedances generally defined by (1) the duty cycle of the switch module (i.e., UFT 302), and (2) the impedance of the storage module (e.g., capacitor 310), at the frequencies of interest (e.g. at the EM input, and intermediate/baseband frequencies).

Starting with an aperture width of approximately ½ the period of the EM signal being down-converted as an example embodiment, this aperture width (e.g. the "closed time") can be decreased (or increased). As the aperture width is decreased, the characteristic impedance at the input and the output of the energy transfer module increases. Alternatively, as the aperture width increases from ½ the period of the EM signal being down-converted, the impedance of the energy transfer module decreases.

One of the steps in determining the characteristic input impedance of the energy transfer module could be to measure its value. In an embodiment, the energy transfer module's characteristic input impedance is 300 ohms. An impedance matching circuit can be utilized to efficiently couple an input EM signal that has a source impedance of, for example, 50 ohms, with the energy transfer module's impedance of, for example, 300 ohms. Matching these impedances can be accomplished in various manners, including providing the necessary impedance directly or the use of an impedance match circuit as described below.

Referring to FIG. 8, a specific example embodiment using an RF signal as an input, assuming that the impedance 812 is a relatively low impedance of approximately 50 Ohms, for example, and the input impedance 816 is approximately 300 Ohms, an initial configuration for the input impedance match module 806 can include an inductor 906 and a capacitor 908, configured as shown in FIG. 9. The configuration of the inductor 906 and the capacitor 908 is a possible configuration when going from a low impedance to a high impedance. Inductor 906 and the capacitor 908 constitute an L match, the calculation of the values which is well known to those skilled in the relevant arts.

The output characteristic impedance can be impedance matched to take into consideration the desired output frequencies. One of the steps in determining the characteristic output impedance of the energy transfer module could be to measure its value. Balancing the very low impedance of the storage module at the input EM frequency, the storage module should have an impedance at the desired output frequencies that is preferably greater than or equal to the load that is intended to be driven (for example, in an embodiment, storage module impedance at a desired 1 MHz output frequency is 2K ohm and the desired load to be driven is 50 ohms). An additional benefit of impedance matching is that filtering of unwanted signals can also be accomplished with the same components.

In an embodiment, the energy transfer module's characteristic output impedance is 2K ohms. An impedance matching circuit can be utilized to efficiently couple the down-converted signal with an output impedance of, for example, 2K ohms, to a load of, for example, 50 ohms. Matching these impedances can be accomplished in various manners, including providing the necessary load impedance directly or the use of an impedance match circuit as described below.

When matching from a high impedance to a low impedance, a capacitor 914 and an inductor 916 can be configured as shown in FIG. 9. The capacitor 914 and the inductor 916 constitute an L match, the calculation of the component values being well known to those skilled in the relevant arts.

The configuration of the input impedance match module 806 and the output impedance match module 808 are considered to be initial starting points for impedance matching, in accordance with embodiments of the present invention. In some situations, the initial designs may be suitable without further optimization. In other situations, the initial designs can be optimized in accordance with other various design criteria and considerations.

As other optional optimizing structures and/or components are utilized, their affect on the characteristic impedance of the energy transfer module should be taken into account in the match along with their own original criteria.

2.4. Frequency Up-Conversion

The present invention is directed to systems and methods of frequency up-conversion, and applications of same.

An example frequency up-conversion system 1000 is illustrated in FIG. 10. The frequency up-conversion system 1000 is now described.

Figure 13A:
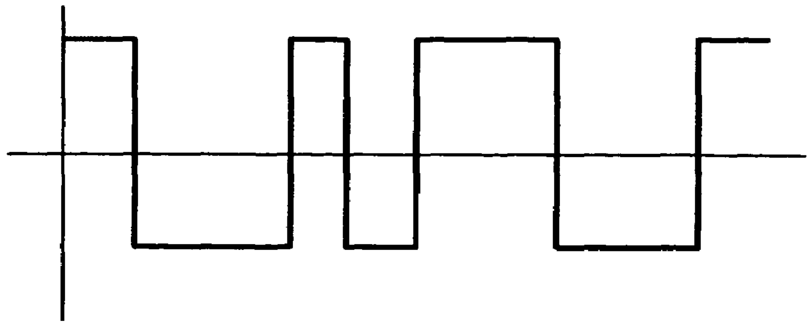
Figure 13B:
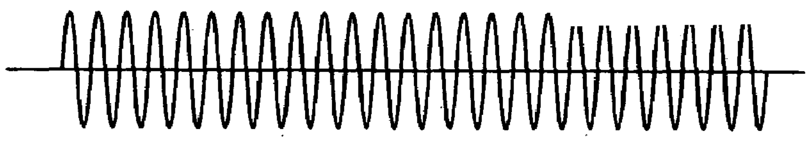
Figure 13C:
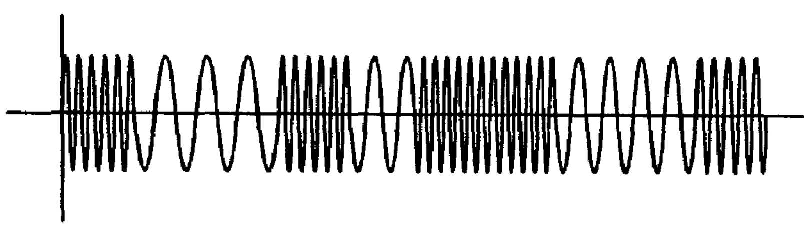

An input signal 1002 (designated as "Control Signal" in FIG. 10) is accepted by a switch module 1004. For purposes of example only, assume that the input signal 1002 is a FM input signal 1306, an example of which is shown in FIG. 13C. FM input signal 1306 may have been generated by modulating information signal 1302 onto oscillating signal 1304 (FIGS. 13A and 13B). It should be understood that the invention is not limited to this embodiment. The information signal 1302 can be analog, digital, or any combination thereof, and any modulation scheme can be used.

Figure 13D:
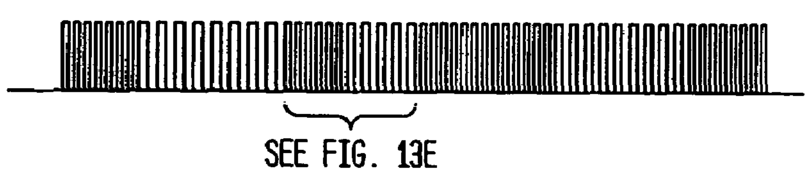

The output of switch module 1004 is a harmonically rich signal 1006, shown for example in FIG. 13D as a harmonically rich signal 1308. The harmonically rich signal 1308 has a continuous and periodic waveform.

Figure 13E:
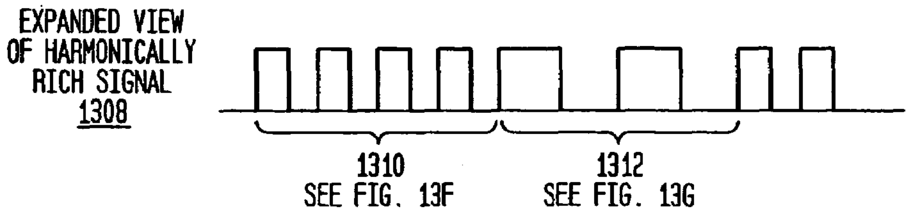

FIG. 13E is an expanded view of two sections of harmonically rich signal 1308, section 1310 and section 1312. The harmonically rich signal 1308 may be a rectangular wave, such as a square wave or a pulse (although, the invention is not limited to this embodiment). For ease of discussion, the term "rectangular waveform" is used to refer to waveforms that are substantially rectangular. In a similar manner, the term "square wave" refers to those waveforms that are substantially square and it is not the intent of the present invention that a perfect square wave be generated or needed.

Figure 13F:
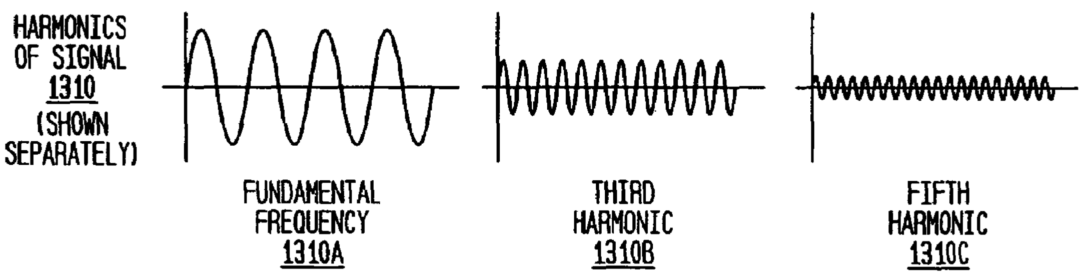
Figure 13G:
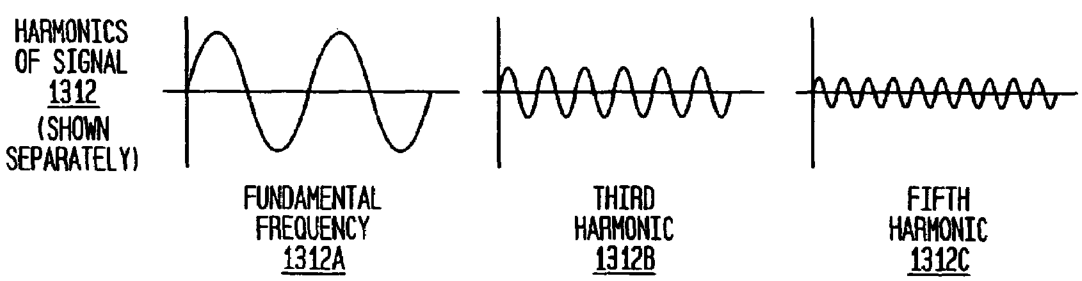
Figure 13H:
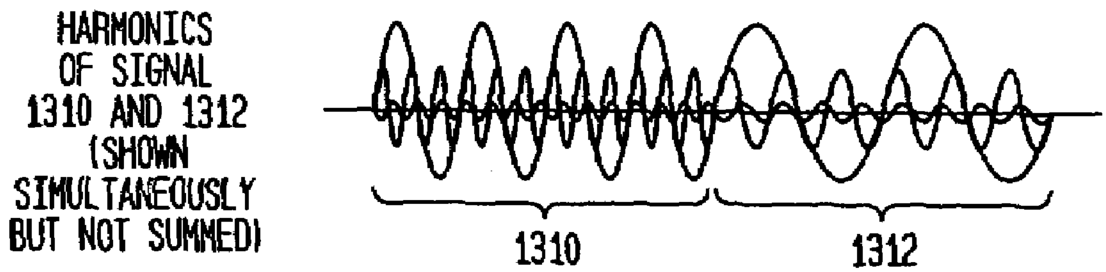

Harmonically rich signal 1308 is comprised of a plurality of sinusoidal waves whose frequencies are integer multiples of the fundamental frequency of the waveform of the harmonically rich signal 1308. These sinusoidal waves are referred to as the harmonics of the underlying waveform, and the fundamental frequency is referred to as the first harmonic. FIG. 13F and FIG. 13G show separately the sinusoidal components making up the first, third, and fifth harmonics of section 1310 and section 1312. (Note that in theory there may be an infinite number of harmonics; in this example, because harmonically rich signal 1308 is shown as a square wave, there are only odd harmonics). Three harmonics are shown simultaneously (but not summed) in FIG. 13H.

The relative amplitudes of the harmonics are generally a function of the relative widths of the pulses of harmonically rich signal 1006 and the period of the fundamental frequency, and can be determined by doing a Fourier analysis of harmonically rich signal 1006. According to an embodiment of the invention, the input signal 1306 may be shaped to ensure that the amplitude of the desired harmonic is sufficient for its intended use (e.g., transmission).

Figure 13I:
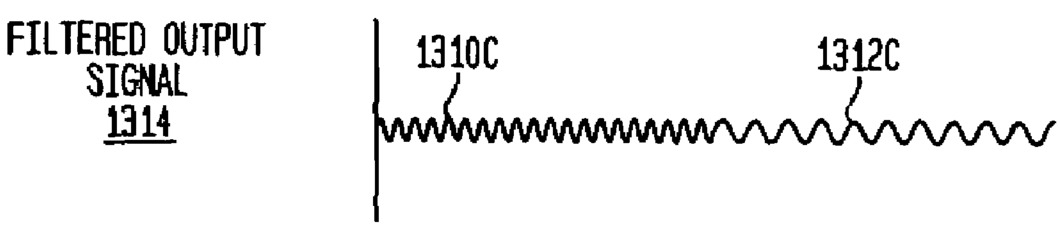

An optional filter 1008 filters out any undesired frequencies (harmonics), and outputs an electromagnetic (EM) signal at the desired harmonic frequency or frequencies as an output signal 1010, shown for example as a filtered output signal 1314 in FIG. 13I.

FIG. 11 illustrates an example universal frequency up-conversion (UFU) module 1101. The UFU module 1101 includes an example switch module 1004, which comprises a bias signal 1102, a resistor or impedance 1104, a universal frequency translator (UFT) 1150, and a ground 1108. The UFT 1150 includes a switch 1106. The input signal 1002 (designated as "Control Signal" in FIG. 11) controls the switch 1106 in the UFT 1150, and causes it to close and open. Harmonically rich signal 1006 is generated at a node 1105 located between the resistor or impedance 1104 and the switch 1106.

Also in FIG. 11, it can be seen that an example optional filter 1008 is comprised of a capacitor 1110 and an inductor 1112 shunted to a ground 1114. The filter is designed to filter out the undesired harmonics of harmonically rich signal 1006.

The invention is not limited to the UFU embodiment shown in FIG. 11.

For example, in an alternate embodiment shown in FIG. 12, an unshaped input signal 1201 is routed to a pulse shaping module 1202. The pulse shaping module 1202 modifies the unshaped input signal 1201 to generate a (modified) input signal 1002 (designated as the "Control Signal" in FIG. 12). The input signal 1002 is routed to the switch module 1004, which operates in the manner described above. Also, the filter 1008 of FIG. 12 operates in the manner described above.

The purpose of the pulse shaping module 1202 is to define the pulse width of the input signal 1002. Recall that the input signal 1002 controls the opening and closing of the switch 1106 in switch module 1004. During such operation, the pulse width of the input signal 1002 establishes the pulse width of the harmonically rich signal 1006. As stated above, the relative amplitudes of the harmonics of the harmonically rich signal 1006 are a function of at least the pulse width of the harmonically rich signal 1006. As such, the pulse width of the input signal 1002 contributes to setting the relative amplitudes of the harmonics of harmonically rich signal 1006.

Further details of up-conversion as described in this section are presented in U.S. Pat. No. 6,091,940, entitled "Method and System for Frequency Up-Conversion," incorporated herein by reference in its entirety.

2.5. Enhanced Signal Reception

The present invention is directed to systems and methods of enhanced signal reception (ESR), and applications of same, which are described in the above-referenced U.S. Pat. No. 6,061,555, entitled "Method and System for Ensuring Reception of a Communications Signal," incorporated herein by reference in its entirety.

2.6. Unified Down-Conversion and Filtering

The present invention is directed to systems and methods of unified down-conversion and filtering (UDF), and applications of same.

In particular, the present invention includes a unified down-converting and filtering (UDF) module that performs frequency selectivity and frequency translation in a unified (i.e., integrated) manner. By operating in this manner, the invention achieves high frequency selectivity prior to frequency translation (the invention is not limited to this embodiment). The invention achieves high frequency selectivity at substantially any frequency, including but not limited to RF (radio frequency) and greater frequencies. It should be understood that the invention is not limited to this example of RF and greater frequencies. The invention is intended, adapted, and capable of working with lower than radio frequencies.

FIG. 14 is a conceptual block diagram of a UDF module 1402 according to an embodiment of the present invention. The UDF module 1402 performs at least frequency translation and frequency selectivity.

The effect achieved by the UDF module 1402 is to perform the frequency selectivity operation prior to the performance of the frequency translation operation. Thus, the UDF module 1402 effectively performs input filtering.

According to embodiments of the present invention, such input filtering involves a relatively narrow bandwidth. For example, such input filtering may represent channel select filtering, where the filter bandwidth may be, for example, 50 KHz to 150 KHz. It should be understood, however, that the invention is not limited to these frequencies. The invention is intended, adapted, and capable of achieving filter bandwidths of less than and greater than these values.

In embodiments of the invention, input signals 1404 received by the UDF module 1402 are at radio frequencies.

The UDF module 1402 effectively operates to input filter these RF input signals 1404. Specifically, in these embodiments, the UDF module 1402 effectively performs input, channel select filtering of the RF input signal 1404. Accordingly, the invention achieves high selectivity at high frequencies.

The UDF module 1402 effectively performs various types of filtering, including but not limited to bandpass filtering, low pass filtering, high pass filtering, notch filtering, all pass filtering, band stop filtering, etc., and combinations thereof.

Conceptually, the UDF module 1402 includes a frequency translator 1408. The frequency translator 1408 conceptually represents that portion of the UDF module 1402 that performs frequency translation (down conversion).

The UDF module 1402 also conceptually includes an apparent input filter 1406 (also sometimes called ah input filtering emulator). Conceptually, the apparent input filter 1406 represents that portion of the UDF module 1402 that performs input filtering.

In practice, the input filtering operation performed by the UDF module 1402 is integrated with the frequency translation operation. The input filtering operation can be viewed as being performed concurrently with the frequency translation operation. This is a reason why the input filter 1406 is herein referred to as an "apparent" input filter 1406.

The UDF module 1402 of the present invention includes a number of advantages. For example, high selectivity at high frequencies is realizable using the UDF module 1402. This feature of the invention is evident by the high Q factors that are attainable. For example, and without limitation, the UDF module 1402 can be designed with a filter center frequency $f_c$ on the order of 900 MHZ, and a filter bandwidth on the order of 50 KHz. This represents a Q of 18,000 (Q is equal to the center frequency divided by the bandwidth).

It should be understood that the invention is not limited to filters with high Q factors. The filters contemplated by the present invention may have lesser or greater Qs, depending on the application, design, and/or implementation. Also, the scope of the invention includes filters where Q factor as discussed herein is not applicable.

The invention exhibits additional advantages. For example, the filtering center frequency $f_c$ of the UDF module 1402 can be electrically adjusted, either statically or dynamically.

Also, the UDF module 1402 can be designed to amplify input signals.

Further, the UDF module 1402 can be implemented without large resistors, capacitors, or inductors. Also, the UDF module 1402 does not require that tight tolerances be maintained on the values of its individual components, i.e., its resistors, capacitors, inductors, etc. As a result, the architecture of the UDF module 1402 is friendly to integrated circuit design techniques and processes.

The features and advantages exhibited by the UDF module 1402 are achieved at least in part by adopting a new technological paradigm with respect to frequency selectivity and translation. Specifically, according to the present invention, the UDF module 1402 performs the frequency selectivity operation and the frequency translation operation as a single, unified (integrated) operation. According to the invention, operations relating to frequency translation also contribute to the performance of frequency selectivity, and vice versa.

According to embodiments of the present invention, the UDF module generates an output signal from an input signal using samples/instances of the input signal and/or samples/instances of the output signal.

More particularly, first, the input signal is under-sampled. This input sample includes information (such as amplitude, phase, etc.) representative of the input signal existing at the time the sample was taken.

As described further below, the effect of repetitively performing this step is to translate the frequency (that is, down-convert) of the input signal to a desired lower frequency, such as an intermediate frequency (IF) or baseband.

Next, the input sample is held (that is, delayed).

Then, one or more delayed input samples (some of which may have been scaled) are combined with one or more delayed instances of the output signal (some of which may have been scaled) to generate a current instance of the output signal.

Thus, according to a preferred embodiment of the invention, the output signal is generated from prior samples/instances of the input signal and/or the output signal. (It is noted that, in some embodiments of the invention, current samples/instances of the input signal and/or the output signal may be used to generate current instances of the output signal.). By operating in this manner, the UDF module 1402 preferably performs input filtering and frequency down-conversion in a unified manner.

Further details of unified down-conversion and filtering as described in this section are presented in U.S. Pat. No. 6,049,706, entitled "Integrated Frequency Translation And Selectivity," filed Oct. 21, 1998, and incorporated herein by reference in its entirety.

3. Example Embodiments of the Invention

As noted above, the UFT module of the present invention is a very powerful and flexible device. Its flexibility is illustrated, in part, by the wide range of applications and combinations in which it can be used. Its power is illustrated, in part, by the usefulness and performance of such applications and combinations.

Such applications and combinations include, for example and without limitation, applications/combinations comprising and/or involving one or more of: (1) frequency translation; (2) frequency down-conversion; (3) frequency up-conversion; (4) receiving; (5) transmitting; (6) filtering; and/or (7) signal transmission and reception in environments containing potentially jamming signals. Example receiver and transmitter embodiments implemented using the UFT module of the present invention are set forth below.

3.1. Receiver Embodiments

In embodiments, a receiver according to the invention includes an aliasing module for down-conversion that uses a universal frequency translation (UFT) module to down-convert an EM input signal. For example, in embodiments, the receiver includes the aliasing module 300 described above, in reference to FIG. 3A or FIG. 3G. As described in more detail above, the aliasing module 300 may be used to down-convert an EM input signal to an intermediate frequency (IF) signal or a demodulated baseband signal.

In alternate embodiments, the receiver may include the energy transfer system 401, including energy transfer module 404, described above, in reference to FIG. 4. As described in more detail above, the energy transfer system 401 may be used to down-convert an EM signal to an intermediate frequency (IF) signal or a demodulated baseband signal. As also described above, the energy transfer system 401 may include an optional energy transfer signal module 408, which can perform any of a variety of functions or combinations of functions including, but not limited to, generating the energy transfer signal 406 of various aperture widths.

In further embodiments of the present invention, the receiver may include the impedance matching circuits and/or techniques described in herein for optimizing the energy transfer system of the receiver.

3.3.1. In-Phase/Quadrature-Phase (I/Q) Modulation Mode Receiver Embodiments

FIG. 15 illustrates an exemplary I/Q modulation mode embodiment of a receiver 1502, according to an embodiment of the present invention. This I/Q modulation mode embodiment is described herein for purposes of illustration, and not limitation. Alternate I/Q modulation mode embodiments (including equivalents, extensions, variations, deviations, etc., of the embodiments described herein), as well as embodiments of other modulation modes, will be apparent to persons skilled in the relevant art(s) based on the teachings contained herein. The invention is intended and adapted to include such alternate embodiments.

Receiver 1502 comprises an I/Q modulation mode receiver 1738, a first optional amplifier 1516, a first optional filter 1518, a second optional amplifier 1520, and a second optional filter 1522.

I/Q modulation mode receiver 1538 comprises an oscillator 1506, a first UFD module 1508, a second UFD module 1510, a first UFT module 1512, a second UFT module 1514, and a phase shifter 1524.

Oscillator 1506 provides an oscillating signal used by both first UFD module 1508 and second UFD module 1510 via the phase shifter 1524. Oscillator 1506 generates an "I" oscillating signal 1526.

"I" oscillating signal 1526 is input to first UFD module 1508. First UFD module 1508 comprises at least one UFT module 1512. First UFD module 1508 frequency down-converts and demodulates received signal 1504 to down-converted "I" signal 1530 according to "I" oscillating signal 1526.

Phase shifter 1524 receives "I" oscillating signal 1526, and outputs "Q" oscillating signal 1528, which is a replica of "I" oscillating signal 1526 shifted preferably by 90 degrees.

Second UFD module 1510 inputs "Q" oscillating signal 1528. Second UFD module 1510 comprises at least one UFT module 1514. Second UFD module 1510 frequency down-converts and demodulates received signal 1504 to down-converted "Q" signal 1532 according to "Q" oscillating signal 1528.

Down-converted "I" signal 1530 is optionally amplified by first optional amplifier 1516 and optionally filtered by first optional filter 1518, and a first information output signal 1534 is output.

Down-converted "Q" signal 1532 is optionally amplified by second optional amplifier 1520 and optionally filtered by second optional filter 1522, and a second information output signal 1536 is output.

In the embodiment depicted in FIG. 15, first information output signal 1534 and second information output signal 1536 comprise a down-converted baseband signal. In embodiments, first information output signal 1534 and second information output signal 1536 are individually received and processed by related system components. Alternatively, first information output signal 1534 and second information output signal 1536 are recombined into a single signal before being received and processed by related system components.

Alternate configurations for I/Q modulation mode receiver 1538 will be apparent to persons skilled in the relevant art(s) from the teachings herein. For instance, an alternate embodiment exists wherein phase shifter 1524 is coupled between received signal 1504 and UFD module 1510, instead of the configuration described above. This and other such I/Q modulation mode receiver embodiments will be apparent to persons skilled in the relevant art(s) based upon the teachings herein, and are within the scope of the present invention.

3.1.2. Other Receiver Embodiments

The receiver embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, down-converting different combinations of modulation techniques in an "I/Q" mode. Other embodiments include those shown in the documents referenced above, including but not limited to U.S. patent application Ser. Nos. 09/525,615 and 09/550,644. Such alternate embodiments fall within the scope and spirit of the present invention.

For example, other receiver embodiments may down-convert signals that have been modulated with other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), down-converting a signal with two forms of modulation embedding thereon, and combinations thereof.

3.2. Transmitter Embodiments

The following discussion describes frequency up-converting signals transmitted according to the present invention, using a Universal Frequency Up-conversion Module. Frequency up-conversion of an EM signal is described above, and is more fully described in U.S. Pat. No. 6,091,940 entitled "Method and System for Frequency Up-Conversion," filed Oct. 21, 1998 and issued Jul. 18, 2000, the full disclosure of which is incorporated herein by reference in its entirety, as well as in the other documents referenced above (see, for example, U.S. patent application Ser. No. 09/525,615).

Exemplary embodiments of a transmitter according to the invention are described below. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

In embodiments, the transmitter includes a universal frquency up-conversion (UFU) module for frequency up-converting an input signal. For example, in embodiments, the system transmitter includes the UFU module 1000, the UFU module 1101, or the UFU module 1290 as described, above, in reference to FIGS. 10, 11 and 12, respectively. In further embodiments, the UFU module is used to both modulate and up-convert an input signal.

3.2.1. In-Phase/Quadrature-Phase (I/Q) Modulation Mode Transmitter Embodiments

In FIG. 16, an I/Q modulation mode transmitter embodiment is presented. In this embodiment, two information signals are accepted. An in-phase signal ("I") is modulated such that its phase varies as a function of one of the information signals, and a quadrature-phase signal ("Q") is modulated such that its phase varies as a function of the other information signal. The two modulated signals are combined to form an "I/Q" modulated signal and transmitted. In this manner, for instance, two separate information signals could be transmitted in a single signal simultaneously. Other uses for this type of modulation would be apparent to persons skilled in the relevant art(s).

FIG. 16 illustrates an exemplary block diagram of a transmitter 1602 in an I/Q modulation mode. In FIG. 16, a baseband signal comprises two signals, first information signal 1612 and second information signal 1614. Transmitter 1602 comprises an I/Q transmitter 1604 and an optional amplifier 1606. I/Q transmitter 1604 comprises at least one UFT module 1610. I/Q transmitter 1604 provides I/Q modulation to first information signal 1612 and second information signal 1614, outputting I/Q output signal 1616. Optional amplifier 1606 optionally amplifies I/Q output signal 1616, outputting up-converted signal 1618.

FIG. 17 illustrates a more detailed circuit block diagram for I/Q transmitter 1604. I/Q transmitter 1604 is described herein for purposes of illustration, and not limitation. Alternate embodiments (including equivalents, extensions, variations, deviations, etc., of the embodiments described herein) will be apparent to persons skilled in the relevant art(s) based on the teachings contained herein. The invention is intended and adapted to include such alternate embodiments.

I/Q transmitter 1604 comprises a first UFU module 1702, a second UFU module 1704, an oscillator 1706, a phase shifter 1708, a summer 1710, a first UFT module 1712, a second UFT module 1714, a first phase modulator 1728, and a second phase modulator 1730.

Oscillator 1706 generates an "I"-oscillating signal 1716.

A first information signal 1612 is input to first phase modulator 1728. The "I"-oscillating signal 1716 is modulated by first information signal 1612 in the first phase modulator 1728, thereby producing an "I"-modulated signal 1720.

First UFU module 1702 inputs "I"-modulated signal 1720, and generates a harmonically rich "I" signal 1724 with a continuous and periodic wave form.

The phase of "I"-oscillating signal 1716 is shifted by phase shifter 1708 to create "Q"-oscillating signal 1718. Phase shifter 1708 preferably shifts the phase of "I"-oscillating signal 1716 by 90 degrees.

A second information signal 1614 is input to second phase modulator 1730. "Q"-oscillating signal 1718 is modulated by second information signal 1614 in second phase modulator 1730, thereby producing a "Q" modulated signal 1722.

Second UFU module 1704 inputs "Q" modulated signal 1722, and generates a harmonically rich "Q" signal 1726, with a continuous and periodic waveform.

Harmonically rich "I" signal 1724 and harmonically rich "Q" signal 1726 are preferably rectangular waves, such as square waves or pulses (although the invention is not limited to this embodiment), and are comprised of pluralities of sinusoidal waves whose frequencies are integer multiples of the fundamental frequency of the waveforms. These sinusoidal waves are referred to as the harmonics of the underlying waveforms, and a Fourier analysis will determine the amplitude of each harmonic.

Harmonically rich "I" signal 1724 and harmonically rich "Q" signal 1726 are combined by summer 1710 to create harmonically rich "I/Q" signal 1734. Summers are well known to persons skilled in the relevant art(s).

Optional filter 1732 filters out the undesired harmonic frequencies, and outputs an I/Q output signal 1616 at the desired harmonic frequency or frequencies.

It will be apparent to persons skilled in the relevant art(s) that an alternative embodiment exists wherein the harmonically rich "I" signal 1724 and the harmonically rich "Q" signal 1726 may be filtered before they are summed, and further, another alternative embodiment exists wherein "I"-modulated signal 1720 and "Q"-modulated signal 1722 may be summed to create an "I/Q"-modulated signal before being routed to a switch module. Other "I/Q"-modulation embodiments will be apparent to persons skilled in the relevant art(s) based upon the teachings herein, and are within the scope of the present invention. Further details pertaining to an I/Q modulation mode transmitter are provided in co-pending U.S. Pat. No. 6,091,940 entitled "Method and System for Frequency Up-Conversion," filed Oct. 21, 1998 and issued Jul. 18, 2000, which is incorporated herein by reference in its entirety.

3.3.2. Other Transmitter Embodiments

The transmitter embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments include, but are not limited to, combinations of modulation techniques in an "I/Q" mode. Such embodiments also include those described in the documents referenced above, such as U.S. patent application Ser. Nos. 09/525,615 and 09/550,644. Such alternate embodiments fall within the scope and spirit of the present invention.

For example, other transmitter embodiments may utilize other modulation techniques. These would be apparent to one skilled in the relevant art(s) based on the teachings disclosed herein, and include, but are not limited to, amplitude modulation (AM), frequency modulation (FM), pulse width modulation, quadrature amplitude modulation (QAM), quadrature phase-shift keying (QPSK), time division multiple access (TDMA), frequency division multiple access (FDMA), code division multiple access (CDMA), embedding two forms of modulation onto a signal for up-conversion, etc., and combinations thereof.

3.3. Transceiver Embodiments

As discussed above, embodiments of the invention include a transceiver unit, rather than a separate receiver and transmitter. Furthermore, the invention is directed to any of the applications described herein in combination with any of the transceiver embodiments described herein.

An exemplary embodiment of a transceiver system 1800 of the present invention is illustrated in FIG. 18.

Transceiver 1802 frequency down-converts first EM signal 1808 received by antenna 1806, and outputs down-converted baseband signal 1812. Transceiver 1802 comprises at least one UFT module 1804 at least for frequency down-conversion.

Transceiver 1802 inputs baseband signal 1814. Transceiver 1802 frequency up-converts baseband signal 1814. UFT module 1804 provides at least for frequency up-conversion. In alternate embodiments, UFT module 1804 only supports frequency down-conversion, and at least one additional UFT module provides for frequency up-conversion. The up-converted signal is output by transceiver 1802, and transmitted by antenna 1806 as second EM signal 1810.

First and second EM signals 1808 and 1810 may be of substantially the same frequency, or of different frequencies. First and second EM signals 1808 and 1810 may have been modulated using the same technique, or may have been modulated by different techniques.

Further example embodiments of receiver/transmitter systems applicable to the present invention may be found in U.S. Pat. No. 6,091,940 entitled "Method and System for Frequency Up-Conversion," incorporated by reference in its entirety.

These example embodiments and other alternate embodiments (including equivalents, extensions, variations, deviations, etc., of the example embodiments described herein) will be apparent to persons skilled in the relevant art(s) based on the referenced teachings and the teachings contained herein, and are within the scope and spirit of the present invention. The invention is intended and adapted to include such alternate embodiments.

3.4. Other Embodiments

The embodiments described above are provided for purposes of illustration. These embodiments are not intended to limit the invention. Alternate embodiments, differing slightly or substantially from those described herein, will be apparent to persons skilled in the relevant art(s) based on the teachings contained herein. Such alternate embodiments fall within the scope and spirit of the present invention.

4. Mathematical Description of the Present Invention

As described and illustrated in the preceding sections and sub-sections, embodiments of the present invention down-convert and up-convert electromagnetic signals. In this section, matched filter theory, sampling theory, and frequency domain techniques, as well as other theories and techniques that would be known to persons skilled in the relevant art, are used to further describe the present invention. In particular, the concepts and principles of these theories and techniques are used to describe the present invention's waveform processing.

As will be apparent to persons skilled in the relevant arts based on the teachings contained herein, the description of the present invention contained herein is a unique and specific application of matched filter theory, sampling theory, and frequency domain techniques. It is not taught or suggested in the present literature. Therefore, a new transform has been developed, based on matched filter theory, sampling theory, and frequency domain techniques, to describe the present invention. This new transform is described below and referred to herein as the UFT transform.

It is noted that the following describes embodiments of the invention, and it is provided for illustrative purposes. The invention is not limited to the descriptions and embodiments described below. It is also noted that characterizations such as "optimal," "sub-optimal," "maximum," "minimum," "ideal," "non-ideal," and the like, contained herein, denote relative relationships.

4.1. Overview

Embodiments of the present invention down-convert an electromagnetic signal by repeatedly performing a matched filtering or correlating operation on a received carrier signal. Embodiments of the invention operate on or near approximate half cycles (e.g., ½, 1½, 2½, etc.) of the received signal. The results of each matched filtering/correlating process are accumulated, for example using a capacitive storage device, and used to form a down-converted version of the electromagnetic signal. In accordance with embodiments of the invention, the matched filtering/correlating process can be performed at a sub-harmonic or fundamental rate.

Operating on an electromagnetic signal with a matched filtering/correlating process or processor produces enhanced (and in some cases the best possible) signal-to-noise ration (SNR) for the processed waveform. A matched filtering/correlating process also preserves the energy of the electromagnetic signal and transfers it through the processor.

Since it is not always practical to design a matched filtering/correlating processor with passive networks, the sub-sections that follow also describe how to implement the present invention using a finite time integrating operation and an RC processing operation. These embodiments of the present invention are very practical and can be implemented using existing technologies, for example but not limited to CMOS technology.

4.2. High Level Description of a Matched Filtering/Correlating Characterization/Embodiment of the Invention In order to understand how embodiments of the present invention operate, it is useful to keep in mind the fact that such embodiments do not operate by trying to emulate an ideal impulse sampler. Rather, the present invention operates by accumulating the energy of a carrier signal and using the accumulated energy to produce the same or substantially the same result that would be obtained by an ideal impulse sampler, if such a device could be built. Stated more simply, embodiments of the present invention recursively determine a voltage or current value for approximate half cycles (e.g., ½, 1½, 2½, etc.) of a carrier signal, typically at a sub-harmonic rate, and use the determined voltage or current values to form a down-converted version of an electromagnetic signal. The quality of the down-converted electromagnetic signal is a function of how efficiently the various embodiments of the present invention are able to accumulate the energy of the approximate half cycles of the carrier signal.

Ideally, some embodiments of the present invention accumulate all of the available energy contained in each approximate half cycle of the carrier signal operated upon. This embodiment is generally referred to herein as a matched filtering/correlating process or processor. As described in detail below, a matched filtering/correlating processor is able to transfer substantially all of the energy contained in a half cycle of the carrier signal through the processor for use in determining, for example, a peak or an average voltage value of the carrier signal. This embodiment of the present invention produces enhanced (and in some cases the best possible) signal-to noise ration (SNR), as described in the sub-sections below.

FIG. 19 illustrates an example method 1900 for down-converting an electromagnetic signal using a matched filtering/correlating operation. Method 1900 starts at step 1910.

In step 1910, a matched filtering/correlating operation is performed on a portion of a carrier signal. For example, a match filtering/correlating operation can be performed on a 900 MHz RF signal, which typically comprises a 900 MHz sinusoid having noise signals and information signals superimposed on it. Many different types of signals can be operated upon in step 1910, however, and the invention is not limited to operating on a 900 MHz RF signal. In embodiments, Method 1900 operates on approximate half cycles of the carrier signal.

In an embodiment of the invention, step 1910 comprises the step of convolving an approximate half cycle of the carrier signal with a representation of itself in order to efficiently acquire the energy of the approximate half cycle of the carrier signal. As described elsewhere herein, other embodiments use other means for efficiently acquiring the energy of the approximate half cycle of the carrier signal. The matched filtering/correlating operation can be performed on any approximate half cycle of the carrier signal (although the invention is not limited to this), as described in detail in the sub-sections below.

In step 1920, the result of the matched filtering/correlating operation in step 1910 is accumulated, preferably in an energy storage device. In an embodiment of the present invention, a capacitive storage devise is used to store a portion of the energy of an approximate half cycle of the carrier signal.

Steps 1910 and 1920 are repeated for additional half cycles of the carrier signal. In an embodiment of the present invention, steps 1910 and 1920 are normally performed at a sub-harmonic rate of the carrier signal, for example at a third sub-harmonic rate. In another embodiment, steps 1910 and 1920 are repeated at an offset of a sub-harmonic rate of the carrier signal.

In step 1930, a down-converted signal is output. In embodiments, the results of steps 1910 and 1920 are passed on to a reconstruction filter or an interpolation filter.

FIG. 20 illustrates an example gated matched filtering/correlating system 2000, which can be used to implement method 1900. Ideally, in an embodiment, an impulse response of matched filtering/correlating system 2000 is identical to the modulated carrier signal, $S_i(t)$, to be processed. As can be seen in FIG. 20, system 2000 comprises a multiplying module 2002, a switching module 2004, and an integrating module 2006.

System 2000 can be thought of as a convolution processor. System 2000 multiplies the modulated carrier signal, $S_i(t)$, by a representation of itself, $S_i(t-\tau)$, using multiplication model 2002. The output of multiplication module 2002 is then gated by switching module 2004 to integrating module 2006. As can be seen in FIG. 20, switching module 2004 is controlled by a windowing function, $u(t)-u(t-T_A)$. The length of the windowing function aperture is $T_A$, which is in an embodiment equal to an approximate half cycle of the carrier signal. Switching module 2004 in an embodiment ensures that approximate half cycles of the carrier signal are normally operated upon at a sub-harmonic rate. In an embodiment shown in FIG. 72, preprocessing is used to select a portion of the carrier signal to be operated upon in accordance with the present invention. In an embodiment of system 2000, the received carrier signal is operated on at an off-set of a sub-harmonic rate of the carrier signal. Integration module 2006 integrates the gated output of multiplication module 2002 and passes on its result, $S_0(t)$. This embodiment of the present invention is described in more detail in subsequent sub-sections.

As will be apparent to persons skilled in the relevant arts given the discussion herein, the present invention is not a traditional realization of a matched filter/correlator.

4.3. High Level Description of a Finite Time Integrating Characterization/Embodiment of the Invention As described herein, in some embodiments, a matched filter/correlator embodiment according to the present invention provides maximum energy transfer and maximum SNR. A matched filter/correlator embodiment, however, might not always provide an optimum solution for all applications. For example, a matched filter/correlator embodiment might be too expensive or too complicated to implement for some applications. In such instances, other embodiments according to the present invention may provide acceptable results at a substantially lower cost, using less complex circuitry. The invention is directed to those embodiments as well.

As described herein in subsequent sub-sections, a gated matched filter/correlator processor can be approximated by a processor whose impulse response is a step function having a, duration substantially equal to the time interval defined for the waveform, typically a half cycle of the electromagnetic signal, and an integrator. Such an approximation of a gated matched filter/correlator is generally referred to as a finite time integrator. A finite time integrator in accordance with an embodiment of the present invention can be implemented with, for example, a switching device controlled by a train of pulses having apertures substantially equal to the time interval defined for the waveform. The energy transfer and SNR of a finite time integrator implemented in accordance with an embodiment of the present invention is nearly that of a gated matched filter/correlator, but without having to tailor the matched filter/correlator for a particular type of electromagnetic signal. As described in sub-section 6, a finite time integrator embodiment according to the present invention can provide a SNR result that differs from the result of matched filter/correlator embodiment by only 0.91 dB.

FIG. 21 illustrates an example method 2100 for down-converting an electromagnetic signal using a matched filtering/correlating operation. Method 2100 starts at step 2110.

In step 2110, a matched filtering/correlating operation is performed on a portion of a carrier signal. For example, a match filtering/correlating operation can be performed on a 900 MHz RF signal, which typically comprises a 900 MHz sinusoid having noise signals and information signals superimposed on it. Many different types of signals can be operated upon in step 2110, however, and the invention is not limited to operating on a 900 MHz RF signal. In embodiments, Method 2100 operates on approximate half cycles of the carrier signal.

In an embodiment of the invention, step 2110 comprises the step of convolving an approximate half cycle of the carrier signal with a representation of itself in order to efficiently acquire the energy of the approximate half cycle of the carrier signal. As described elsewhere herein, other embodiments use other means for efficiently acquiring the energy of the approximate half cycle of the carrier signal. The matched filtering/correlating operation can be performed on any approximate half cycle of the carrier signal (although the invention is not limited to this), as described in detail in the sub-sections below.

In step 2120, the result of the matched filtering/correlating operation in step 2110 is accumulated, preferably in an energy storage device. In an embodiment of the present invention, a capacitive storage devise is used to store a portion of the energy of an approximate half cycle of the carrier signal.

Steps 2110 and 2120 are repeated for additional half cycles of the carrier signal. In one embodiment of the present invention, steps 2110 and 2120 are performed at a sub-harmonic rate of the carrier signal. In another embodiment, steps 2110 and 2120 are repeated at an off-set of a sub-harmonic rate of the carrier signal.

In step 2130, a down-converted signal is output. In embodiments, the results of steps 2110 and 2120 are passed on to a reconstruction filter or an interpolation filter.

FIG. 22 illustrates an example finite time integrating system 2200, which can be used to implement method 2100. Finite time integrating system 2200 has an impulse response that is approximately rectangular, as further described in sub-section 4. As can be seen in FIG. 22, system 2200 comprises a switching module 2202 and an integrating module 2204.

Switching module 2202 is controlled by a windowing function, $u(t)-u(t-T_A)$. The length of the windowing function aperture is $T_A$, which is equal to an approximate half cycle of the received carrier signal, $S_i(t)$. Switching module 2202 ensures that approximate half cycles of the carrier signal can be operated upon at a sub-harmonic rate. In an embodiment of system 2200, the received carrier signal is operated on at an off-set of a sub-harmonic rate of the carrier signal.

Integration module 2204 integrates the output of switching module 2202 and passes on its result, $S_O(t)$. This embodiment of the present invention is described in more detail in sub-section 4 below.

4.4. High Level Description of an RC Processing Characterization/Embodiment of the Invention The prior sub-section describes how a gated matched filter/correlator can be approximated with a finite time integrator. This sub-section describes how the integrator portion of the finite time integrator can be approximated with a resistor/capacitor (RC) processor. This embodiment of the present invention is generally referred to herein as an RC processor, and it can be very inexpensive to implement. Additionally, the RC processor embodiment according to the present invention can be implemented using only passive circuit devices, and it can be implemented, for example, using existing CMOS technology. This RC processor embodiment, shown in FIG. 24, utilizes a very low cost integrator or capacitor as a memory across the aperture or switching module. If the capacitor is suitably chosen for this embodiment, the performance of the RC processor approaches that of the matched filter/correlator embodiments described herein.

FIG. 23 illustrates an example method 2300 for down-converting an electromagnetic signal using a matched filtering/correlating operation. Method 2300 starts at step 2310.

In step 2310, a matched filtering/correlating operation is performed on a portion of a carrier signal. For example, a match filtering/correlating operation can be performed on a 900 MHz RF signal, which typically comprises a 900 MHz sinusoid having noise signals and information signals superimposed on it. Many different types of signals can be operated upon in step 2310, however, and the invention is not limited to operating on a 900 MHz RF signal. In embodiments, Method 2300 operates on approximate half cycles of the carrier signal.

In an embodiment of the invention, step 2310 comprises the step of convolving an approximate half cycle of the carrier signal with a representation of itself in order to efficiently acquire the energy of the approximate half cycle of the carrier signal. As described elsewhere herein, other embodiments use other means for efficiently acquiring the energy of the approximate half cycle of the carrier signal. The matched filtering/correlating operation can be performed on any approximate half cycle of the carrier signal (although the invention is not limited to this), as described in detail in the sub-sections below.

In step 2320, the result of the matched filtering/correlating operation in step 2310 is accumulated, preferably in an energy storage device. In an embodiment of the present invention, a capacitive storage devise is used to store a portion of the energy of an approximate half cycle of the carrier signal.

Steps 2310 and 2320 are repeated for additional half cycles of the carrier signal. In an embodiment of the present invention, steps 2310 and 2320 are normally performed at a sub-harmonic rate of the carrier signal, for example at a third sub-harmonic rate. In another embodiment, steps 2310 and 2320 are repeated at an offset of a sub-harmonic rate of the carrier signal.

In step 2330, a down-converted signal is output. In embodiments, the results of steps 2310 and 2320 are passed on to a reconstruction filter or an interpolation fiter.

FIG. 24 illustrates an example RC processing system 2400, which can be used to implement method 2300. As can be seen in FIG. 24, system 2400 comprises a source resistance 2402, a switching module 2404, and a capacitance 2406. Source resistance 2402 is a lumped sum resistance.

Switching module 2404 is controlled by a windowing function, $u(t)-u(t-T_A)$. The length of the windowing function aperture is $T_A$, which is equal to an approximate half cycle of the received carrier signal, $S_i(t)$. Switching module 2404 ensures that approximate half cycles of the carrier signal are normally processed at a sub-harmonic rate. In an embodiment of system 2400, the received carrier signal is processed on at an off-set of a sub-harmonic rate of the carrier signal.

Capacitor 2406 integrates the output of switching module 2404 and accumulates the energy of the processed portions of the received carrier signal. RC processor 2400 also passes on its result, $S_O(t)$, to subsequent circuitry for further processing. This embodiment of the present invention is described in more detail in subsequent sub-sections.

It is noted that the implementations of the invention presented above are provided for illustrative purposes. Other implementations will be apparent to persons skilled in the art based on the herein teachings, and the invention is directed to such implementations.

4.5. Representation of a Power Signal as a Sum of Energy Signals

This sub-section describes how a power signal can be represented as a sum of energy signals. The detailed mathematical descriptions in the sub-sections below use both Fourier transform analysis and Fourier series analysis to describe embodiments of the present invention. Fourier transform analysis typically is used to describe energy signals while Fourier series analysis is used to describe power signals. In a strict mathematical sense, Fourier transforms do not exist for power signals. It is occasionally mathematically convenient, however, to analyze certain repeating or periodic power signals using Fourier transform analysis.

Both Fourier series analysis and Fourier transform analysis can be used to describe periodic waveforms with pulse like structure. For example, consider the ideal impulse sampling train in EQ. (1).

$$x(t) = \sum_{m=-\infty}^{\infty} \delta(t - mT_S) \quad \text{EQ. (1)}$$

Suppose that this sampling train is convolved (in the time domain) with a particular waveform s(t), which is of finite duration $T_A$. Hence s(t) is an energy waveform. Then:

$$s(t) * x(t) = \sum_{m=-\infty}^{\infty} \delta(t - mT_S) * s(t) \quad \text{EQ. (2)}$$

$$= \sum_{m=-\infty}^{\infty} s(t - mT_S) \quad \text{EQ. (3)}$$

The above equation is a well known form of the sampler equation for arbitrary pulse shapes which may be of finite time duration rather than impulse-like. The sampler equation possesses a Fourier transform on a term-by-term basis because each separate is an energy waveform.

Applying the convolution theorem and a term-by-term Fourier transform yields:

$$\tilde{\Im}\{s(t)*x(t)\}\Delta\tilde{\Im}\{\sum_{m=-\infty}^{\infty}\}\delta(t-mT_s)s(f) = \sum_{m=-\infty}^{\infty} T_s^{-1}\delta(f-m/T_s)S(n/T_s) \quad \text{EQ. (4)}$$

where $f_s=T_s^{-1}$. In this manner the Fourier transform may be derived for a train of pulses of arbitrary time domain definition provided that each pulse is of finite time duration and each pulse in the train is identical to the next. If the pulses are not deterministic then techniques viable for stochastic signal analysis may be required. It is therefore possible to represent the periodic signal, which is a power signal, by an infinite linear sum of finite duration energy signals. If the power signal is of infinite time duration, an infinite number of energy waveforms are required to create the desired representation.

FIG. 25 illustrates a pulse train 2502. Each pulse of pulse deterministic train 2502, for example pulse 2504, is an energy signal.

FIG. 26 illustrates one heuristic method based on superposition for combining pulses to form pulse deterministic train 2502.

The method of FIG. 26 shows how a power signal can be obtained from a linear piece-wise continuous sum of energy signals.

4.5.1. De-Composition of a Sine Wave into an Energy Signal Representation

The heuristic discussion presented in the previous section can be applied to the piecewise linear reconstruction of a sine wave function or carrier. FIG. 27 illustrates a simple way to view such a construction.

Using the previously developed equations, the waveform y(t) can be represented by:

$$\sin(\omega_c t+\phi)\big|_{t=0}^{mT} = \sum_{l=0}^{m=even}\sin(\omega_c t+\phi)\left[u(t)-u\left(t-\frac{T_c}{2}\right)\right]*\delta\left(t-l\cdot\frac{T_s}{2}\right) + \sum_{k=1}^{m=odd}\sin(\omega_c t+\phi)\left[u\left(t-\frac{T_c}{2}\right)-u\left(t-\frac{3T_c}{2}\right)\right]*\delta\left(t-k\frac{T_s}{2}\right) \quad \text{EQ. (5)}$$

and y(t) can be rewritten as:

$$y(t) = \sum_{l=0}^{m,even}\left[u\left(t-\frac{lT_s}{2}\right)-u\left(t-\frac{lT_s}{2}-\frac{T_c}{2}\right)\right]\cdot\sin\left(\omega_c\left(t-\frac{lT_s}{2}\right)+\phi\right) + \sum_{k=1}^{m=odd}[u(t-kT_s)-u(t-kT_s)]\cdot\sin\left(\omega_c\left(t-kT_s-\frac{T_c}{2}\right)\right)\sin(\omega_c(t-kT_s)+\phi) \quad \text{EQ. (6)}$$

In general, $T_s$ is usually integrally related to $T_c$. That is, the sampling interval $T_s$ divided by $T_c$ usually results in an integer, which further reduces the above equation. The unit step functions are employed to carve out the portion of a sine function applicable for positive pulses and negative pulse, respectively. The point is a power signal may be viewed as an infinite linear sum of energy signals.

4.5.2. Decomposition of Sine Waveforms

FIG. 28 illustrates how portions of a carrier signal or sine waveform are selected for processing according to embodiments of the present invention. Embodiments of the present invention operate recursively, at a sub-harmonic rate, on a carrier signal (i.e., sine wave waveform). FIG. 28 shows the case where there is synchronism in phase and frequency between the clock of the present invention and the carrier signal. This sub-section, as well as the previous sub-sections, illustrates the fact that each half-sine segment of a carrier signal can be viewed as an energy signal, and may be partitioned from the carrier or power signal by a gating process.

4.6. Matched Filtering/Correlating Characterization/Embodiment 4.6.1. Time Domain Description Embodiments of the present invention are interpreted as a specific implementation of a matched filter and a restricted Fourier sine or cosine transform. The matched filter of such embodiments is not a traditional realization of a matched filter designed to extract information at the data bandwidth. Rather, the correlation properties of the filter of the embodiments exploit specific attributes of bandpass waveforms to efficiently down convert signals from RF. A controlled aperture specifically designed to the bandpass waveform is used. In addition, the matched filter operation of embodiments of the present invention is applied recursively to the bandpass signal at a rate sub-harmonically related to the carrier frequency. Each matched filtered result or correlation of embodiments of the present invention is retained and accumulated to provide an initial condition for subsequent recursions of the correlator. This accumulation is approximated as a zero order data hold filter.

An attribute of bandpass waveforms is that they inherently possess time domain structure, which can be compared to sampling processes. For example, FIG. 29 illustrates a double sideband large carrier AM waveform 2902, with a dashed reference 2904 and black sample dots 2906. Each half sine above or below the dashed reference 2904 can represent a finite duration pulse that possesses information impressed on the carrier by the modulation process.

Sampled systems attempt to extract information in the envelope, at the black sample dots 2906, if possible. The sample times illustrated by the black sample dots 2906 are shown here at optimum sampling times.

Difficulties arise when the bandpass waveform is at RF. Then sampling is difficult because of sample rate, sample aperture, and aperture uncertainty. When the traditional sampler acquires, the aperture and aperture uncertainty must be minimized such that the number associated with the acquired waveform value possesses great accuracy at a particular instant in time with minimum variance. Sample rate can be reduced by sampling sub-harmonically. However, precisely controlling a minimized aperture makes the process very difficult, if not impossible, at RF.

In FIG. 29, the area under a half-sine cycle 2908 is illustrated with hatched marks. In accordance with embodiments of the present invention, instead of obtaining a sample of a single waveform voltage value, energy in the hatched area is acquired. By acquiring energy in the hatched area, the effects of aperture uncertainty can be minimized. Moreover, the waveform itself possesses the sampling information between the half sine zero crossings. This is true because the total energy of the hatched area is proportional to the peak of the modulated half sine peak. This is illustrated by EQ. (7), below. All that remains is to extract that latent information. In embodiments, the underlying theory for optimal extractions of the energy is in fact matched filter theory.

$$E_A = \int_{-\infty}^{\infty} S_i(t)^2\,dt = 2A^2\int_0^{T_A/2}(\sin(2\pi ft))^2\,dt = \frac{A^2 T_A}{2} \qquad \text{EQ. (7)}$$

$E_A = A^2\pi/2$ for the case of $\omega_c = 1$ $f_A = T_A^{-1} = 2f_c$ $T_c = T_A/2$ $T_c = f_c^{-1} = \omega_c/2\pi$ Historically, an optimization figure of merit is signal-to-noise ratio (SNR) at the system output. FIG. 30 illustrates a block diagram of an example optimum processor system 3002, which considers additive white Gaussian noise (AWGN). The general theory described herein can be extended to systems operating in the presence of colored noise as well.

Although an RF carrier with modulated information is typically a power signal, the analysis which follows considers the power signal to be a piece-wise construct of sequential energy signals where each energy waveform is a half sine pulse (single aperture) or multiple sine pulses (see sub-section 2 above). Hence, theorems related to finite time observations, Fourier transforms, etc., may be applied throughout.

Analysis begins with the assumption that a filtering process can improve SNR. No other assumptions are necessary except that the system is casual and linear. The analysis determines the optimum processor for SNR enhancement and maximum energy transfer.

The output of the system is given by the convolution integral illustrated in EQ. (8):

$$S_0(t) = \int_0^{\infty} h(\tau) S_i(t-\tau)\,d\tau \qquad \text{EQ. (8)}$$

where $h(\tau)$ is the unknown impulse response of the optimum processor.

The output noise variance is found from EQ. (9):

$$\sigma_0^2 = N_0\int_0^{\infty} h^2(\tau)\,d\tau \text{ (Single sided noise PSD)} \qquad \text{EQ. (9)}$$

The signal to noise ratio at time $t_0$ is given by EQ. (10):

$$\frac{S_0^2(t_0)}{\sigma_0^2} = \frac{\left[\int_0^{\infty} h(\tau) S_i(t_0-\tau)\,d\tau\right]^2}{N_0\int_0^{\infty} h^2(\tau)\,d\tau} \qquad \text{EQ. (10)}$$

The Schwarz inequality theorem may be used to maximize the above ratio by recognizing, in EQ. (11), that:

$$\frac{S_0^2(t_0)}{\sigma_0^2} \le \frac{\int_0^{\infty} h^2(\tau)\int_0^{\infty} S_i^2(t_0-\tau)\,d\tau}{N_0\int_0^{\infty} h^2(\tau)\,d\tau} \qquad \text{EQ. (11)}$$

The maximum SNR occurs for the case of equality in EQ. (11), which yields EQ. (12):

$$\left|\frac{S_0^2(t_0)}{\sigma_0^2}\right|\max = \frac{1}{N_0}\int_0^{\infty} S_i^2(t_0-\tau)\,d\tau \qquad \text{EQ. (12)}$$

In general therefore:

$$h(\tau) = kS_i(t_0-\tau)u(\tau) \qquad \text{EQ. (13)}$$

where $u(\tau)$ is added as a statement of causality and k is an arbitrary gain constant. Since, in general, the original waveform $S_i(t)$ can be considered as an energy signal (single half sine for the present case), it is important to add the consideration of $t_0$, a specific observation time. That is, an impulse response for an optimum processor may not be optimal for all time. This is due to the fact that an impulse response for realizable systems operating on energy signals will typically die out over time. Hence, the signal at $t_0$ is said to possess the maximum SNR.

This can be verified by maximizing EQ. (12) in general.

$$\left(\frac{d}{dt}\right)\frac{S_0^2(t)}{\sigma_0^2} = 0 \qquad \text{EQ. (14)}$$

It is of some interest to rewrite EQ. (12) by a change of variable, substituting $t = t_0 - \tau$. This yields:

$$k\int_0^{\infty} S_i^2(t_0-\tau)\,d\tau = k\int_{-\infty}^{t_0} S_i^2(t)\,dt \qquad \text{EQ. (15)}$$

This is the energy of the waveform up to time $t_0$. After $t_0$, the energy falls off again due to the finite impulse response nature of the processor. EQ. (15) is of great importance because it reveals an often useful form of a matched filter known as a correlator. That is, the matched filter may be implemented by multiplying the subject waveform by itself over the time interval defined for the waveform, and then integrated. In this realization the maximum output occurs when the waveform and its optimal processor aperture are exactly overlapped for $t_0 = T_a$. It should also be evident from the matched filter equivalency stated in EQ. (15) that the maximum SNR solution also preserves the maximum energy transfer of the desired waveform through the processor. This may be proven using the Parseval and/or Rayliegh energy theorems. EQ. (15) relates directly to Parseval's theorem.

4.6.2. Frequency Domain Description

The previous sub-section derived an optimal processor from the time domain point-of-view according to embodiments of the invention. In an embodiment, the present invention is defined to correlate with a finite time duration half-sine pulse ($T_A$ wide), which is a portion of the carrier signal. The aperture portion of this correlation is represented herein. Fourier transforms may be applied to obtain a frequency domain representation for h(t). This result is shown below.

$$H(f)=kS_i^*(f)e^{-j2\pi f t_0} \quad \text{EQ. (16)}$$

Letting $j\omega=j2\pi f$ and $t_0=T_A$, we can write the following EQ. (17) for FIGS. 31 and 32.

$$H(j\omega)=\frac{2}{T_A}e^{-j\omega T_A/2}\frac{\sin(\omega T_A/2)}{\omega T_A/2} \quad \text{EQ. (17)}$$

$$H(j\omega)=\frac{2}{T_A}e^{-j\omega T_A/2}\frac{\sin(\omega T_A/2)}{\omega T_A/2}$$

The frequency domain representation in FIG. 31 represents the response of an optimum processor according to embodiments. FIG. 32 illustrates responses of processors that use parameters different than $T_A$. For $t_0<<T_A$, the frequency domain response possesses too wide a bandwidth which captures too little of the main lobe of desired energy with respect to out of band noise power. Conversely, when $t_0>>T_A$, the energy transfer from the signal's main lobe is very inefficient. Therefore, proper selection of $T_A$ is key for implementation efficiency.

Another simple but useful observation is gleaned from EQ. (15) and Rayleigh's Energy Theorem for Fourier transforms, as illustrated by EQ. (18).

$$E=\int_{-\infty}^{\infty}|S_i(t)|^2dt=\int_{-\infty}^{\infty}|H(f)|^2df \quad \text{EQ. (18)}$$

EQ. (18) verifies that the transform of the optimal filter of various embodiments should substantially match the transform of the specific pulse, which is being processed, for efficient energy transfer.

FIG. 33 illustrates the slight differences between the transform of an ideal impulse response (half, sine) (Plot 3302) and a rectangular sample aperture (Plot 3304) according to an embodiment of the invention. Even though they are not perfectly matched, the correlation is quite good. Plot 3302 is a plot of the normalized Fourier transform for an ideal half sine impulse response. Plot 3304 is a plot of the normalized Fourier transform for a rectangular sampling aperture (finite time integrator) according to the invention. In circuit embodiments of the invention, finite rise and fall times shape the aperture to quasi-Gaussian. Plot 3306, a plot of the normalized Fourier transform for a CMOS sampling aperture (with natural process shaping) according to the invention, illustrates a pulse from a CMOS circuit embodiment of the invention designed specifically to the $T_A=1$ criteria for the carrier half sine. As can be seen in FIG. 33, its correlation is excellent. Channel resistances can increase non-linearity for the shaped aperture in CMOS, however, so that only part of the maximum possible shaping benefit is realized.

4.7. Finite Time Integrating Characterization/Embodiment

It is not always practical to design the matched filter with passive networks. Sometimes the waveform correlation of $S_i(t)$ is also cumbersome to generate exactly. However, a single aperture realization of embodiments of the present invention is practical, even in CMOS, with certain concessions.

Consider FIGS. 34 and 35, which illustrate an optimum single aperture realization of embodiments of the present invention using sub harmonic sampling (3rd harmonic) and a processor 3510 according to such embodiments. Ideally over the aperture of interest, $T_A$, a half sine impulse response or waveform is used to operate on the original gated $S_i(t)$. Suppose for ease of implementation, however, that a rectangular impulse response is used, as illustrated by FIGS. 36A and 36B. The Fourier transform of this processor still overlaps the Fourier transform for the original pulse $S_i(t)$ with similar nulls, as shown in FIG. 33, when the aperture is implemented using available CMOS technology (hardware). A perfect finite time integrator has a response that has different null locations, but it still has a very desirable SNR. Although the Fourier correlation is not perfect, it is still quite good. Furthermore, it can be implemented using a simple switch that lets the half sine through in order to charge a capacitor, which acquires the total energy of the half sine at $t_0\cong T_A$.

Applying EQ. (17) for both the matched filter and non-matched filter embodiments yields:

Optimal Matched Filter Embodiment Result $$E_{AO}=\int_0^{T_A}S_i^2(t)dt=\frac{A^2T_A}{2}$$

$E_{AO}=A^2\pi$ for $\omega_c=1$; and

Finite Time Integrator Embodiment Result $$E_{ASO}=\left(\int_0^{T_A}A\cdot S(t)\right)^2dt=\left(\frac{2T_AA}{\pi}\right)^2$$

$E_{ASO}=(2kA)^2$ for $\omega_c=1$

It turns out in practice that realizable apertures are not perfectly rectangular and do possess a finite rise and fall time. In particular, they become triangular or nearly sinusoidal for very high frequency implementations. Thus, the finite time integrating processor result tends toward the matched filtering/correlating processor result when the aperture becomes sine-like, if the processor possesses constant impedance across the aperture duration. Even though the matched filter/correlator response produces a lower output value at $T_A$, it yields a higher SNR by a factor of 0.9 dB, as further illustrated below in sub-section 6.

4.8. RC Processing Characterization/Embodiment

Sometimes a precise matched filter is difficult to construct, particularly if the pulse shape is complex. Often, such complexities are avoided in favor of suitable approximations, which preserve the essential features. The single aperture realization of embodiments of the present invention is usually implemented conceptually as a first order approximation to a matched filter where the pulse shape being matched is a half-sine pulse. As shown in above, in embodiments, the matched filter is applied recursively to a carrier waveform. The time varying matched filter output correlation contains information modulated onto the carrier. If many such matched filter correlation samples are extracted, the original information modulated onto the carrier is recovered.

A baseband filter, matched or otherwise, may be applied to the recovered information to optimally process the signal at baseband. The present invention should not be confused with this optimal baseband processing. Rather embodiments of the present invention are applied on a time microscopic basis on the order of the time scale of a carrier cycle.

FIG. 37 illustrates a basic circuit 3702 that can be used to describe an example RC processor according to embodiments of the present invention. Circuit 3702 comprises a switch 3704. The switch 3704 is closed on a $T_A$ basis in order to sample $V_i(t)$. In the analysis that follows, the transfer function and impulse response are derived for circuit 3702.

The switch 3704 functions as a sampler, which possesses multiplier attributes. Heviside's operator is used to model the switch function. The operator is multiplied in the impulse response, thus rendering it essential to the matched filtering/correlating process.

In the analysis that follows, only one aperture event is considered. That is, the impulse response of the circuit is considered to be isolated aperture-to-aperture, except for the initial value inherited from the previous aperture.

For circuit 3702, shown in FIG. 37:

$$V_0(t) = \frac{1}{C}\int i(t)dt \quad \text{EQ. (19)}$$

$$i(t) = \frac{V_i(t)[u(t)-u(t-T_A)] - V_0(t)}{R} \quad \text{EQ. (20)}$$

$$V_0(t) = \int \frac{V_i(t)[u(t)-(t-T_A)] - V_0(t)}{RC}dt \quad \text{EQ. (21)}$$

$$V_0(t) + \int \frac{V_0(t)}{RC}dt = \int \frac{V_i(t)[u(t)-u(t-T_A)]}{RC}dt \quad \text{EQ. (22)}$$

EQ. (22) represents the integro-differential equation for circuit 3702. The right hand side of EQ. (22) represents the correlation between the input waveform $V_i(t)$ and a rectangular window over the period $T_A$.

The Laplace transform of EQ. (22) is:

$$V_0(s)\left(1+\frac{1}{sRC}\right) + \underbrace{\frac{V_0(0)}{sRC}}_{\text{initial condition}} = V_i(s)\left(\frac{1-e^{-sT_A}}{s^2RC}\right) + \underbrace{\frac{V_i(0)}{sRC}}_{\text{initial condition}} \quad \text{EQ. (23)}$$

Consider that the initial condition equal to zero, then:

$$H(s) = \frac{V_0(s)}{V_i(s)} = RC^{-1}\cdot\left(\frac{1-e^{-sT_A}}{s}\right)\cdot\left(\frac{1}{s+(RC)^{-1}}\right) \quad \text{EQ. (24)}$$

$$\therefore h(t) = \left(\frac{e^{\frac{t}{-RC}}}{RC}\right)[u(t)-u(t-T_A)] \quad \text{EQ. (25)}$$

Suppose that $$V_i(t) = A\sin\left(2\pi\frac{f_A}{2}t+\phi\right),$$

as illustrated in FIG. 38, where $f_A = T_A^{-1}$ and $\phi$ is an arbitrary phase shift. (FIG. 38 also shows h(t).) Note in FIG. 38 that h(t) is not ideally a sine pulse. However, the cross correlation of h(t) and $V_i(t)$ can still be quite good if RC is properly selected. This is the optimization, which-is required in order to approximate a matched filter result (namely SNR optimization given h(t) and $V_i(t)$).

$$V_0(t) = V_i(t)*h(t) = A\sin(\pi f_A t)*h(t);\ 0 \leqq t \leqq T_A \quad \text{EQ. (26)}$$

$$V_0(t) = \int_0^\infty \sin(\pi f_A(t-\tau))\frac{e^{\frac{-\tau}{RC}}}{RC}d\tau \quad \text{EQ. (27)}$$

By a change of variables;

$$V_0(t) = \int_{-\infty}^{t} A\sin(\pi f_A\tau+\phi)\cdot \frac{e^{\frac{-(t-\tau)}{RC}}}{RC}[u(t-\tau)-u(t-\tau-T_A)]d\tau \quad \text{EQ. (28)}$$

where $f_A \Delta 2f = T_A^{-1}$ $$\therefore V_0(t) = \frac{A}{1+(\pi f_A RC)^2}(-\pi f_A t+\phi) + \sin(\pi f_A t+\phi) - Ae^{-t/RC}\left(\sin\phi - \frac{(\pi f_A RC)^2}{1+(\pi f_A RC)^2}\cdot\sin\phi - \frac{\pi f_A RC}{1+(\pi f_A RC)^2}\cdot\cos\phi\right)$$

$0 \le t \le T_A$ $$V_0(t) = \left[\frac{1}{1+(RC\pi f_A)^2}\right](\sin(\pi f_A t) - \pi f_A RC\cdot\cos(\pi f_A t) + \pi f_A RC\cdot e^{-t/RC})$$

$0 \le t \le T_A,\ \phi = 0$

Notice that the differential equation solution provides for carrier phase skew, $\phi$. It is not necessary to calculate the convolution beyond $T_A$ since the gating function restricts the impulse response length.

FIG. 39 illustrates the response $V_0(t)$. The output may peak just before $T_A$ (depending on the RC value) because the example RC processor is not a perfect matched filtering/correlating processor, but rather an approximation. FIG. 40 illustrates that the maximum of the function occurs at $t \cong 0.75T_A$, for a $\beta=2.6$, which can be verified by evaluating:

$$\frac{\partial}{\partial t}V_0(t) = 0 \quad \text{EQ. (29)}$$

Solving the differential equation for $V_0(t)$ permits an optimization of $\beta=(RC)^{-1}$ for maximization of $V_0$.

FIG. 41 illustrates a spread of values for beta. In embodiments, the peak $\beta$ occurs at approximately $\beta \cong 2.6$. FIG. 41 illustrates a family of output responses for processors according to embodiments of the present invention having different beta values. In embodiments, the definition used for optimality to obtain $\beta=2.6$ is the highest value of signal obtained at the cutoff instant, $T_A$. Other criteria can be applied, particularly for multiple pulse accumulation and SNR consideration.

In embodiments, one might be tempted to increase $\beta$ and cutoff earlier (i.e., arbitrarily reduce $T_A$). However, this does not necessarily always lead to enhanced SNR, and it reduces charge transfer in the process. It can also create impedance matching concerns, and possibly make it necessary to have a high-speed buffer. That is, reducing $T_A$ and C is shown below to decrease SNR. Nevertheless, some gain might be achieved by reducing $T_A$ to 0.75 for β=2.6, if maximum voltage is the goal.

In embodiments, in order to maximize SNR, consider the following. The power in white noise can be found from:

$$\sigma^2 = N_0 \int_0^\infty h^2(\lambda) d\lambda \quad \text{EQ. (30)}$$

$$\sigma^2 = N_0 \int_0^\infty \left(\frac{e^{-2\lambda} / RC^2}{RC}\right)(u(t) - u(\lambda - T_A))\, d\lambda (\text{Single sided noise } PSD) \quad \text{EQ. (31)}$$

$$\sigma^2 = \frac{\beta N_0 (1 - e^{-2\beta N_o T_A})}{2} @ T_A \quad \text{EQ. (32)}$$

$\beta = (RC)^{-1}$

Notice that $\sigma^2$ is a function of RC.

The signal power is calculated from:

$$(V_0(t))^2 = \left(\frac{1}{1 + (\beta^{-1}\pi f_A)^2}\right)^2 (\sin(\pi f_A t) - \beta^{-1}\pi f_A \cdot \cos(\pi f_A t) + \beta^{-1}\pi f_A e^{-\beta_t})^2 \quad \text{EQ. (33)}$$

Hence, the SNR at $T_A$ is given by:

$$\left.\frac{(V_0(t))^2}{\sigma^2}\right|_{t=T_A} = \frac{2}{\beta N_0 (1 - e^{-2\beta N_o T_A})} \left(\frac{1}{1 + (\beta^{-1}\pi f_A)^2}\right)^2 (\beta^{-1}\pi f_A + \beta^{-1}\pi f_A e^{-\beta T_A})^2 \quad \text{EQ. (34)}$$

Maximizing the SNR requires solving:

$$\frac{\partial}{\partial \beta}\left(\frac{V_0(t)^2}{\sigma^2}\right) = 0 \quad \text{EQ. (35)}$$

Solving the $SNR_{max}$ numerically yields β values that are ever decreasing but with a diminishing rate of return.

As can be seen in FIG. 42, in embodiments, β=2.6 for the maximum voltage response, which corresponds to a normalized SNR relative to an ideal matched filter of 0.431. However, in embodiments, selecting a β of 1/10 the β, which optimizes voltage, produces a superior normalized SNR of 0.805 (about 80.5% efficiency) This is a gain in SNR performance of about 2.7 dB.

In certain embodiments, it turns out that for an ideal matched filter the optimum sampling point corresponding to correlator peak is precisely $T_A$. However, in embodiments, for the RC processor, the peak output of occurs at approximately 0.75 $T_A$ for large β (i.e., β=2.6). That is because the impulse response is not perfectly matched to the carrier signal. However, as β is reduced significantly, the RC processor response approaches the efficiency of the finite time integrating processor response in terms of SNR performance. As β is lowered, the optimal SNR point occurs closer to $T_A$, which simplifies design greatly. Embodiments of the present invention provides excellent energy accumulation over $T_A$ for low β, particularly when simplicity is valued.

4.9. Charge Transfer and Correlation

The basic equation for charge transfer is:

$$\frac{dq}{dt} = C\frac{dv}{dt}, \text{ (assuming } C \text{ constant over time)} \quad \text{EQ. (36)}$$

$$q = CV$$

Similarly the energy u stored by a capacitor can be found from:

$$u = \int_0^q \frac{q_x}{C} dq_x = \frac{q^2}{2C} \quad \text{EQ. (37)}$$

From EQs. (36) and (37):

$$u = \frac{Cv^2}{2} \quad \text{EQ. (38)}$$

Thus, the charge stored by a capacitor is proportional to the voltage across the capacitor, and the energy stored by the capacitor is proportional to the square of the charge or the voltage. Hence, by transferring charge, voltage and energy are also transferred. If little charge is transferred, little energy is transferred, and a proportionally small voltage results unless C is lowered.

The law of conversation of charge is an extension of the law of the conservation of energy. EQ. (36) illustrates that if a finite amount of charge must be transferred in an infinitesimally short amount of time then the voltage, and hence voltage squared, tends toward infinity. The situation becomes even more troubling when resistance is added to the equation. Furthermore, $$V_c = \frac{1}{C}\int_0^{T_A} i\,dt \qquad \text{EQ. (39)}$$

This implies an infinite amount of current must be supplied to create the infinite voltage if $T_A$ is infinitesimally small. Clearly, such a situation is impractical, especially for a device without gain.

In most radio systems, the antenna produces a small amount of power available for the first conversion, even with amplification from an LNA. Hence, if a finite voltage and current restriction do apply to the front end of a radio then a conversion device, which is an impulse sampler, must by definition possess infinite gain. This would not be practical for a switch. What is usually approximated in practice is a fast sample time, charging a small capacitor, then holding the value acquired by a hold amplifier, which preserves the voltage from sample to sample.

The analysis that follows shows that given a finite amount of time for energy transfer through a conversion device, the impulse response of the ideal processor, which transfers energy to a capacitor when the input voltage source is a sinusoidal carrier and possesses a finite source impedance, is represented by embodiments of the present invention. If a significant amount of energy can be transferred in the sampling process then the tolerance on the charging capacitor can be reduced, and the requirement for a hold amplifier is significantly reduced or even eliminated.

In embodiments, the maximum amount of energy available over a half sine pulse can be found from:

$$u = \int_0^{T_A} S_i^2(t)\,dt = \frac{A^2 T_A}{2} \quad (A^2\pi/2 \text{ for } \omega_c = 1) \qquad \text{EQ. (40)}$$

This points to a correlation processor or matched filter processor. If energy is of interest then a useful processor, which transfers all of the half sine energy, is revealed in EQ. (39), where $T_A$ is an aperture equivalent to the half sine pulse. In embodiments, EQ. (40) provides the clue to an optimal processor.

Consider the following equation sequence.

$$\int_0^{\infty} h(\tau)S_i(t-\tau)d\tau \Rightarrow \int_{-0}^{T_A} kS_i^2(T_A-\tau)d\tau \Rightarrow \int_{-0}^{T_A} S_i^2(t)dt \qquad \text{EQ. (41)}$$

where $h(\tau)=S_i(T_A-\tau)$ and $t=T_A-\tau$.

This is the matched filter equation with the far most right hand side revealing a correlator implementation, which is obtained by a change of variables as indicated. The matched filter proof for $h(\tau)=S_i(T_A-\tau)$ is provided below. Note that the correlator form of the matched filter is exactly a statement of the desired signal energy. Therefore a matched filter/correlator accomplishes acquisition of all the energy available across a finite duration aperture. Such a matched filter/correlator can be implemented as shown in FIG. 43.

In embodiments, when optimally configured, the example matched filter/correlator of FIG. 43 operates in synchronism with the half sine pulse $S_i(t)$ over the aperture $T_A$. Phase skewing and phase roll will occur for clock frequencies, which are imprecise. Such imprecision can be compensated for by a carrier recovery loop, such as a Costas Loop. A Costas Loop can develop the control for the acquisition clock, which also serves as a sub-harmonic carrier. However, phase skew and non-conherency does not invalidate the optimal form of the processor provided that the frequency or phase errors are small, relative to $T^{-1}_A$. Noncoherent and differentially coherent processors may extract energy from both I and Q with a complex correlation operation followed by a rectifier or phase calculator. It has been shown that phase skew does not alter the optimum SNR processor formulation. The energy which is not transferred to I is transferred to Q and vice versa when phase skew exists. This is an example processor for a finite duration sample window with finite gain sampling function, where energy or charge is the desired output.

A matched filter/correlator embodiment according to the present invention might be too expensive and complicated to build for some applications. In such cases, however, other processes and processors according to embodiments of the invention can be used. The approximation to the matched filter/correlator embodiment shown in FIG. 44 is just one embodiment that can be used in such instances. The finite time integrator embodiment of FIG. 44 requires only a switch and an integrator. Sub-section 6 below shows that this embodiment of the present invention has only a 0.91 dB difference in SNR compared to the matched filter/correlator embodiment.

Another very low cost and easy to build embodiment of the present invention is the RC processor. This embodiment, shown in FIG. 45, utilizes a very low cost integrator or capacitor as a memory across the aperture. If C is suitable chosen for this embodiment, its performance approaches that of the matched filter/correlator embodiment, shown in FIG. 43. Notice the inclusion of the source impedance, R, along with the switch and capacitor. This simple embodiment nevertheless can approximate the optimum energy transfer of the matched filter/correlator embodiment if properly designed.

When maximum charge is transferred, the voltage across the capacitor 4504 in FIG. 45 is maximized over the aperture period for a specific RC combination.

Using EQs. (36) and (39) yields:

$$q = C\cdot\frac{1}{C}\int_0^{T_A} i_c\,dt \qquad \text{EQ. (42)}$$

If it is accepted that an infinite amplitude impulse with zero time duration is not available or practical, due to physical parameters of capacitors like ESR, inductance and breakdown voltages, as well as currents, then EQ. (42) reveals the following important considerations for embodiments of the invention:

The transferred charge, q, is influenced by the amount of time available for transferring the charge;

The transferred charge, q, is proportional to the current available for charging the energy storage device; and Maximization of charge, q, is a function of $i_c$, C, and $T_A$. Therefore, it can be shown that for embodiments:

$$q_{max} = Cv_{max} = C\left[\frac{1}{C}\int_0^{T_A} i_c dt\right]_{max} \quad \text{EQ. (43)}$$

The impulse response for the RC processing network was found in sub-section 5.2 below to be;

$$h(t) = \frac{e^{\frac{-\tau}{RC}}}{RC}[u(\tau) - u(\tau - T_A)] \quad \text{EQ. (44)}$$

Suppose that $T_A$ is constrained to be less than or equal to ½ cycle of the carrier period. Then, for a synchronous forcing function, the voltage across a capacitor is given by EQ. (45).

$$V_0(t) = \int_{-\infty}^{t} \sin(\pi f_A \tau) \cdot \frac{e^{\frac{-(t-\tau)}{RC}}}{RC} d\tau \quad \text{EQ. (45)}$$

Maximizing the charge, q, requires maximizing EQ. (28) with respect to t and β.

$$\frac{\partial^2 V_0(t)}{\partial t \partial \beta} = 0 \quad \text{EQ. (46)}$$

It is easier, however, to set R=1, $T_A$=1, A=1, $f_A = T_A^{-1}$ and then calculate $q = cV_0$ from the previous equations by recognizing that $$q = \frac{\beta^{-1}}{R} V_0 = cV_0,$$

which produces a normalized response.

FIG. 46 illustrates that increasing C is preferred in embodiments of the invention. It can be seen in FIG. 46 that as C increases (i.e., asβ decreases) the charge transfer also increases. This is what is to be expected based on the optimum SNR solution. Hence, for embodiments of the present invention, an optimal SNR design results in optimal charge transfer. As C is increased, bandwidth considerations should be taken into account.

In embodiments, EQ. (40) establishes $T_A$ as the entire half sine for an optimal processor. However, in embodiments, optimizing jointly for t and β reveals that the RC processor response creates an output across the energy storage capacitor that peaks for $t_{max} \cong 0.75T_A$, and $\beta_{max} \cong 2.6$, when the forcing function to the network is a half sine pulse.

In embodiments, if the capacitor of the RC processor embodiment is replaced by an ideal integrator then $t_{max} \rightarrow T_A$.

$$\beta T_A \simeq 1.95 \quad \text{Eq. (47)}$$

where $\beta = (RC)^{-1}$

For example, for a 2.45 GHz signal and a source impedance of 50Ω, EQ. (47) above suggests the use of a capacitor of ≅2 pf. This is the value of capacitor for the aperture selected, which permits the optimum voltage peak for a single pulse accumulation. For practical realization of the present invention, the capacitance calculated by EQ. (47) is a minimum capacitance. SNR is not considered optimized at $\beta T_A \simeq 1.95$. As shown earlier, a smaller β yields better SNR and better charge transfer. In embodiments, as discussed below, it turns out that charge can also be optimized if multiple apertures are used for collecting the charge.

In embodiments, for the ideal matched filter/correlator approximation, $\beta T_A$ is constant and equivalent for both consideration of optimum SNR and optimum charge transfer, and charge is accumulated over many apertures for most practical designs. Consider the following example, β=0.25, and $T_A$=1. Thus $\beta T_A$=0.25. At 2.45 GHz, with R=50Ω, C can be calculated from:

$$C \geqq \frac{T_A}{R(.25)} \geq 16.3\ pf \quad \text{EQ. (48)}$$

The charge accumulates over several apertures, and SNR is simultaneously optimized melding the best of two features of the present invention. Checking CV for $\beta T_A \simeq 1.95$ vs. $\beta T_A$=0.25 confirms that charge is optimized for the latter.

4.10. Load Resistor Consideration

The general forms of the differential equation and transfer function, described above, for embodiments of the present invention are the same as for a case involving a load resistor, $R_L$, applied across capacitor, C. FIG. 47A illustrates an example RC processor embodiment 4702 of the present invention having a load resistance 4704 across a capacitance 4706.

Consider RC processing embodiment 4702 (without initial conditions).

EQ. (24) becomes:

$$H(s) = \frac{1 - e^{-sT_A}}{s}\left(\frac{1}{sCR + k}\right) \quad \text{EQ. (49)}$$

$$k = (R/R_L + 1) \quad \text{EQ. (50)}$$

$$h(t) = \left(\frac{e^{-\frac{t \cdot k}{RC}}}{RC}\right)[u(t) - (t - T_A)] \quad \text{EQ. (51)}$$

It should be clear that $R_L$ 4704, and therefore k, accelerate the exponential decay cycle.

$$V_0(t) = \int_{-\infty}^{t} \sin(\pi f_a \tau) \cdot \frac{e^{k(t-\tau)}}{RC} d\tau \quad \text{EQ. (52)}$$

$$V_0(t) = \left(\frac{1}{k^2 + (\pi f_A)^2}\right)\left[k \cdot \sin(\pi f_A t) - \pi f_A RC \cdot \cos(\pi f_A t) + RCe^{-\frac{kt}{RC}}\right] 0 \leq t \leq T_A \quad \text{EQ. (53)}$$

This result is valid only over the acquisition aperture. After the switch is opened, the final voltage that occurred at the sampling instance $t \cong T_A$ becomes an initial condition for a discharge cycle across $R_L$ 4704. The discharge cycle possesses the following response:

$$V_D = \frac{V_A \cdot e^{-\frac{t}{R_L C}}}{R_L C} u(t - T_A)\text{(single event discharge)} \quad \text{EQ. (54)}$$

$V_A$ is defined as $V_0(t \cong T_A)$. Of course, if the capacitor 4706 does not completely discharge, there is an initial condition present for the next acquisition cycle.

FIG. 47B illustrates an example implementation of the invention, modeled as a switch S, a capacitor $C_S$, and a load resistance R. FIG. 47D illustrates example energy transfer pulses, having apertures A, for controlling the switch S. FIG. 47C illustrates an example charge/discharge timing diagram for the capacitor $C_S$, where the capacitor $C_S$ charges during the apertures A, and discharge between the apertures A.

Equations (54.1) through (63) derive a relationship between the capacitance of the capacitor $C_S$ ($C_S(R)$), the resistance of the resistor R, the duration of the aperture A (aperture width), and the frequency of the energy transfer pulses (freq LO). Equation 54.11 illustrates that optimum energy transfer occurs when x=0.841. Based on the disclosure herein, one skilled in the relevant art(s) will realize that values other that 0.841 can be utilized.

$$\phi = \frac{1}{C}\int i(t)\partial t + Ri(t) \quad \text{EQ. (54.1)}$$

$$\frac{\partial}{\partial t}\phi = \frac{\partial}{\partial t}\left[\frac{1}{C}\int i(t)\partial t + Ri(t)\right] \quad \text{EQ. (54.2)}$$

$$\phi = \frac{i(t)}{C_s} + \frac{R\partial i(t)}{\partial t} \quad \text{EQ. (54.3)}$$

$$\phi = \frac{1}{C_s} + R \cdot s \quad \text{EQ. (54.4)}$$

$$s = \frac{-1}{C_s \cdot R}, \text{ by definition: } i_{init}(t) = \frac{V_c, init}{R} \quad \text{EQ. (54.5)}$$

$$i(t) = \left(\frac{V_C, init}{R}\right) \cdot e^{\left(\frac{-t}{C_s \cdot R}\right)} \quad \text{EQ. (54.6)}$$

$$V_{out}(t) = R \cdot i(t) = V_{C_s} init \cdot e^{\left(\frac{-t}{C_s \cdot R}\right)} \quad \text{EQ. (55)}$$

Maximum power transfer occurs when:

$$\text{Power\_Final} = \frac{1}{\sqrt{2}} \cdot \text{Peak\_Power} \quad \text{EQ. (56)}$$

$$\text{Power\_Peak} = \frac{(V_{C_s}\text{peak})^2}{R} \quad \text{EQ. (57)}$$

$$\text{Power\_Final} = \frac{(x \cdot V_{C_s}\text{peak})^2}{R} \quad \text{EQ. (58)}$$

Using substitution:

$$\frac{(x \cdot V_{C_s}\text{peak})^2}{R} = \frac{(V_{C_s}\text{peak})^2}{R} \cdot \frac{1}{\sqrt{2}} \quad \text{EQ. (59)}$$

Solving for "x" yields: x=0.841.
Letting $V_{C_s}$init=1 yields $V_{out}(t)$=0.841 when $$t = \frac{1}{freqLO} - \text{Aperture\_Width} \quad \text{EQ. (60)}$$

Using substitution again yields:

$$0.841 = 1 \cdot e^{\left(\frac{\frac{1}{freqLO} - \text{Aperture\_Width}}{C_s \cdot R}\right)} \quad \text{EQ. (61)}$$

$$\ln(0.841) = \left(\frac{\frac{1}{freqLO} - \text{Aperture\_Width}}{C_s \cdot R}\right) \quad \text{EQ. (62)}$$

This leads to the following EQ. (63) for selecting a capacitance.

$$C_s(R) = \left(\frac{\frac{1}{freqLO} - \text{Aperture\_Width}}{-\ln(0.841) \cdot R}\right) \quad \text{EQ. (63)}$$

4.11. Signal-To-Noise Ratio Comparison of the Various Embodiments

The prior sub-sections described the basic SNR definition and the SNR of an optimal matched filter/correlator processor according to embodiments of the present invention. This sub-section section describes the SNR of additional processor embodiments of the present invention and compares their SNR with the SNR of an optimal matched filter/correlator embodiment. The description in this sub-section is based on calculations relating to single apertures and not accumulations of multiple aperture averages. Since SNR is a relative metric, this method is useful for comparing different embodiments of the present invention. The SNR for an example optimal matched filter/correlator processor embodiment, an example finite time integrator processor embodiment, and an example RC processor embodiment are considered and compared.

EQ. (64) represents the output SNR for an example optimal matched filter/correlator processor embodiment. EQ. (65), which can be obtained from EQ. (64), represents the output SNR for a single aperture embodiment assuming a constant envelope sine wave input. The results could modify according to the auto-correlation function of the input process, however, over a single carrier half cycle, this relationship is exact.

$$SNR_{opt} \Delta \frac{1}{N_0}\int_0^{\infty} S_i^2(t_0 - \tau)\,d\tau \quad \text{EQ. (64)}$$

$$SNR_{opt} \Delta \frac{T_A A^2}{2N_0} \quad \text{EQ. (65)}$$

(Single aperture case, single sided PSD for $N_0$)

The description that follows illustrates the SNR for three processor embodiments of the present invention for a given input waveform. These embodiments are:

An Example Optimal Matched Filter/Correlator Processor Embodiment;

An Example Finite Time Integrator processor Embodiment; and

An Example RC Processor Embodiment

The relative value of the SNR of these three embodiments is accurate for purposes of comparing the embodiments. The absolute SNR may be adjusted according to the statistic and modulation of the input process and its complex envelope.

Consider an example finite time integrator processor, such as the one illustrated in FIG. 36B. The impulse response of the finite time integrator processor is given by EQ. (66):

$$h(t)=k,\ 0\leqq t\leqq T_A \qquad \text{EQ. (66)}$$

where k is defined as an arbitrary constant (e.g., 1).

The noise power at the integrator's output can be calculated using EQ. (67):

$$\overline{Y^2}=N_0\int_0^\infty h^2(\tau)\,d\tau=N_0T_A \text{ (Single sided noise PSD)} \qquad \text{EQ. (67)}$$

The signal power over a single aperture is obtained by EQ. (68):

$$y(t)^2=(2A\int_0^{T_A/2}\sin(\omega t)dt)^2 \qquad \text{EQ. (68)}$$

Choosing A=1, the finite time integrator output SNR becomes:

$$SNR_{int}=\frac{4T_A}{\pi^2N_0} \qquad \text{EQ. (69)}$$

An example RC filter can also be used to model an embodiment of the present invention. The resistance is related to the combination of source and gating device resistance while the capacitor provides energy storage and averaging. The mean squared output of a linear system may be found from EQ. (70):

$$\overline{Y^2}=\int_0^\infty d\tau_1\int_0^\infty R_x(\tau_A-\tau_1)h(\tau_1)h(\tau_2)\,d\tau_2 \qquad \text{EQ. (70)}$$

For the case of input AWGN:

$$R_{xn}(\tau)=N_0\delta(\tau) \qquad \text{EQ. (71)}$$

$$\overline{Y^2}=N_0\int_0^\infty d\tau_1\int_0^\infty \delta(\tau_2-\tau_1)h(\tau_1)h(\tau_2)\,d\tau_2 \qquad \text{EQ. (72)}$$

$$\overline{Y_n^2}=N_0\int_0^\infty h^2(\tau)\,d\tau \qquad \text{EQ. (73)}$$

This leads to the result in EQ. (74):

$$H(s)=\frac{1/RC}{s+1/RC}*\left(\frac{1-e^{-sT_A}}{s}\right) \qquad \text{EQ. (74)}$$

R is the resistor associated with processor source, and C is the energy storage capacitor.

Therefore;

$$h(t)=\frac{1}{RC}e^{-t/RC}\ (u(t)-u(t-T_A)) \qquad \text{EQ. (75)}$$

And finally:

$$\overline{Y_n^2}=\frac{N_0}{2RC_0} \qquad \text{EQ. (76)}$$

The detailed derivation for the signal voltage at the output to the RC filter is provided above. The use of the β parameter is also described above. Hence, the $SNR_{RC}$ is given by:

$$SNR_{RC}=\frac{2(V_0(t_s))^2}{\beta N_0}T_A=1, \qquad \text{EQ. (77)}$$

$$A=1 \text{ (Normalized for illustration)}$$

Illustrative SNR performance values of the three example processor embodiments of the present invention are summarized in the table below:

| | Performance Relative to the Performance of an Optimal Matched Filter Embodiment |
|---|---|
| Example Matched Filter | |
| $SNR_{MF}=\frac{T_A}{2N_0}$ | 0 dB |
| Example Integrator Approximate | |
| $SNR_{INT}=\frac{4T_A}{\pi^2N_0}$ | −.91 dB |
| Example RC Approximate (3 example cases for reference) | |
| $SNR_{RC}=\frac{V_0(t)^2\cdot 2}{\beta N_0}\cong\frac{.2142}{N_0}$ | −3.7 dB, at $T_A$ = 1, β = 2.6 |
| $SNR_{RC}\cong\frac{.377}{N_0}$ | −1.2 dB, at $T_A$ = .75, β = 2.6 |
| $SNR_{RC}\cong\frac{.405}{N_0}$ | −.91 dB at $T_A$ = 1, β ≦ .25 |

Notice that as the capacitor becomes larger, the RC processor behaves like a finite time integrator and approximates its performance. As described above in sub-section 5, with a β of 0.25, a carrier signal of 2450 MHz, and R=50Ω, the value for C becomes C≧16.3 pf.

The equations above represent results for a half-sine wave processor according to the invention having it apertures time aligned to a carrier signal. The analysis herein, however, is readily extendable, for example, to complex I/Q embodiments according to the invention, in which all energy is accounted for between I and Q. The results of such analyses are the same.

FIG. 48 illustrates the output voltage waveforms for all three processor embodiments. (Note that two curves are shown for the RC correlator processor, β=2.6 and β=0.25). FIG. 49A illustrates the relative SNR's over the aperture.

4.12. Carrier Offset and Phase Skew Characteristics of Embodiments of the Present Invention FIG. 49B illustrates some basic matched filter waveforms that are common to some communications applications. The first waveform 4950 is a baseband rect function. Since this waveform is symmetric it is easy to visualize the time reversed waveform corresponding to the ideal matched filter impulse response, h(t), which is also a rect function:

$$h(t) * S_i(t-\tau)\int_{t_1}^{t_2} S_i(t-\tau)h(t)dt \quad \text{EQ. (77.1)}$$

The second waveform 4960 illustrates the same rect function envelope at passband (RF) and it's matched filter impulse response. Notice the sine function phase reversal corresponding to the required time axis flip. FIG. 49C shows a waveform 4970. Waveform 4970 is a single half sine pulse whose time reversed representation is identical. This last impulse response would be optimal but as pointed out earlier may be difficult to implement exactly. Fortunately, an exact replica is not required.

FIG. 49D illustrates some exemplary approaches for a complex matched filter/correlator processor applied to a variety of waveforms. As shown in FIG. 49D, approaches 4980 and 4985 are classical ways to producing a complex matched filter/correlator processor. FIG. 49E shows approach 4990. Approach 4990 shows one embodiment of a complex matched filter/correlator processor implemented with the UFT as the processor. The only difference in the UFT approach 4990 is the duration of the pulse envelope. The fact that the gating pulse is small compared to other applications for a correlator is of little consequence to the complex baseband processor. When there is no phase skew then all of the correlated energy is transferred to the I output. When there is a phase skew then a portion of the aliased down converted energy is transferred to the I output and the remainder to the Q. All of the correlated energy is still available, in its optimally filtered form, for final processing in the BB processor.

The fact that a non-coherent processor is used or a differentially coherent BB processor used in lieu of a coherent Costas Loop in no way diminishes the contribution of the UFT correlator effect obtained by selecting the optimal aperture $T_A$ based on matched filter theory.

Consider FIG. 49E which illustrates an aperture with a phase shifted sine function. In addition, a derivation is provided which indicates that the aperture with phase skew, as referenced to the half sine function, can be represented by the fundamental correlator kernel multiplied by a constant. This provides insight into the interesting SNR properties of the UFT which are based on matched filter principles over the aperture regardless of phase skew $\phi$.

Moreover, Section IV, part 5.1 above illustrates that a complex UFT downconverter which utilizes a bandpass filter actually resembles the optimal matched filter/correlator kernel in complex form with the in phase result scaled by cos $\phi$ and the quadrature phase component scaled by sin$\phi$. This process preserves all the energy of the downconverter signal envelope (minus system loses) with a part of the energy in I and the remainder in Q.

4.13. Multiple Aperture Embodiments of the Present Invention

The above sub-sections describe single aperture embodiments of the present invention. That is, the above sub-sections describe the acquisition of single half sine waves according to embodiments of the invention. Other embodiments of the present invention are also possible, however, and the present invention can be extended to other waveform partitions that capture multiple half sine waves. For example, capturing two half sine waves provides twice the energy compared to capturing only a single half sine. Capturing n half sines provides n times the energy, et cetera, until sub harmonic sampling is no longer applicable. The invention is directed to other embodiments as well. Of course, the matched filter waveform requires a different correlating aperture for each new n. This aspect of the present invention is illustrated in FIGS. 50A and 50B.

In the example of FIG. 50B, the sample aperture window is twice as long as the examples in the previous sub-sections. The matched filter impulse response in FIG. 50B is bipolar to accommodate a full sine cycle. The embodiment of this example can be implemented, for example, with a rectangular bipolar function (Haar's Wavelet) gating device.

Fourier transforming the components for the example processor yields the results shown in FIG. 51 and EQ. (78).

$$S(f) \cong \sum_{n=-\infty}^{\infty} \frac{Af_sT_A}{2}\left[\frac{\sin(\pi(nf_s - Nf_s)T_A)}{(\pi(nf_s - Nf_s)T_A)} + \frac{\sin(\pi nf_s + Nf_s)T_A}{(\pi(nf_s + Nf_s)T_A}\right]\delta(f - nf_s) \quad \text{EQ. (78)}$$

The transform of the periodic, sampled, signal is first given a Fourier series representation (since the Fourier transform of a power signal does not exist in strict mathematical sense) and each term in the series is transformed sequentially to produce the result illustrated. Notice that outside of the desired main lobe aperture response that certain harmonics are nulled by the (sin(x))/x response. Even those harmonics, which are not completely nulled, are reduced by the side lobe attenuation. The sinc function acts on the delta function spectrum to attenuate that spectrum according to the (sin(x))/x envolope (shown by a dashed line). As can be seen in FIG. 51, some sub-harmonics and super-harmonics are eliminated or attenuated by the frequency domain nulls and side lobes of the bipolar matched filter/correlator processor, which is a remarkable result.

Theoretically, arbitrary impulse responses may be constructed in the manner above, particularly if weighting is applied across the aperture or if multiple apertures are utilized to create a specific Fourier response. FIR filters and convolvers may be constructed by extending the aperture and utilizing the appropriate weighting factors. Likewise, disjoint or staggered apertures may be constructed to provide a particular desired impulse response. These apertures can be rearranged and tuned 'on the fly'.

FIG. 52 (I/Q Bipolar Aperture for 2.4-2.5 GHz 3rd Harmonic Down Converter Application) and FIG. 53 (Down Converted I/Q Waveforms-Slight Carrier Offset) illustrate the results from an actual circuit design and simulation targeting the 2.4-2.5 GHz ISM band and implementing a bipolar weighted aperture. FIG. 52 illustrates actual gating pulses, which form the apertures for I−, I+, Q−, and Q+. FIG. 53 illustrates the baseband I and Q outputs corresponding to the down converter. In embodiments, the sequence I−, I+, Q− and Q+ apertures are repeated every three carrier cycles, nominally. Hence, out of six sine carrier segments, four are captured. Conversion losses well below 10 dB are possible with this embodiment of the present invention.

4.14. Mathematical Transform Describing Embodiments of the Present Invention 4.14.1. Overview The operation of the present invention represents a new signal-processing paradigm. Embodiments of the invention can be shown to be related to particular Fourier sine and cosine transforms. Hence, the new term UFT transform is utilized to refer to the process. As already stated, in embodiments of the present invention can be viewed as a matched filter or correlator operation, which in embodiments is normally applied recursively to the carrier signal at a sub-harmonic rate. A system equation may be written to describe this operation, assuming a rectangular sample aperture and integrators as operators, as shown in FIG. 54 and EQ. (79). The process integrates across an acquisition aperture then stores that value, or a significant portion thereof, to be accumulated with the next aperture. Hence, energy from the input is acquired during $T_A$ and held for $T_S-T_A$ until the next acquisition.

$$D_n \underline{\Delta} \Sigma_{n=1}^{k} \int_{nT_S}^{nT_S+T_A} (u(t-nT_S)-u(t-(nT_S+T_A)))\cdot A_n \sin(\omega t+\phi_{(n-l)})dt$$

$$-\alpha\Sigma_{n=1}^{k} \int_{(n+l)T_S}^{(n+l)T_S+T_A} (u(t-(n-l)T_S)-u(t-(n-(1-l))T_S+T_A))\cdot A_{(n-l)} S_1(\omega t+\phi_{(n-l)})dt \quad \text{EQ. (79)}$$

where:

$T_A$ is the aperture duration;

$T_S$ is the sub-harmonic sample period;

k is the total number of collected apertures;

l is the sample memory depth;

$\alpha$ is the UFT leakage coefficient;

$A_n$ is the amplitude weighting on the nth aperture due to modulation, noise, etc.; and $\phi_n$ is the phase domain shift of nth aperture due to modulation, noise, carrier offset, etc.

$D_n$ represents the UFT transform applicable to embodiments of the invention. The first term defines integration over a rectangular segment of the carrier signal of $T_A$ time duration. k pulses are summed to form a memory of the recursively applied kernel. The second term in the equation provides for the fact that practical implementations possess finite memory. Hence, embodiments of the present invention are permitted to leak after a fashion by selecting $\alpha$ and l. This phenomena is reflected in the time variant differential equation, EQ. (22), derived above. In embodiments, for a perfect zero order data hold function, $\alpha=0$. If leakage exists on a sample to sample basis, l is set to 0 or 1.

4.14.2. The Kernel for Embodiments of the Invention

The UFT kernel applicable to embodiments of the invention is given by EQ. (80):

$$D_1=\int_0^{T_A}(u(t)-u(t-T_A))\cdot A \sin(\omega t+\phi)dt \quad \text{EQ. (80)}$$

EQ. (80) accounts for the integration over a single aperture of the carrier signal with arbitrary phase, $\phi$, and amplitude, A. Although A and $\phi$ are shown as constants in this equation, they actually may vary over many (often hundreds or thousands) of carrier cycles Actually, $\phi(t)$ and A(t) may contain the modulated information of interest at baseband. Nevertheless, over the duration of a pulse, they may be considered as constant.

4.14.3. Waveform Information Extraction

Ever since Nyquist developed general theories concerning waveform sampling and information extraction, researchers and developers have pursued optimum sampling techniques and technologies. In recent years, many radio architectures have embraced these technologies as a means to an end for ever more 'digital like' radios. Sub sampling, IF sampling, syncopated sampling, etc., are all techniques employed for operating on the carrier to extract the information of interest. All of these techniques share a common theory and common technology theme, i.e., Nyquist's theory and ideal impulse samplers. Clearly, Nyquist's theory is truly ideal, from a theoretical perspective, while ideal impulse samplers are pursued but never achieved.

Consider the method of developing an impulse sample using functions with shrinking apertures, as illustrated in FIG. 55, wherein $T_{A1}>T_{A2}>T_{A3}$. The method illustrated in FIG. 55 utilizes a pulse shape, for example a normalized Gaussian, a modified sinc, or some other suitable type, and permits the pulse width to shrink as the peak amplitude grows. As the pulse width shrinks, the area of the pulse becomes unity. These pulse generation methods are formulated using distribution mathematics techniques. Typically, such formulations require the assumption that causality is violated as is illustrated by the precursors in FIG. 55. Hence, such pulses are not practical because they are non-causal. In addition, since impulse samplers are implemented to store the sample value at an instantaneous waveform point, they typically utilize a sample and hold approach, which typically implies the charging of a capacitor. As would be known to persons skilled in the relevant arts given the discussion herein, parasitics can present significant charging concerns for such pulses because of the relationships represented by EQ. (81) and EQ. (82).

$$\frac{dq}{dt} = C\frac{dv}{dt} \text{(Charge Differential)} \quad \text{EQ. (81)}$$

$$u = \int_0^q \frac{q_x}{c} - dq_x = \frac{q^2}{2c} = \frac{Cv^2}{2} \text{(Energy)} \quad \text{EQ. (82)}$$

As would be apparent to persons skilled in the relevant arts given the discussion herein, an arbitrary capacitance, c, cannot be charged in an infinitesimally short time period without an infinite amount of energy. Even approximations to an ideal impulse therefore can place unrealistic demands on analog sample acquisition interface circuits in terms of parasitic capacitance vs. pulse width, amplitude, power source, etc. Therefore, a trade-off is typically made concerning some portion of the mix.

The job of a sample and hold circuit is to approximate an ideal impulse sampler followed by a memory. There are limitations in practice, however. A hold capacitor of significant value must be selected in order to store the sample without droop between samples. This requires a healthy charging current and a buffer, which isolates the capacitor in between samples, not to mention a capacitor, which is not 'leaky,' and a buffer without input leakage currents. In general, ideal impulse samplers are very difficult to approximate when they must operate on RF waveforms, particularly if IC implementations and low power consumption are required.

The ideal sample extraction process is mathematically represented in EQ. (83) by the sifting function.

$$\int_{-\infty}^{\infty} x(t)\delta(t - T_A/2)dt = x\left(\frac{T_A}{2}\right) \quad \text{EQ. (83)}$$

where:

$\frac{T_A}{2}$ Δ Sample Time;

x(t) Δ Sampled Function; and δ(t) Δ Impulse Sample Function.

Suppose now that:

$$x(t)=A\sin(t+\phi) \quad (84)$$

then:

$$\int_{-\infty}^{\infty} A\sin(t+\phi)\delta(t-T_A/2)dt=A\sin(T_A/2+\phi)$$

$$=A\cos(\phi)\int_{-\infty}^{\infty}\sin(t)\delta(t-T_A/2)dt+A\sin(\phi)\int_{-\infty}^{\infty}\cos(t)\delta(t-T_A/2)dt \quad \text{EQ. 85)}$$

$$=A\cos(\phi)\sin(T_A/2)=A\cos(\phi);\ T_A=\pi \quad \text{EQ. (86)}$$

This represents the sample value acquired by an impulse sampler operating on a carrier signal with arbitrary phase shift ϕ. EQ. (86) illustrates that the equivalence of representing the output of the sampler operating on a signal, X(t), without phase shift, ϕ, weighted by cos ϕ, and the original sampled X(t), which does have a phase shift. The additional requirement is that a time aperture of $T_A$ corresponds to π radians.

Next, consider the UFT kernel:

$$D_1\Delta\int_{-\infty}^{\infty}(u(t)-u(t-T_A))\sin(t+\phi)dt \quad \text{EQ. (87)}$$

Using trigonometric identities yields:

$$D_1\Delta A\cos(\phi)\int_{-\infty}^{\infty}(u(t)-u(t-T_A))\sin(t)dt \quad \text{EQ. (88)}$$

Now the kernel does not possess a phase term, and it is clear that the aperture straddles the sine half cycle depicted in FIG. 56. In EQ. (88), cos ϕ is a weighting factor on the result, which originally illustrated the non-ideal alignment of the present invention clock and carrier signal. Trigonometric identities provide a means of realigning the present invention clock and carrier signal while accounting for the output result due to phase skew.

Consider the ideal aperture of embodiments of the invention shown in FIG. 57. Notice that the ideal aperture is illustrated as possessing two equal ½ aperture components. Hence the UFT kernel for embodiments of the invention can be rewritten as:

$$D_1\Delta A\cos(\phi)\left[\int_{-\infty}^{\infty}(u(t)-u(T_A/2))\sin(t)dt+\int_{-\infty}^{\infty}(u(t-T_A/2)-u(t-T_A))\sin(t)dt\right] \quad \text{EQ. (89)}$$

It should also be apparent to those skilled in the relevant arts given the discussion herein that the first integral is equivalent to the second, so that;

$$D_1=2A\cos(\phi)\int_{-\infty}^{\infty}(u(t)-u(t-T_A/2))\sin(t)dt \quad \text{EQ. (90)}$$

As illustrated in FIG. 58, a property relating unit step functions and delta functions is useful. In FIG. 58, a step function is created by integrating a delta function. Therefore;

$$D_1 = 2A\cos(\phi)\int_{-\infty}^{\infty}\left[\int_{-\infty}^{t}\delta(t')dt' - \int_{-\infty}^{t}\delta(t' - T_A/2)dt'\right]\sin(t)dt \quad \text{EQ. (91)}$$

Using the principle of integration by parts yields EQ. (92).

$$\begin{aligned} D_1 &= 2A\cos(\phi)\int_{-\infty}^{t}\cos(t')\delta(t')dt' + \\ &\quad 2A\cos(\phi)\int_{-\infty}^{t}\cos(t')\delta(t' - T_A/2)dt \\ &= 2A\cos\phi\left(\cos(0) - \cos\left(\frac{T_A}{2}\right)\right) \\ &= 2A\cos(\phi), \text{ for } T_A = \pi \end{aligned} \quad \text{EQ. (92)}$$

This is a remarkable result because it reveals the equivalence of the output of embodiments of the present invention with the result presented earlier for the arbitrarily phased ideal impulse sampler, derived by time sifting. That is, in embodiments, the UFT transform calculates the numerical result obtained by an ideal sampler. It accomplishes this by averaging over a specially constructed aperture. Hence, the impulse sampler value expected at $T_A/2$ is implicitly derived by the UFT transform operating over an interval, $T_A$. This leads to the following very important implications for embodiments of the invention:

The UFT transform is very easy to construct with existing circuitry hardware, and it produces the results of an ideal impulse sampler, indirectly, without requiring an impulse sampler.

Various processor embodiments of the present invention reduce the variance of the expected ideal sample, over that obtained by impulse sampling, due to the averaging process over the aperture.

4.15. Proof Statement for UFT Complex Downconverter Embodiment of the Present Invention The following analysis utilizes concepts of the convolution property for the sampling waveform and properties of the Fourier transform to analyze the complex clock waveform for the UFT as well as the down conversion correlation process. FIG. 59 illustrates this process.

In addition r(t) is considered filtered, by a bandpass filter. In one exemplary embodiment, sub-optimal correlators approximate the UFT. This analysis illustrates that some performance is regained when the front-end bandpass filter is used, such that the derived correlator kernel resembles the optimal form obtained from matched filter theory. Furthermore, the analysis illustrates that the arbitrary phase shift of a carrier on which the UFT operates, does not alter the optimality of the correlator structure which can always be modeled as a constant times the optimal kernel. This is due to the fact that UFT is by definition matched to a pulse shape resembling the carrier half cycle which permits phase skew to be viewed as carrier offset rather than pulse shape distortion.

Using the pulse techniques described above, describing pulse trains, the clock signal for UFT may be written as equation 6002 of FIG. 60.

$p_c(t)$Δ A basic pulse shape of the clock (gating waveform), in our case defined to have specific correlation properties matched to the half sine of the carrier waveform.

$T_S$Δ Time between recursively applied gating waveforms.

$T_A$Δ Width of gating waveform

In FIG. 60, $C_I(t)$ in equation 6004 and $C_Q(t)$ in equation 6006 are considered to be complex clocks shifted in phase by $T_A/2$. The received carrier is related to $T_A$ by $f_c \approx (2T_A)^{-1}$ Although the approximation is used, ideal carrier tracking for coherent demodulation will yield an equal sign after lock. However, this is not required to attain the excellent benefit from UFT processing. Other sections herein provide embodiments that develop expressions for $C_I$ and $C_Q$ from Fourier series analysis to illustrate the components of the gating waveforms at the Carrier frequency which are harmonically related to $T_s$.

By the methods described above, the Fourier transform of the clock is found from:

$$C_I(f) = \Im\left\{\sum_{m=-\infty}^{\infty} \delta(t - mT_s)\right\} P_c(f) \qquad \text{EQ. (93)}$$

$$C_I(f) = \sum_{n=-\infty}^{\infty} \frac{T_A}{T_s} \frac{\sin(n\pi f_s T_A)}{n\pi f_s T_A} \cdot \delta(f - nf_s) \qquad \text{EQ. (94)}$$

$C_Q$ possesses the same magnitude response of course but is delayed or shifted in phase and therefore may be written as:

$$C_Q(f) = C_I(f) e^{-jn\pi f T_A} \qquad \text{EQ. (95)}$$

When $T_A$ corresponds to a half sine width then the above phase shift related to a $$\frac{\pi}{2}$$

radians phase skew for $C_Q$ relative to $C_I$.

In one exemplary embodiment, consider then the complex UFT processor operating on a shifted carrier for a single recursion only, $$S_0(t) = \int_0^{T_A} r(t) C_I(t) dt + \int_{T_A/2}^{3T_A/2} r(t) C_Q(t) dt$$

$$S_0(t) = \int_0^{T_A} (A \sin(\omega t + \phi) + n(t)) C_I(t) dt + \qquad \text{EQ. (96.1)}$$

$$\int_{T_A/2}^{3T_A/2} (A \sin(\omega t + \phi) + n(t)) C_Q(t) dt \qquad \text{EQ. (96.2)}$$

This analysis assumes that r(t), the input carrier plus noise, is band limited by a filter. In this case therefore the delta function comb evident in the transform of $C_I$ and $C_Q$ are ignored except for the components at the carrier. Embodiments in other sections break $C_I$ and $C_Q$ into a Fourier series. In this series, only the harmonic of interest would be retained when the input waveform r(t) is bandpass limited because all other cross correlations tend to zero. Hence, $$S_0(t) \approx K \int_0^{T_A} (A \sin(\omega t + \phi) + n(t)) \sin(\omega t) dt +$$

$$K \int_{T_A/2}^{3T_A/2} (A \sin(\omega t + \phi) + n(t)) \cos(\omega t) dt \qquad \text{EQ. (96.3)}$$

$$S_0(t) \approx K \int_0^{T_A} (A \sin(\omega t) \cos\phi + \cos(\omega t) \sin\phi + n(t)) \sin(\omega t) dt +$$

$$K \int_{T_A/2}^{3T_A/2} (A \sin(\omega t) \cos\phi + \cos(\omega t) \sin\phi + n(t)) \cos(\omega t) dt \qquad \text{EQ. (96.4)}$$

The clock waveforms have been replaced by the single sine and cosine components from the Fourier transform and Fourier series, which produce the desired result due to the fact that a front-end filter filters all other spectral components. This produces a myriad of cross correlations for the complex UFT processor. K is included as a scaling factor evident in the transform.

$$S_0(t) = KA\cos\phi \overbrace{\int_0^{T_A} (\sin(\omega t))^2 dt}^{\text{optimal correlator}} + K \int_0^{T_A} n(t) \sin\omega t\, dt + KA\sin\phi \int_{\frac{T_A}{2}}^{\frac{3T_A}{2}} \overbrace{(\cos(\omega t))^2}^{\text{optimal correlator}} dt + K \int_{\frac{T_A}{2}}^{\frac{3T_A}{2}} n(t) \cos\omega t\, dt \qquad \text{EQ. (97.1)}$$

$$\therefore S_0(t) = \left(\frac{KA\pi}{2}\cos\phi + \tilde{n}_I\right) I \text{ component} \qquad \text{EQ. (97.2)}$$

$$+ \left(\frac{KA\pi}{2}\sin\phi + \tilde{n}_Q\right) Q \text{ component} \qquad \text{EQ. (97.3)}$$

$$\text{where } K = \left(\frac{T_A}{T_s} \frac{\sin\left(n\pi \frac{T_A}{T_s}\right)}{\left(n\pi \frac{T_A}{T_s}\right)}\right) \qquad \text{EQ. (97.4)}$$

A and ϕ are the original components of the complex modulation envelope (amplitude and phase) for the carrier and are assumed to vary imperceptibly over the duration for $T_A$. What is very interesting to note is that the above equations are exactly the optimum form for the complex correlator whose pulse shape is a half sine with components weighted by cosine for I, and sine for Q. Furthermore, when an input bandpass filter is considered as a part of the system then the approximate kernels used throughout various analyses based on the gating function become replaced by the ideal matched filter analogy. Hence, the approximation in CMOS using rectangular gating functions, which are known to cause only a 0.91 dB hit in performance if C is selected correctly, probably can be considered pessimistic if the receiver front end is filtered. A detailed discussion of alias bands of noise produced by the images of the sampling waveform is not presented here because front end bandpass filters can be used to eliminate such noise.

4.16. Acquisition and Hold Processor Embodiment

As illustrated in FIG. 61, embodiments of the present invention can be approximately modeled as a particular case of a sampling system. In the example model in FIG. 61, both an acquisition phase and a hold phase for each $T_s$ cycle is shown, where:

- $r(t) \Delta$ Input Waveform RF Modulated Carrier Plus Noise
- $C_A(t) \Delta$ Present Invention Aperture Waveform Pulse Train
- $\delta_H(t) \Delta$ Holding Phase Impulse Train
- $h_A(t) \Delta$ Integrator Impulse Response of the present Invention
- $h_H(t) \Delta$ 0DH Portion of Present Invention Impulse Response The embodiment in FIG. 61 consists of a gating device followed by a finite time integrator, then an ideal sampler, and finally a holding filter, which accumulates and stores the energy from the acquisition phase. This is called an acquisition and hold processor. The acquisition phase of the operation is described by:

$$X(t) = C_T(t) r(t) * h_A(t) \qquad \text{EQ. (98)}$$

$$X(t) = \sum_{k=-\infty}^{\infty} (u(t - kT_s) - u(t - (kT_s + T_A)) A_k (\sin(\omega_c t + \phi_k)) * h_A(t)) \qquad \text{EQ. (99)}$$

The ultimate output includes the hold phase of the operation and is written as:

$$S_0(t)=(X(t)\delta_H(t))*h_H(t) \quad \text{EQ. (100)}$$

$$S_0(t) = \sum_{k=-\infty}^{\infty}(X(t)\delta_H(t-k(T_s)))*u(t-(kT_s+T_A))-u(t-(k+1)T_s) \quad \text{EQ. (101)}$$

$$T=T_s-T_A \quad \text{EQ. (102)}$$

This embodiment considers the aperture operation as implemented with an ideal integrator and the hold operation as implemented with the ideal integrator. As shown elsewhere herein, this can be approximated by energy storage in a capacitor under certain circumstances.

The acquisition portion of the operation possesses a Fourier transform given by:

$$X_0(\omega)=\Im_0\{X_0(t)\}=\sum_{k=-\infty}^{\infty}\frac{1}{2\pi T_s}\overbrace{\delta(\omega-k\omega_s)}^{\text{Harmonic Sifter}}\overbrace{\left(\frac{T_A}{2}e^{\frac{j\omega T_A}{2}}\frac{\sin\left(\frac{\omega T_A}{2}\right)}{\frac{\omega T_A}{2}}\right)}^{\text{Finite Time Integrator}}\underbrace{S_i(\omega)_C}_{\text{Original Information Spectrum Chopped by } C(t)}$$

$S_i(\omega)=\Im\{r(t)\}$ (Modulated Information Spectrum)

$S_0(\omega)$ can be found in a similar manner.

$$\Im\{S_0(t)\}=\sum_{k=-\infty}^{\infty}\frac{1}{2\pi T_s}\overbrace{\delta(\omega-k\omega_s)}^{\text{Harmonic Sifter}}\overbrace{\left(\frac{T}{2}e^{\frac{j\omega T_A}{2}}\frac{\sin\left(\frac{\omega T}{2}\right)}{\frac{\omega T}{2}}\right)}^{\text{Z0DH Response}}X(\omega)$$

$T=T_s-T_A$

The example of FIG. 62 illustrates the various components of the above transform superimposed on the same graph, for a down conversion case, where $T_A$ is chosen as a single aperture realization and the $3^{rd}$ sub harmonic is used for down conversion. The analysis does not consider the affect of noise, although, it is straightforward to accomplish, particularly in the case of AWGN. The lowpass spectrum possesses nulls at $nf_{SA}$, n=0, ±1 ±2, . . . , where $f_s=(T_s-T_A)^{-1}$. This Z0DH spectral response is also present at each harmonic of $f_s$, although it is not indicated by the graphic.

The acquisition portion of the Fourier transform yields the following an important insight:

$$X_0(\omega)=\frac{KT_A}{T_s}\sum_{k=-\infty}^{\infty}\delta(\omega-k\omega_s)\left(e^{j\omega\frac{T_A}{2}}\frac{\sin\left(\omega\frac{T_A}{2}\right)}{\omega\frac{T_A}{2}}\right)\cdot S_i(\omega)_c \quad \text{EQ. (103)}$$

-continued $$S_i(\omega)_c=A_kT_Ae^{j\omega\frac{T_A}{2}}\frac{\sin\left(\omega\left(\frac{T_A}{2}\right)\right)}{\omega\left(\frac{T_A}{2}\right)}(\delta(\omega-\omega_c)+\delta(\omega+\omega_c)) \quad \text{EQ. (104)}$$

As should be apparent to persons skilled in the relevant arts given the discussion herein, down conversion occurs whenever $k\omega_s=\omega_c$. It is useful to find $T_A$, which maximizes the component of the spectrum at $\omega_c$, which is subject to down conversion and is the desired signal. This is accomplished simply by examining the kernel.

$$\tilde{X}\triangleq\left|\frac{T_A}{T_s}\frac{\sin\left(\omega\left(\frac{T_A}{2}\right)\right)}{\omega\left(\frac{T_A}{2}\right)}\right| \quad \text{EQ. (105)}$$

$$\text{For } \omega=\omega_c,\ \tilde{X}=\left|\frac{T_A}{n\cdot T_c}\frac{\sin\left(\pi\frac{T_A}{T_c}\right)}{\left(\pi\frac{T_A}{T_c}\right)}\right|, \quad \text{EQ. (106)}$$

$$nT_c=T_s \text{ for Harmonic Conversion}$$

The kernel is maximized for values of $$\frac{T_A}{T_c}=\frac{1}{2},\frac{3}{2},\frac{5}{2},\ldots$$

Advocates of impulse samplers might be quick to point out that letting $T_A\rightarrow 0$ maximizes the sinc function. This is true, but the sinc function is multiplied by $T_A$ in the acquisition phase. Hence, a delta function that does not have infinite amplitude will not acquire any energy during the acquisition phase of the sampler process. It must possess infinite amplitude to cancel the effect of $T_A\rightarrow 0$ so that the multiplier of the sinc function possesses unity weighting. Clearly, this is not possible for practical circuits.

On the other hand, embodiments of the present invention with $$\frac{T_A}{T_c}=\frac{1}{2},\frac{3}{2},\frac{5}{2},\ldots \text{ etc.},$$

does pass significant calculable energy during the acquisition phase. This energy is directly used to drive the energy storage element of 0DH filter or other interpolation filter, resulting in practical RF impedance circuits. The cases for $T_A/T_C$ other than ½ can be represented by multiple correlators, for example, operating on multiple half sine basis.

Moreover, it has been shown that the specific gating aperture, C(t), does not destroy the information. Quite the contrary, the aperture design for embodiments of the present invention produces the result of the impulse sampler, scaled by a gain constant, and possessing less variance. Hence, the delta sifting criteria, above trigonometric optimization, and correlator principles all point to an aperture of $$\frac{T_A}{T_c} = \frac{1}{2}$$

nominal.

If other impulse responses are added around the present invention (i.e., energy storage networks, matching networks, etc.) or if the present invention is implemented by simple circuits (such as the RC processor) then in embodiments the optimal aperture can be adjusted slightly to reflect the peaking of these other embodiments. It is also of interest to note that the Fourier analysis above predicts greater DC offsets for increasing ratios of $$\frac{T_A}{T_c}.$$

Therefore, for various embodiments, $$\frac{T_A}{T_c} = \frac{1}{2}$$

is probably the best design parameter for a low DC offset system.

4.17. Comparison of the UFT Transform to the Fourier Sine and Cosine Transforms

The sine and cosine transforms are defined as follows:

$$F_c(\omega)\Delta\int_0^\infty f(t)\sin\,\omega t\,dt\ \ \omega\geqq 0\ \text{(sine transform)} \quad \text{EQ. (107)}$$

$$F_s(\omega)\Delta\int_0^\infty f(t)\cos\,\omega t\,dt\ \ \omega\geqq 0\ \text{(cosine transform)} \quad \text{EQ. (108)}$$

Notice that when $f(t)$ is defined by EQ. (109):

$$f(t)=u(t)-u(u-T_A) \quad \text{EQ. (109)}$$

The UFT transform kernel appears as a sine or cosine transform depending on φ. Hence, many of the Fourier sine and cosine transform properties may be used in conjunction with embodiments of the present invention to solve signal processing problems.

The following sine and cosine transform properties predict the following results of embodiments of the invention:

| Sine and Cosine Transform Property | Prediction of Embodiments of the Invention |
| --- | --- |
| Frequency Shift Property | Modulation and Demodulation while Preserving Information |
| Time Shift Property | Aperture Values Equivalent to Constant Time Delta Time Sift. |
| Frequency Scale Property | Frequency Division and Multiplication |

Of course many other properties are applicable as well. The subtle point presented here is that for embodiments the UFT transform does in fact implement the transform, and therefore inherently possesses these properties.

Consider the following specific example: let $f(t)=u(t)-u(t-T_A)$ and let $\omega=2\pi f=\pi f_A=1$.

$$\Im_c[f(t)] = \int_0^{T_A}\cos(\omega t)\,dt = \frac{1}{\omega}\sin\omega T_A = 0 \quad \text{EQ. (110)}$$

$$\Im_s[f(t)] = \frac{1}{\omega} - \frac{1}{\omega}\cos\,\omega T_A = 2 \quad \text{EQ. (111)}$$

This is precisely the result for $D_{Ic}$ and $D_{Is}$. Time shifting yields:

$$\Im_s[f_0(t+T_s)+f_0(t-T_s)]=2F_s(\omega)\cos(T_s\omega)$$

(Time Shift Property)

Let the time shift to be denoted by $T_s$.

$$f(t)=u(t)-u(t-T_A) \quad \text{EQ. (112)}$$

$$f_0(t)\Delta\frac{1}{2}(u(t+T_s)-u(t)) + \frac{1}{2}(u(t)-u(t-T_s)) \quad \text{EQ. (113)}$$

Notice that $f_0(t)$ has been formed due to the single sided nature of the sine and cosine transforms. Nevertheless, the amplitude is adjusted by ½ to accommodate the fact that the energy must be normalized to reflect the odd function extension. Then finally:

$$\Im_s[f_0(t+T_s)+f_0(t-T_s)] = \frac{2}{2}F_s(\omega)\cos(T_s\omega) = 2\cos(\pi T_s/T_A) \quad \text{EQ. (114)}$$

which is the same solution for phase offset obtained earlier by other means.

The implications of this transform may be far reaching when it is considered that the discrete Fourier sine and cosine transforms are originally based on the continuous transforms as follows:

$$\Im_c\{f(t)\}=\int_0^\infty f(t)\cos\,\omega t\,dt \quad \text{EQ. (115)}$$

$$\Im_{DC}\{f(t)\}\Delta\,\Im\{f(n)\} = \sqrt{\frac{2}{N}}\sum_{m=0}^{N}\alpha_m\alpha_n\cos\left(\frac{mn\pi}{N}\right)f(n) \quad \text{EQ. (116)}$$

That is, the original kernel cos (ωt) and function $f(t)$ are sampled such that:

$f(n)\Delta$ Sampled Version of $f(t)$ $\omega_m=2\pi_m\Delta f$ $t_n=n\Delta t$ $\Delta f\Delta$ Frequency Sample Interval $\Delta t\Delta$ Time Sample Interval Hence the new discrete cosine transform kernel is:

$$k_c(m,n)=\cos(2\pi mn\ \Delta f\Delta t)=\cos(\pi mn/n)\Delta f\Delta t=½N \quad \text{EQ. (117)}$$

N is the total number of accumulated samples for m, n, or the total record length.

In recent years, the discrete cosine transform (DCT) and discrete sine transform (DST) have gained much recognition due to their efficiency for waveform coding compression, spectrum analysis, etc. In fact, it can be shown that these transforms can approach the efficiency of Karhunen-Loeve transforms (KLT), with minimal computational complexity. The implication is that the sifted values from DI could be used as DCT sample values ƒ(n). Then the DCT and DST properties will apply along with their processing architectures. In this manner, communications signals, like OFDM, could be demodulated in a computationally efficient manner. Many other signal processing applications are possible using the present invention, and the possibilities are rich and varied.

4.18. Conversion, Fourier Transform, and Sampling Clock Considerations

The previous sub-sections described how embodiments of the present invention involve gating functions of controlled duration over which integration can occur. This section now addresses some consideration for the controlling waveform of the gating functions.

For sub harmonic sampling:

$f_s=f_c/M$ $f_s\Delta$ Sample Rate $f_c\Delta$ Carrier Frequency $M\Delta$ As an integer such that $0<M<\infty$ The case M=1 represents a classic down conversion scenario since $f_s=f_c$. In general though, M will vary from 3 to 10 for most practical applications. Thus the matched filtering operation of embodiments of the present invention is applied successively at a rate, $f_s$, using the approach of embodiments of the present invention. Each matched filter/correlator operation represents a new sample of the bandpass waveform.

The subsequent equations illustrate the sampling concept, with an analysis base on approximations that ignore some circuit phenomena. A more rigorous analysis requires explicit transformation of the circuit impulse response. This problem can be solved by convolving in the time domain as well, as will be apparent to persons skilled in the relevant arts given the discussion herein. The results will be the same. The analysis presented herein is an abbreviated version of one provided above. As in the subsection 8, the acquisition portion of the present invention response is analyzed separately from the hold portion of the response to provide some insight into each. The following sub-section uses a short-hand notation for convenience.

$$X_0(t)=S_i(t)\sum_{k=-\infty}^{\infty}\tilde{C}(t-kT_s)\text{(approximate output of acquisition)}\qquad \text{EQ. (118)}$$

$X_0(t)\Delta$ Output of Sample $S_i[t]\Delta$ Waveform being Sampled $k\Delta$ Sampling Index $T_s\Delta$ Sampling Interval$=f_s^{-1}$ $\tilde{C}(t-kT_s)\Delta$ Quasi-Matched Filter/Correlator Sampling Aperture, which includes averaging over the Aperture.

EQ. (118) can be rewritten a:

$$X_0(t)\cong\sum_{k=-\infty}^{\infty}S_i(kT_s)*\tilde{C}(t-kT_s)\qquad \text{EQ. (119)}$$

If $\tilde{C}(t)$ possesses a very small aperture with respect to the inverse information bandwidth, $T_A<<BW_i^{-1}$, then the sampling aperture will weight the frequency domain harmonics of $f_s$. The Fourier transform, and the modulation property may be applied to EQ. (119) to obtain EQ. (120) (note this problem was solved above by convolving in the time domain).

$$X_0(\omega)=(S_i(\omega)_c\tilde{C}(\omega))\qquad \text{EQ. (120)}$$

$$\therefore X_0(\omega)\equiv\qquad \text{EQ. (121)}$$

$$\frac{K}{T_s}\sum_{k=-\infty}^{\infty}\delta_i(\omega-k\omega_s)\left[\frac{T_A\cdot e^{j\omega T_A/2}}{2}\frac{\sin(\omega T_A/2)}{\omega T_A/2}\right]\cdot S_i(\omega)_c$$

$K\Delta$ Arbitrary Gain Constant, which includes a ½π factor $\omega\ \underline{\Delta}\ 2\pi f$ Essentially, on the macroscopic frequency scale, there is a harmonic sample comb generated, which possesses components at every $Nf_s$ for N=1, 2, 3 . . . ∞, with nulls at every $Z\cdot f_A$, where $f_A$ is defined as $T_A^{-1}$. FIG. 63 illustrates this result.

The thickness of each spike in FIG. 63 illustrates the surrounding band produced from $S_i(\omega)$. $S_i(\omega)$ is a complex transform including magnitude and phase, which can be assigned a vector representation in the time domain (i.e., I and Q components). The natural action of embodiments of the present invention, in the hold portion of the response, acts as a lowpass filter in the down conversion case, thereby reducing the levels of all the harmonic sidebands. Likewise, the up converter utilizes a bandpass matched filter to extract the desired carrier and reject unwanted images.

Notice that each harmonic including baseband possesses a replica of $S_i(\omega)$ which is in fact the original desired signal. {$S_i(\omega)$ is the original information spectrum and is shown to survive the acquisition response of the present invention (i.e., independent integration over each aperture)}. Lathi and many others pointed out that $\tilde{C}(\omega)$ could be virtually any harmonic function and that conversion to baseband or passband will result from such operations on $S_i(t)$.

Each discrete harmonic spectrum provides a potential down conversion source to baseband (at DC). Of course, theoretically, there cannot be a conversion of $Z\cdot f_a$ because of the spectral nulls. FIG. 63 illustrates the important relationships between $f_s$, $f_a$ and the relative harmonic conversion efficiency related to the $\text{sinc}^2$ function harmonic comb weighting, resulting from a simple rectangular sampling aperture.

It should also be noted that in all practical cases, $f_s>>2\cdot BW_i$, so that Nyquist criteria are more than satisfied. The lowpass response of embodiments of the present invention can be ideally modeled as a zero order data hold filter, with a finite time integrator impulse response duration of $T=T_s-T_A$. The ultimate output Fourier transform is given by EQ. (122).

$$S_0(\omega)=\qquad \text{EQ. (122)}$$

$$\sum_{k=-\infty}^{\infty}\underbrace{\frac{K}{T_s}\delta(\omega-k\omega_s)}_{\text{Harmonic Sifter}}\underbrace{\left(\frac{T}{2}e^{j\omega T/2}\frac{\sin\omega T/2}{\omega T/2}\right)}_{\text{Z0DH Response}}\cdot\underbrace{X(\omega)}_{\text{Acquisition Response}}$$

The Z0DH is a type of lowpass filter or sample interpolator which provides a memory in between acquisitions.

Each acquisition is accomplished by a correlation over $T_A$, and the result becomes an accumulated initial condition for the next acquisition.

4.19. Phase Noise Multiplication

Typically, processor embodiments of the present invention sample at a sub-harmonic rate. Hence the carrier frequency and associated bandpass signal are down converted by a $M \cdot f_s$ harmonic. The harmonic generation operation can be represented with a complex phasor.

$$S_{amp}(t)\Delta(e^{-j\omega_s t+\phi(t)})^m \quad \text{EQ. (123)}$$

$S_{amp}(t)$ can be rewritten as:

$$S_{amp}(t)=e^{-jM\omega_s t}\cdot e^{M\phi(t)} \quad \text{EQ. (124)}$$

$\phi(t)\Delta$ Phase Noise on the Conversion Clock

As EQ. (124) indicates, not only is the frequency content of the phasor multiplied by M but the phase noise is also multiplied by M. This results in an M-tuple convolution of the phase noise spectrum around the harmonic. The total phase noise power increase is approximated by EQ. (125).

$$\phi=\Delta 20\log_{10} M \text{ (Phase Noise)} \quad \text{EQ. (125)}$$

That is, whatever the phase jitter component, $\phi(t)$, existing on the original sample clock at $Mf_s$, it possesses a phase noise floor degraded according to EQ. (125).

4.20. AM-PM Conversion and Phase Noise

This section describes what the conversion constant and the output noise is for AM to PM conversion according to embodiments of the present invention, considering the noise frequency of the threshold operation. As illustrated in FIG. 64, suppose that the output of a sine signal source must be filtered and compared, in order to obtain a suitable clock signal. For cases where the equivalent input noise power of the threshold device can be considered to be much less than the input power source sine wave, a single zero crossing per cycle of sine wave can be assumed to occur. For such low noise cases, the threshold operation may be viewed as an AM to PM conversion device.

The slope at the zero crossings of a pure sine wave, s(t)=A sin ωt, can be calculated. Differentiating s(t) with respect to t yields s(t)=ωA cos ωt. For ω A≠0, the zero crossings occur at $$\omega t=\pi/2, 3\pi/2, 5\pi/2 \ldots \quad \text{EQ. (126)}$$

$$\therefore t=\frac{1}{4f}, \frac{3}{4f}, \frac{5}{4f} \ldots \{\text{for } s(t)\}$$

These zero crossings represent the points of minimum slope or crests of the original s(t). The maximum slope is found at the zero crossings of s(t) at ωt=0, π, 2π, . . . etc. Plugging those arguments into s(t) give slopes of: Slope=ωA, −ωA, ωA, −ωA . . . etc. The time at which these zero crossings occur is given by:

$$\omega t=\pi, 2\pi, 3\pi \ldots \; t=\frac{1}{2f}, \frac{1}{f}, \frac{3}{2f}, \ldots \{\text{for } s(t)\}.$$

It stands to reason that for the low noise power assumption, which implies one zero crossing per carrier cycle, the slope at the zero crossing will be modified randomly if a Gaussian process (n(t)) is summed to the signal. Of course, if the change in slope of the signal is detectable, the delta time of the zero crossing is detectable, and hence phase noise is produced. The addition of noise to the signal has the effect of moving the signal up and down on the amplitude axis while maintaining a zero mean. This can be written more formally as:

$$\left|\frac{\partial s(t)}{\partial t}\right|=\omega A=\text{for } \omega t=n\frac{\pi}{2} \quad \text{EQ. (127)}$$

If A is replaced, by A−Δa, where Δa represents the noise deviation, then one will not always observe a zero crossing at the point of maximum slope ωA. Sometimes the zero crossing will occur at ω(A−Δa). This leads to the low noise approximation:

$$\omega(A-\Delta a)=\omega A\cos[\omega(t\pm\epsilon)] \quad \text{EQ. (128)}$$

$$\arccos\left(\frac{\frac{A-\Delta a}{A}}{\omega}\right)=t\pm\varepsilon \quad \text{EQ. (129)}$$

The low noise assumption implies that the low noise power prohibits the arcos function from transforming the Gaussian pdf of the noise. That is, ±Δa occurs over minute ranges for the argument of the arcos and hence the relationship is essentially linear. Secondly, since A is a peak deviation in the sine wave Δa will be considered as a peak deviation of the additive noise process. This is traditionally accepted as being 4σ where σ is the standard deviation of the process and $\sigma^2$ is the variance. Therefore we write K arcos (1−4σ/A)=t±ϵ, where ϵ represents a peak time deviation in the zero crossing excursion, K=1/ω, and t is the mean zero crossing time given previously as: t=1/sƒ, 1/ƒ, 3/2ƒ, . . . If only the deviation contribution to the above equation is retained, the equation reduces to:

$$K\cos^{-1}\left(\frac{4\sigma}{A}\right)=\varepsilon=\Delta t \quad \text{EQ. (130)}$$

Since for 4σ/A<<0.01, the above function is quasi-linear, one can write the final approximation as:

$$K\frac{4\sigma}{A}=\Delta t=\frac{4\sigma}{\omega A}\text{seconds (peak)} \quad \text{EQ. (131)}$$

An appropriate conversion to degrees becomes, $$360^\circ f_c=\frac{4\sigma_x}{\frac{4\sigma}{\omega_c A}} \quad \text{EQ. (132)}$$

$f_c$=frequency of carrier $\sigma_x$=phase noise in degrees rms

σ=standard deviation of equivalent input comparator noise $$\therefore \sigma_x = \frac{(360)\sigma}{2\pi A}\text{degrees rms} \quad \text{EQ. (133)}$$

$$\frac{\sigma_x}{57.3} = \text{radians rms} = \sigma_\phi$$

$\sigma_{\phi_x}{}^2$=variance or power in dBc

Now a typical threshold operator may have a noise figure, NF, of approximately 15 dB. Hence, one can calculate $\sigma_x$ (assume $\sigma_\phi{}^2=2.4\times10^{-8}$ rad$^2$ source phase noise):

$$-174 \text{ dBm/Hz}+15+10 \log_{10} 100\times10^6=-79 \text{ dBm} \quad \text{EQ. (134)}$$

where 100 MHz of input bandwidth is assumed.

$$\text{anti log}-7.9=1.26\times10^{-8} \text{ milliwatts}=1.26\times10^{-11} \text{ watts} \quad \text{EQ. (135)}$$

$$\therefore \sigma=\sqrt{1.26\times10^{-11}}\cong3.55\times10^{-6} \quad \text{EQ. (136)}$$

$$\sigma_x = \frac{(360)3.55\times10^{-6}}{2\pi(.6)} \simeq 3.39\times10^{-4} \text{ degrees rms}$$

$$\sigma_{\phi_x}\cong5.92\times10^{-6} \text{ rad rms}$$

$$\sigma_{\phi_l}{}^2=\sigma_\theta{}^2+\sigma_{\phi_x}{}^2\simeq2.4\times10^{-8}+3.5\times10^{-11}\cong2.4\times10^{-8} \text{ rad}^2$$

$\sigma_\theta{}^2$=phase noise of source before threshold device

Therefore, the threshold device has little to no impact on the total phase noise modulation on this particular source because the original source phase noise dominates. A more general result can be obtained for arbitrarily shaped waveforms (other than simple sine waves) by using a Fourier series expansion and weighting each component of the series according to the previously described approximation. For simple waveforms like a triangle pulse, the slope is simply the amplitude divided by the time period so that in the approximation:

$$\Delta t \approx \frac{k4\sigma T_r}{A_T} \quad \text{EQ. (137)}$$

k; an arbitrary scaling constant $T_r$; time period for the ramping edge of the triangle Hence, the ratio of $(\sigma T_r/A_r)$ is important and should be minimized. As an example, suppose that the triangle pulse rise time is 500 nsec. Furthermore, suppose that the amplitude, $A_T$, is 35 milli volts. Then, with a 15 dB NF, the $\Delta t$ becomes:

$$\Delta t = \frac{k\cdot4\cdot(3.55\times10^{-6})V500n\text{sec}}{.035} \simeq 203 \text{ ps}$$

$$\sigma\simeq203/4\cong50.7 \text{ ps } (1\Omega)$$

This is all normalized to a 1Ω system. If a 50Ω system were assumed then:

$$\sigma\simeq358.5 \text{ ps } (50\Omega)$$

In addition, it is straight forward to extend these results to the case of DC offset added to the input of the threshold device along with the sine wave. Essentially the zero crossing slope is modified due to the virtual phase shift of the input sine function at the threshold. DC offset will increase the phase noise component on the present invention clock, and it could cause significant degradation for certain link budgets and modulation types.

4.21. Pulse Accumulation and System Time Constant 4.21.1. Pulse Accumulation

Examples and derivations presented in previous sub-sections illustrate that in embodiments single aperture acquisitions recover energies proportional to:

$$E_l = \int_0^{T_A} S_i^2(t)dt = \frac{A_n^2 T_A}{2} \text{(Optimum aperture)} \quad \text{EQ. (138)}$$

$A_n\Delta$ as the Carrier Envelope Weighting of the nth Sample.

In addition, sub-section 8 above, describes a complete UFT transform over many pulses applicable to embodiments of the invention. The following description therefore is an abbreviated description used to illustrate a long-term time constant consideration for the system.

As described elsewhere herein, the sample rate is much greater than the information bandwidth of interest for most if not all practical applications.

$$f_s>>BW_i \quad \text{EQ. (139)}$$

Hence, many samples may be accumulated as indicated in previous sub-sections, provided that the following general rule applies:

$$\frac{f_s}{l} > BW_i \quad \text{EQ. (140)}$$

where l represents the total number of accumulated samples. EQ. (140) requires careful consideration of the desired information at baseband, which must be extracted. For instance, if the baseband waveform consists of sharp features such as square waves then several harmonics would necessarily be required to reconstruct the square wave which could require $BW_i$ of up to seven times the square wave rate. In many applications however the base band waveform has been optimally prefiltered or bandwidth limited apriori (in a transmitter), thus permitting significant accumulation. In such circumstances, $f_s/l$ will approach $BW_i$.

This operation is well known in signal processing and historically has been used to mimic an average. In fact it is a means of averaging scaled by a gain constant. The following equation relates to EQ. (118).

$$\sum_{n=1}^{l} E_l = \sum_{l=1}^{x} \frac{A_n^2 T_A}{2} \cong \frac{lA^2 T_A}{2} \quad \text{EQ. (141)}$$

Notice that the nth index has been removed from the sample weighting. In fact, the bandwidth criteria defined in EQ. (140) permits the approximation because the information is contained by the pulse amplitude. A more accurate description is given by the complete UFT transform, which does permit variation in A. A cannot significantly vary from pulse to pulse over an l pulse interval of accumulation, however. If A does vary significantly, l is not properly selected. A must be permitted to vary naturally, however, according to the information envelope at a rate proportional to $BW_i$. This means that l cannot be permitted to be too great because information would be lost due to filtering. This shorthand approximation illustrates that there is a long term system time constant that should be considered in addition to the short-term aperture integration interval.

In embodiments, usually the long term time constant is controlled by the integration capacitor value, the present invention source impedance, the present invention output impedance, and the load. The detailed models presented elsewhere herein consider all these affects. The analysis in this section does not include a leakage term that was presented in previous sub-sections.

EQs. (140) and (141) can be considered a specification for slew rate. For instance, suppose that the bandwidth requirement can be specified in terms of a slew rate as follows:

$$SR = \times \frac{\text{volts}}{\mu\ \text{sec}} \quad \text{EQ. (142)}$$

The number of samples per μsec is given by:

$l_s = f_s \times 1 \times 10^{-6}$ ($f_s$ is derived from the present invention clock rate)

If each sample produces a voltage proportional to $A^2T_A/2$ then the total voltage accumulated per microsecond is:

$$V_{\mu\text{sec}} \cong l_s \frac{A^2 T_A}{2} \quad \text{EQ. (143)}$$

The previous sub-sections illustrates how the present invention output can accumulate voltage (proportional to energy) to acquire the information modulated onto a carrier. For down conversion, this whole process is akin to lowpass filtering, which is consistent with embodiments of the present invention that utilize a capacitor as a storage device or means for integration.

4.21.2. Pulse Accumulation by Correlation

The previous sub-sections introduced the idea that in embodiments information bandwidth is much less than the bandwidth associated with the present invention's impulse response for practical applications. The concept of single aperture energy accumulation was used above to describe the central ideas of the present invention. As shown in FIG. 65, multiple aperture accumulation permits baseband waveform reconstruction. FIG. 65 illustrates the results from simulation of actual circuits according to embodiments of the present invention implemented with CMOS and passive components.

The staircase output of the example in FIG. 65 follows the complex modulation envelope for the input signal. Subsection 5 predicts this result via the time variant linear differential equation. FIG. 65 illustrates the staircase accumulation of half sine energy for three apertures based on 3× sampling. As can be seen in FIG. 65, the leakage between accumulations is very small.

4.22. Energy Budget Considerations

Consider the following equation for a window correlator aperture:

$$E_{ASO} = \int_0^{TA} A \cdot S_i(t)\,dt \quad \text{EQ. (144)}$$

In EQ. (144), the rectangular aperture correlation function is weighted by A. For convenience, it is now assumed to be weighted such that:

$$E_{ASO} = \int_0^{TA} kA \cdot S_i(t)\,dt = 2A \text{ (Normalized, } \omega_c = 1) \quad \text{EQ. (145)}$$

Since embodiments of the present invention typically operate at a sub-harmonic rate, not all of the energy is directly available due to the sub-harmonic sampling process. For the case of single aperture acquisition, the energy transferred versus the energy available is given by:

$$\frac{E_0}{E_i} = \frac{E_{ASO}}{2N} = \frac{A}{N} \quad \text{EQ. (146)}$$

NΔ harmonic of operation

The power loss due to harmonic operation is:

$$E_{LN} = 10 \log_{10}(2N) \quad \text{EQ. (147)}$$

There is an additional loss due to the finite aperture, $T_A$, which induces (sin x/x) like weighting onto the harmonic of interest. This energy loss is proportional to:

$$E_{LSINC} \simeq \left(\frac{\sin(\pi N f_s T_A)}{\pi N f_s T_A}\right) \text{(Up conversion only)} \quad \text{EQ. (148)}$$

$N \cdot f_s \Delta$ operating carrier frequency $f_s \Delta$ sampling rate (directly related to the clock rate)

EQ. (148) indicates that the harmonic spectrum attenuates rapidly as $N \cdot f_s$ approaches $T_A^{-1}$. Of course there is some attenuation even if that scenario is avoided. EQ. (148) also reveals, however, that in embodiments for single aperture operation the conversion loss due to $E_{LSINC}$ will always be near 3.92 dB. This is because:

$$(2 \cdot N f_s)^{-1} = T_A \text{ (~3.92 dB condition)} \quad \text{EQ. (149)}$$

Another way of stating the condition is that $T_A$ is always ½ the carrier period.

Consider an ideal implementation of an embodiment of the present invention, without any circuit losses, operating on a $5^{th}$ harmonic basis. Without any other considerations, the energy loss through the device is at minimum:

$$E_L = E_{LN} + E_{LSINC} = 10\text{ dB} + 3.92 \simeq 14\text{ dB (for up conversion)} \quad \text{EQ. (150)}$$

Down conversion does not possess the 3.92 dB loss so that the baseline loss for down conversion is that represented by EQ. (147). Parasitics will also affect the losses for practical systems. These parasitics must be examined in detail for the particular technology of interest.

Next suppose that a number of pulses may be accumulated using the multi-aperture strategy and diversity means of an embodiment of the present invention, as described above. In this case, some of the energy loss calculated by EQ. (150) can be regained. For example, if four apertures are used then the pulse energy accumulation gain is 6 dB. For the previous example, this results in an overall gain of 6 dB-14 dB, or −8 dB (instead of −14 dB). This energy gain is significant and will translate to system level specification improvements in the areas of noise frequency, intercept point, power consumption, size, etc. It should be recognized, however, that a diversity system with active split or separate amplifier chains would use more power and become more costly. In addition, in embodiments, energy storage networks coupled to the circuitry of the present invention may be used to accumulate energy between apertures so that each aperture delivers some significant portion of the stored energy from the network. In this manner, some inefficiencies of the sub harmonic sampling process can be removed by trading impedance matching vs. complexity, etc., as further described below.

4.23. Energy Storage Networks

Embodiments of the present invention have been shown to be a type of correlator, which is applied to the carrier on a sub harmonic basis. It is also been shown herein that certain architectures according to embodiments of the invention benefit significantly from the addition of passive networks, particular when coupled to the front end of a processor according to the present invention used as a receiver. This result can be explained using linear systems theory.

To understand this, it is useful to consider the following. Embodiments of the present invention can be modeled as a linear, time-variant (LTV) device. Therefore, the following concepts apply:

The LTV circuits can be modeled to have an average impedance; and

The LTV circuits can be modeled to have an average power transfer or gain.

These are powerful concepts because they permit the application of the maximum bilateral power transfer theorem to embodiments of the present invention. As a result, in embodiments, energy storage devices/circuits which fly wheel between apertures to pump up the inter sample power can be viewed on the many sample basis (long time average) as providing optimum power transfer through matching properties. The between sample model on the time microscopic scale is best viewed on a differential equation basis while the time macroscopic view can utilize simpler analysis techniques such as the maximum power transfer equations for networks, correlator theory, etc. The fact that the differential equations can be written for all time unifies the theory between the short time (between sample) view and long time (many sample accumulation) view. Fortunately, the concepts for information extraction from the output of the present invention are easily formulated without differential equation analysis.

Network theory can be used to explain why certain networks according to the present invention provide optimum power gain. For example, network theory explains embodiments of the present invention when energy storage networks or matching networks are utilized to 'fly wheel' between apertures, thereby, on the average, providing a good impedance match. Network theory does not explain, however, why $T_A$ is optimal. For instance, in some embodiments, one may deliberately utilize an aperture that is much less than a carrier half cycle. For such an aperture, there is an optimal matching network nonetheless. That is, a processor according to an embodiment of the present invention utilizing an improper aperture can be optimized, although it will not perform as well as a processor according to an embodiment of the present invention that utilizes an optimal aperture accompanied by an optimal matching network.

The idea behind selecting an optimal aperture is matched filter theory, which provides a general guideline for obtaining the best correlation properties between the incoming waveform and the selected aperture. Any practical correlator or matched filter is constrained by the same physical laws, however, which spawned the maximum power transfer theorems for networks. It does not do any good to design the optimum correlator aperture if the device possesses extraordinary impedance mismatches with its source and load. The circuit theorems do predict the optimal impedance match while matched filter theory does not. The two work hand in hand to permit a practical explanation for:

Why $T_A$ is optimal; and

How processors according to embodiments of the present invention are optimized for performance in practical circuits.

The following sub-section analyzes the present invention on a macroscopic scale using the notions of average impedance and power transfer.

4.24. Impedance Matching

When a processor embodiment according to the present invention is 'off,' there is one impedance, and when a processor embodiment according to the present invention is 'on,' there is another impedance due to the architecture of the present invention and its load. In practice, the aperture will affect the 'on' impedance. Hence, on the average, the input impedance looking into the circuitry of an embodiment of the present invention (i.e., its ports) is modified according to the present invention clock and $T_A$. Impedance matching networks must take this into account.

$$\mathcal{Z}_{av} = \frac{V}{I_{av}} \quad \text{EQ. (151)}$$

EQ. (151) illustrates that the average impedance, $\mathcal{Z}_{av}$, is related to the voltage, V, divided by the average current flow, $I_{av}$, into a device, for example a processor according to an embodiment of the present invention. EQ. (151) indicates that for a processor according to an embodiment of the present invention the narrower $T_A$ and the less frequent a sample is acquired, the greater $\mathcal{Z}_{av}$ becomes.

To understand this, consider the fact that a $10^{th}$ harmonic system according to an embodiment of the present invention operates with half as many samples as a $5^{th}$ harmonic sample according to the present invention. Thus, according to EQ. (151), a $5^{th}$ harmonic sample according to an embodiment of the present invention would typically possess a higher input/output impedance than that a $10^{th}$ harmonic system according to the present invention. Of course, practical board and circuit parasitics will place limits on how much the impedance scaling properties of the present invention processor clock signals control the processor's overall input/output impedance.

As will be apparent to persons skilled in the relevant arts given the discussion herein, in embodiments, matching networks should be included at the ports of a processor according to the present invention to accommodate $\mathcal{Z}_{av}$, as measured by a typical network analyzer.

4.25. Time Domain Analysis

All signals can be represented by vectors in the complex signal plane. Previous sub-sections derived the result for down converting (or up converting) $S_i(t)$ in the transform domain via $S_i(\omega)$. An I/Q modem embodiment of the present invention, however, was developed using a time domain analysis. This time domain analysis is repeated here and provides a complementary view to the previous sub-sections.

FIG. 66 illustrates an embodiment of the present invention implementing a complex down converter architecture. Operation of this embodiment is described given by:

$$S_0(t_k) \cong \sum_{k=0}^{\infty} (S_i(t_k) + n(t_k))\ (C_{Ik} + C_{Qk}) \qquad \text{EQ. (152.1)}$$

where $S_i(t_k)$ is defined as the $k^{th}$ sample from the UFT transform such that $S_i(t_k)$ is filtered over the $k^{th}$ interval, $n(t_k)$ is defined as the noise sample at the output of the $k^{th}$ present invention kernel interval such that it has been averaged by the present invention process over the interval, $C_{Ik}$ is defined as the $k^{th}$ in phase gating waveform (the present invention clock), and $C_{Qk}$ is defined as the $k^{th}$ quadrature phase gating waveform (the present invention clock).

The 'goodness' of $S_i(t_k)$ and $n_i(t_k)$ has been shown previously herein as related to the type of present invention processor used (e.g., matched filtering/correlating processor, finite time integrating processor, or RC processor). Each $t_k$ instant is the time tick corresponding to the averaging of input waveform energy over a $T_A$ (aperture) duration. It has been assumed that $C_{Ik}$ and $C_{Qk}$ are constant envelope and phase for the current analysis, although in general this is not required. Many different, interesting processors according to embodiments of the present invention can be constructed by manipulating the amplitudes and phases of the present invention clock.

$C_{Ik}$ and $C_{Qk}$ can be expanded as follows:

$$C_{Ik} = K\frac{T_A}{T_s}\left[1 + 2\left(\frac{\sin\pi\frac{T_A}{T_s}}{\pi\frac{T_A}{T_s}}\cdot\cos 2\pi f_s t_k + \frac{\sin 2\pi\frac{T_A}{T_s}}{\pi\frac{T_A}{T_s}}\cdot\cos 4\pi f_s t_k + \frac{\sin 3\pi\frac{T_A}{T_s}}{3\pi\frac{T_A}{T_s}}\cdot\cos 6\pi f_s t_k + \ \dots\ \frac{\sin n\pi\frac{T_A}{T_s}}{n\pi\frac{T_A}{T_s}}\cdot\cos n\cdot 2\pi f_s t_k\right)\right] \qquad \text{EQ. (152.2)}$$

$$C_{Qk} = K\frac{T_A}{T_s}\left[1 + 2\left(\frac{\sin\pi\frac{T_A}{T_s}}{\pi\frac{T_A}{T_s}}\cdot\sin 2\pi f_s t_k - \frac{\sin 2\pi\frac{T_A}{T_s}}{\pi\frac{T_A}{T_s}}\cdot\cos 4\pi f_s t_k - \frac{\sin 3\pi\frac{T_A}{T_s}}{3\pi\frac{T_A}{T_s}}\cdot\sin 6\pi f_s t_k\ \dots\ \frac{\sin n\pi\frac{T_A}{T_s}}{n\pi\frac{T_A}{T_s}}\cdot\cos(n\cdot 2\pi f_s t_k + n\phi)\right)\right] \qquad \text{EQ. (152.3)}$$

The above treatment is a Fourier series expansion of the present invention clocks where:

K Δ Arbitrary Gain Constant $T_A$ Δ Aperture Time$=f_s^{-1}$ $T_s$ Δ The Present Invention Clock Interval or Sample Time n Δ Harmonic Spectrum Harmonic Order φ Δ As phase shift angle usually selected as 90° (π/2) for orthogonal signaling Each term from $C_{Ik}$, $C_{Qk}$ will down convert (or up convert). However, only the, odd terms in the above formulation (for φ=π/2) will convert in quadrature. φ could be selected otherwise to utilize the even harmonics, but this is typically not done in practice.

For the case of down conversion, r(t) can be written as:

$$r(t_k)=\sqrt{2}A(\tilde{S}_u(t_k)\cos(m\cdot 2\pi f t_k+\Theta)-\tilde{S}_{iQ}(t_k)\sin(m\cdot 2\pi f t_k+\Theta)+n(t)) \qquad \text{EQ. (153)}$$

After applying ($C_{Ik}$, $C_{Qk}$) and lowpass filtering, which in embodiments is inherent to the present invention process, the down converted components become:

$$S_0(t_k)_I=A\ S_{iI}(t_k)+\tilde{n}_{Ik} \qquad \text{EQ. (154)}$$

$$S_0(t_k)_Q=A\ S_{iQ}(t_k)+\tilde{n}_{Qk} \qquad \text{EQ. (155)}$$

where:

$S_{iI}(t_k)$ Δ The In phase component of the desired baseband signal.

$S_{iQ}(t_k)$ Δ The quadrature phase component of the desired baseband signal.

$\tilde{n}_I,\tilde{n}_Q$ Δ In phase and quadrature phase noise samples m Δ Is the harmonic of interest equal to one of the 'n' numbers, for perfect carrier synchronization.

Now m and n can be selected such that the down conversion ideally strips the carrier ($mf_s$), after lowpass filtering. If the carrier is not perfectly coherent, a phase shift occurs as described in previous sub-section. The result presented above would modify to:

$$S_0(t)=(S_0(t)_I+jS_0(t)_Q)e^{j\phi} \qquad \text{EQ. (156)}$$

where φ is the phase shift. This is the same phase shift affect derived earlier as cos φ in the present invention transform.

When there is a slight carrier offset then φ can be written as φ(t) and the I and Q outputs represent orthogonal, harmonically oscillating vectors super imposed on the desired signal output with a beat frequency proportional to:

$$f_{error}\ \Delta\ nf_s\pm m(f_s\pm f_\Delta)=f_s(n-m)+mf_\Delta \qquad \text{EQ. (157)}$$

$f_\Delta$ Δ as a slight frequency offset between the carrier and the present invention clock This entire analysis could have been accomplished in the frequency domain as described herein, or it could have been formulated from the present invention kernel as:

$$S_0(t)=D_{IQ}(S_i(t)+n(t)) \qquad \text{EQ. (158)}$$

The recursive kernel $D_{IQ}$ is defined in sub-section 8 and the I/Q version is completed by superposition and phase shifting the quadrature kernel.

The previous equation for r(t) could be replaced with:

$$BB(t)=\tilde{S}_{iI}\pm\tilde{S}_{iQ} \text{ where } f=0 \text{ and } \Theta=\pi/4 \text{ and } n(t)=0 \quad \text{EQ. (159)}$$

BB(t) could be up converted by applying $C_I$,$C_Q$. The desired carrier then is the appropriate harmonic of $C_I$,$C_Q$ whose energy is optimally extracted by a network matched to the desired carrier.

4.26. Complex Passband Waveform Generation Using the Present Invention Cores

This sub-section introduces the concept of using a present invention core to modulate signals at RF according to embodiments of the invention. Although many specific modulator architectures are possible, which target individual signaling schemes such as AM, FM, PM, etc., the example architecture presented here is a vector signal modulator. Such a modulator can be used to create virtually every known useful waveform to encompass the whole of analog and digital communications applications, for "wired" or "wireless," at radio frequency or intermediate frequency. In essence, a receiver process, which utilizes the present invention, may be reversed to create signals of interest at passband. Using I/Q waveforms at baseband, all points within the two dimensional complex signaling constellation may be synthesized when cores according to the present invention are excited by orthogonal sub-harmonic clocks and connected at their outputs with particular combining networks. A basic architecture that can be used is shown in FIG. 67.

FIG. 67 depicts one embodiment of a based vector modulator according to the present invention. FIG. 67 shows I and Q inputs that can accept analog or balanced digital waveforms. By selecting I and Q appropriately, AM, FM, BPSK, QPSK, MSK, QAM, OFDM, multi-tone, and a host of other signals can be synthesized. In this embodiment of the present invention, the present invention cores are driven differentially on I and Q. $C_I$,$C_{\bar{I}}$, $C_Q$, $C_{\bar{Q}}$ are the in phase and quadrature sub-harmonic clocks, respectively, with their inverted phases as well. $C_I$ and $C_Q$ can be created in quadrature for I Q operation if the output power combiner is a 0° combiner. On the other hand, $C_I$ and $C_Q$ can be in phase when a 90° output power combiner is utilized at RF. This latter architecture can be used whenever the signaling bandwidth is very small with respect to the RF center frequency of the output and small with respect to the 1 dB passband response of the combiner. If one assumes constant values on I and $\bar{I}$, the waveform diagrams in FIG. 68 can be constructed. As indicated in FIG. 67, the power combiner and bandpass reconstruction filter are optional components.

In FIG. 68, $C_I$ and $\overline{C_I}$ are out of phase by 180° if referenced back to the clock. In this case, clock refers to the sub-harmonic waveform used to generate $C_I$ and $\overline{C_I}$. $C_I$ is coincident with the rising edges of clock with a pulse width of $T_A$ while $\overline{C_I}$ is coincident with the falling edges of clock with a pulse width of $T_A$. $C_I$ and $\overline{C_I}$ activate two of the processors according to the present invention, as shown in FIG. 67, which are driven by differential signals. $I_C$ is illustrated as if the system is ideal without losses, parasitics, or distortions. The time axis for $I_C$ may be arranged in a manner to represent the waveform as an odd function. For such an arrangement, the Fourier series is calculated to obtain EQ. (160).

$$I_c(t)=\sum_{n=1}^{\infty}\left(\frac{4\sin\left(\frac{n\pi T_A}{T_s}\right)\cdot\sin\left(\frac{n\pi}{2}\right)}{n\pi}\right)\cdot\sin\left(\frac{2n\pi}{T_s}\right) \quad \text{EQ. (160)}$$

To illustrate this, if a passband waveform must be created at five times the frequency of the sub-harmonic clock then a baseline power for that harmonic extraction can be calculated for n=5. For the case of n=5, it is found that the $5^{th}$ harmonic yields:

$$I_c(t)\,|_{n=5}=\frac{4}{5\pi}(\sin(5\omega_s t)) \quad \text{EQ. (161)}$$

This component can be extracted from the Fourier series via a bandpass filter centered around $f_s$. This component is a carrier at 5 times the sampling frequency.

This illustration can be extended to show the following:

$$m(t)\cdot I_c(t)\,|_{\substack{n=5\\ \varnothing=(t)}}=\frac{4\cdot m(t)}{5\pi}(\sin(5\omega_s t+5\phi(t))) \quad \text{EQ. (162)}$$

This equation illustrates that a message signal may have been superposed on I and $\bar{I}$ such that both amplitude and phase are modulated, i.e., m(t) for amplitude and $\phi$(t) for phase. In such cases, it should be noted that $\phi$(t) is augmented modulo n while the amplitude modulation m(t) is scaled. The point of this illustration is that complex waveforms may be reconstructed from their Fourier series with multi-aperture processor combinations, according to the present invention.

In a practical system according to an embodiment of the present invention, parasitics, filtering, etc., may modify $I_c(t)$. In many applications according to the present invention, charge injection properties of processors play a significant role. However, if the processors and the clock drive circuits according to embodiments of the present invention are matched then even the parasitics can be managed, particularly since unwanted distortions are removed by the final bandpass filter, which tends to completely reconstruct the waveform at passband.

Like the receiver embodiments of the present invention, which possess a lowpass information extraction and energy extraction impulse response, various transmitter embodiments of the present invention use a network to create a bandpass impulse response suitable for energy transfer and waveform reconstruction. In embodiments, the simplest reconstruction network is an L-C tank, which resonates at the desired carrier frequency $N\cdot f_s=f_c$.

4.27. Example Embodiments of the Invention 4.27.1. Example I/Q Modulation Receiver Embodiment FIG. 69 illustrates an example I/Q modulation receiver 6900, according to an embodiment of the present invention. I/Q modulation receiver 6900 comprises a first Processing module 6902, a first optional filter 6904, a second Processing module 6906, a second optional filter 6908, a third Processing module 6910, a third optional filter 6912, a fourth Processing module 6914, a fourth filter 6916, an optional LNA 6918, a first differential amplifier 6920, a second differential amplifier 6922, and an antenna 6972.

I/Q modulation receiver 6900 receives, down-converts, and demodulates a I/Q modulated RF input signal 6982 to an I baseband output signal 6984, and a Q baseband output signal 6986. I/Q modulated RF input signal comprises a first information signal and a second information signal that are I/Q modulated onto an RF carrier signal. I baseband output signal 6984 comprises the first baseband information signal. Q baseband output signal 6986 comprises the second baseband information signal.

Antenna 6972 receives I/Q modulated RF input signal 6982. I/Q modulated RF input signal 6982 is output by antenna 6972 and received by optional LNA 6918. When present, LNA 6918 amplifies I/Q modulated RF input signal 6982, and outputs amplified I/Q signal 6988.

First Processing module 6902 receives amplified I/Q signal 6988. First Processing module 6902 down-converts the I-phase signal portion of amplified input I/Q signal 6988 according to an I control signal 6990. First Processing module 6902 outputs an I output signal 6998.

In an embodiment, first Processing module 6902 comprises a first storage module 6924, a first UFT module 6926, and a first voltage reference 6928. In an embodiment, a switch contained within first UFT module 6926 opens and closes as a function of I control signal 6990. As a result of the opening and closing of this switch, which respectively couples and de-couples first storage module 6924 to and from first voltage reference 6928, a down-converted signal, referred to as I output signal 6998, results. First voltage reference 6928 may be any reference voltage, and is ground in some embodiments. I output signal 6998 is stored by first storage module 6924.

In an embodiment, first storage module 6924 comprises a first capacitor 6974. In addition to storing I output signal 6998, first capacitor 6974 reduces or prevents a DC offset voltage resulting from charge injection from appearing on I output signal 6998

I output signal 6998 is received by optional first filter 6904. When present, first filter 6904 is a high pass filter to at least filter I output signal 6998 to remove any carrier signal "bleed through". In an embodiment, when present, first filter 6904 comprises a first resistor 6930, a first filter capacitor 6932, and a first filter voltage reference 6934. Preferably, first resistor 6930 is coupled between I output signal 6998 and a filtered I output signal 6907, and first filter capacitor 6932 is coupled between filtered I output signal 6907 and first filter voltage reference 6934. Alternately, first filter 6904 may comprise any other applicable filter configuration as would be understood by persons skilled in the relevant arts. First filter 6904 outputs filtered I output signal 6907.

Second Processing module 6906 receives amplified I/Q signal 6988. Second Processing module 6906 down-converts the inverted I-phase signal portion of amplified input I/Q signal 6988 according to an inverted I control signal 6992. Second Processing module 6906 outputs an inverted I output signal 6901.

In an embodiment, second Processing module 6906 comprises a second storage module 6936, a second UFT module 6938, and a second voltage reference 6940. In an embodiment, a switch contained within second UFT module 6938 opens and closes as a function of inverted I control signal 6992. As a result of the opening and closing of this switch, which respectively couples and de-couples second storage module 6936 to and from second voltage reference 6940, a down-converted signal, referred to as inverted I output signal 6901, results. Second voltage reference 6940 may be any reference voltage, and is preferably ground. Inverted I output signal 6901 is stored by second storage module 6936.

In an embodiment, second storage module 6936 comprises a second capacitor 6976. In addition to storing inverted I output signal 6901, second capacitor 6976 reduces or prevents a DC offset voltage resulting from above described charge injection from appearing on inverted I output signal 6901.

Inverted I output signal 6901 is received by optional second filter 6908. When present, second filter 6908 is a high pass filter to at least filter inverted I output signal 6901 to remove any carrier signal "bleed through". In an embodiment, when present, second filter 6908 comprises a second resistor 6942, a second filter capacitor 6944, and a second filter voltage reference 6946. In an embodiment, second resistor 6942 is coupled between inverted I output signal 6901 and a filtered inverted I output signal 6909, and second filter capacitor 6944 is coupled between filtered inverted I output signal 6909 and second filter voltage reference 6946. Alternately, second filter 6908 may comprise any other applicable filter configuration as would be understood by persons skilled in the relevant arts. Second filter 6908 outputs filtered inverted I output signal 6909.

First differential amplifier 6920 receives filtered I output signal 6907 at its non-inverting input and receives filtered inverted I output signal 6909 at its inverting input. First differential amplifier 6920 subtracts filtered inverted I output signal 6909 from filtered I output signal 6907, amplifies the result, and outputs I baseband output signal 6984. Other suitable subtractor modules may be substituted for first differential amplifier 6920, and second differential amplifier 6922, as would be understood by persons skilled in the relevant arts from the teachings herein. Because filtered inverted I output signal 6909 is substantially equal to an inverted version of filtered I output signal 6907, I baseband output signal 6984 is substantially equal to filtered I output signal 6909, with its amplitude doubled. Furthermore, filtered I output signal 6907 and filtered inverted I output signal 6909 may comprise substantially equal noise and DC offset contributions of the same polarity from prior down-conversion circuitry, including first Processing module 6902 and second Processing module 6906, respectively. When first differential amplifier 6920 subtracts filtered inverted I output signal 6909 from filtered I output signal 6907, these noise and DC offset contributions substantially cancel each other.

Third Processing module 6910 receives amplified I/Q signal 6988. Third Processing module 6910 down-converts the Q-phase signal portion of amplified input I/Q signal 6988 according to an Q control signal 6994. Third Processing module 6910 outputs an Q output signal 6903.

In an embodiment, third Processing module 6910 comprises a third storage module 6948, a third UFT module 6950, and a third voltage reference 6952. In an embodiment, a switch contained within third UFT module 6950 opens and closes as a function of Q control signal 6994. As a result of the opening and closing of this switch, which respectively couples and de-couples third storage module 6948 to and from third voltage reference 6952, a down-converted signal, referred to as Q output signal 6903, results. Third voltage reference 6952 may be any reference voltage, and is preferably ground. Q output signal 6903 is stored by third storage module 6948.

In an embodiment, third storage module 6948 comprises a third capacitor 6978. In addition to storing Q output signal 6903, third capacitor 6978 reduces or prevents a DC offset voltage resulting from above described charge injection from appearing on Q output signal 6903.

Q output signal 6903 is received by optional third filter 6916. When present, third filter 6916 is a high pass filter to at least filter Q output signal 6903 to remove any carrier signal "bleed through". In an embodiment, when present, third filter 6912 comprises a third resistor 6954, a third filter capacitor 6958, and a third filter voltage reference 6958. In an embodiment, third resistor 6954 is coupled between Q output signal 6903 and a filtered Q output signal 6911, and third filter capacitor 6956 is coupled between filtered Q output signal 6911 and third filter voltage reference 6958. Alternately, third filter 6912 may comprise any other applicable filter configuration as would be understood by persons skilled in the relevant arts. Third filter 6912 outputs filtered Q output signal 6911.

Fourth Processing module 6914 receives amplified I/Q signal 6988. Fourth Processing module 6914 down-converts the inverted Q-phase signal portion of amplified input I/Q signal 6988 according to an inverted Q control signal 6996. Fourth Processing module 6914 outputs an inverted Q output signal 6905.

In an embodiment, fourth Processing module 6914 comprises a fourth storage module 6960, a fourth UFT module 6962, and a fourth voltage reference 6964. In an embodiment, a switch contained within fourth UFT module 6962 opens and closes as a function of inverted Q control signal 6996. As a result of the opening and closing of this switch, which respectively couples and de-couples fourth storage module 6960 to and from fourth voltage reference 6964, a down-converted signal, referred to as inverted Q output signal 6905, results. Fourth voltage reference 6964 may be any reference voltage, and is preferably ground. Inverted Q output signal 6905 is stored by fourth storage module 6960.

In an embodiment, fourth storage module 6960 comprises a fourth capacitor 6980. In addition to storing inverted Q output signal 6905, fourth capacitor 6980 reduces or prevents a DC offset voltage resulting from above described charge injection from appearing on inverted Q output signal 6905.

Inverted Q output signal 6905 is received by optional fourth filter 6916. When present, fourth filter 6916 is a high pass filter to at least filter inverted Q output signal 6905 to remove any carrier signal "bleed through". In an embodiment, when present, fourth filter 6916 comprises a fourth resistor 6966, a fourth filter capacitor 6968, and a fourth filter voltage reference 6970. In an embodimnet, fourth resistor 6966 is coupled between inverted Q output signal 6905 and a filtered inverted Q output signal 6913, and fourth filter capacitor 6968 is coupled between filtered inverted Q output signal 6913 and fourth filter voltage reference 6970. Alternately, fourth filter 6916 may comprise any other applicable filter configuration as would be understood by persons skilled in the relevant arts. Fourth filter 6916 outputs filtered inverted Q output signal 6913.

Second differential amplifier 6922 receives filtered Q output signal 6911 at its non-inverting input and receives filtered inverted Q output signal 6913 at its inverting input. Second differential amplifier 6922 subtracts filtered inverted Q output signal 6913 from filtered Q output signal 6911, amplifies the result, and outputs Q baseband output signal 6986. Because filtered inverted Q output signal 6913 is substantially equal to an inverted version of filtered Q output signal 6911, Q baseband output signal 6986 is substantially equal to filtered Q output signal 6913, with its amplitude doubled. Furthermore, filtered Q output signal 6911 and filtered inverted Q output signal 6913 may comprise substantially equal noise and DC offset contributions of the same polarity from prior down-conversion circuitry, including third Processing module 6910 and fourth Processing module 6914, respectively. When second differential amplifier 6922 subtracts filtered inverted Q output signal 6913 from filtered Q output signal 6911, these noise and DC offset contributions substantially cancel each other.

4.27.2. Example I/Q Modulation Control Signal Generator Embodiments

FIG. 70 illustrates an exemplary block diagram for an example I/Q modulation control signal generator 7000, according to an embodiment of the present invention. I/Q modulation control signal generator 7000 generates I control signal 6990, inverted I control signal 6992, Q control signal 6994, and inverted Q control signal 6996 used by I/Q modulation receiver 6900 of FIG. 69. I control signal 6990 and inverted I control signal 6992 operate to down-convert the I-phase portion of an input I/Q modulated RF signal. Q control signal 6994 and inverted Q control signal 6996 act to down-convert the Q-phase portion of the input I/Q modulated RF signal. Furthermore, I/Q modulation control signal generator 7000 has the advantage of generating control signals in a manner such that resulting collective circuit re-radiation is radiated at one or more frequencies outside of the frequency range of interest. For instance, potential circuit re-radiation is radiated at a frequency substantially greater than that of the input RF carrier signal frequency.

I/Q modulation control signal generator 7000 comprises a local oscillator 7002, a first divide-by-two module 7004, a 180 degree phase shifter 7006, a second divide-by-two module 7008, a first pulse generator 7010, a second pulse generator 7012, a third pulse generator 7014, and a fourth pulse generator 7016.

Local oscillator 7002 outputs an oscillating signal 7018. FIG. 71 shows an exemplary oscillating signal 7018.

First divide-by-two module 7004 receives oscillating signal 7018, divides oscillating signal 7018 by two, and outputs a half frequency LO signal 7020 and a half frequency inverted LO signal 7026. FIG. 71 shows an exemplary half frequency LO signal 7020. Half frequency inverted LO signal 7026 is an inverted version of half frequency LO signal 7020. First divide-by-two module 7004 may be implemented in circuit logic, hardware, software, or any combination thereof, as would be known by persons skilled in the relevant arts.

180 degree phase shifter 7006 receives oscillating signal 7018, shifts the phase of oscillating signal 7018 by 180 degrees, and outputs phase shifted LO signal 7022. 180 degree phase shifter 7006 may be implemented in circuit logic, hardware, software, or any combination thereof, as would be known by persons skilled in the relevant arts. In alternative embodiments, other amounts of phase shift may be used.

Second divide-by two module 7008 receives phase shifted LO signal 7022, divides phase shifted LO signal 7022 by two, and outputs a half frequency phase shifted LO signal 7024 and a half frequency inverted phase shifted LO signal 7028. FIG. 71 shows an exemplary half frequency phase shifted LO signal 7024. Half frequency inverted phase shifted LO signal 7028 is an inverted version of half frequency phase shifted LO signal 7024. Second divide-by-two module 7008 may be implemented in circuit logic, hardware, software, or any combination thereof, as would be known by persons skilled in the relevant arts.

First pulse generator 7010 receives half frequency LO signal 7020, generates an output pulse whenever a rising edge is received on half frequency LO signal 7020, and outputs I control signal 6990. FIG. 71 shows an exemplary I control signal 6990.

Second pulse generator 7012 receives half frequency inverted LO signal 7026, generates an output pulse whenever a rising edge is received on half frequency inverted LO signal 7026, and outputs inverted I control signal 6992. FIG. 71 shows an exemplary inverted I control signal 6992.

Third pulse generator 7014 receives half frequency phase shifted LO signal 7024, generates an output pulse whenever a rising edge is received on half frequency phase shifted LO signal 7024, and outputs Q control signal 6994. FIG. 71 shows an exemplary Q control signal 6994.

Fourth pulse generator 7016 receives half frequency inverted phase shifted LO signal 7028, generates an output pulse whenever a rising edge is received on half frequency inverted phase shifted LO signal 7028, and outputs inverted Q control signal 6996. FIG. 71 shows an exemplary inverted Q control signal 6996.

In an embodiment, control signals 6990, 6992, 6994 and 6996 output pulses having a width equal to one-half of a period of I/Q modulated RF input signal 6982. The invention, however, is not limited to these pulse widths, and control signals 6990, 6992, 6994, and 6996 may comprise pulse widths of any fraction of, or multiple and fraction of, a period of I/Q modulated RF input signal 6982. Also, other circuits for generating control signals 6990, 6992, 6994, and 6996 will be apparent to persons skilled in the relevant arts based on the herein teachings.

First, second, third, and fourth pulse generators 7010, 7012, 7014, and 7016 may be implemented in circuit logic, hardware, software, or any combination thereof, as would be known by persons skilled in the relevant arts.

As shown in FIG. 71, in embodiments control signals 6990, 6992, 6994, and 6996 comprise pulses that are non-overlapping. Furthermore, in this example, pulses appear on these signals in the following order: I control signal 6990, Q control signal 6994, inverted I control signal 6992, and inverted Q control signal 6996. Potential circuit re-radiation from I/Q modulation receiver 6900 may comprise frequency components from a combination of these control signals.

For example, FIG. 72 shows an overlay of pulses from I control signal 6990, Q control signal 6994, inverted I control signal 6992, and inverted Q control signal 6996. When pulses from these control signals leak through first, second, third, and fourth Processing modules 6902, 6906, 6910, and 6914 to antenna 6982 (shown in FIG. 69), they may be radiated from I/Q modulation receiver 6900, with a combined waveform that appears to have a primary frequency equal to four times the frequency of any single one of control signals 6990, 6992, 6994, and 6996. FIG. 71 shows an example combined control signal 7102.

FIG. 72 also shows an example I/Q modulation RF input signal 6982 overlaid upon control signals 6990, 6992, 6994, and 6996. As shown in FIG. 72, pulses on I control signal 6990 overlay and act to down-convert a positive I-phase portion of I/Q modulation RF input signal 6982. Pulses on inverted I control signal 6992 overlay and act to down-convert a negative I-phase portion of I/Q modulation RF input signal 6982. Pulses on Q control signal 6994 overlay and act to down-convert a rising Q-phase portion of I/Q modulation RF input signal 6982. Pulses on inverted Q control signal 6996 overlay and act to down-convert a falling Q-phase portion of I/Q modulation RF input signal 6982.

As FIG. 72 further shows in this example, the frequency ratio between the combination of control signals 6990, 6992, 6994, and 6996 and I/Q modulation RF input signal 6982 is 4:3. Because the frequency of the potentially re-radiated signal, combined control signal 7102, is substantially different from that of the signal being down-converted, I/Q modulation RF input signal 6982, it does not interfere with signal down-conversion as it is out of the, frequency band of interest, and hence may be filtered out. In this manner, I/Q modulation receiver 6900 reduces problems due to circuit re-radiation. As will be understood by persons skilled in the relevant arts from the teachings herein, frequency ratios other than 4:3 may be implemented to achieve similar reduction of problems of circuit re-radiation.

It should be understood that the above control signal generator circuit example is provided for illustrative purposes only. The invention is not limited to these embodiments. Alternative embodiments (including equivalents, extensions, variations, deviations, etc., of the embodiments described herein) for I/Q modulation control signal generator 7000 will be apparent to persons skilled in the relevant arts from the teachings herein, and are within the scope of the present invention.

4.27.3. Detailed Example I/Q Modulation Receiver Embodiment with Exemplary Waveforms FIG. 73 illustrates a more detailed example circuit implementation of I/Q modulation receiver 6900, according to an embodiment of the present invention. FIGS. 74-84 show waveforms related to an example implementation of I/Q modulation receiver 6900 of FIG. 73.

Figure 74:
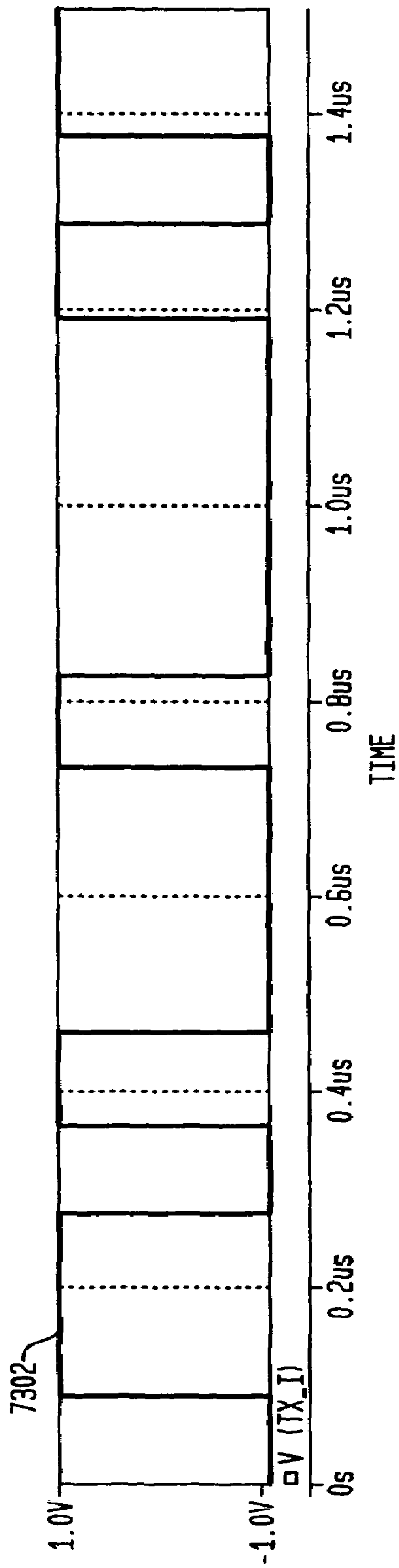
Figure 75:
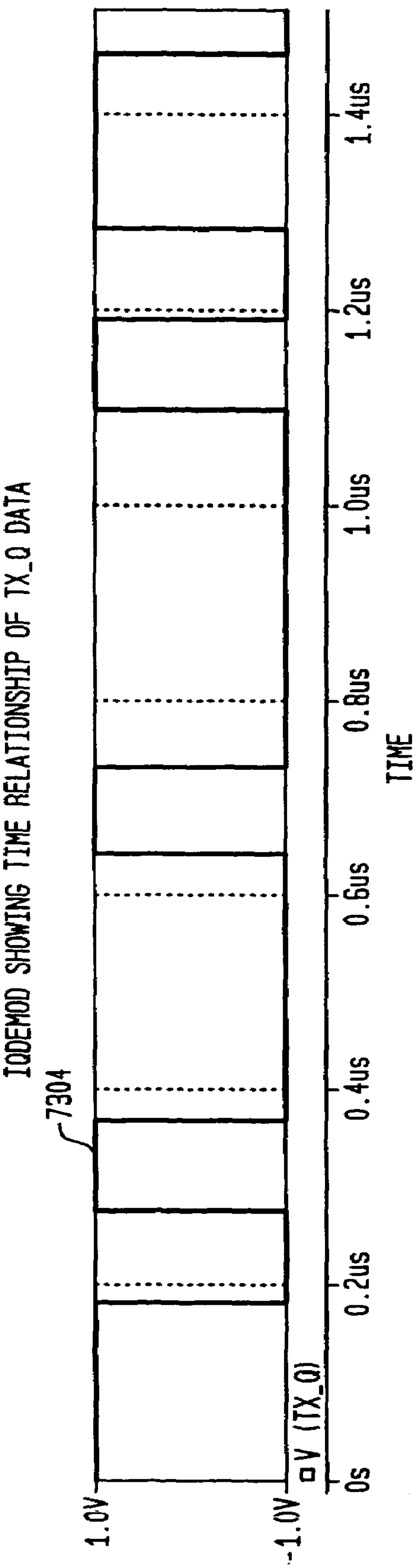

FIGS. 74 and 75 show first and second input data signals 7302 and 7304 to be I/Q modulated with a RF carrier signal frequency as the I-phase and Q-phase information signals, respectively.

Figures 76, 77, 78, 79, 80:
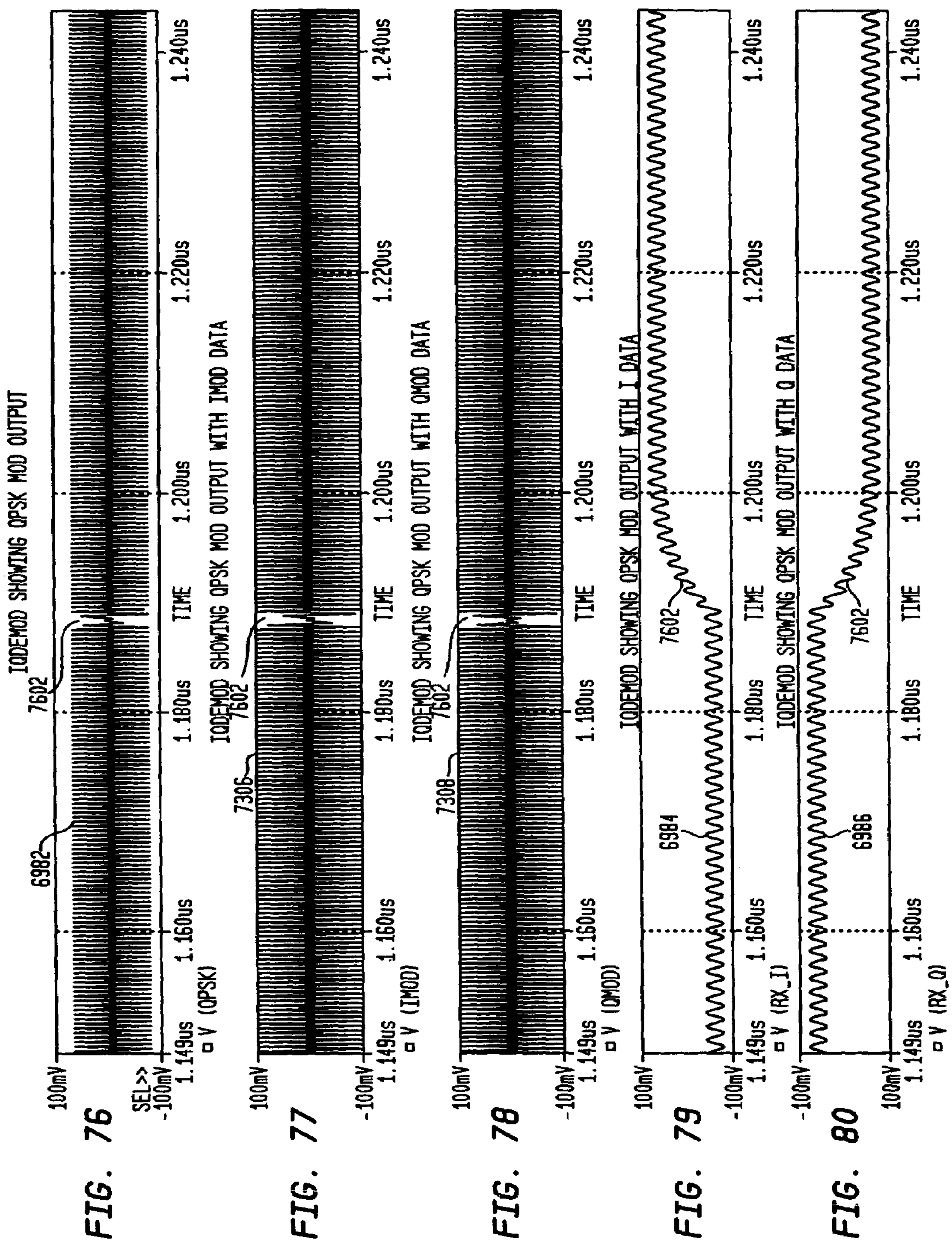

FIGS. 77 and 78 show the signals of FIGS. 74 and 75 after modulation with a RF carrier signal frequency, respectively, as I-modulated signal 7306 and Q-modulated signal 7308.

FIG. 76 shows an I/Q modulation RF input signal 6982 formed from I-modulated signal 7306 and Q-modulated signal 7308 of FIGS. 77 and 78, respectively.

Figure 83:
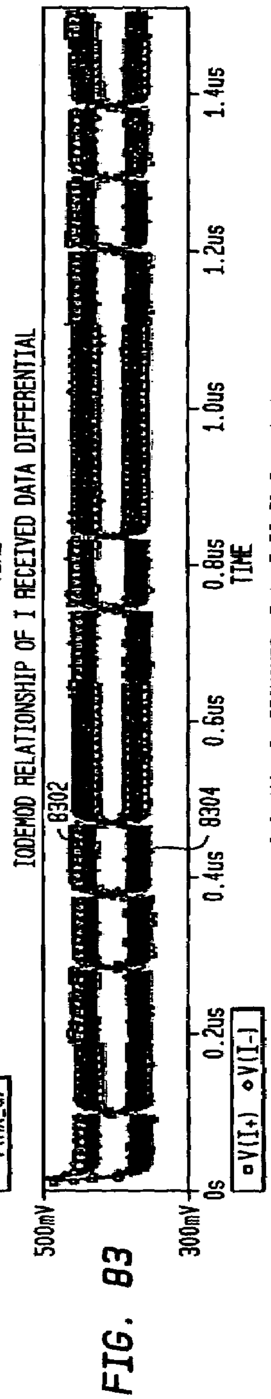

FIG. 83 shows an overlaid view of filtered I output signal 8302 and filtered inverted I output signal 8304.

Figure 84:
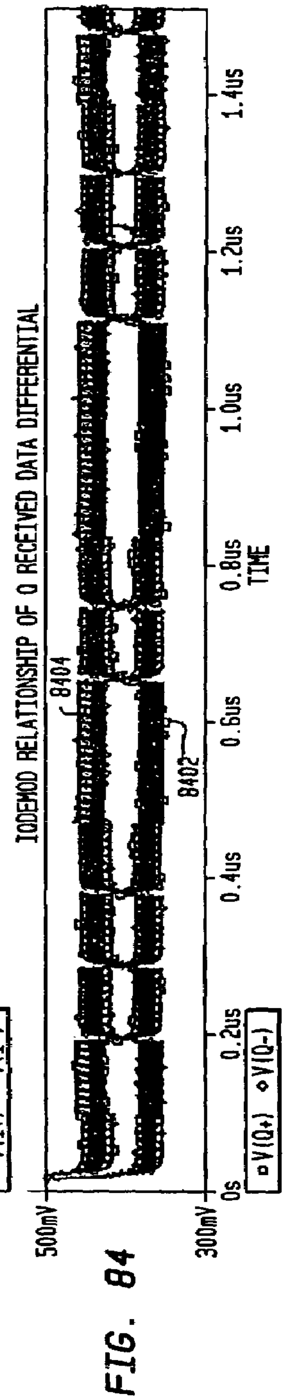

FIG. 84 shows an overlaid view of filtered Q output signal 8402 and filtered inverted Q output signal 8404.

FIGS. 79 and 80 show I baseband output signal 6984 and Q baseband output signal 6986, respectfully. A data transition 7602 is indicated in both. I baseband output signal 6984 and Q baseband output signal 6986. The corresponding data transition 7602 is indicated in I-modulated signal 7306 of FIG. 77, Q-modulated signal 7308 of FIG. 78, and I/Q modulation RF input signal 6982 of FIG. 76.

Figure 81:
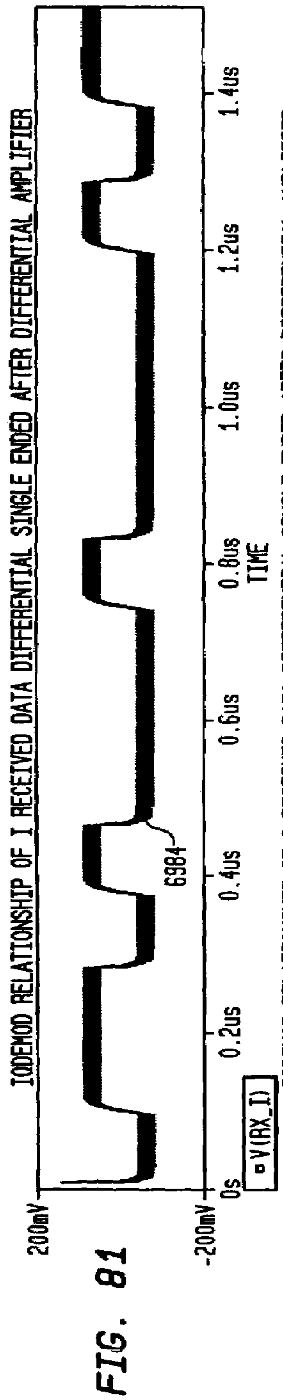
Figure 82:
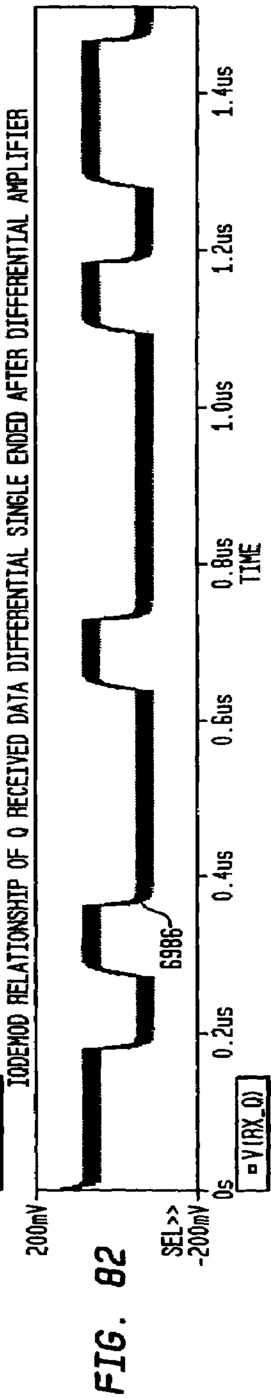

FIGS. 81 and 82 show I baseband output signal 6984 and Q baseband output signal 6986 over a wider time interval.

4.27.4. Example Single Channel Receiver Embodiment

FIG. 85 illustrates an example single channel receiver 8500, corresponding to either the I or Q channel of I/Q modulation receiver 6900, according to an embodiment of the present invention. Single channel receiver 8500 can down-convert an input RF signal 8506 modulated according to AM, PM, FM, and other modulation schemes. Refer to the section above for further description on the operation of single channel receiver 8500.

4.27.5. Example Automatic Gain Control (AGC) Embodiment

According to embodiments of the invention, the amplitude level of the down-converted signal can be controlled by modifying the aperture of the control signal that controls the switch module. Consider EQ. 163, below, which represents the change in charge in the storage device of embodiments of the UFT module, such as a capacitor.

$$\Delta q(t) = 2 \cdot C \cdot A \cdot \sin\left(\frac{1}{2} \cdot T\right) \cdot \cos\left(t - \frac{1}{2} \cdot T\right) \quad \text{EQ. 163}$$

This equation is a function of T, which is the aperture of the control signal. Thus, by modifying the aperture T of the control signal, it is possible to modify the amplitude level of the down-converted signal.

Some embodiments may include a control mechanism to enable manual control of aperture T, and thus manual control of the amplitude level of the down-converted signal. Other embodiments may include automatic or semi-automatic control modules to enable automatic or semi-automatic control of aperture T, and thus automatic or semi-automatic control of the amplitude level of the down-converted signal. Such embodiments are herein referred to (without limitation) as automatic gain control (AGC) embodiments. Other embodiments include a combination of manual and automatic control of aperture T.

4.27.6. Other Example Embodiments

Additional aspects/embodiments of the invention are considered in this section.

In one embodiment of the present invention there is provided a method of transmitting information between a transmitter and a receiver comprising the steps of transmitting a first series of signals each having a known period from the transmitter at a known first repetition rate; sampling by the receiver each signal in the first series of signals a single time and for a known time interval the sampling of the first series of signals being at a second repetition rate that is a rate different from the first repetition rate by a known amount; and generating by the receiver an output signal indicative of the signal levels sampled in step B and having a period longer than the known period of a transmitted signal.

In another embodiment of the invention there is provided a communication system comprising a transmitter means for transmitting a first series of signals of known period at a known first repetition rate, a receiver means for receiving the first series of signals, the receiver means including sampling means for sampling the signal level of each signal first series of signals for a known time interval at a known second repetition rate, the second repetition rate being different from the first repetition rate by a known amount as established by the receiver means. The receiver means includes first circuit means for generating a first receiver output signal indicative of the signal levels sampled and having a period longer than one signal of the first series of signals. The transmitter means includes an oscillator for generating an oscillator output signal at the first repetition rate, switch means for receiving the oscillator output signal and for selectively passing the oscillator output signal, waveform generating means for receiving the oscillator output signal for generating a waveform generator output signal having a time domain and frequency domain established by the waveform generating means.

The embodiment of the invention described herein involves a single or multi-user communications system that utilizes coherent signals to enhance the system performance over conventional radio frequency schemes while reducing cost and complexity. The design allows direct conversion of radio frequencies into baseband components for processing and provides a high level of rejection for signals that are not related to a known or controlled slew rate between the transmitter and receiver timing oscillators. The system can be designed to take advantage of broadband techniques that further increase its reliability and permit a high user density within a given area. The technique employed allows the system to be configured as a separate transmitter-receiver pair or a transceiver.

An objective of the present system is to provide a new communication technique that can be applied to both narrow and wide band systems. In its most robust form, all of the advantages of wide band communications are an inherent part of the system and the invention does not require complicated and costly circuitry as found in conventional wide band designs. The communications system utilizes coherent signals to send and receive information and consists of a transmitter and a receiver in its simplest form. The receiver contains circuitry to turn its radio frequency input on and off in a known relationship in time to the transmitted signal. This is accomplished by allowing the transmitter timing oscillator and the receiver timing oscillator to operate at different but known frequencies to create a known slew rate between the oscillators. If the slew rate is small compared to the timing oscillator frequencies, the transmitted waveform will appear stable in time, i.e., coherent (moving at the known slew rate) to the receiver's switched input. The transmitted waveform is the only waveform that will appear stable in time to the receiver and thus the receiver's input can be averaged to achieve the desired level filtering of unwanted signals. This methodology makes the system extremely selective without complicated filters and complex encoding and decoding schemes and allows the direct conversion of radio frequency energy from an antenna or cable to baseband frequencies with a minimum number of standard components further reducing cost and complexity. The transmitted waveform can be a constant carrier (narrowband), a controlled pulse (wideband and ultra-wideband) or a combination of both such as a dampened sinusoidal wave and or any arbitrary periodic waveform thus the system can be designed to meet virtually any bandwidth requirement. Simple standard modulation and demodulation techniques such as AM and Pulse Width Modulation can be easily applied to the system.

Depending on the system requirements such as the rate of information transfer, the process gain, and the intended use, there are multiple preferred embodiments of the invention. The embodiment discussed herein will be the amplitude and pulse width modulated system. It is one of the simplest implementations of the technology and has many common components with the subsequent systems. A amplitude modulated transmitter consists of a Transmitter Timing Oscillator, a Multiplier, a Waveform Generator, and an Optional Amplifier. The Transmitter Timing Oscillator frequency can be determined by a number of resonate circuits including an inductor and capacitor, a ceramic resonator, a SAW resonator, or a crystal. The output waveform is sinusoidal, although a squarewave oscillator would produce identical system performance.

The Multiplier component multiplies the Transmitter Timing Oscillator output signal by 0 or 1 or other constants, K1 and K2, to switch the oscillator output on and off to the Waveform Generator. In this embodiment, the information input can be digital data or analog data in the form of pulse width modulation. The Multiplier allows the Transmitter Timing Oscillator output to be present at the Waveform Generator input when the information input is above a predetermined value. In this state the transmitter will produce an output waveform. When the information input is below a predetermined value, there is no input to the Waveform Generator and thus there will be no transmitter output waveform. The output of the Waveform Generator determines the system's bandwidth in the frequency domain and consequently the number of users, process gain immunity to interference and overall reliability), the level of emissions on any given frequency, and the antenna or cable requirements. The Waveform Generator in this example creates a one cycle pulse output which produces an ultra-wideband signal in the frequency domain. An optional power Amplifier stage boosts the output of the Waveform Generator to a desired power level.

With reference now to the drawings, the amplitude and pulse width modulated transmitter in accord with the present invention is depicted at numeral 15800 in FIGS. 158 and 159. The Transmitter Timing Oscillator 15802 is a crystal-controlled oscillator operating at a frequency of 25 MHZ. Multiplier 15804 includes a two-input NAND gate 15902 controlling the gating of oscillator 15802 output to Waveform Generator 15806. Waveform Generator 15806 produces a pulse output as depicted at 16008 in FIGS. 160 and 161, which produces a frequency spectrum 16202 in FIG. 162. Amplifier 15808 is optional. The transmitter 15800 output is applied to antenna or cable 15810, which as understood in the art, may be of various designs as appropriate in the circumstances.

Figure 161:
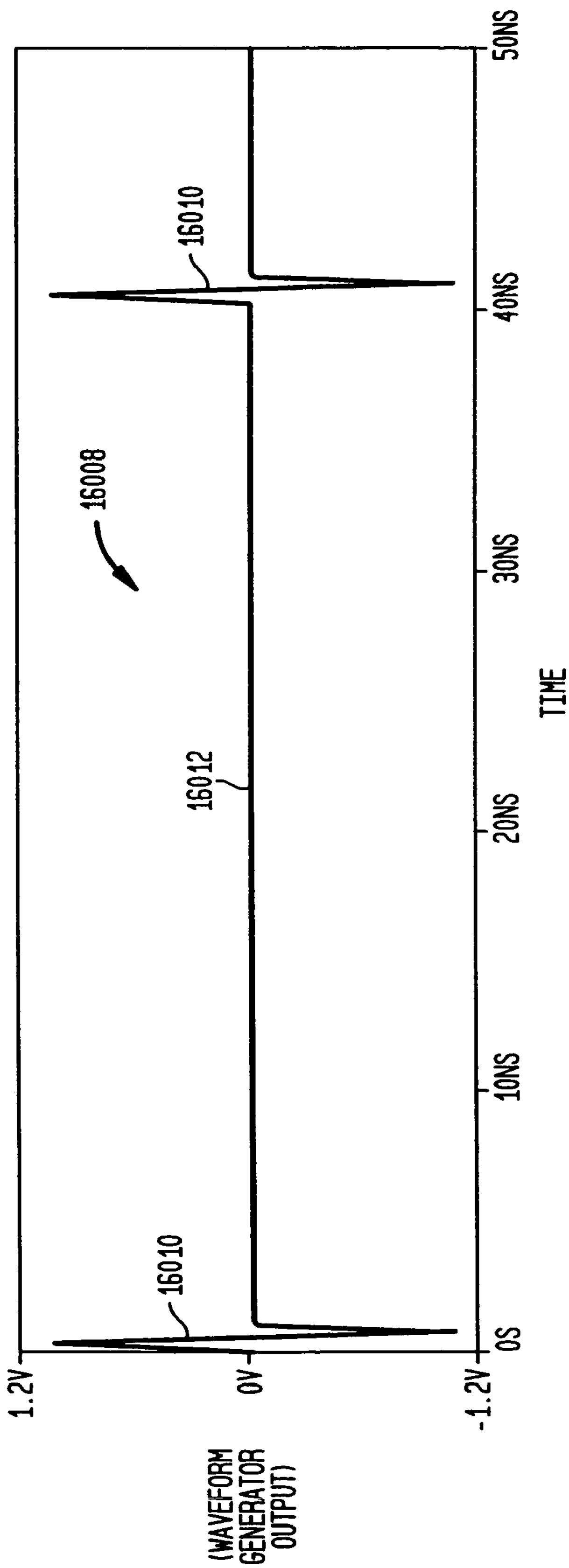
Figure 162:
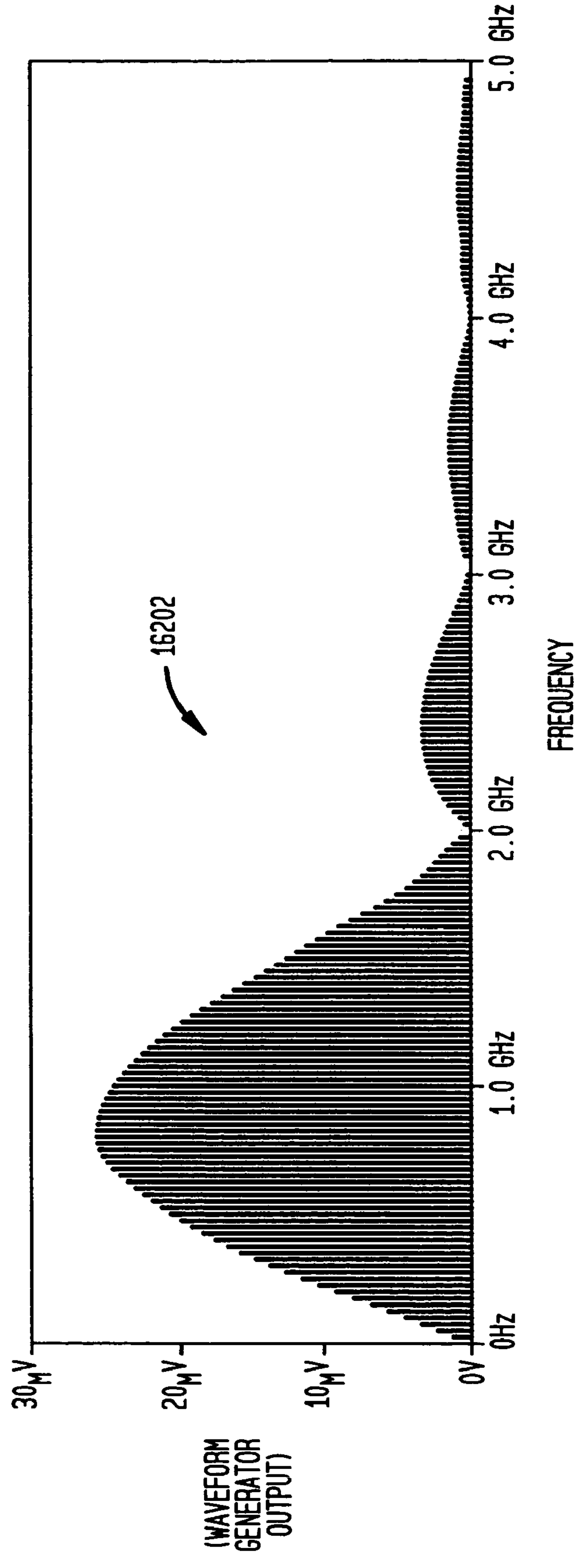

FIGS. 160-162 illustrate the various signals present in transmitter 15800. The output of transmitter 15800 at "A" may be either a sinusoidal or squarewave signal 16002 that is provided as one input into NAND gate 15902. Gate 15902 also receives an information signal 16004 at "B" which, in the embodiment shown, is digital in form. The output 16006 of Multiplier 15804 can be either sinusoidal or squarewave depending upon the original signal 16002. Waveform Generator 15806 provides an output of a single cycle impulse signal 16008. The single cycle impulse 16010 varies in voltage around a static level 16012 and is created at 40 nanoseconds intervals. In the illustrated embodiment, the frequency of transmitter 15802 is 25 MHZ and accordingly, one cycle pulses of 1.0 GHZ are transmitted every 40 nanoseconds during the total time interval that gate 15902 is "on" and passes the output of transmitter oscillator 15802.

FIG. 163 shows the preferred embodiment receiver block diagram to recover the amplitude or pulse width modulated information and consists of a Receiver Timing Oscillator 16310, Waveform Generator 16308, RF Switch Fixed or Variable Integrator 16306, Decode Circuit 16314, two optional Amplifier/Filter stages 16304 and 16312, antenna or cable input 16302, and Information Output 16316. The Receiver Timing Oscillator 16310 frequency can be determined by a number of resonate circuits including an inductor and capacitor, a ceramic resonator, a SAW resonator, or a crystal. As in the case of the transmitter, the oscillator 16310 shown here is a crystal oscillator. The output waveform is a squarewave, although a sinewave oscillator would produce identical system performance. The squarewave timing oscillator output 16402 is shown as A in FIG. 164. The Receiver Timing Oscillator 16310 is designed to operate within a range of frequencies that creates a known range of slew rates relative to the Transmitter Timing Oscillator 15802. In this embodiment, the Transmitter Timing Oscillator 15802 frequency is 25 MHZ and the Receiver Timing Oscillator 16310 outputs between 25.0003 MHZ and 25.0012 MHZ which creates a +300 to +1200 Hz slew rate.

The Receiver Timing Oscillator 16310 is connected to the Waveform Generator 16308 which shapes the oscillator signal into the appropriate output to control the amount of the time that the RF switch 16306 is on and off. The on-time of the RF switch 16306 should be less than ½ of a cycle (1/10 of a cycle is preferred) or in the case of a single pulse, no wider than the pulse width of the transmitted waveform or the signal gain of the system will be reduced. Examples are illustrated in Table A1. Therefore the output of the Waveform Generator 16308 is a pulse of the appropriate width that occurs once per cycle of the receiver timing oscillator 16310. The output 16404 of the Waveform Generator is shown as B in FIG. 164.

TABLE A1

| Transmitted Waveform | Gain Limit on-time | Preferred on-time |
|---|---|---|
| Single 1 nanosecond pulse | 1 nanosecond | 100 picoseconds |
| 1 Gigahertz 1, 2, 3 . . . etc. cycle output | 500 picoseconds | 50 picoseconds |
| 10 Gigahertz 1, 2, 3 . . . etc. cycle output | 50 picoseconds | 5 picoseconds |

The R Switch/Integrator 16306 samples the RF signal 16406 shown as "C" in FIG. 164 when the Waveform Generator output 16404 is below a predetermined value. When the Waveform Generator output 16404 is above a predetermined value, the RF Switch 16306 becomes a high impedance node and allows the Integrator to hold the last RF signal sample 16406 until the next cycle of the Waveform Generator 16308 output. The Integrator section of 16306 is designed to charge the Integrator quickly (fast attack) and discharge the Integrator at a controlled rate (slow decay). This embodiment provides unwanted signal rejection and is a factor in determining the baseband frequency response of the system. The sense of the switch control is arbitrary depending on the actual hardware implementation.

In an embodiment of the present invention, the gating or sampling rate of the receiver 16300 is 300 Hz higher than the 25 MHZ transmission rate from the transmitter 15800. Alternatively, the sampling rate could be less than the transmission rate. The difference in repetition rates between the transmitter 15800 and receiver 16300, the "slew rate," is 300 Hz and results in a controlled drift of the sampling pulses over the transmitted pulse which thus appears "stable" in time to the receiver 16300. With reference now to FIGS. 160 and 164, an example is illustrated for a simple case of an output signal 16408 (FIG. 164, "D") that is constructed of four samples from four RF input pulses 16406 for ease of explanation. As can be clearly seen, by sampling the RF pulses 16406 passed when the transmitter information signal 16004 (FIG. 160) is above a predetermine threshold the signal 16408 is a replica of a signal 16406 but mapped into a different time base. In the case of this example, the new time base has a period four times longer than real time signal. The use of an optional amplifier/filter 16312 results in a further refinement of the signal 16408 which is present at "E" as signal 16410.

Decode Circuitry 16314 extracts the information contained in the transmitted signal and includes a Rectifier that rectifies signal 16408 or 16410 to provide signal 16412 at "G" in FIG. 164. The Variable Threshold Generator circuitry in circuit 16314 provides a DC threshold signal level 16414 for signal 16410 that is used to determine a high (transmitter output on) or low (transmitter output off) and is shown at "H." The final output signal 16416 at "F" is created by an output voltage comparator in circuit 16314 that combines signals 16412 and 16414 such that when the signal 16412 is a higher voltage than signal 16414, the information output signal goes high. Accordingly, signal 16416 represents, for example, a digital "1" that is now time-based to a 1:4 expansion of the period of an original signal 16406. While this illustration provides a 4:1 reduction in frequency, it is sometimes desired to provide a reduction of more than 50,000:1; in the preferred embodiment, 100,000:1 or greater is achieved. This results in a shift directly from RF input frequency to low frequency baseband without the requirement of expensive intermediate circuitry that would have to be used if only a 4:1 conversion was used as a first stage. Table A2 provides information as to the time base conversion and includes examples.

Units s=1 ps=1_$10^{12}$ ns=1_$10^{-9}$ us=1_$10^{-6}$ MHz=1_$10^{-6}$ KHz=1_$10^{3}$ Receiver Timing Oscillator Frequency=25.0003 MHz Transmitter Timing Oscillator Frequency=25 MHz $$\text{period} = \frac{1}{\text{Transmitter Timing Oscillator Frequency}}$$

$$\text{period} = 40\text{ ns}$$

$$\text{slew rate} = \frac{1}{\text{Receiver Timing Oscillator Frequency} - \text{Transmitter Timing Oscillator Frequency}}$$

$$\text{slew rate} = 0.003\ s$$

$$\text{time base multiplier} = \frac{\text{slew rate}}{\text{period}} \text{ seconds per nanosecond}$$

time base multiplier=8.333_$10^{4}$

EXAMPLE 1

1 nanosecond translates into 83.33 microseconds time base=(1 ns)_time base multiplier time base=83.333 us

EXAMPLE 2

TABLE A2

2 Gigahertz translates into 24 Kilohertz
2 Gigahertz = 500 picosecond period
time base = (500 ps)_time base multiplier
time base = 41.667 us $$\text{frequency} = \frac{1}{\text{time base}}$$

frequency = 24 KHz

In the illustrated embodiment, the signal 16416 at "F" has a period of 83.33 usec, a frequency of 12 KHz and it is produced once every 3.3 msec for a 300 Hz slew rate. Stated another way, the system is converting a 1 gigahertz transmitted signal into an 83.33 microsecond signal.

Accordingly, the series of RF pulses 16010 that are transmitted during the presence of an "on" signal at the information input gate 15902 are used to reconstruct the information input signal 16004 by sampling the series of pulses at the receiver 16300. The system is designed to provide an adequate number of RF inputs 16406 to allow for signal reconstruction.

An optional Amplifier/Filter stage or stages 16304 and 16312 may be included to provide additional receiver sensitivity, bandwidth control or signal conditioning for the Decode Circuitry 16314. Choosing an appropriate time base multiplier will result in a signal at the output of the Integrator 16306 that can be amplified and filtered with operational amplifiers rather than RF amplifiers with a resultant simplification of the design process. The signal 16410 at "E" illustrates the use of Amplifier/Filter 16312 (FIG. 165). The optional RF amplifier 16304 shown as the first stage of the receiver should be included in the design when increased sensitivity and/or additional filtering is required. Example receiver schematics are shown in FIGS. 165-167.

FIGS. 168-171 illustrate different pulse output signals 16802 and 17002 and their respective frequency domain at 16902 and 17102. As can be seen from FIGS. 168 and 169, the half-cycle signal 16802 generates a spectrum less subject to interference than the single cycle of FIG. 161 and the 10-cycle pulse of FIG. 170. The various outputs determine the system's immunity to interference, the number of users in a given area, and the cable and antenna requirements. FIGS. 161 and 162 illustrate example pulse outputs.

FIGS. 172 and 173 show example differential receiver designs. The theory of operation is similar to the non-differential receiver of FIG. 163 except that the differential technique provides an increased signal to noise ratio by means of common mode rejection. Any signal impressed in phase at both inputs on the differential receiver will attenuated by the differential amplifier shown in FIGS. 172 and 173 and conversely any signal that produces a phase difference between the receiver inputs will be amplified.

FIGS. 174 and 175 illustrate the time and frequency domains of a narrow band/constant carrier signal in contrast to the ultra-wide band signals used in the illustrated embodiment.

5. Architectural Features of the Invention

The present invention provides, among other things, the following architectural features:

- optimal baseband signal to noise ratio regardless of modulation (programmable RF matched filter);
- exceptional linearity per milliwatt consumed;
- easily integrated into bulk C-MOS (small size/low cost, high level of integration);
- fundamental or sub-harmonic operation (does not change conversion efficiency);
- transmit function provides frequency multiplication and signal gain; and
- optimal power transfer into a scalable output impedance (independent of device voltage or current).

The present invention provides simultaneous solutions for two domains: power sampling and matched filtering. A conventional sampler is a voltage sampling device, and does not substantially affect the input signal. A power sampler according to the present invention attempts to take as much power from the input to construct the output, and does not necessarily preserve the input signal.

6. Additional Benefits of the Invention 6.1. Compared to an Impulse Sampler

The present invention out-performs a theoretically perfect impulse sampler. The performance of a practical implementation of the present invention exceeds the performance of a practical implementation of an impulse sampler. The present invention is easily implemented (does not require impulse circuitry).

6.2. Linearity

The present invention provides exceptional linearity per milliwatt. For example, rail to rail dynamic range is possible with minimal increase in power. In an example integrated circuit embodiment, the present invention provides +55 dmb IP2, +15 dbm IP3, @ 3.3V, 4.4 ma, −15 dmb LO. GSM system requirements are +22 dbm IP2, −10.5 dmb IP3. CDMA system requirements are +50 dmb IP2, +10 dbm IP3.

6.3. Optimal Power Transfer into a Scalable Output Impedance

In an embodiment of the present invention, output impedance is scalable to facilitate a low system noise figure. In an embodiment, changes in output impedance do not affect power consumption.

6.4. System Integration

In an embodiment, the present invention enables a high level of integration in bulk C-MOS. Other features include:

- small footprint;
- no multiplier circuits (no device matching, or balancing transistors);
- transmit and receive filters at baseband;
- low frequency synthesizers;
- DC offset solutions;
- architecturally reduces re-radiation;
- inherent noise rejection; and
- lower cost.\

Referring to FIG. 90A, a single-switch, differential input, differential output receiver 9000, according to an embodiment of the present invention, is shown. If an I/Q signal is being received, receiver 9000 could be implemented for each of the I- and Q-phase signals. No balanced transistor is required in receiver 9000. Any charge injection that creates a DC offset voltage on a first switch input 9002 creates a substantially equal DC offset voltage on a second switch input 9004, so that any resulting DC offset due to charge injection is substantially canceled.

In an embodiment, LO signal 9006 runs at a sub-harmonic. Gilbert cells lose efficiency when run at a sub-harmonic, as compared to the receiver of the present invention.

FIG. 90A shows a substantially maximal linearity configuration. The drain and source voltages are virtually fixed in relation to $V_{gs}$. The DC voltage across first switch input 9002 and second switch input 9004 remains substantially constant.

Single-switch, differential input, differential output receiver embodiments according to the present invention, are discussed in further detail elsewhere herein.

Referring to FIG. 90A, re-radiation is substantially all common mode. With a perfect splitter, the re-radiation will be substantially eliminated.

Referring to FIG. 90B, a first switch 9010 and a second switch 9012 are implemented in a receiver 9014, according to an embodiment of the present invention. Receiver 9014 moves re-radiation off frequency to the next even harmonic frequency higher. Referring to FIG. 90D, re-radiation was substantially shifted from 2.49 GHz (see re-radiation spike 9018) to 3.29 GHz (see larger re-radiation spike 9020).

Receiver embodiments, according to the present invention, for reducing or eliminating circuit re-radiation, such as receiver 9014, are discussed in further detail elsewhere herein.

6.5. Fundamental or Sub-Harmonic Operation

Sub-harmonic operation is preferred for many direct down-conversion implementations because it tends to avoid oscillators and/or signals near the desired operating frequency.

Conversion efficiency is generally constant regardless of the sub-harmonic. Sub-harmonic operation enables micro power receiver designs.

6.6. Frequency Multiplication and Signal Gain

A transmit function in accordance with the present invention provides frequency multiplication and signal gain. For example, a 900 MHz design example (0.35μ CMOS) embodiment features −15 dbm 180 MHz LO, 0 dbm 900 MHz I/O output, 5 VDC, 5 ma. A 2400 MHz design example (0.35μ CMOS) embodiment features −15 dbm 800 MHz LO, −6 dbm 2.4 GHz I/O output, 5 VDC, 16 ma.

A transmit function in accordance with the present invention also provides direct up-conversion (true zero IF).

6.7. Controlled Aperture Sub-Harmonic Matched Filter Features 6.71. Non-Negligible Aperture A non-negligible aperture, as taught herein, substantially preserves amplitude and phase information, but not necessarily the carrier signal. A general concept is to under-sample the carrier while over sampling the information.

The present invention transfers optimum energy. Example embodiments have been presented herein, including DC examples and carrier half cycle examples.

6.7.2. Bandwidth

With regard to input bandwidth, optimum energy transfer generally occurs every n+½ cycle. Output bandwidth is generally a function of the LO.

6.7.3. Architectural Advantages of a Universal Frequency Down-Converter

A universal frequency down-converter (UDF), in accordance with the invention, can be designed to provides, among other things, the following features:

- filter Q's of 100,000+;
- filters with gain;
- filter integration in CMOS;
- electrically modified center frequency and bandwidth;
- stable filter parameters in the presence of high level signals; and
- UDF's can be mass produced without tuning.

6.7.4. Complimentary FET Switch Advantages

Complimentary FET switch implementations of the invention provide, among other things, increased dynamic range (lower $Rds_{on}$–increased conversion efficiency, higher IIP2, IIP3, minimal current increase (+CMOS inverter), and lower re-radiation (charge cancellation). For example, refer to FIGS. 112 and 113.

6.7.5. Differential Configuration Characteristics

Differential configuration implementations of the invention provide, among other things, DC off-set advantages, lower re-radiation, input and output common mode rejection, and minimal current increase. For example, refer to FIG. 114.

6.7.6. Clock Spreading Characteristics

Clock spreading aspects of the invention provide, among other things, lower re-radiation, DC off-set advantages, and flicker noise advantages. For example, refer to FIGS. 115-117.

6.7.7. Controlled Aperture Sub Harmonic Matched Filter Principles

The invention provides, among other things, optimization of signal to noise ratio subject to maximum energy transfer given a controlled aperture, and maximum energy transfer while preserving information. The invention also provides bandpass wave form auto sampling and pulse energy accumulation 6.7.8. Effects of Pulse Width Variation Pulse width can be optimized for a frequency of interest. Generally, pulse width is n plus ½ cycles of a desired input frequency. Generally, in CMOS implementations of the invention, pulse width variation across process variations and temperature of interest is less than +/−16 percent.

6.8. Conventional Systems 6.8.1. Heterodyne Systems

Conventional heterodyne systems, in contrast to the present invention, are relatively complex, require multiple RF synthesizers, require management of various electromagnetic modes (shield, etc.), require significant intermodulation management, and require a myriad of technologies that do not easily integrate onto integrated circuits.

6.8.2. Mobile Wireless Devices

High quality mobile wireless devices have not been implemented via zero IF because of the high power requirements for the first conversion in order to obtain necessary dynamic range, the high level of LO required (LO reradiation), adjacent channel interference rejection filtering, transmitter modulation filtering, transmitter LO leakage, and limitations on RF synthesizer performance and technology.

6.9. Phase Noise Cancellation

The complex phasor notation of a harmonic signal is known from Euler's equation, shown here as EQ. (164).

$$S(t)=e^{-j(\omega_c t+\phi)} \qquad \text{EQ. (164)}$$

Suppose that $\phi$ is also some function of time $\phi(t)$. $\phi(t)$ represents phase noise or some other phase perturbation of the waveform. Furthermore, suppose that $\phi(t)$ and $-\phi(t)$ can be derived and manipulated. Then if follows that the multiplication of $S_1(t)$ and $S_2(t)$ will yield EQ. (165).

$$S(t)=S_1(t)\cdot S_2(t)=e^{-j(\omega_c t+\phi(t))}\cdot e^{-j(\omega_c t-\phi(t))}=e^{-j2\omega_c t} \qquad \text{EQ. (165)}$$

Figure 168:
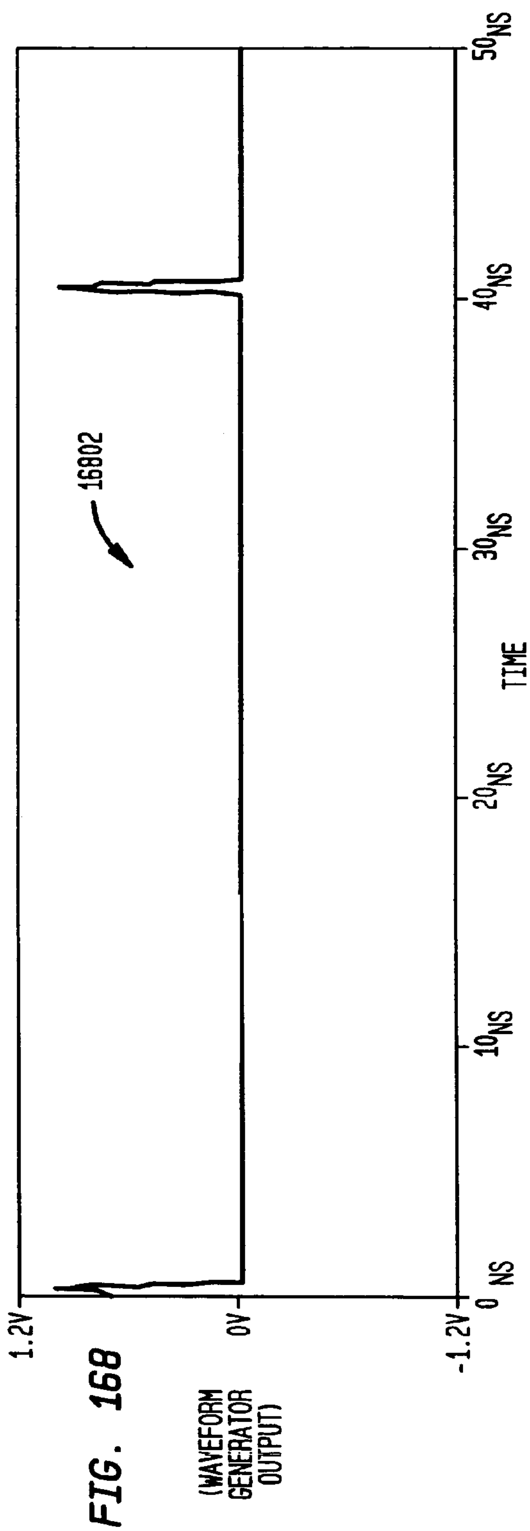
Figure 169:
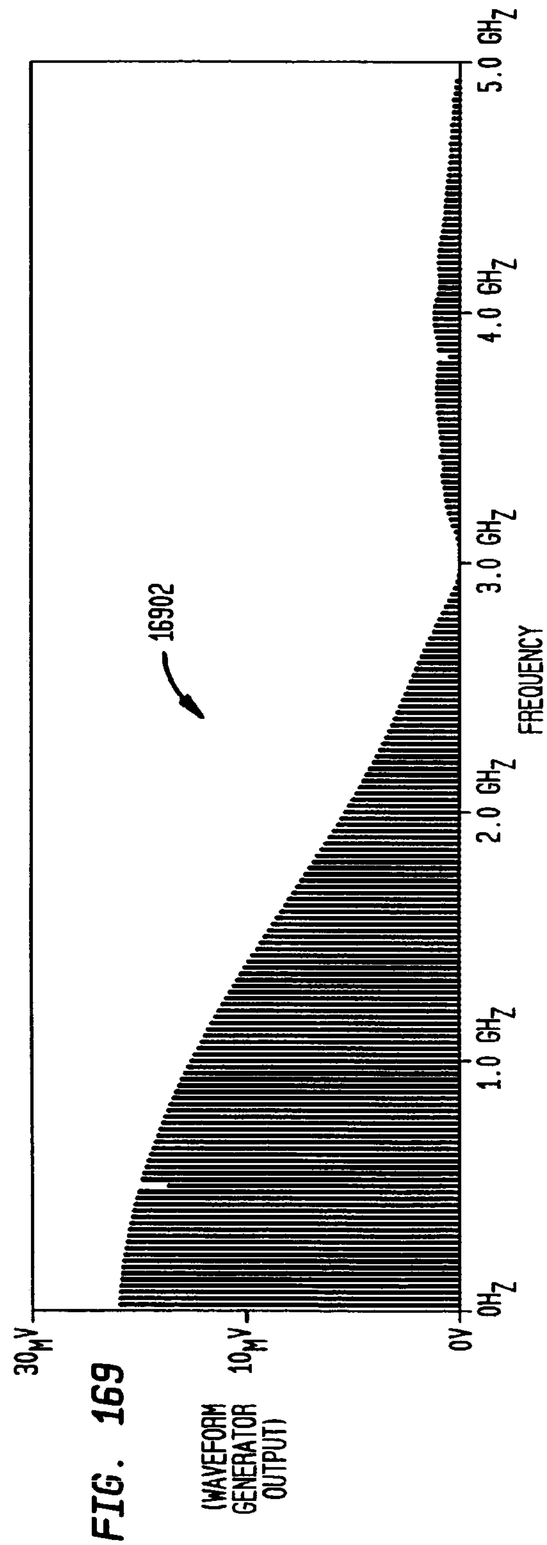

Thus, the phase noise $\phi(t)$ can be canceled. Trigonometric identities verify the same result except for an additional term at DC. This can be implemented with, for example, a four-quadrant version of the invention. FIG. 168 illustrates an implementation for a doubler (2× clock frequency and harmonics thereof. FIG. 169 illustrates another implementation (harmonics with odd order phase noise canceling).

In an embodiment two clocks are utilized for phase noise cancellation of odd and even order harmonics by cascading stages. A four quadrant implementation of the invention can be utilized to eliminate the multiplier illustrated in FIG. 169.

6.10. Multiplexed UFD

In an embodiment, parallel receivers and transmitters are implemented using single pole, double throw, triple throw, etc., implementations of the invention.

A multiple throw implementation of the invention can also be utilized. In this embodiment, many frequency conversion options at multiple rates can be performed in parallel or serial. This can be implemented for multiple receive functions, multi-band radios, multi-rate filters, etc.

6.11. Sampling Apertures

Figure 170:
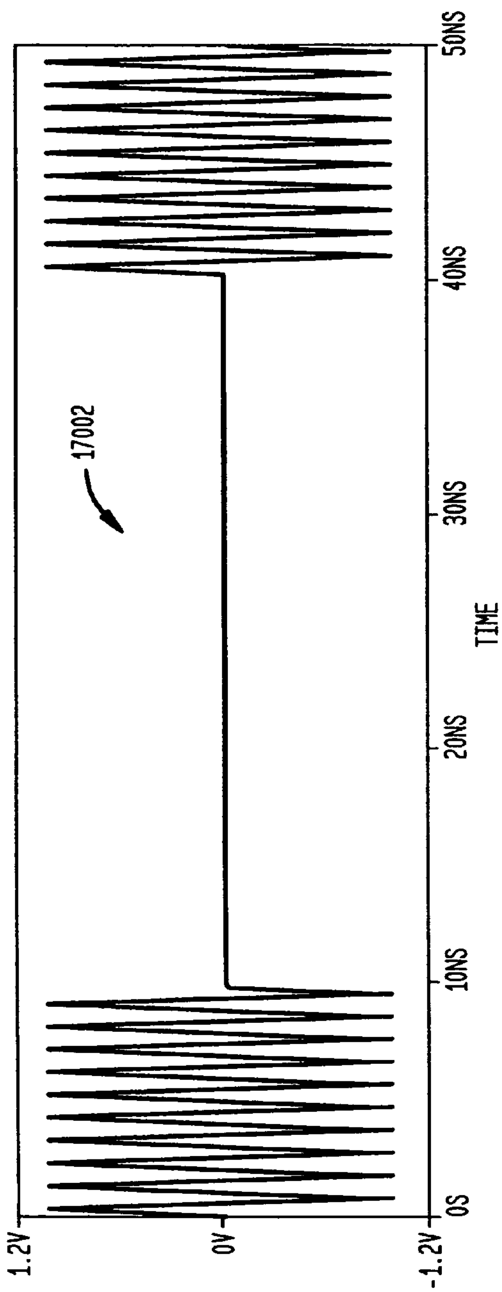

Multiple apertures can be utilized to accomplish a variety of effects. For example, FIG. 170 illustrates a bipolar sample aperture and a corresponding sine wave being sampled. The bipolar sample aperture is operated at a sub harmonic of the sine wave being sampled. By calculating the Fourier transform of each component within the Fourier series, it can be shown that the sampling power spectrum goes to zero at the sub harmonics and super harmonics. As a result, the comb spectrum is substantially eliminated except at the conversion frequency.

Similarly, the number of apertures can be extended with associated bipolar weighting to form a variety of impulse responses and to perform filtering at RF.

6.12. Diversity Reception and Equalizers

The present invention can be utilized to implement maximal ratio post detection combiners, equal gain post detection combiners, and selectors.

Figure 171:
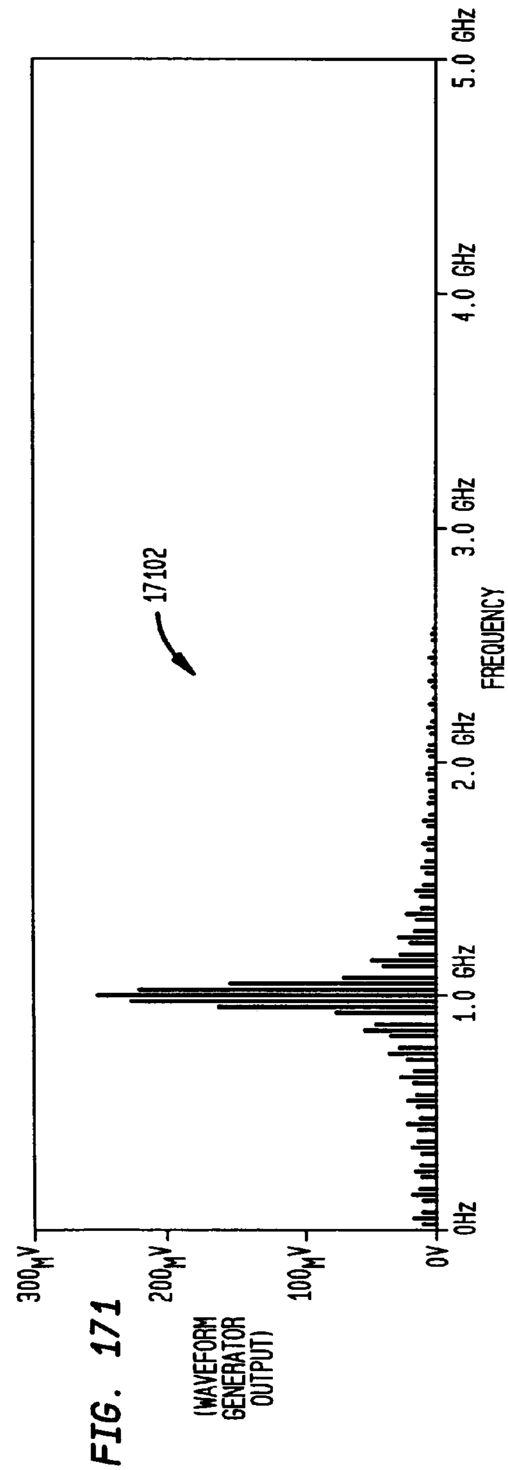

FIG. 171 illustrates an example diversity receiver implemented in accordance with the present invention.

FIG. 144 illustrates an example equalizer implemented in accordance with the present invention.

The present invention can serve as a quadrature down converter and as a unit delay function. In an example of such an implementation, the unit delay function is implemented with a decimated clock at baseband.

7. Conclusions

Example embodiments of the methods, systems, and components of the present invention have been described herein. As noted elsewhere, these example embodiments have been described for illustrative purposes only, and are not limiting. Other embodiments are possible and are covered by the invention. Such other embodiments include but are not limited to hardware, software, and software/hardware implementations of the methods, systems, and components of the invention. Such other embodiments will be apparent to persons skilled in the relevant art(s) based on the teachings contained herein. Thus, the breadth and scope of the present invention should not be limited by any of the above-described exemplary embodiments, but should be defined only in accordance with the following claims and their equivalents.

8. Glossary of Terms

| | |
|---|---|
| A.M. | Amplitude Modulation |
| A/D | Analog/Digital |
| AWGN | Additive White Gaussian |
| C | Capacitor |
| CMOS | Complementary Metal Oxide Semiconductor |
| dB | Decibel |
| dBm | Decibels with Respect to One Milliwatt |
| DC | Direct Current |
| DCT | Discrete Cosine Transform |
| DST | Discrete Sine Transform |
| FIR | Finite Impulse Response |
| GHz | Giga Hertz |
| I/Q | In Phase/Quadrature Phase |
| IC | Integrated Circuits, Initial Conditions |
| IF | Intermediate Frequency |
| ISM | Industrial, Scientific, Medical Band |
| L-C | Inductor-Capacitor |
| LO | Local Oscillator |
| NF | Noise Frequency |
| OFDM | Orthogonal Frequency Division Multiplex |
| R | Resistor |
| RF | Radio Frequency |
| rms | Root Mean Square |

-continued

| | |
|---|---|
| SNR | Signal to Noise Ratio |
| WLAN | Wireless Local Area Network |
| UFT | Universal Frequency Translation |

9. Conclusion

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for down-converting a signal comprising:

(a) recursively applying a matched filter operation to said signal at a rate sub-harmonically related to said signal;

(b) retaining and accumulating a result of said matched filter operation to provide an initial condition for subsequent recursions of said matched filter operation, wherein said accumulation is approximated as a zero order data hold filter; and (c) generating a down-converted signal from said accumulated results.

2. The method of claim 1, wherein step (a) comprises multiplying said signal by itself over a time interval defined for said signal, and then integrating the result over said time interval.

3. The method of claim 2, further comprising acquiring sampling information from energy under a half sine curve, wherein said energy under said half sine curve is proportional to a peak of said signal.

4. The method of claim 1, further comprising acquiring energy from said signal under a half-sine cycle, thereby minimizing effects of aperture uncertainty.

5. The method of claim 1, wherein step (a) is performed with a single aperture RC processor that is a first order approximation of said matched filter operation, where a pulse shape being matched is a half-sine pulse.

6. The method of claim 5, wherein said RC processor integrates across an acquisition aperture and stores the result to accumulate said result with a subsequent aperture.

7. The method of claim 6, wherein a maximum voltage is accumulated by said RC processor at time $t \cong 0.75T_A$ and $\beta \cong 2.6$, wherein the forcing function is a half sine pulse, $T_A$ is the aperture duration and $\beta=(RC)^{-1}$.

8. The method of claim 7, wherein when said RC processor accumulates charge over multiple apertures and wherein signal to noise ratio (SNR) and charge transfer is optimized for $\beta \approx 0.25$, and $T_A \approx 1$.

9. The method of claim 7, wherein said signal has frequency $f_c$ related to aperture duration $T_A$ by $f_c \approx (2T_A)^{-1}$.

10. The method of claim 7, wherein said aperture having a ratio of $$\frac{T_A}{T_c} = \frac{1}{2},$$

results in an optimal design parameter for a low DC offset system, wherein $T_c$ is a period of said signal.

11. The method of claim 6, wherein said RC processor calculates a numerical result substantially similar to that of an ideal sampler by averaging over multiple apertures.

12. The method of claim 11, wherein said RC processor aperture design produces results similar to that of an impulse sampler, scaled by a gain constant, and possesses lesser variance than an impulse sampler.

13. The method of claim 6, wherein said RC processor reduces the variance of an expected ideal sample, over that obtained by impulse sampling, by averaging over multiple apertures.

14. The method of claim 13, wherein an impulse sampler value expected at time $T_{A/2}$ is derived by said RC processor operating over an aperture of duration $T_A$.

15. The method of claim 6, wherein a clock signal controlling said aperture of said RC processor is defined as:

$$C_I(t) = \sum_{m=-\infty}^{\infty} \delta(t - mT_S) * p_C(t) = \sum_{m=-\infty}^{\infty} p(t - mT_S)$$

$$C_I(t) = \sum_{m=-\infty}^{\infty} (u(t) - u(t - T_A)) * \delta(t - mT_S)$$

$$C_Q(t) = \sum_{m=-\infty}^{\infty} (u[t - T_A/2] - u[t - 3T_A/2]) * \delta(t - (mT_S + T_A/2))$$

wherein, $C_I(t)$ is a complex in phase clock shifted in phase by $T_{A/2}$, $C_Q(t)$ is a complex quadrature phase clock shifted in phase by $T_{A/2}$, $P_c(t)\Delta$ is a basic pulse shape of said clock (gating waveform) having correlation properties matched to a half sine of said signal, $T_s\Delta$ is a time between recursively applied gating waveforms, $T_A\Delta$ is an aperture duration, and $\delta(t)\Delta$ is an impulse sample function.

16. The method of claim 6, wherein an optimal capacitance ($C_s$) for said RC processor is related to said aperture width (Aperture_Width), a resistance (R) and frequency of apertures ($f$reqLO) by the equation $$C_s(R) = \left( \frac{\frac{1}{freqLO} - \text{Aperture\_Width}}{-\ln(0.841) \cdot R} \right).$$

17. The method of claim 5, further comprising: successively applying said matched filter operation of said RC processor on said signal at a rate:

$$f_s = f_c/M$$

wherein, $f_s\Delta$ is a sampling rate, $f_c\Delta$ is a signal frequency, and $M\Delta$ is an integer such that $0<M<\infty$.

18. The method of claim 17, wherein M is greater than or equal to 3 and lesser than or equal to 10.

19. The method of claim 17, wherein said sampling rate is greater than twice an information bandwidth frequency of said signal.

20. The method of claim 17, wherein a ratio of said sampling rate ($f_s$) to number of samples (l) is greater than an information bandwidth frequency of said signal.

21. The method of claim 20, wherein voltage accumulated per microsecond ($V_{\mu sec}$) is $$V_{\mu\text{sec}} \cong l_s \frac{A^2 T_A}{2}$$

wherein, $l_s$ is a number of samples accumulated per microsecond, and

A is an amplitude of an original component of a complex modulation envelope for said signal.

22. The method of claim 1, wherein a maximum output of said matched filter operation occurs when said signal and a corresponding aperture are substantially overlapped for a time observation $t_0 \approx T_A$.

23. The method of claim 1, wherein said matched filter comprises a correlator that acquires substantially all of the energy available across a finite duration aperture.

24. The method of claim 1, wherein energy accumulated over an aperture is $$E_l = \int_0^{T_A} S_i^2(t)dt = \frac{A_n^2 T_A}{2}$$

wherein, $A_n\Delta$ is a carrier signal envelope weighting of the nth sample, and $S_i(t)$ is the original signal.

25. The method of claim 1, wherein step(a) comprises multiplying said signal by itself over a time interval defined for said signal, wherein step(b) comprises integrating the result of step(a) over said time interval according to:

$$\int_{-0}^{T_A} S_i^2(t)dt$$

wherein, $S_i(t)$ is the original signal, and $T_A$ is an aperture duration.

* * * * *

UNITED STATES PATENT AND TRADEMARK OFFICE

CERTIFICATE OF CORRECTION

PATENT NO. : 7,308,242 B2 
APPLICATION NO. : 10/914337
DATED : December 11, 2007
INVENTOR(S) : Sorrells et al.

It is certified that error appears in the above-identified patent and that said Letters Patent is hereby corrected as shown below:

Title Page
Item (56), References Cited section, U.S. PATENT DOCUMENTS, please add
--3,641,442 02/1972 Boucher--.

Column 92
Line 13 please replace "$T_{A/2}$" with --$T_A$/2--.
Line 30 please replace "$T_{A/2}$" with --$T_A$/2--.
Line 32 please replace "$T_{A/2}$" with --$T_A$/2--.

Signed and Sealed this

Twelfth Day of August, 2008

JON W. DUDAS
*Director of the United States Patent and Trademark Office*